US012799393B2

(12) United States Patent
Wolohan et al.

(10) Patent No.: US 12,799,393 B2
(45) Date of Patent: Nov. 17, 2026

(54) ORGANIC ELECTROLUMINESCENT MATERIALS AND DEVICES

(71) Applicant: UNIVERSAL DISPLAY CORPORATION, Ewing, NJ (US)

(72) Inventors: Peter Wolohan, Princeton Junction, NJ (US); Tyler Fleetham, Yardley, PA (US); Nicholas J. Thompson, New Hope, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 335 days.

(21) Appl. No.: 18/673,429

(22) Filed: May 24, 2024

(65) Prior Publication Data

US 2024/0425750 A1 Dec. 26, 2024

Related U.S. Application Data

(60) Provisional application No. 63/503,962, filed on May 24, 2023.

(51) Int. Cl.

| | |
|---|---|
| ***C09K 11/06*** | (2006.01) |
| ***H10K 50/11*** | (2023.01) |
| ***H10K 85/60*** | (2023.01) |
| *H10K 101/30* | (2023.01) |

(52) U.S. Cl.

CPC .............. *C09K 11/06* (2013.01); *H10K 50/11* (2023.02); *H10K 85/615* (2023.02); *C09K 2211/1011* (2013.01); *H10K 2101/30* (2023.02)

(58) Field of Classification Search

CPC . C09K 11/06; C09K 2211/1011; H10K 50/11; H10K 85/615; H10K 2101/30; H10K 2101/20; H10K 2101/40; H10K 85/40; H10K 85/654; H10K 85/657; H10K 85/6572; H10K 85/6574; H10K 85/6576

See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,639,914 | A | 6/1997 | Tomiyama et al. |

(Continued)

FOREIGN PATENT DOCUMENTS

| | | | |
|---|---|---|---|
| CN | 1696137 | A | 11/2005 |
| CN | 102702075 | A | 10/2012 |

(Continued)

OTHER PUBLICATIONS

Ming Yan, et al., Tetrahedron 2015, 71, 1425-30 and Atzrodt et al., Angew. Chem. Int. Ed. (Reviews) 2007, 46, 7744-65.

(Continued)

*Primary Examiner* — Ibrahim A Khan
(74) *Attorney, Agent, or Firm* — LNK Law, PLLC

(57) ABSTRACT

Provided are organic compounds comprising a first moiety and a second moiety which are connected by a structure comprising at least four 6-membered carbocyclic groups which hare grouped around a central C, Si, or Ge atom. Also provided are formulations comprising these organic compounds. Further provided are organic light emitting devices (OLEDs) and related consumer products that utilize these organic compounds.

20 Claims, 2 Drawing Sheets

(56) References Cited

U.S. PATENT DOCUMENTS 5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,413,656 B1 7/2002 Thompson
6,468,819 B1 10/2002 Kim et al.
6,517,957 B1 2/2003 Senoo et al.
6,653,654 B1 11/2003 Che
6,656,612 B2 12/2003 Okada et al.
6,670,645 B2 12/2003 Grushin et al.
6,687,266 B1 2/2004 Ma et al.
6,699,599 B2 3/2004 Li et al.
6,835,469 B2 12/2004 Kwong et al.
6,916,554 B2 7/2005 Ma et al.
6,921,915 B2 7/2005 Takiguchi et al.
7,154,114 B2 12/2006 Brooks et al.
7,279,704 B2 10/2007 Walters et al.
7,332,232 B2 2/2008 Ma et al.
7,345,301 B2 3/2008 Gerhard et al.
7,378,162 B2 5/2008 Jeong et al.
7,431,968 B1 10/2008 Shtein et al.
7,534,505 B2 5/2009 Lin et al.
7,605,277 B2 10/2009 Kai et al.
7,675,228 B2 3/2010 Tonkin et al.
7,728,137 B2 6/2010 Stössel et al.
7,740,957 B2 6/2010 Kim et al.
7,749,615 B2 7/2010 Fukumatsu et al.
7,759,489 B2 7/2010 Watanabe et al.
7,846,763 B2 12/2010 Bold et al.
7,951,947 B2 5/2011 Igarashi et al.
7,968,146 B2 6/2011 Wagner et al.
7,993,760 B2 8/2011 Komori et al.
8,044,222 B2 10/2011 Yabunouchi et al.
8,062,769 B2 11/2011 Kai et al.
8,067,099 B2 11/2011 Watanabe et al.
8,129,083 B2 3/2012 Yabunouchi et al.
8,222,637 B2 7/2012 Kawamura et al.
8,231,983 B2 7/2012 Sugita et al.
8,258,297 B2 9/2012 Molt et al.
8,263,770 B2 9/2012 Mat-Suo et al.
8,288,013 B2 10/2012 Morishita
8,372,527 B2 2/2013 Morishita et al.
8,373,159 B2 2/2013 Langer et al.
8,383,828 B2 2/2013 Molt et al.
8,415,031 B2 4/2013 Xia et al.
8,557,400 B2 10/2013 Xia et al.
8,574,725 B2 11/2013 Nishimura et al.
8,592,586 B2 11/2013 Molt et al.
8,597,798 B2 12/2013 Parham et al.
8,608,986 B2 12/2013 Akino et al.
8,614,010 B2 12/2013 Yabunouchi
8,703,304 B2 4/2014 Yabunouchi et al.
8,759,819 B2 6/2014 Nishimura et al.
8,871,361 B2 10/2014 Xia et al.
9,093,652 B2 7/2015 Jung et al.
9,169,282 B2 10/2015 Stoessel et al.
9,181,289 B2 11/2015 Stoessel et al.
9,196,842 B2 11/2015 Kato et al.
9,296,944 B2 3/2016 Toshihiro et al.
9,466,803 B1 10/2016 Park et al.
9,472,762 B2 10/2016 Murer et al.
9,490,432 B2 11/2016 Zeika et al.
9,564,595 B2 2/2017 Kato et al.
9,595,681 B2 3/2017 Mujica-Fernaud et al.
9,604,972 B2 3/2017 Yoshida et al.
9,634,255 B2 4/2017 Kato et al.
9,799,835 B2 10/2017 Kim et al.
9,837,622 B2 12/2017 Stoessel et al.
9,882,142 B2 1/2018 Mujica-Fernaud et al.
9,882,149 B2 1/2018 Kim et al.
9,978,975 B2 5/2018 Kambe et al.
10,008,672 B2 6/2018 Stoessel et al.
10,103,340 B2 10/2018 Stoessel et al.
10,256,412 B2 * 4/2019 Kim .................... H10K 85/622
10,347,850 B2 7/2019 Ono et al.
10,385,263 B2 8/2019 Fuchs et al.
10,522,768 B2 12/2019 Egen et al.
10,790,452 B2 * 9/2020 Kim .................... C07D 471/04
11,309,511 B2 * 4/2022 Sakamoto ............ H10K 50/156
11,462,703 B2 * 10/2022 Lee ........................ H10K 50/11
12,543,496 B2 * 2/2026 Pashazadeh ......... C07D 403/10
2001/0019782 A1 9/2001 Igarashi et al.
2002/0034656 A1 3/2002 Thompson et al.
2002/0158242 A1 10/2002 Son et al.
2003/0068526 A1 4/2003 Kamatani et al.
2003/0072964 A1 4/2003 Kwong et al.
2003/0138657 A1 7/2003 Li et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0174116 A1 9/2004 Lu et al.
2005/0123751 A1 6/2005 Tsutsui
2005/0123788 A1 6/2005 Huo et al.
2005/0123791 A1 6/2005 Deaton et al.
2005/0139810 A1 6/2005 Kuehl et al.
2005/0238919 A1 10/2005 Ogasawara
2005/0244673 A1 11/2005 Satoh et al.
2005/0260449 A1 11/2005 Walters et al.
2006/0008670 A1 1/2006 Lin et al.
2006/0065890 A1 3/2006 Stossel et al.
2006/0127696 A1 6/2006 Stossel et al.
2006/0134459 A1 6/2006 Huo et al.
2006/0134462 A1 6/2006 Yeh et al.
2006/0182993 A1 8/2006 Ogata et al.
2006/0202194 A1 9/2006 Jeong et al.
2006/0240279 A1 10/2006 Adamovich et al.
2006/0251923 A1 11/2006 Lin et al.
2006/0280965 A1 12/2006 Kwong et al.
2007/0018155 A1 1/2007 Bae et al.
2007/0034863 A1 2/2007 Fortte et al.
2007/0087321 A1 4/2007 Pribenszky et al.
2007/0103060 A1 5/2007 Itoh et al.
2007/0104977 A1 5/2007 Arakane et al.
2007/0104979 A1 5/2007 Kim et al.
2007/0104980 A1 5/2007 Kim et al.
2007/0111026 A1 5/2007 Deaton et al.
2007/0138437 A1 6/2007 Haga et al.
2007/0145888 A1 6/2007 Yabonouchi et al.
2007/0160905 A1 7/2007 Morishita et al.
2007/0181874 A1 8/2007 Prakash et al.
2007/0190359 A1 8/2007 Knowles et al.
2007/0224450 A1 9/2007 Kim et al.
2007/0231600 A1 10/2007 Kamatani et al.
2007/0252140 A1 11/2007 Limmert et al.
2007/0278936 A1 12/2007 Herron et al.
2007/0278938 A1 12/2007 Yabunouchi et al.
2008/0005851 A1 1/2008 Perez-Prat Vinuesa et al.
2008/0014464 A1 1/2008 Kawamura et al.
2008/0018237 A1 1/2008 Yamamoto et al.
2008/0020237 A1 1/2008 Ren et al.
2008/0091025 A1 4/2008 Morishita et al.
2008/0106190 A1 5/2008 Yabunouchi et al.
2008/0107919 A1 5/2008 Hwang et al.
2008/0124572 A1 5/2008 Mizuki et al.
2008/0145707 A1 6/2008 Yabunouchi et al.
2008/0161567 A1 7/2008 Stoessel et al.
2008/0210930 A1 9/2008 Kamatani et al.
2008/0220265 A1 9/2008 Xia et al.
2008/0233410 A1 9/2008 Mashima et al.
2008/0233434 A1 9/2008 Kawamura et al.
2008/0261076 A1 10/2008 Kwong et al.
2008/0297033 A1 12/2008 Knowles et al.
2008/0303417 A1 12/2008 Yabunouchi et al.
2009/0017330 A1 1/2009 Toshihiro et al.
2009/0030202 A1 1/2009 Toshihiro et al.
2009/0039776 A1 2/2009 Yamada et al.

(56) References Cited

U.S. PATENT DOCUMENTS

2009/0066235 A1 3/2009 Yabunouchi et al.
2009/0085476 A1 4/2009 Park et al.
2009/0091253 A1 4/2009 Yasukawa et al.
2009/0101870 A1 4/2009 Prakash et al.
2009/0104472 A1 4/2009 Je et al.
2009/0108737 A1 4/2009 Kwong et al.
2009/0115316 A1 5/2009 Zheng et al.
2009/0115320 A1 5/2009 Kawamura et al.
2009/0115322 A1 5/2009 Walters et al.
2009/0140637 A1 6/2009 Hosokawa et al.
2009/0167161 A1 7/2009 Yabunouchi et al.
2009/0167162 A1 7/2009 Chun et al.
2009/0167167 A1 7/2009 Aoyama et al.
2009/0179554 A1 7/2009 Kuma et al.
2009/0179555 A1 7/2009 Kim et al.
2009/0218940 A1 9/2009 Okajima et al.
2009/0302743 A1 12/2009 Kato et al.
2009/0309488 A1 12/2009 Kato et al.
2010/0012931 A1 1/2010 Kato et al.
2010/0084966 A1 4/2010 Shinya et al.
2010/0090591 A1 4/2010 Alleyne et al.
2010/0102716 A1 4/2010 Kim et al.
2010/0105902 A1 4/2010 Inoue et al.
2010/0108990 A1 5/2010 Hosokawa et al.
2010/0148663 A1 6/2010 Tsai et al.
2010/0187984 A1 7/2010 Chun et al.
2010/0219397 A1 9/2010 Watanabe et al.
2010/0244004 A1 9/2010 Xia et al.
2010/0270916 A1 10/2010 Xia et al.
2010/0288362 A1 11/2010 Hatwar et al.
2010/0295032 A1 11/2010 Kwong et al.
2011/0007385 A1 1/2011 Yamanashi et al.
2011/0037057 A1 2/2011 LeCloux et al.
2011/0057559 A1 3/2011 Xia et al.
2011/0108822 A1 5/2011 Parham et al.
2011/0156017 A1 6/2011 Lee et al.
2011/0163302 A1 7/2011 Lin et al.
2011/0204333 A1 8/2011 Xia et al.
2011/0210320 A1 9/2011 Shin et al.
2011/0215710 A1 9/2011 Xia et al.
2011/0227049 A1 9/2011 Xia et al.
2011/0240968 A1 10/2011 Kim et al.
2011/0278551 A1 11/2011 Yabunouchi et al.
2011/0285275 A1 11/2011 Huang et al.
2012/0075273 A1 3/2012 Shigemoto et al.
2012/0126221 A1 5/2012 Tetsu et al.
2012/0146012 A1 6/2012 Limmert et al.
2012/0193612 A1 8/2012 Chun et al.
2012/0205642 A1 8/2012 Yokoyama et al.
2012/0205645 A1 8/2012 Fuchs et al.
2012/0214993 A1 8/2012 Aihara et al.
2012/0292601 A1 11/2012 Kottas et al.
2012/0319091 A1 12/2012 Kato
2013/0009543 A1 1/2013 Hiroshi et al.
2013/0033172 A1 2/2013 Huang et al.
2013/0105787 A1 5/2013 Daisaku et al.
2013/0146848 A1 6/2013 Ma et al.
2013/0165653 A1 6/2013 Inoue et al.
2013/0175519 A1 7/2013 Naoki et al.
2013/0181190 A1 7/2013 Ma et al.
2013/0241401 A1 9/2013 Kwong et al.
2013/0248830 A1 9/2013 Welsh et al.
2013/0334521 A1 12/2013 Lee et al.
2014/0001446 A1 1/2014 Mizuki et al.
2014/0014925 A1 1/2014 Jung et al.
2014/0014927 A1 1/2014 Kim et al.
2014/0034914 A1 2/2014 Takada et al.
2014/0103305 A1 4/2014 Ma et al.
2014/0117329 A1 5/2014 Lee et al.
2014/0183503 A1 7/2014 Hiroshi et al.
2014/0183517 A1 7/2014 Huh et al.
2014/0191225 A1 7/2014 Inoue et al.
2014/0225088 A1 8/2014 Hwang et al.
2014/0246656 A1 9/2014 Inoue et al.
2014/0284580 A1 9/2014 Balaganesan et al.
2015/0014649 A1* 1/2015 Ma ........................ C07D 409/14 548/440
2015/0060804 A1 3/2015 Kanitz et al.
2015/0123047 A1 5/2015 Maltenberger et al.
2015/0171348 A1 6/2015 Stoessel et al.
2015/0221874 A1 8/2015 Kim et al.
2015/0228899 A1 8/2015 Tomoki et al.
2015/0263294 A1 9/2015 Kim et al.
2015/0280136 A1 10/2015 Ryu et al.
2016/0046652 A1* 2/2016 Lu ........................ H10K 85/346 546/13
2016/0163995 A1 6/2016 Kang et al.
2017/0025627 A1* 1/2017 Schaefer ............. C07F 15/0033
2017/0098783 A1* 4/2017 Wolohan ............ C07D 491/048
2017/0263869 A1 9/2017 Tada et al.
2018/0130953 A1* 5/2018 Song .................... C07D 403/10
2018/0151816 A1* 5/2018 Xia ..................... C07F 15/0086
2018/0287079 A1* 10/2018 Wolohan ............. C07F 15/0033
2019/0081248 A1* 3/2019 Lin ...................... C07D 487/04
2019/0326528 A1* 10/2019 Brooks ............... C07F 15/0086
2023/0132112 A1* 4/2023 Sim ...................... C07D 251/24 257/40
2024/0244955 A1* 7/2024 Horwitz ............... H10K 85/658
2025/0127045 A1* 4/2025 Sim .................... H10K 85/6574
2026/0059934 A1* 2/2026 Kawamura .......... H10K 50/121
2026/0143965 A1* 5/2026 Sakuma ............... C07D 409/12

FOREIGN PATENT DOCUMENTS

CN 103508940 A 1/2014
CN 103694277 A 4/2014
DE 102012005215 B3 4/2013
EP 0650955 A1 5/1995
EP 1238981 A2 9/2002
EP 1239526 A2 9/2002
EP 1244155 A2 9/2002
EP 01602648 A1 12/2005
EP 1617493 A2 1/2006
EP 1624500 A1 2/2006
EP 1642951 A2 4/2006
EP 1647554 A2 4/2006
EP 1698613 A1 9/2006
EP 1725079 A1 11/2006
EP 01734038 A1 12/2006
EP 1806334 A1 7/2007
EP 1841834 A1 10/2007
EP 1930964 A1 6/2008
EP 01956007 A1 8/2008
EP 1961743 A 8/2008
EP 1968131 A1 9/2008
EP 1972613 A1 9/2008
EP 1997799 A1 12/2008
EP 2011790 A1 1/2009
EP 2020694 A1 2/2009
EP 2034538 A1 3/2009
EP 2055700 A1 5/2009
EP 2055701 A1 5/2009
EP 2062907 A2 5/2009
EP 2085382 A1 8/2009
EP 2660300 A2 11/2013
EP 2684932 A1 1/2014
EP 2730583 A1 5/2014
EP 2757608 A1 7/2014
JP 2004022334 A 1/2004
JP 2005112765 A 4/2005
JP 2005149918 A 6/2005
JP 2005268199 A 9/2005
JP 2007073529 A 3/2007
JP 2007091719 A 4/2007
JP 2007254297 A 10/2007
JP 2008021687 A 1/2008
JP 4478555 B2 3/2010
JP 2012074444 A 4/2012
JP 2013110263 A 6/2013
JP 2014009196 A 1/2014
KR 0117693 Y1 4/1998
KR 20100079458 A 7/2010
KR 20110077173 A 7/2011
KR 20110088898 A 8/2011

(56) References Cited

FOREIGN PATENT DOCUMENTS

| | | | |
|---|---|---|---|
| KR | 20120032054 | A | 4/2012 |
| KR | 20120088644 | A | 8/2012 |
| KR | 20120129733 | A | 11/2012 |
| KR | 20130043460 | A | 4/2013 |
| KR | 20130077473 | A | 7/2013 |
| KR | 20130108183 | A | 10/2013 |
| KR | 20130115564 | A | 10/2013 |
| TW | 201139402 | A | 1/2011 |
| TW | 201329200 | A1 | 7/2013 |
| TW | 201332980 | A | 8/2013 |
| WO | 2001039234 | A2 | 5/2001 |
| WO | 2002015645 | A1 | 2/2002 |
| WO | 2003040257 | A1 | 5/2003 |
| WO | 2003060956 | A1 | 7/2003 |
| WO | 2004093207 | A2 | 10/2004 |
| WO | 2005014551 | A1 | 2/2005 |
| WO | 2005019373 | A2 | 3/2005 |
| WO | 2005075451 | A1 | 8/2005 |
| WO | 2005089025 | A1 | 9/2005 |
| WO | 2006056418 | A2 | 6/2006 |
| WO | 2006072002 | A2 | 7/2006 |
| WO | 2006081780 | A1 | 8/2006 |
| WO | 2006081973 | A1 | 8/2006 |
| WO | 2006095951 | A1 | 9/2006 |
| WO | 2006114966 | A1 | 11/2006 |
| WO | 2006121811 | A1 | 11/2006 |
| WO | 2007018067 | A1 | 2/2007 |
| WO | 2007063754 | A1 | 6/2007 |
| WO | 2007108362 | A1 | 9/2007 |
| WO | 2007111263 | A1 | 10/2007 |
| WO | 2007115970 | A1 | 10/2007 |
| WO | 2007115981 | A1 | 10/2007 |
| WO | 2007125714 | A1 | 11/2007 |
| WO | 2008023550 | A1 | 2/2008 |
| WO | 2008023759 | A1 | 2/2008 |
| WO | 2008035571 | A1 | 3/2008 |
| WO | 2008054584 | A1 | 5/2008 |
| WO | 2008056746 | A1 | 5/2008 |
| WO | 2008057394 | A1 | 5/2008 |
| WO | 2008078800 | A1 | 7/2008 |
| WO | 2008096609 | A1 | 8/2008 |
| WO | 2008101842 | A | 8/2008 |
| WO | 2009000673 | A2 | 12/2008 |
| WO | 2009003455 | A1 | 1/2009 |
| WO | 2009003898 | A1 | 1/2009 |
| WO | 2009008277 | A1 | 1/2009 |
| WO | 2009011327 | A1 | 1/2009 |
| WO | 2009021126 | A2 | 2/2009 |
| WO | 2009050281 | A1 | 4/2009 |
| WO | 2009063833 | A1 | 5/2009 |
| WO | 2009066778 | A1 | 5/2009 |
| WO | 2009066779 | A1 | 5/2009 |
| WO | 2009086028 | A2 | 7/2009 |
| WO | 2009100991 | A1 | 8/2009 |
| WO | 2009145016 | A1 | 12/2009 |
| WO | 2009148269 | A1 | 12/2009 |
| WO | 2010011390 | A2 | 1/2010 |
| WO | 2010028151 | A1 | 3/2010 |
| WO | 2010054731 | A1 | 5/2010 |
| WO | 2010056066 | A1 | 5/2010 |
| WO | 2010061824 | A1 | 6/2010 |
| WO | 2010067894 | A1 | 6/2010 |
| WO | 2010072300 | A1 | 7/2010 |
| WO | 2010086089 | A1 | 8/2010 |
| WO | 2010107244 | A2 | 9/2010 |
| WO | 2010118029 | A1 | 10/2010 |
| WO | 2011044988 | A1 | 4/2011 |
| WO | 2011051404 | A1 | 5/2011 |
| WO | 2011074770 | A1 | 6/2011 |
| WO | 2011074770 | A2 | 6/2011 |
| WO | 2011075644 | A2 | 6/2011 |
| WO | 2011081423 | A2 | 7/2011 |
| WO | 2011081431 | A2 | 7/2011 |
| WO | 2011086863 | A1 | 7/2011 |
| WO | 2011105373 | A1 | 9/2011 |
| WO | 2011107491 | A1 | 9/2011 |
| WO | 2012020327 | A1 | 2/2012 |
| WO | 2012128298 | A1 | 9/2012 |
| WO | 2012133644 | A1 | 10/2012 |
| WO | 2012133649 | A1 | 10/2012 |
| WO | 2012163471 | A1 | 12/2012 |
| WO | 2012177006 | A2 | 12/2012 |
| WO | 2013018530 | A1 | 2/2013 |
| WO | 2013024872 | A1 | 2/2013 |
| WO | 2013035275 | A1 | 3/2013 |
| WO | 2013039073 | A1 | 3/2013 |
| WO | 2013079217 | A1 | 6/2013 |
| WO | 2013081315 | A1 | 6/2013 |
| WO | 2013087142 | A1 | 6/2013 |
| WO | 2013094620 | A1 | 6/2013 |
| WO | 2013107487 | A1 | 7/2013 |
| WO | 2013118812 | A1 | 8/2013 |
| WO | 2013120577 | A1 | 8/2013 |
| WO | 2013145667 | A1 | 10/2013 |
| WO | 2013157367 | A1 | 10/2013 |
| WO | 2013174471 | A1 | 11/2013 |
| WO | 2013175747 | A1 | 11/2013 |
| WO | 2013180376 | A1 | 12/2013 |
| WO | 2013191404 | A1 | 12/2013 |
| WO | 2014002873 | A1 | 1/2014 |
| WO | 2014007565 | A1 | 1/2014 |
| WO | 2014008982 | A1 | 1/2014 |
| WO | 2014009310 | A1 | 1/2014 |
| WO | 2014015935 | A2 | 1/2014 |
| WO | 2014015937 | A1 | 1/2014 |
| WO | 2014023377 | A2 | 2/2014 |
| WO | 2014024131 | A1 | 2/2014 |
| WO | 2014030872 | A2 | 2/2014 |
| WO | 2014030921 | A1 | 2/2014 |
| WO | 2014031977 | A1 | 2/2014 |
| WO | 2014034791 | A1 | 3/2014 |
| WO | 2014038456 | A1 | 3/2014 |
| WO | 2014104499 | A1 | 7/2014 |
| WO | 2014104514 | A1 | 7/2014 |
| WO | 2014104535 | A1 | 7/2014 |
| WO | 2014112450 | A1 | 7/2014 |
| WO | 2014142472 | A1 | 9/2014 |
| WO | 2014157018 | A1 | 10/2014 |

OTHER PUBLICATIONS

Baldo et al., "Highly Efficient Phosphorescent Emission from Organic Electroluminescent Devices," Nature, vol. 395, 151-154, 1998.

Baldo et al., "Very high-efficiency green organic light-emitting devices based on electrophosphorescence," Appl. Phys. Lett., vol. 75, No. 3, 4-6 (1999).

Atzrodt et al., Angew. Chem. Int. Ed. (Reviews) 2007, 46, 7744-65.

Fink, R.; Heischkel, Y.; Thelakkat, M.; Schmidt, H.-W. Chem. Mater. 1998, 10, 3620-3625.

Pommerehne, J.; Vestweber, H.; Guss, W.; Mahrt, R. F.; Bassler, H.; Porsch, M.; Daub, J. Adv. Mater. 1995, 7, 551.

Hong et al., Chem. Mater. 2016, 28, 5791-98, 5792-93.

Tavasli et al., J. Mater. Chem. 2012, 22, 6419-29, 6422.

Morello, G.R., J. Mol. Model. 2017, 23:174.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 63/503,962, filed on May 24, 2023, the entire contents of which are incorporated herein by reference.

FIELD

The present disclosure generally relates to organic or metal coordination compounds and formulations and their various uses including as emitters, hosts, sensitizers, charge transporters, or exciton transporters in devices such as organic light emitting diodes and related electronic devices and consumer products.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, organic scintillators, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as displays, illumination, and backlighting.

One application for emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides a compound comprising a first moiety and a second moiety;

wherein the free form of the first moiety has a HOMO level, $E_{HOMO1}$, a LUMO level, $E_{LUMO1}$, and a center of gravity C1;

wherein the free form of the second moiety has a HOMO level, $E_{HOMO2}$, a LUMO level, $E_{LUMO2}$, and a center of gravity C2;

wherein the compound has a Point P;

wherein when the first moiety and the second moiety are connected by a direct bond, then the Point P is the center of the gravity of the direct bond;

wherein when the first moiety and the second moiety are connected by a structure of Formula I or a structure of Formula II, $W^1$ is the Point P;

Formula I

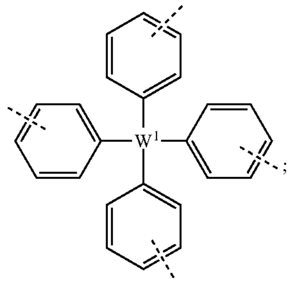

Formula II

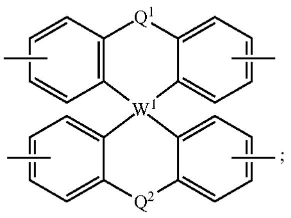

wherein $W^1$ are each independently C, Si or Ge;

wherein $Q^1$ and $Q^2$ are each independently a direct bond or selected from the list consisting of O, S, Se, NR, BR, BRR', PR, CR, C═O, C═NR, C═CRR', C═S, CRR', SO, $SO_2$, P(O)R, SiRR', and GeRR';

wherein each R and R' is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof;

wherein the first moiety and the second moiety are connected to Formula I or Formula II via any of the dashed lines;

wherein the angle between C1, P and C2 is equal to or greater than 45 degrees; and less than 180 degrees, wherein the first moiety and the second moiety are (i) both electron transporting moieties and $|E_{LUMO1}-E_{LUMO2}|<0.2$ eV; or (ii) both hole transporting moieties and $|E_{HOMO1}-E_{HOMO2}|<0.2$ eV.

In another aspect, the present disclosure provides a compound of Formula III or Formula IV Formula III

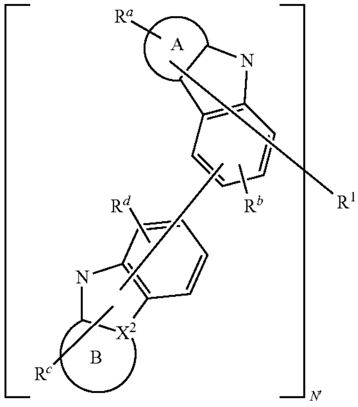

Formula IV

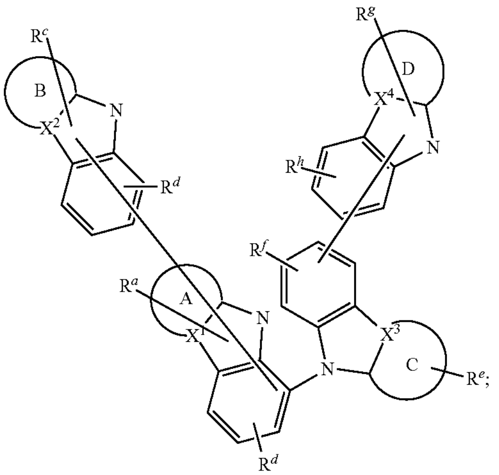

wherein $X^1$—$X^4$ are each independently C or N;

wherein N' is an integer of 2 to 4;

wherein moieties A, B, C and D are each independently a monocyclic ring or a polycyclic fused ring system, wherein the monocyclic ring or each ring of the polycyclic fused ring system is independently a 5-membered to 10-membered carbocyclic or heterocyclic ring;

wherein $R^1$ is a group selected from Formula I or Formula II as defined above;

wherein $R^a$, $R^b$, $R^c$, $R^d$, $R^e$, $R^f$, $R^g$ and $R^h$ each independently represent mono to the maximum allowable substitution, or no substitution;

wherein $R^a$, $R^b$, $R^c$, $R^d$, $R^e$, $R^f$, $R^g$ and $R^h$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof.

In yet another aspect, the present disclosure provides a formulation of the compounds as described herein.

In yet another aspect, the present disclosure provides an OLED having an organic layer comprising the compounds as described herein.

In yet another aspect, the present disclosure provides a consumer product comprising an OLED with an organic layer comprising the compounds as described herein.

DETAILED DESCRIPTION

A. Terminology

Figure 1:
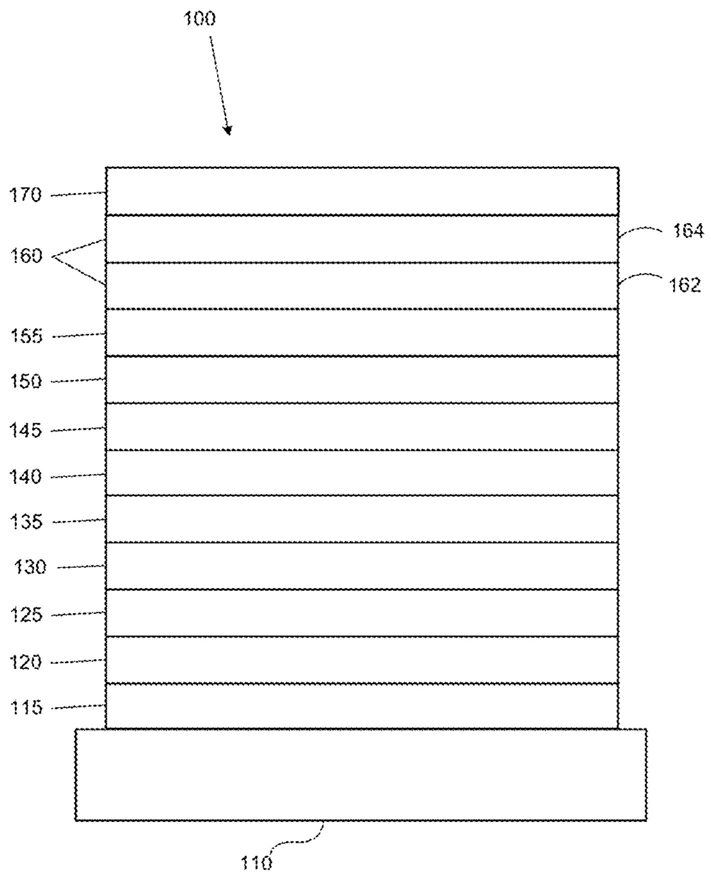
FIG. 1 shows an organic light emitting device.

Unless otherwise specified, the below terms used herein are defined as follows:

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "NIR", "red", "green", "blue", "yellow" layer, material, region, or device refers to a layer, a material, a region, or a device that emits light in the wavelength range of about 700-1500 nm, 580-700 nm, 500-600 nm, 400-500 nm, 540-600 nm, respectively, or a layer, a material, a region, or a device that has a highest peak in its emission spectrum in the respective wavelength region. In some arrangements, separate regions, layers, materials, or devices may provide separate "deep blue" and "light blue" emissions. As used herein, the "deep blue" emission component refers to an emission having a peak emission wavelength that is at least about 4 nm less than the peak emission wavelength of the "light blue" emission component. Typically, a "light blue" emission component has a peak emission wavelength in the range of about 465-500 nm, and a "deep blue" emission component has a peak emission wavelength in the range of about 400-470 nm, though these ranges may vary for some configurations.

In some arrangements, a color altering layer that converts, modifies, or shifts the color of the light emitted by another layer to an emission having a different wavelength is provided. Such a color altering layer can be formulated to shift wavelength of the light emitted by the other layer by a defined amount, as measured by the difference in the wavelength of the emitted light and the wavelength of the resulting light. In general, there are two classes of color altering layers: color filters that modify a spectrum by removing light of unwanted wavelengths, and color changing layers that convert photons of higher energy to lower energy. For example, a "red" color filter can be present in order to filter an input light to remove light having a wavelength outside the range of about 580-700 nm. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material, region, or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.3731, 0.6245]; [0.6270, 0.3725]; Interior: [0.3700, 0.4087]; [0.2886, 0.4572] |

The terms "halo," "halogen," and "halide" are used interchangeably and refer to fluorine, chlorine, bromine, and iodine.

The term "acyl" refers to a substituted carbonyl group (—C(O)—$R_s$).

The term "ester" refers to a substituted oxycarbonyl (—O—C(O)—$R_s$ or —C(O)—O—$R_s$) group.

The term "ether" refers to an —O$R_s$ group.

The terms "sulfanyl" or "thio-ether" are used interchangeably and refer to a —S$R_s$ group.

The term "selenyl" refers to a —Se$R_s$ group.

The term "sulfinyl" refers to a —S(O)—$R_s$ group.

The term "sulfonyl" refers to a —$SO_2$—$R_s$ group.

The term "phosphino" refers to a group containing at least one phosphorus atom bonded to the relevant structure. Common examples of phosphino groups include, but are not limited to, groups such as a —$P(R_s)_2$ group or a —$PO(R_s)_2$ group, wherein each $R_s$ can be same or different.

The term "silyl" refers to a group containing at least one silicon atom bonded to the relevant structure. Common examples of silyl groups include, but are not limited to, groups such as a —$Si(R_s)_3$ group, wherein each $R_s$ can be same or different.

The term "germyl" refers to a group containing at least one germanium atom bonded to the relevant structure. Common examples of germyl groups include, but are not limited to, groups such as a —$Ge(R_s)_3$ group, wherein each $R_s$ can be same or different.

The term "boryl" refers to a group containing at least one boron atom bonded to the relevant structure. Common examples of boryl groups include, but are not limited to, groups such as a —$B(R_s)_2$ group or its Lewis adduct —$B(R_s)_3$ group, wherein $R_s$ can be same or different.

In each of the above, $R_s$ can be hydrogen or a substituent selected from the group consisting of the general substituents as defined in this application. Preferred $R_s$ is selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. More preferably $R_s$ is selected from the group consisting of alkyl, cycloalkyl, aryl, heteroaryl, and combination thereof.

The term "alkyl" refers to and includes both straight and branched chain alkyl groups having an alkyl carbon atom bonded to the relevant structure. Preferred alkyl groups are those containing from one to fifteen carbon atoms, preferably one to nine carbon atoms, and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group can be further substituted.

The term "cycloalkyl" refers to and includes monocyclic, polycyclic, and spiro alkyl groups having a ring alkyl carbon atom bonded to the relevant structure. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group can be further substituted.

The terms "heteroalkyl" or "heterocycloalkyl" refer to an alkyl or a cycloalkyl group, respectively, having at least one carbon atom replaced by a heteroatom. Optionally the at least one heteroatom is selected from O, S, N, P, B, Si, Ge and Se, preferably, O, S or N. Additionally, the heteroalkyl or heterocycloalkyl group can be further substituted.

The term "alkenyl" refers to and includes both straight and branched chain alkene groups. Alkenyl groups are essentially alkyl groups that include at least one carbon-carbon double bond in the alkyl chain with one carbon atom from the carbon-carbon double bond that is bonded to the relevant structure. Cycloalkenyl groups are essentially cycloalkyl groups that include at least one carbon-carbon double bond in the cycloalkyl ring. The term "heteroalkenyl" as used herein refers to an alkenyl group having at least one carbon atom replaced by a heteroatom. Optionally the at least one heteroatom is selected from O, S, N, P, B, Si, Ge, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group can be further substituted.

The term "alkynyl" refers to and includes both straight and branched chain alkyne groups. Alkynyl groups are essentially alkyl groups that include at least one carbon-carbon triple bond in the alkyl chain with one carbon atom from the carbon-carbon triple bond that is bonded to the relevant structure. Preferred alkynyl groups are those containing two to fifteen carbon atoms. Additionally, the alkynyl group can be further substituted.

The terms "aralkyl" or "arylalkyl" are used interchangeably and refer to an aryl-substituted alkyl group having an alkyl carbon atom bonded to the relevant structure. Additionally, the aralkyl group can be further substituted.

The term "heterocyclic group" refers to and includes aromatic and non-aromatic cyclic groups containing at least one heteroatom. Optionally the at least one heteroatom is selected from O, S, Se, N, P, B, Si, Ge, and Se, preferably, O, S, N, or B. Hetero-aromatic cyclic groups may be used interchangeably with heteroaryl. Preferred hetero-non-aromatic cyclic groups are those containing 3 to 10 ring atoms, preferably those containing 3 to 7 ring atoms, which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group can be further substituted or fused.

The term "aryl" refers to and includes both single-ring and polycyclic aromatic hydrocarbyl groups. The polycyclic rings may have two or more rings in which two carbons are common to two adjoining rings (the rings are "fused"). Preferred aryl groups are those containing six to thirty carbon atoms, preferably six to twenty-four carbon atoms, six to eighteen carbon atoms, and more preferably six to twelve carbon atoms. Especially preferred is an aryl group having six carbons, ten carbons, twelve carbons, fourteen carbons, or eighteen carbons. Suitable aryl groups include phenyl, biphenyl, triphenyl, triphenylene, tetraphenylene, naphthalene, anthracene, phenalene, phenanthrene, pyrene, chrysene, perylene, and azulene, preferably phenyl, biphenyl, triphenyl, triphenylene, and naphthalene. Additionally, the aryl group can be further substituted or fused, such as, without limitation, fluorene.

The term "heteroaryl" refers to and includes both single-ring aromatic groups and polycyclic aromatic ring systems that include at least one heteroatom. The heteroatoms include, but are not limited to O, S, Se, N, P, B, Si, Ge, and Se. In many instances, O, S, N, or B are the preferred heteroatoms. Hetero-single ring aromatic systems are preferably single rings with 5 or 6 ring atoms, and the ring can have from one to six heteroatoms. The hetero-polycyclic ring systems can have two or more aromatic rings in which two atoms are common to two adjoining rings (the rings are "fused") wherein at least one of the rings is a heteroaryl. The hetero-polycyclic aromatic ring systems can have from one to six heteroatoms per ring of the polycyclic aromatic ring system. Preferred heteroaryl groups are those containing three to thirty carbon atoms, preferably three to twenty-four carbon atoms, three to eighteen carbon atoms, and more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, selenophenodipyridine, azaborine, borazine, $5\lambda^2,9\lambda^2$-diaza-13b-boranaphtho[2,3,4-de]anthracene, $5\lambda^2$-benzo[d]benzo[4,5]imidazo[3,2-a]imidazole, and 5,9-dioxa-13b-boranaphtho[3,2,1-de]anthracene; preferably dibenzothiophene, dibenzofuran, dibenzoselenophene, carbazole, indolocarbazole, imidazole, pyridine, triazine, benzimidazole, $5\lambda^2,9\lambda^2$-diaza-13b-boranaphtho[2,3,4-de]anthracene, $5\lambda^2$-benzo[d]benzo[4,5]imidazo[3,2-a]imidazole, and 5,9-dioxa-13b-boranaphtho[3,2,1-de]anthracene. Additionally, the heteroaryl group can be further substituted or fused.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, benzimidazole, $5\lambda^2,9\lambda^2$-diaza-13b-boranaphtho[2,3,4-de]anthracene, $5\lambda^2$-benzo[d]benzo[4,5]imidazo[3,2-a]imidazole, 5,9-dioxa-13b-boranaphtho[3,2,1-de]anthracene, and the respective aza-analogs of each thereof are of particular interest.

In many instances, the General Substituents are selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, selenyl, sulfinyl, sulfonyl, phosphino, and combinations thereof.

In some instances, the Preferred General Substituents are selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof.

In some instances, the More Preferred General Substituents are selected from the group consisting of deuterium, fluorine, alkyl, cycloalkyl, alkoxy, aryloxy, amino, silyl, germyl, boryl, aryl, heteroaryl, nitrile, sulfanyl, and combinations thereof.

In some instances, the Even More Preferred General Substituents are selected from the group consisting of deuterium, fluorine, alkyl, cycloalkyl, silyl, aryl, heteroaryl, nitrile, and combinations thereof.

In yet other instances, the Most Preferred General Substituents are selected from the group consisting of deuterium, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one R must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for all available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., Angew. Chem. Int. Ed. (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

As used herein, any specifically listed substituent, such as, without limitation, methyl, phenyl, pyridyl, etc. includes undeuterated, partially deuterated, and fully deuterated versions thereof. Similarly, classes of substituents such as, without limitation, alkyl, aryl, cycloalkyl, heteroaryl, etc. also include undeuterated, partially deuterated, and fully deuterated versions thereof. Unless otherwise specificed, atoms in chemical structures without valences fully filled by H or D should be considered to include undeuterated, partially deuterated, and fully deuterated versions thereof. For example, the chemical structure of

implies to include $C_6H_6$, $C_6D_6$, $C_6H_3D_3$, and any other partially deuterated variants thereof. Some common basic partially or fully deuterated group include, without limitation, $CD_3$, $CD_2C(CH_3)_3$, $C(CD_3)_3$, and $C_6D_5$.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instances, a pair of substituents in the molecule can be optionally joined or fused into a ring. The preferred ring is a five to nine-membered carbocyclic or heterocyclic ring, includes both instances where the portion of the ring formed by the pair of substituents is saturated and where the portion of the ring formed by the pair of substituents is unsaturated. In yet other instances, a pair of adjacent substituents can be optionally joined or fused into a ring. As used herein, "adjacent" means that the two substituents involved can be on the same ring next to each other, or on two neighboring rings having the two closest available substitutable positions, such as 2,2' positions in a biphenyl, or 1, 8 position in a naphthalene.

B. The Compounds of the Present Disclosure

In one aspect, the present disclosure provides a compound comprising a first moiety and a second moiety;

- wherein the free form of the first moiety has a HOMO level, $E_{HOMO1}$, a LUMO level, $E_{LUMO1}$, and a center of gravity C1;
- wherein the free form of the second moiety has a HOMO level, $E_{HOMO2}$, a LUMO level, $E_{LUMO2}$, and a center of gravity C2;
- wherein the compound has a Point P;
- wherein when the first moiety and the second moiety are connected by a direct bond, then the Point P is the center of the gravity of the direct bond;
- wherein when the first moiety and the second moiety are connected by a structure of Formula I or a structure of Formula II, $W^1$ is the Point P;

Formula I

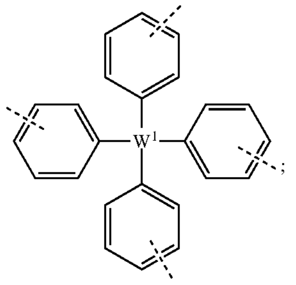

Formula II

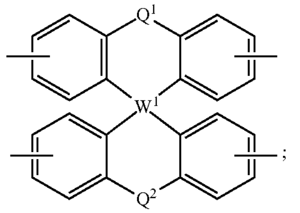

wherein $W^1$ are each independently C, Si or Ge;

wherein $Q^1$ and $Q^2$ are each independently a direct bond or selected from the list consisting of O, S, Se, NR, BR, BRR', PR, CR, C=O, C=NR, C=CRR', C=S, CRR', SO, $SO_2$, P(O)R, SiRR', and GeRR';

wherein each R and R' is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof;

wherein the first moiety and the second moiety are connected to Formula I or Formula II via any of the dashed lines;

wherein the angle between C1, P and C2 is equal to or greater than 45 degrees; and less than 180 degrees, wherein the first moiety and the second moiety are (i) both electron transporting moieties and $|E_{LUMO1}-E_{LUMO2}|<0.2$ eV; or (ii) both hole transporting moieties and $|E_{HOMO1}-E_{HOMO2}|<0.2$ eV. In some embodiments, the first moiety and the second moiety are both electron transporting moieties and $|E_{LUMO1}-E_{LUMO2}|<0.2$ eV.

In some embodiments, the first moiety and the second moiety are both hole transporting moieties and $|E_{LUMO1}-E_{LUMO2}|<0.2$ eV.

In some embodiments, the angle between C1, P and C2 is equal to or greater than 50 degrees; and less than 130 degrees.

In some embodiments, the angle between C1, P and C2 is equal to or greater than 60 degrees; and less than 120 degrees.

In some embodiments, the first moiety and the second moiety are connected by a structure of Formula I.

In some embodiments, the first moiety and the second moiety are connected by a structure of Formula II.

In some embodiments, the first moiety and the second moiety are connected by a direct bond.

In some embodiments, the first moiety and the second moiety are connected by a structure of Formula I or a structure of Formula II, and wherein $W^1$ is C.

In some embodiments, the first moiety and the second moiety are connected by a structure of Formula I or a structure of Formula II, and wherein $W^1$ is Si.

In some embodiments, the first moiety and the second moiety are connected by a structure of Formula I or a structure of Formula II, and wherein $W^1$ is Ge.

In some embodiments, the first moiety and the second moiety are connected by a structure of Formula II, and wherein $Q^1$ and $Q^2$ are the same.

In some embodiments, the first moiety and the second moiety are connected by a structure of Formula II, and wherein $Q^1$ and $Q^2$ are O.

In some embodiments, the first moiety and the second moiety are connected by a structure of Formula II, and wherein $Q^1$ and $Q^2$ are S.

In some embodiments, each R and R' is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some embodiments, moiety 1 and moiety 2 are symmetric and have degenerate HOMO levels.

In another aspect, the present disclosure provides a compound of Formula III or Formula IV Formula III

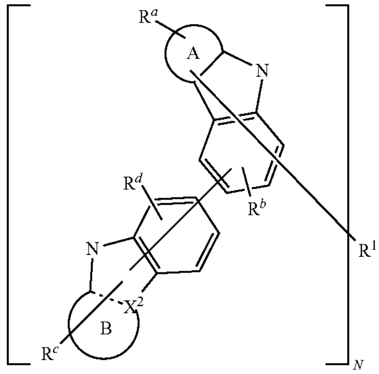

Formula IV

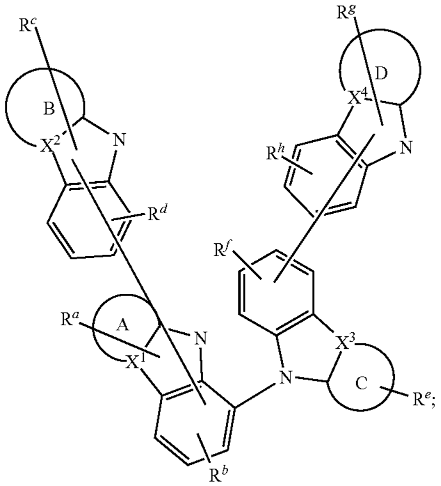

wherein $X^1$—$X^4$ are each independently C or N;

wherein N' is an integer of 2 to 4;

wherein moieties A, B, C and D are each independently a 5 monocyclic ring or a polycyclic fused ring system, wherein the monocyclic ring or each ring of the polycyclic fused ring system is independently a 5-membered to 10-membered carbocyclic or heterocyclic ring;
wherein $R^1$ is a group selected from Formula I or Formula II as defined above;
wherein $R^a$, $R^b$, $R^c$, $R^d$, $R^e$, $R^f$, $R^g$ and $R^h$ each independently represent mono to the maximum allowable substitution, or no substitution;
wherein $R^a$, $R^b$, $R^c$, $R^d$, $R^e$, $R^f$, $R^g$ and $R^h$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof.

Although Formulae III and IV depict certain bonds as a single line, depending on the structure of the formula, such single line can be interpreted as any appropriate bond (e.g., a single bond, a double bond, etc.) in a Lewis structure. It will be understood that, absent an indication to the contrary, the same rule applies to the bonds between atoms of other generalized rings disclosed herein.

In some embodiments, moieties A, B, C and D are each independently a 5-membered or 6-membered carbocyclic or heterocyclic ring.

In some embodiments, the compound is not one of the following two compounds:

In some embodiments, the compound has Formula III.

In some embodiments, the compound has Formula IV.

In some embodiments, the compound has Formula III, and the compound comprises a structure selected from Formula I or II.

In some embodiments, the compound has Formula III, and $R^1$ comprises a structure selected from Formula I.

In some embodiments, the compound has Formula III, and $R^1$ comprises a structure selected from Formula II.

In some embodiments, the compound has Formula III, and $R^1$ comprises a structure selected from Formula I or II, and wherein $W^1$ is C.

In some embodiments, the compound has Formula III, and $R^1$ comprises a structure selected from Formula I or II, and wherein $W^1$ is Si.

In some embodiments, the compound has Formula III, and $R^1$ comprises a structure selected from Formula I or II, and wherein $W^1$ is Ge.

In some embodiments, the compound has Formula III, and $R^1$ comprises a structure selected from Formula II, and wherein $Q^1$ and $Q^2$ are the same.

In some embodiments, the compound has Formula III, and $R^1$ comprises a structure selected from Formula II, and wherein $Q^1$ and $Q^2$ are O.

In some embodiments, the compound has Formula III, and $R^1$ comprises a structure selected from Formula II, and wherein $Q^1$ and $Q^2$ are S.

In some embodiments, at least one of $X^1$ and $X^2$ is N.

In some embodiments, both of $X^1$ and $X^2$ are C.

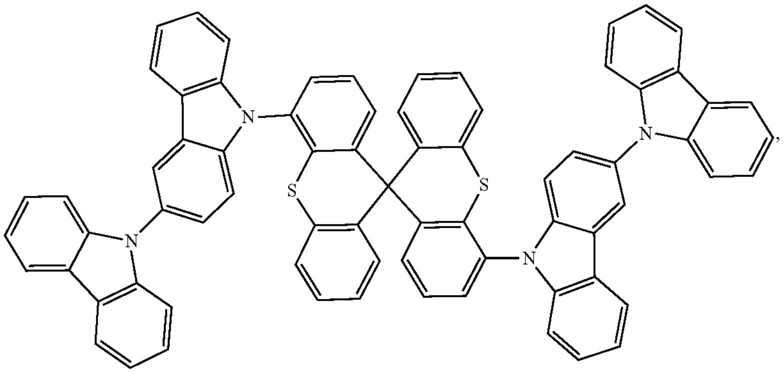

and

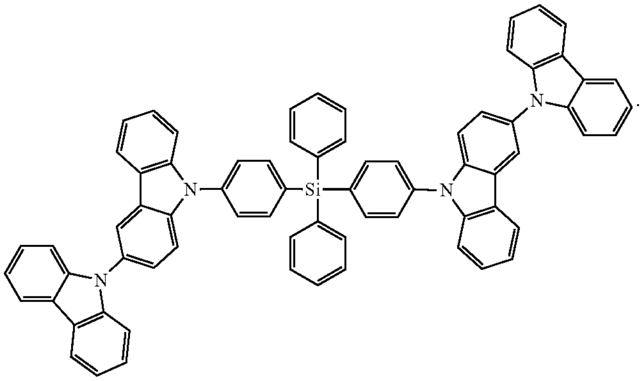

In some embodiments, each $R^a$, $R^b$, $R^c$, $R^d$, $R^e$, $R^f$, $R^g$ and $R^h$ is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some embodiments, the compound has Formula IV, and at least one of $X^3$ and $X^4$ is N.

In some embodiments, the compound has Formula IV, and both of $X^3$ and $X^4$ are C.

In some embodiments, the compound has Formula IV, and all of $X^1$—$X^4$ are C.

In some embodiments, each of moiety A, moiety B, moiety C, and moiety D may be each independently selected from the group consisting of benzene, pyridine, pyrimidine, pyridazine, pyrazine, triazine, imidazole, pyrazole, pyrrole, oxazole, furan, thiophene, thiazole, triazole, naphthalene, quinoline, isoquinoline, quinazoline, benzofuran, aza-benzofuran, benzoxazole, aza-benzoxazole, benzothiophene, aza-benzothiophene, benzothiazole, aza-benzothiazole, benzoselenophene, aza-benzoselenophene, indene, aza-indene, indole, aza-indole, benzimidazole, aza-benzimidazole, carbazole, aza-carbazole, dibenzofuran, aza-dibenzofuran, dibenzothiophene, aza-dibenzothiophene, quinoxaline, phthalazine, phenanthrene, aza-phenanathrene, anthracene, aza-anthracene, phenanthridine, fluorene, and aza-fluorene.

In some embodiments, moiety A is a 6-membered ring.

In some embodiments, moiety A is a 5-membered ring.

In some embodiments, moiety A is a 6-membered carbocyclic ring.

In some embodiments, moiety A is a 6-membered carbocyclic aromatic ring.

In some embodiments, moiety B is a 6-membered ring.

In some embodiments, moiety B is a 5-membered ring.

In some embodiments, moiety B is a 6-membered carbocyclic ring.

In some embodiments, moiety B is a 6-membered carbocyclic aromatic ring.

In some embodiments, the compound has Formula IV, and wherein moiety C is a 6-membered ring.

In some embodiments, the compound has Formula IV, and wherein moiety C is a 5-membered ring.

In some embodiments, the compound has Formula IV, and wherein moiety C is a 6-membered carbocyclic ring.

In some embodiments, the compound has Formula IV, and wherein moiety C is a 6-membered carbocyclic aromatic ring.

In some embodiments, the compound has Formula IV, and wherein moiety D is a 6-membered ring.

In some embodiments, the compound has Formula IV, and wherein moiety D is a 5-membered ring.

In some embodiments, the compound has Formula IV, and wherein moiety D is a 6-membered carbocyclic ring.

In some embodiments, the compound has Formula IV, and wherein moiety D is a 6-membered carbocyclic aromatic ring.

In some embodiments, the compound has Formula III, and wherein moieties A and B are benzene rings.

In some embodiments, the compound has Formula IV, and wherein moieties A, B; C, and D are benzene rings.

In some embodiments, the compound has Formula III, and N is 2.

In some embodiments, the compound has Formula III, and N is 3.

In some embodiments, the compound has Formula III, and N is 4.

In some embodiments, when the compound has Formula III, $R^1$ comprises a structure of Formula I, and $W^1$ is Si, then Formula III is not attached to Formula I in para position.

In some embodiments, when the compound has Formula III, $R^1$ comprises a structure of Formula II, and $Q^1$ and $Q^2$ are both S, then Formula II is not attached to Formula III in ortho position via a direct bond.

In some embodiments, the compound comprises at least four carbazole groups.

In some embodiments, the compound has a structure selected from the group consisting of:

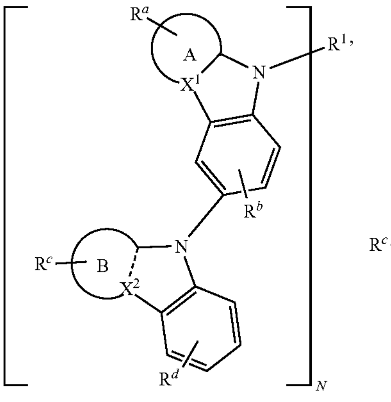

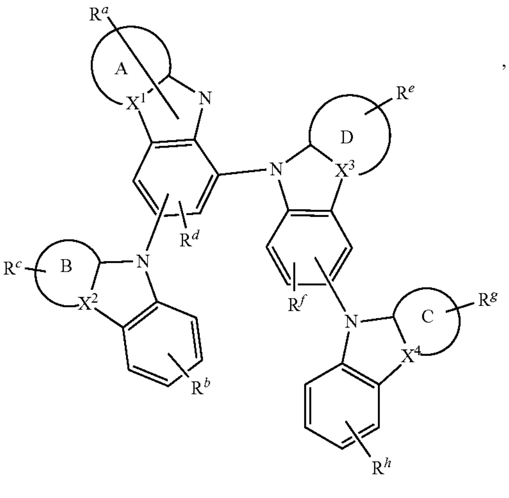

,

-continued

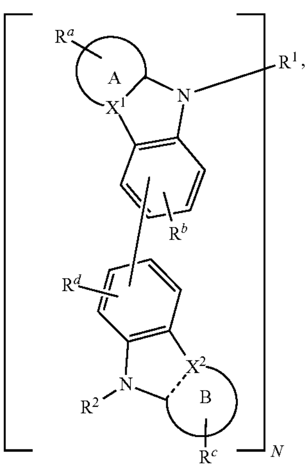

and

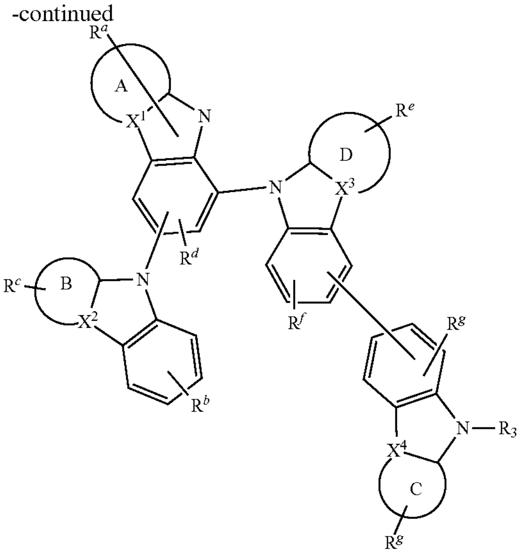

, wherein $R^2$ and $R^3$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof.

In some embodiments, the compound is selected from the group consisting of:

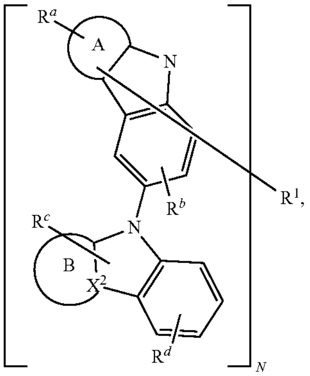

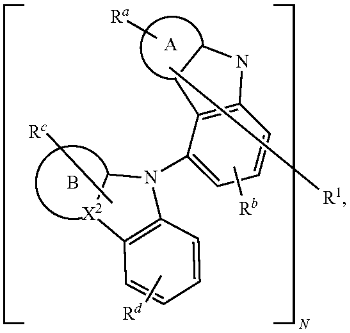

-continued

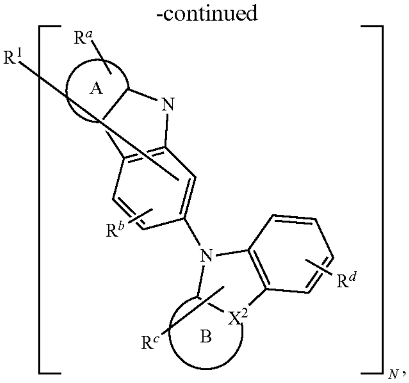

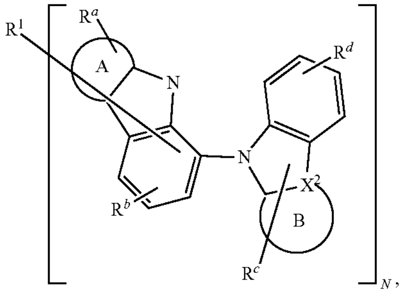

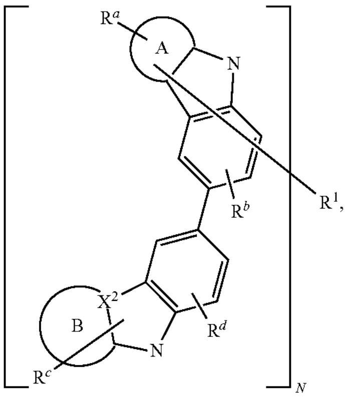

-continued
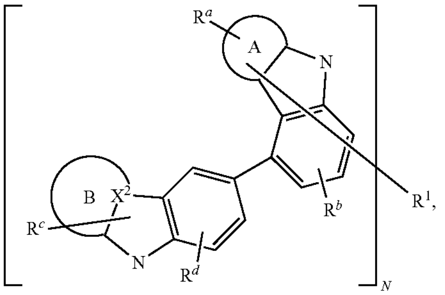
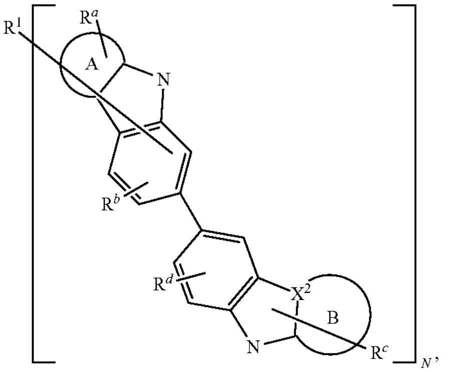
-continued
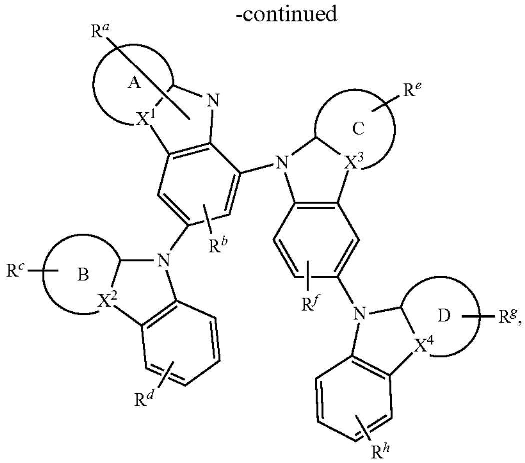
and
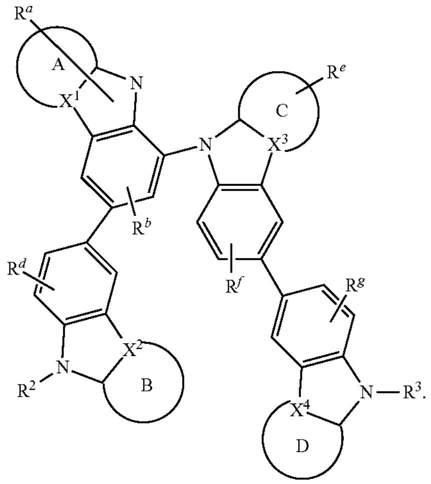
In some embodiments, the compound is selected from the group consisting of:
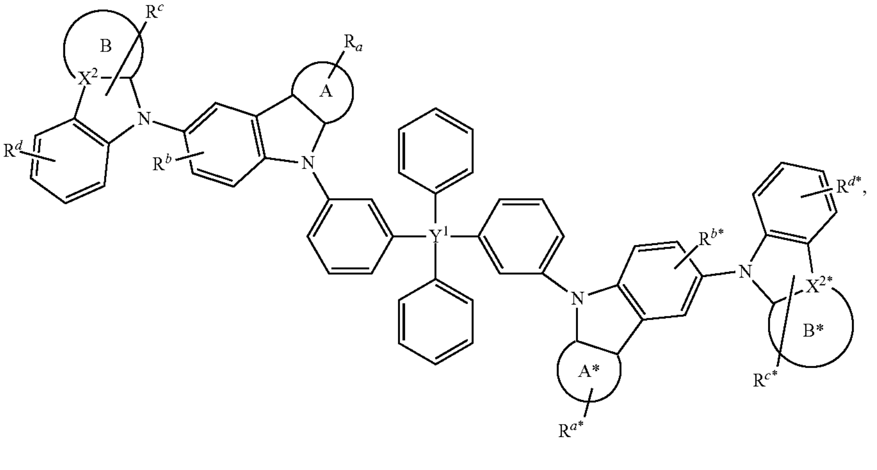

-continued
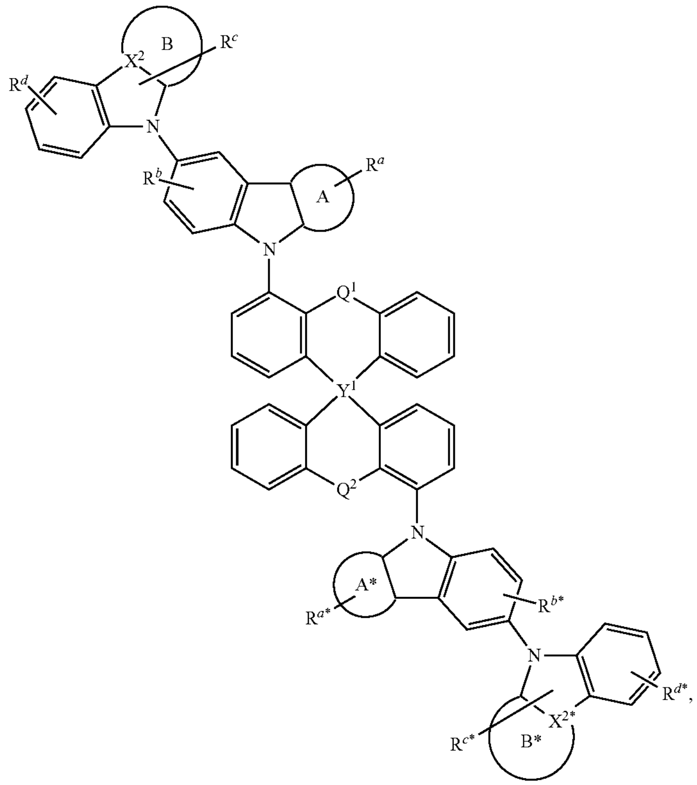
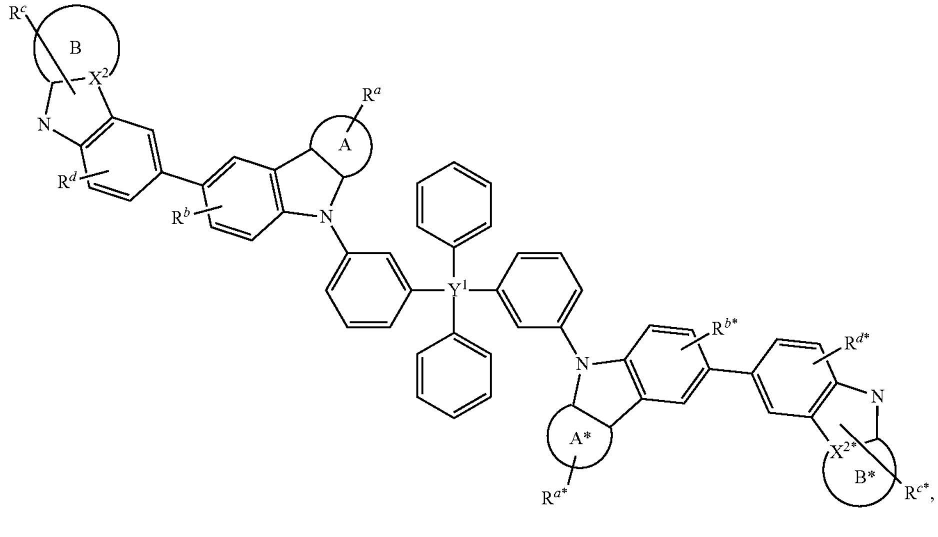

-continued
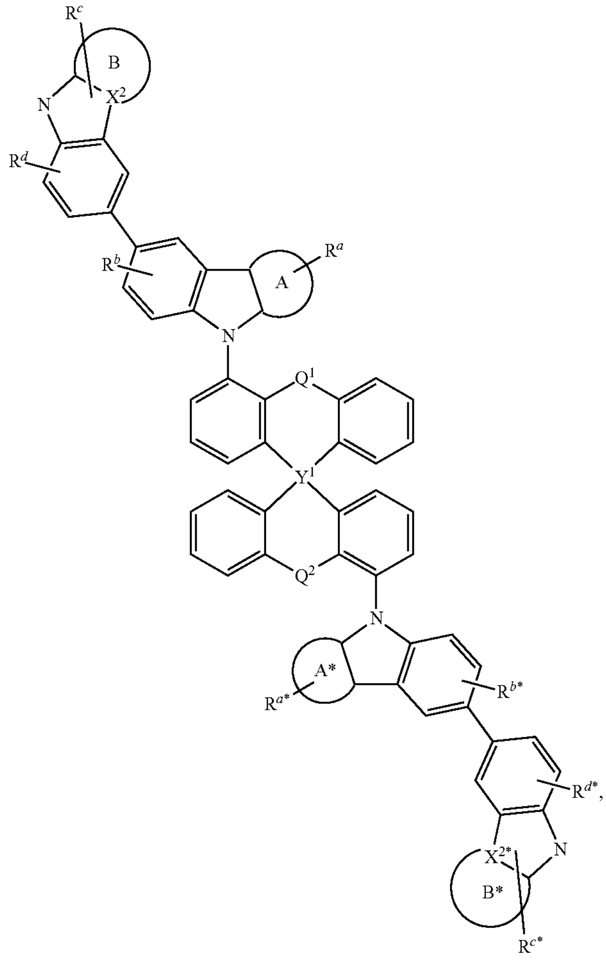
,
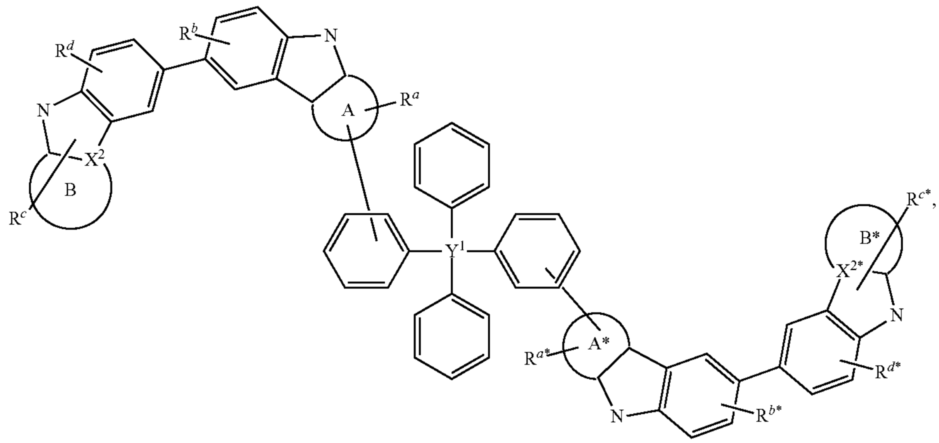
, and

-continued
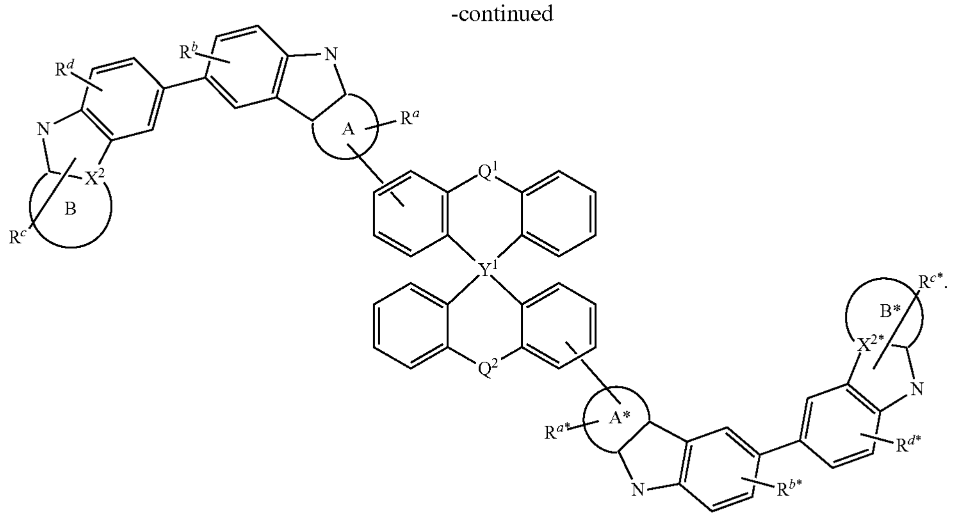
In some embodiments, the compound is selected from the group consisting of:
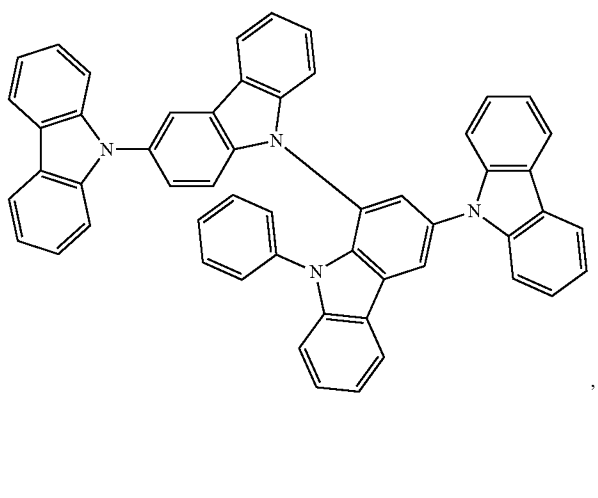
,
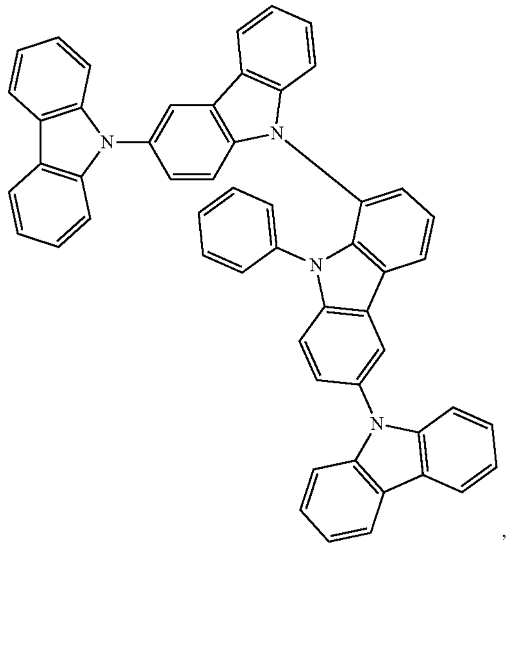
, -continued
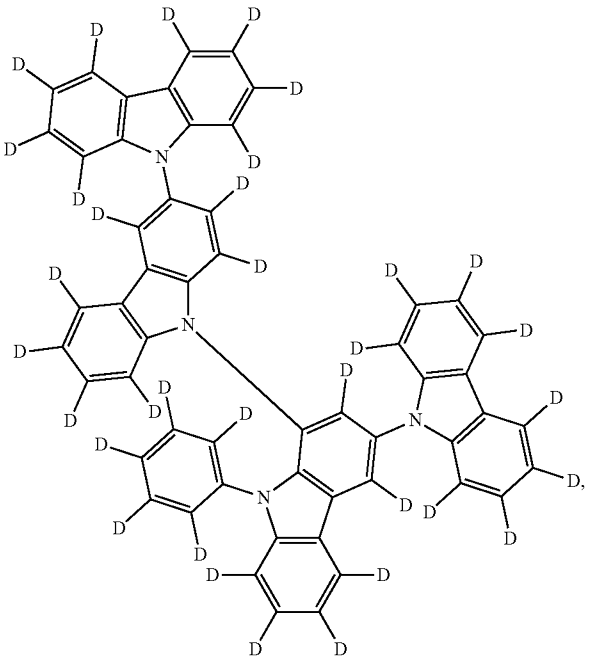
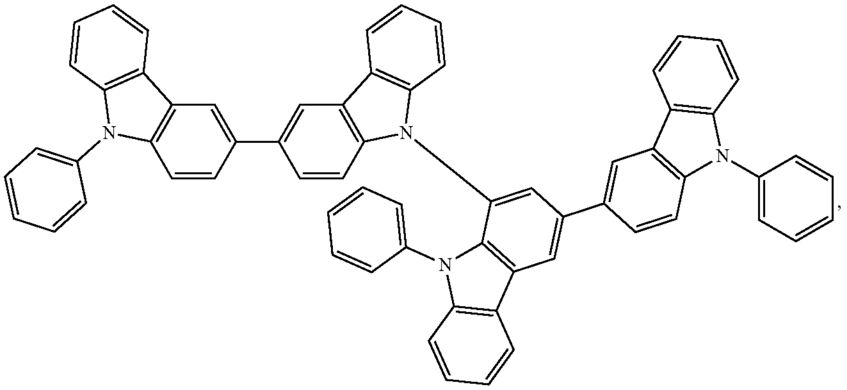
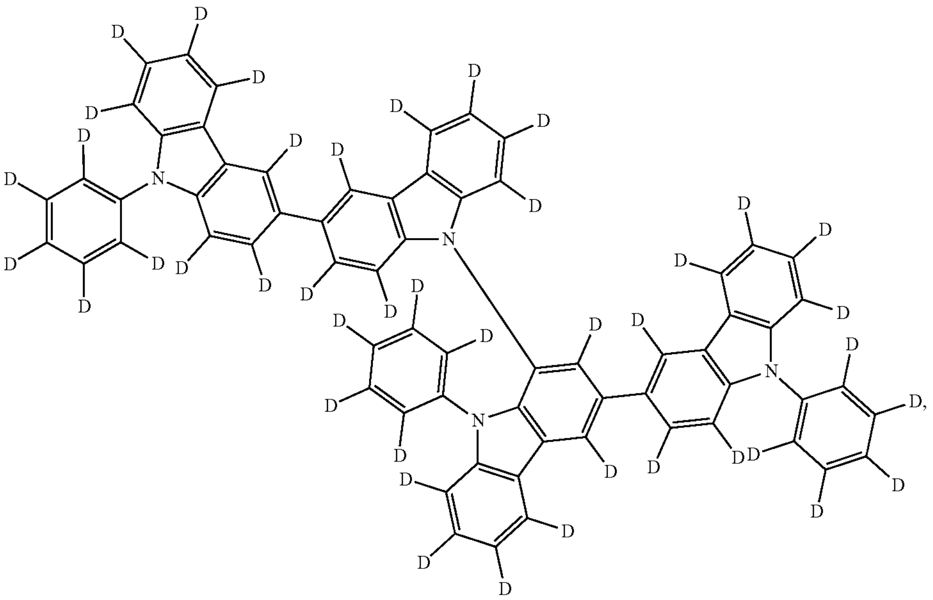

-continued
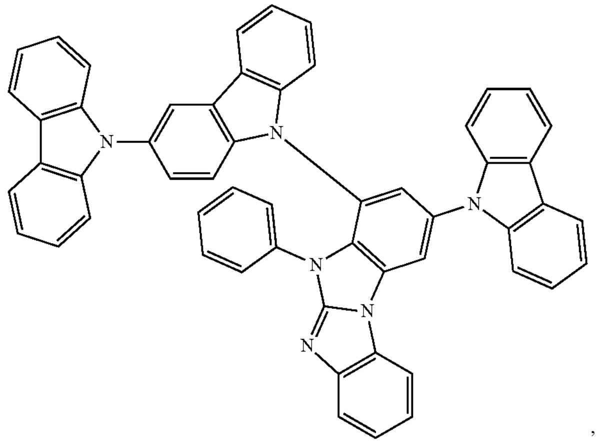
,
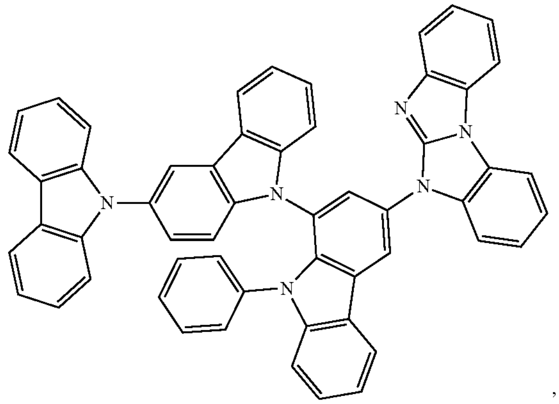
,
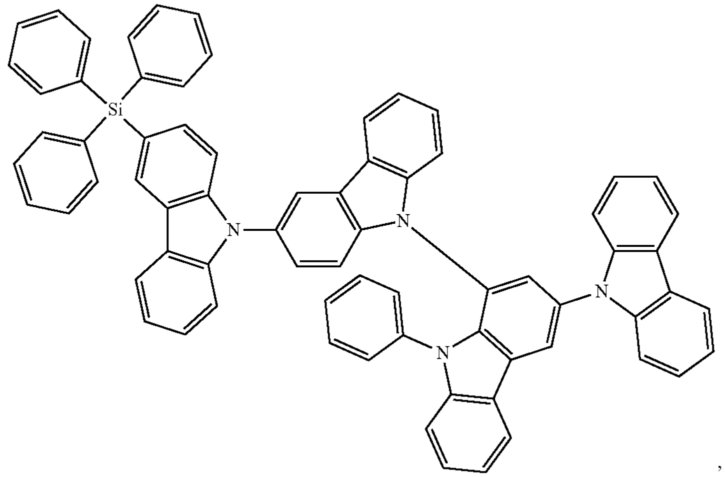
,
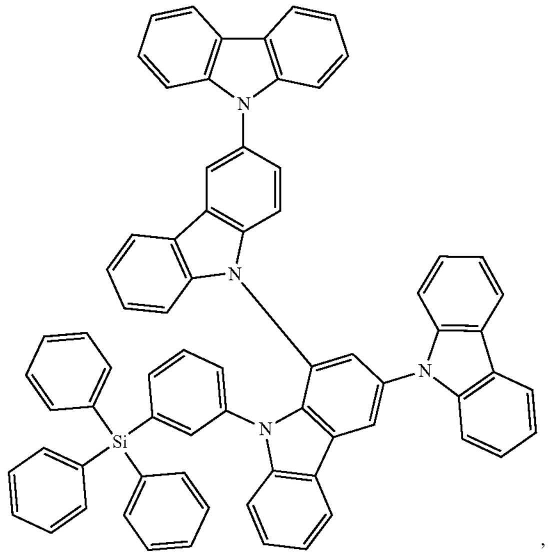
,
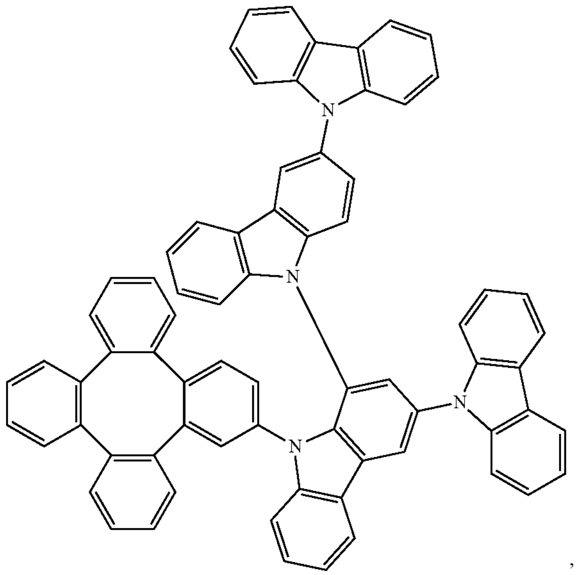
,

-continued
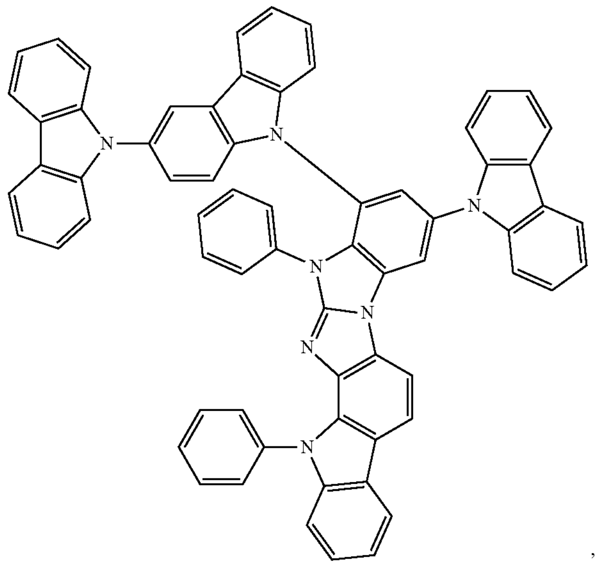
,
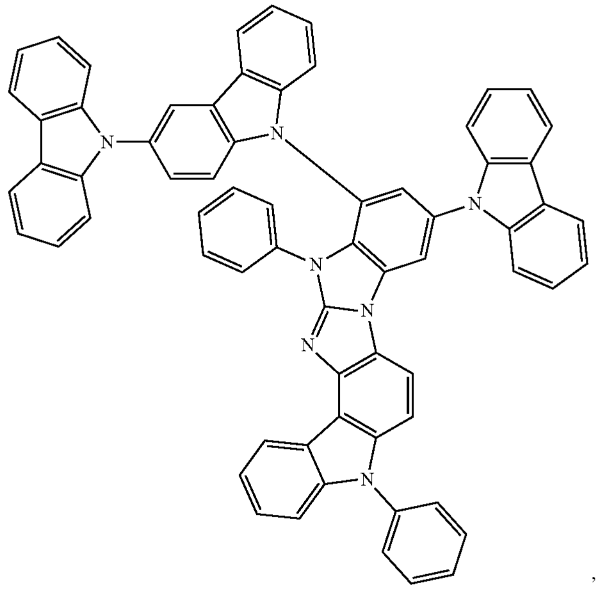
,
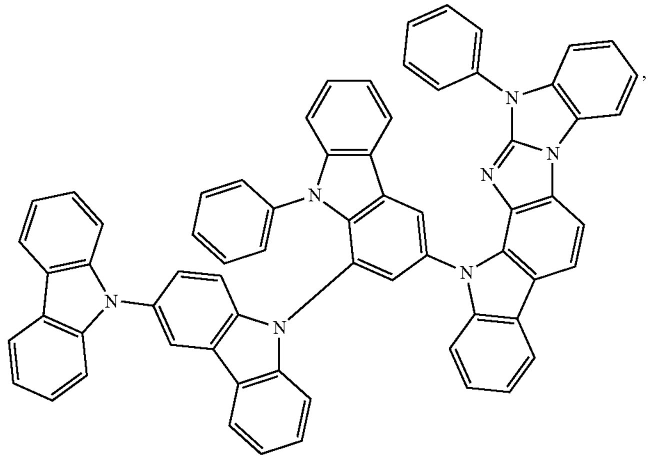
,
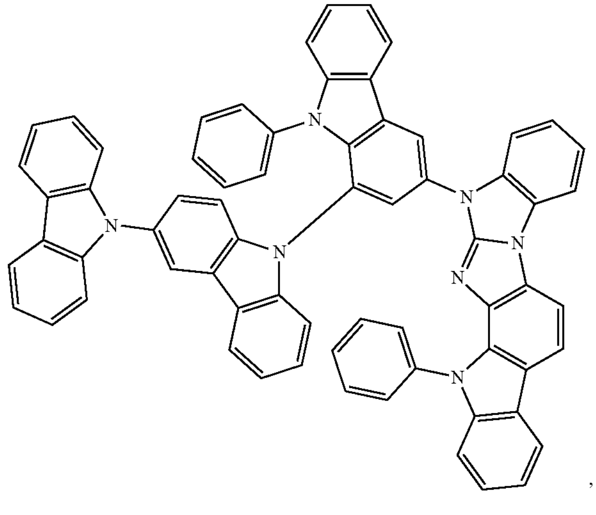
,
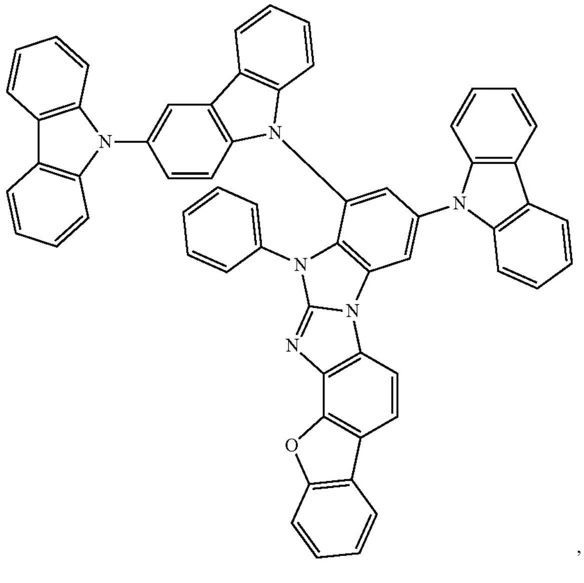
,

-continued
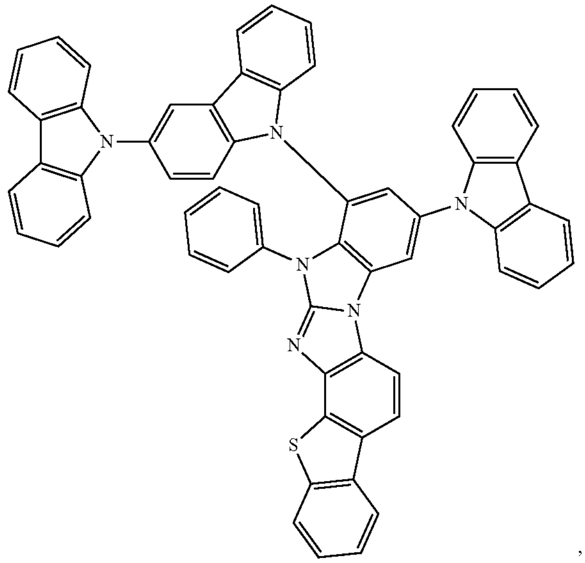
,
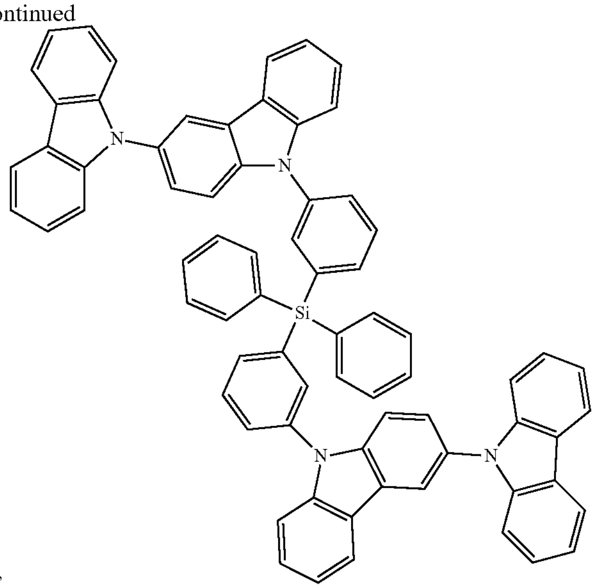
,
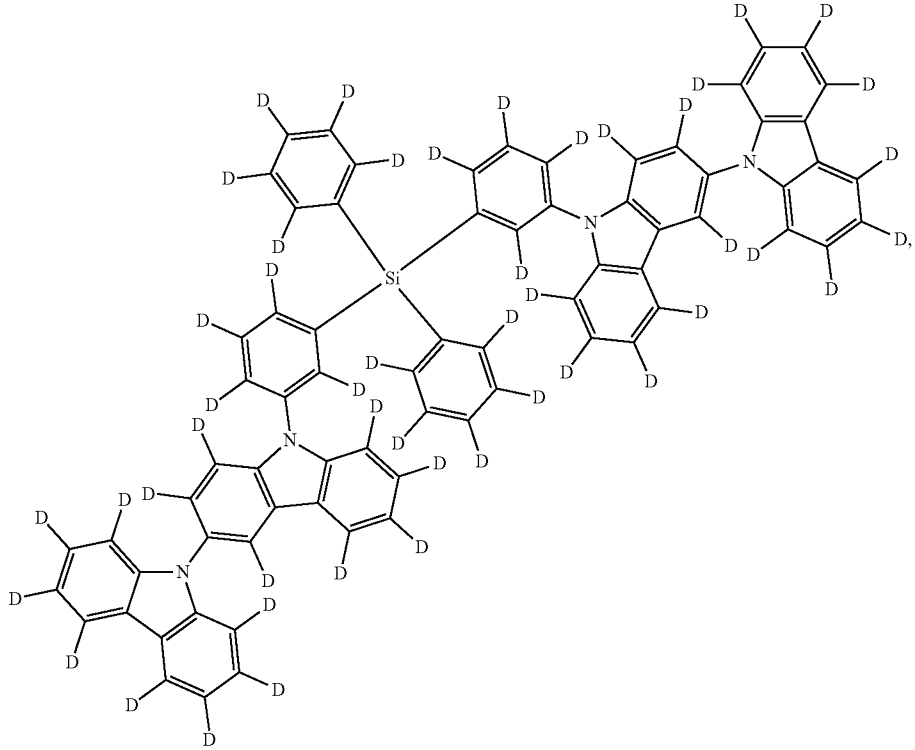
,

-continued
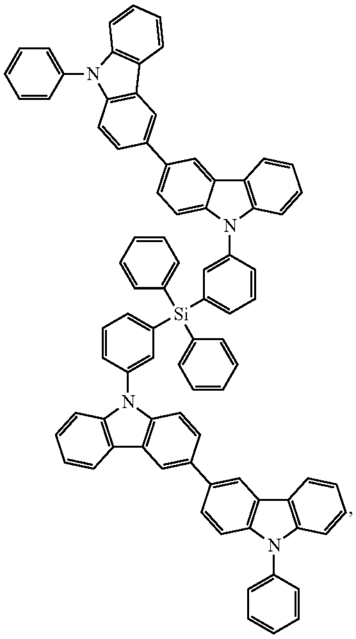
,
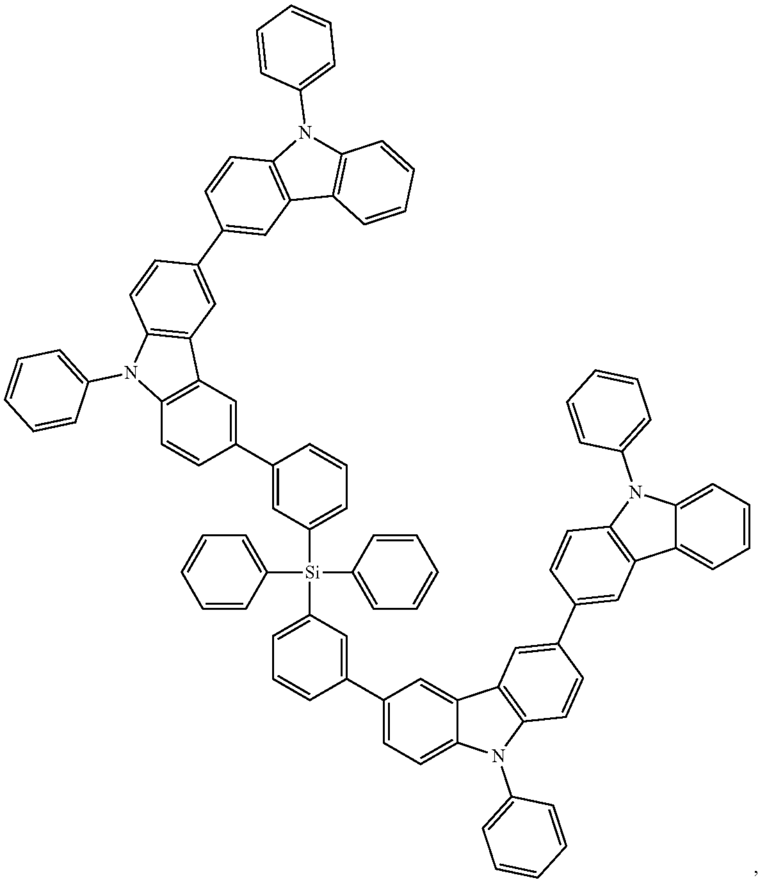
,

-continued
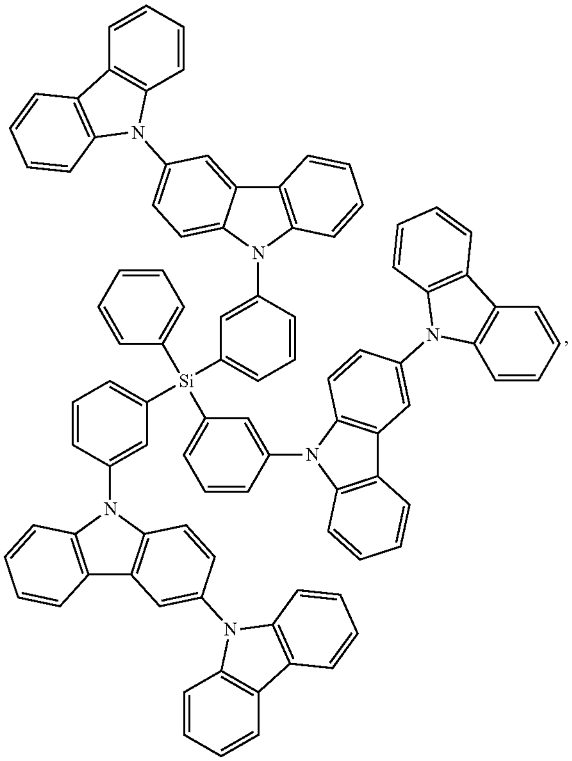
,
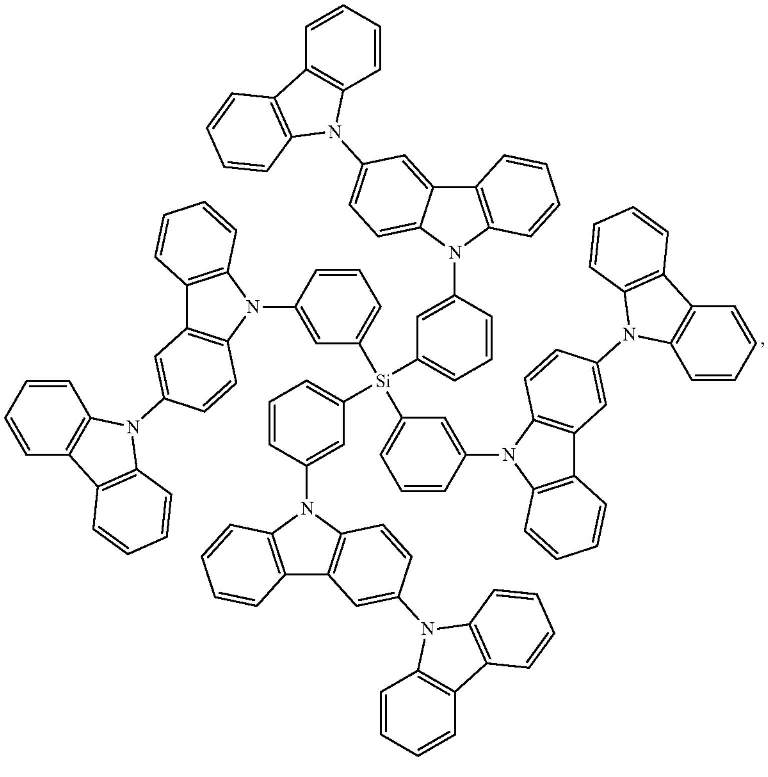
,

-continued
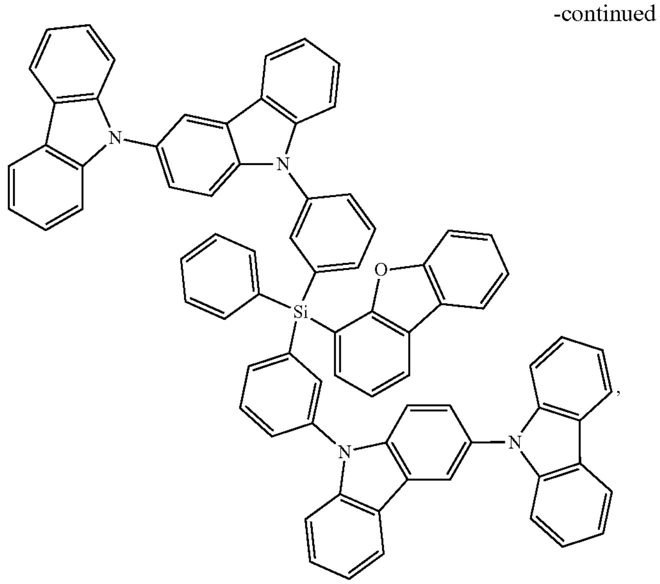
,
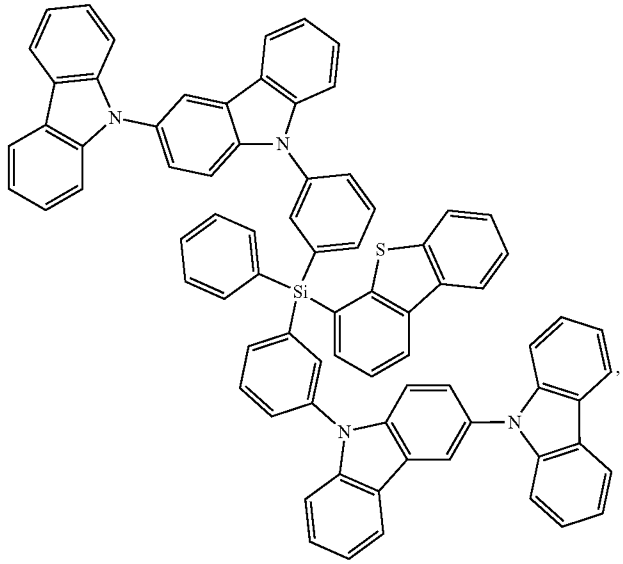
,
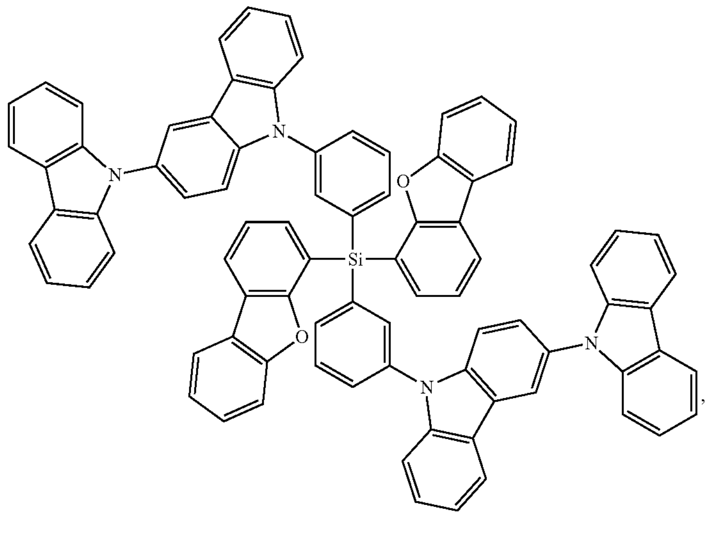
,

-continued
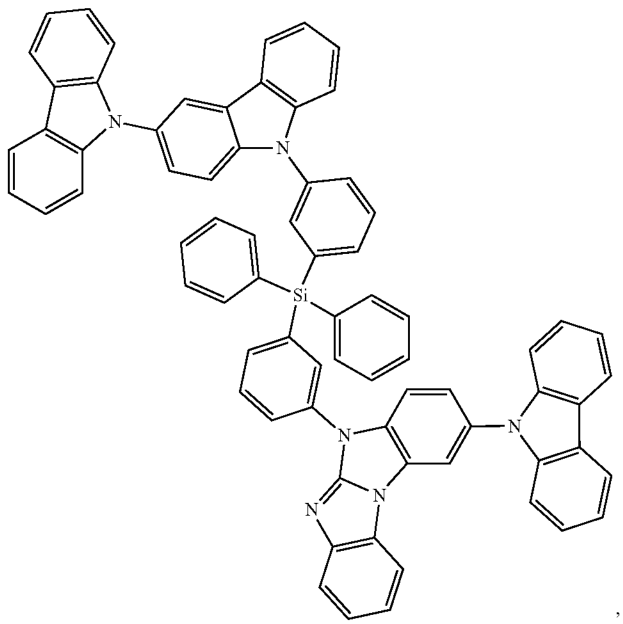
,
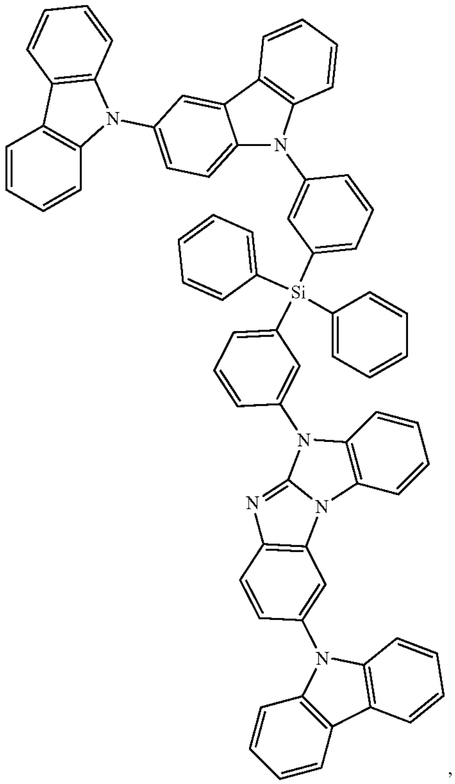
,
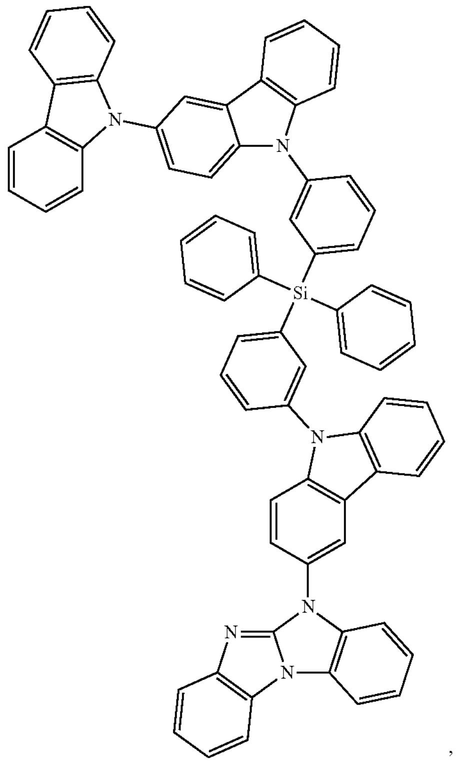
,
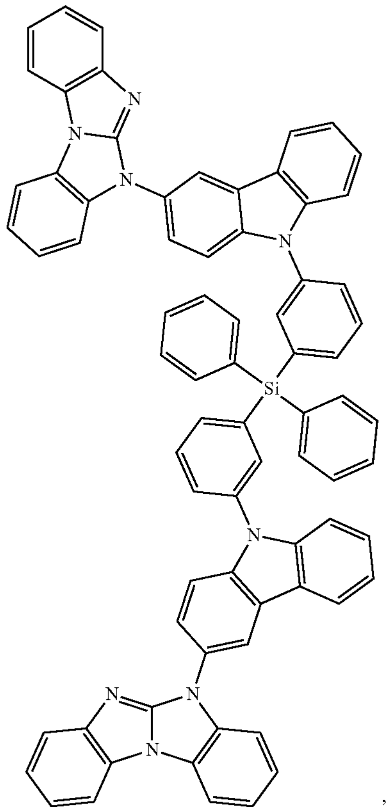
,

-continued
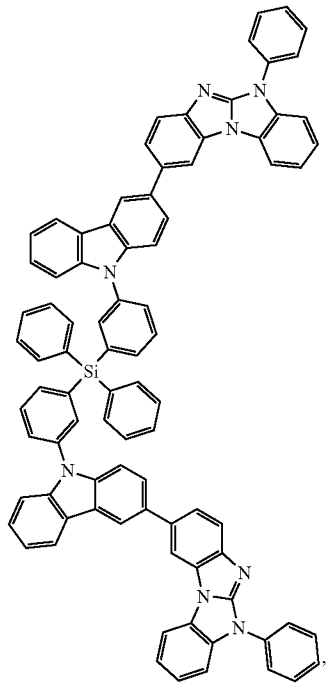
,
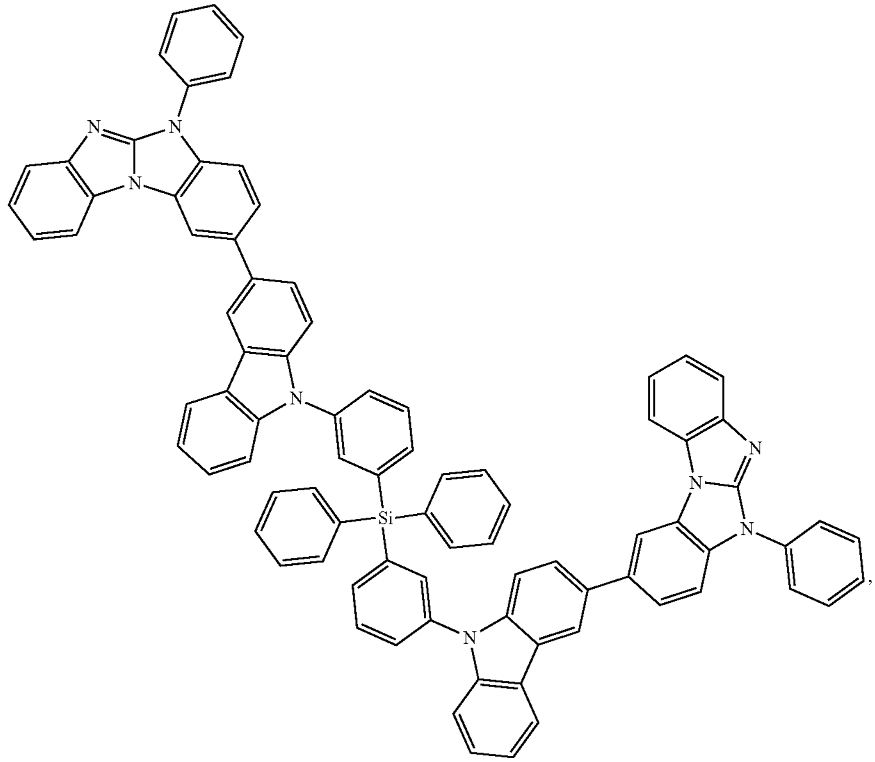
,

-continued
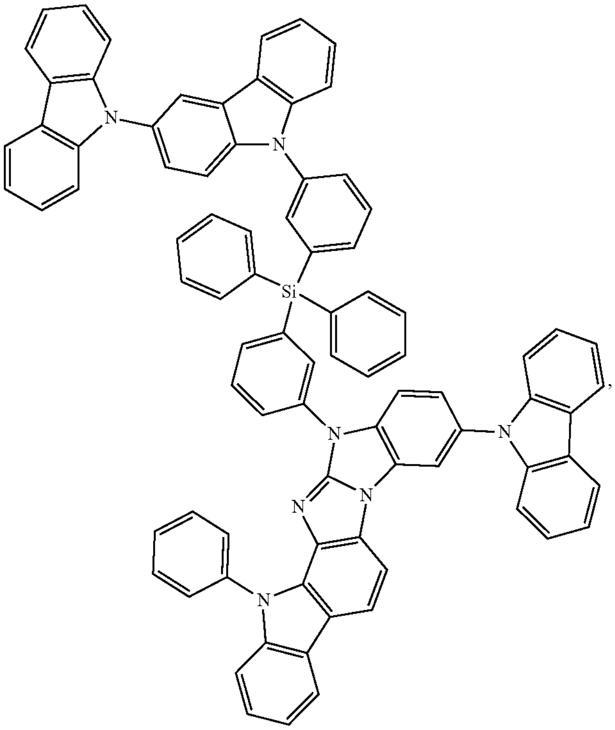
,
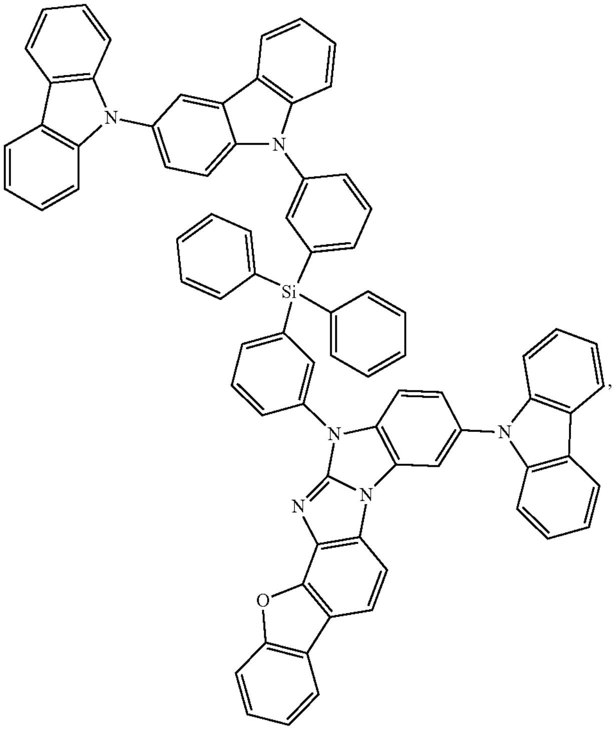
,

-continued
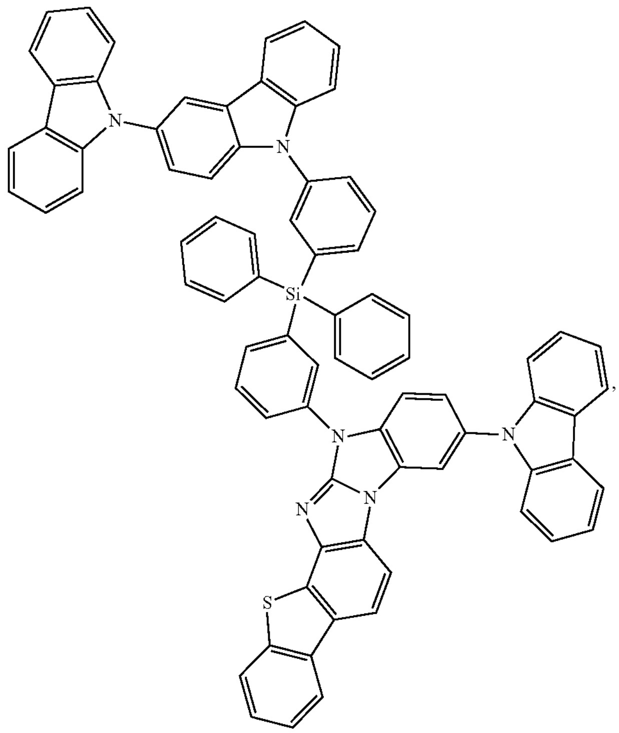
,
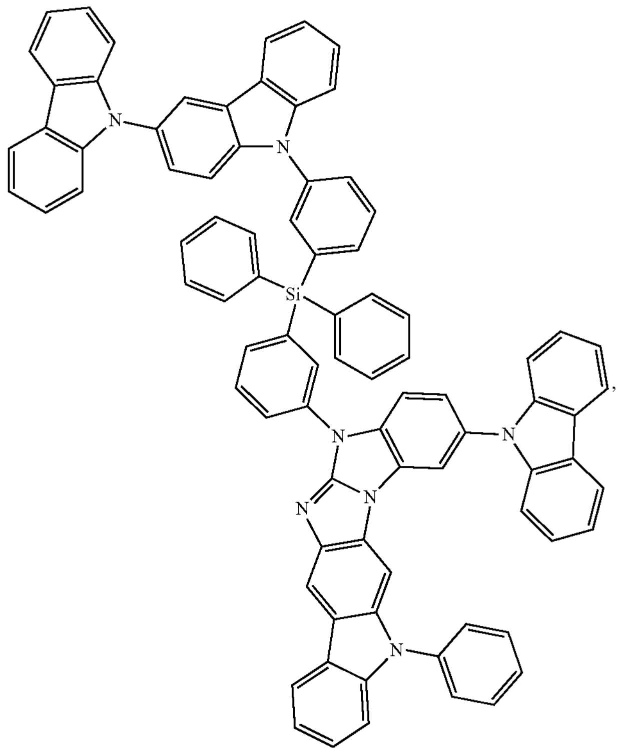
,

-continued
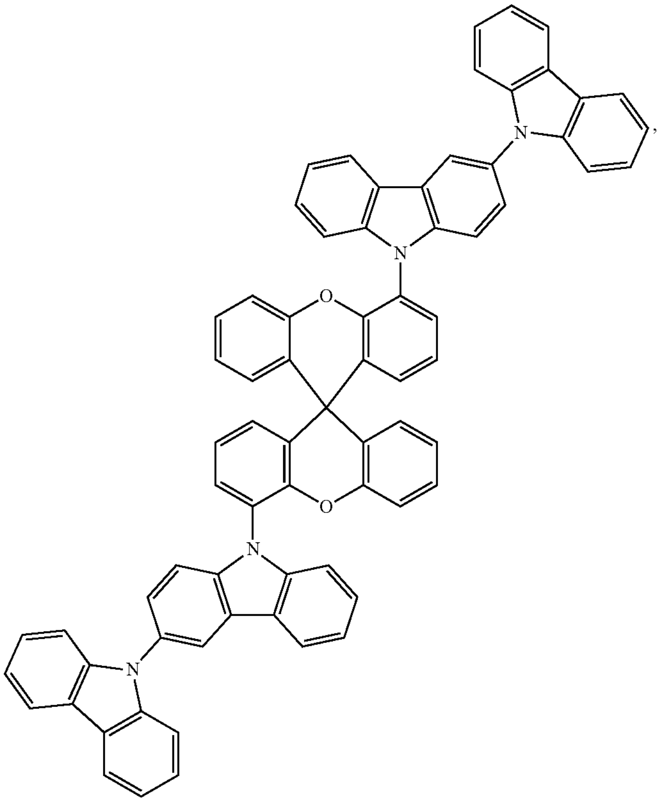
,
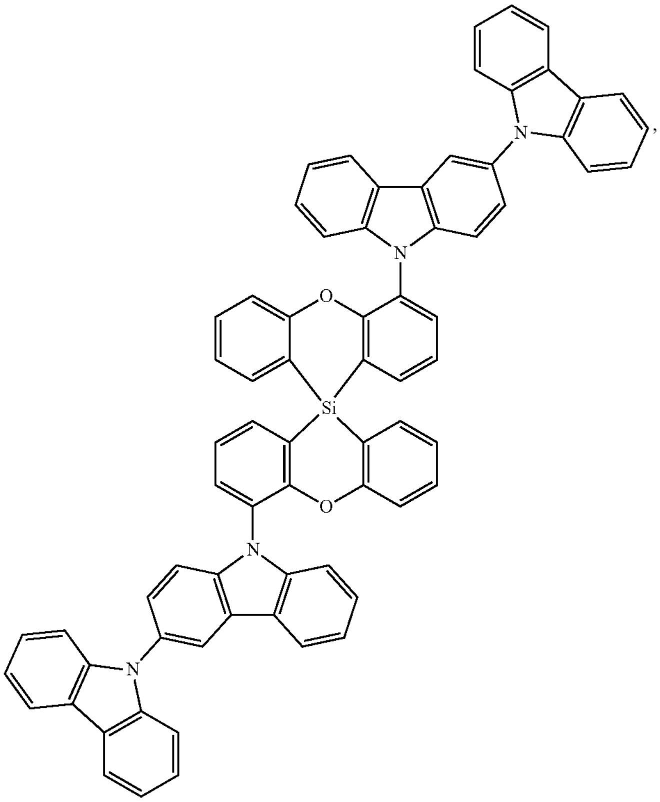
,

-continued
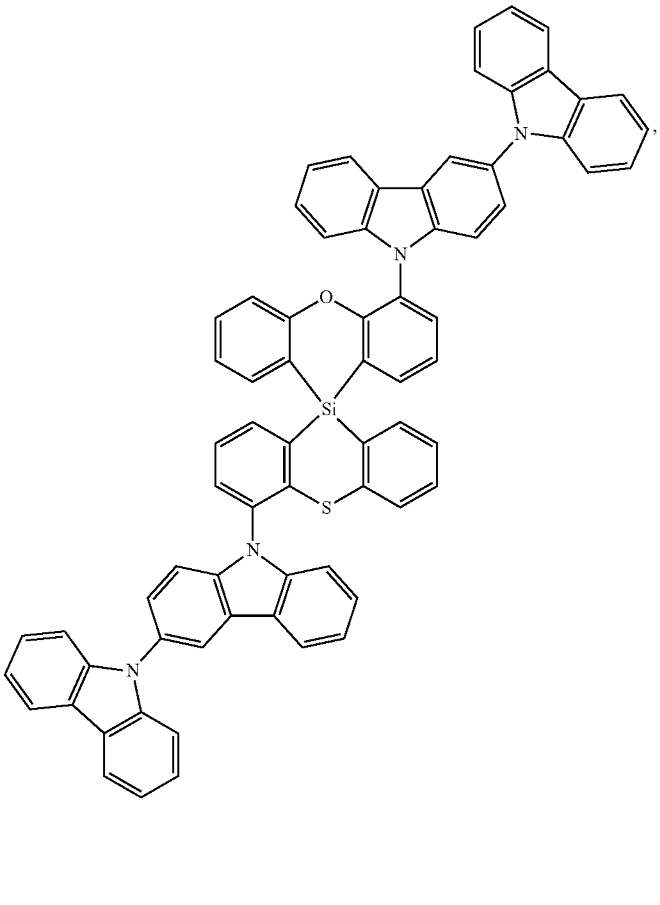
,

-continued
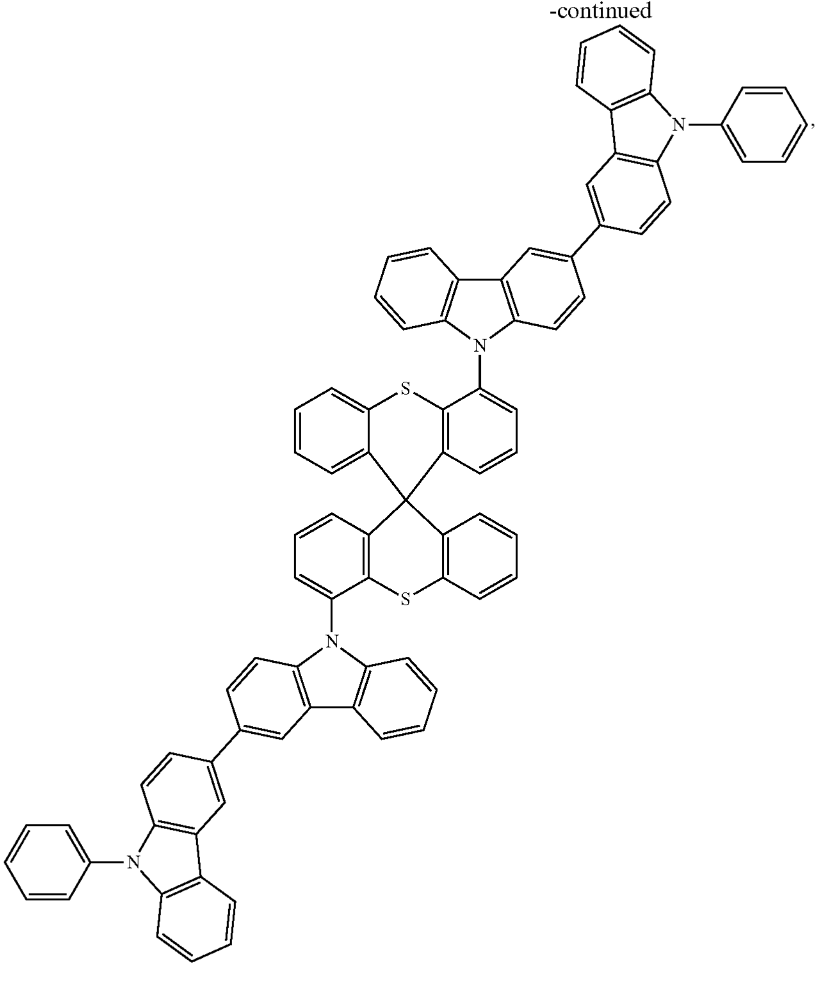
,
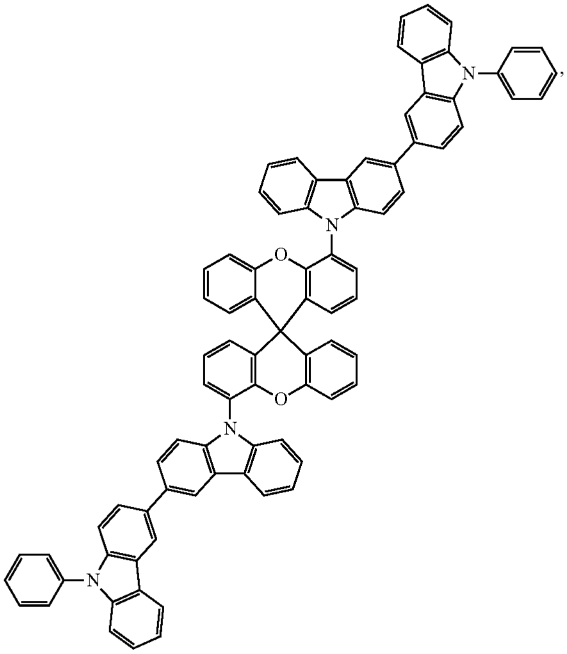
,

-continued
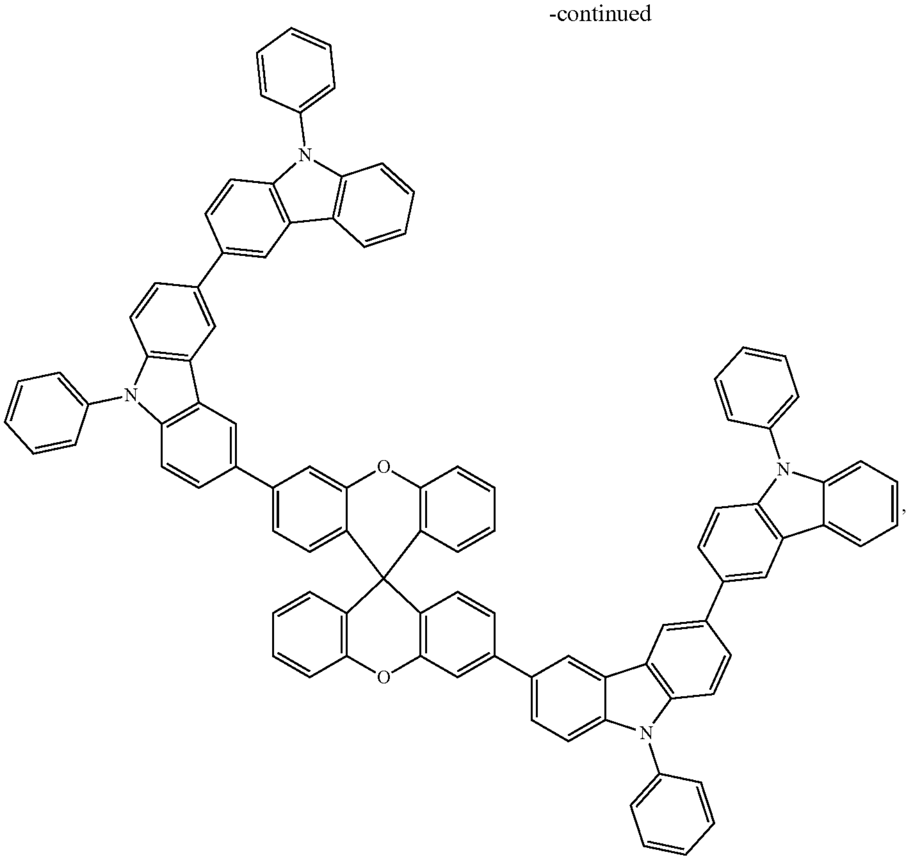
,
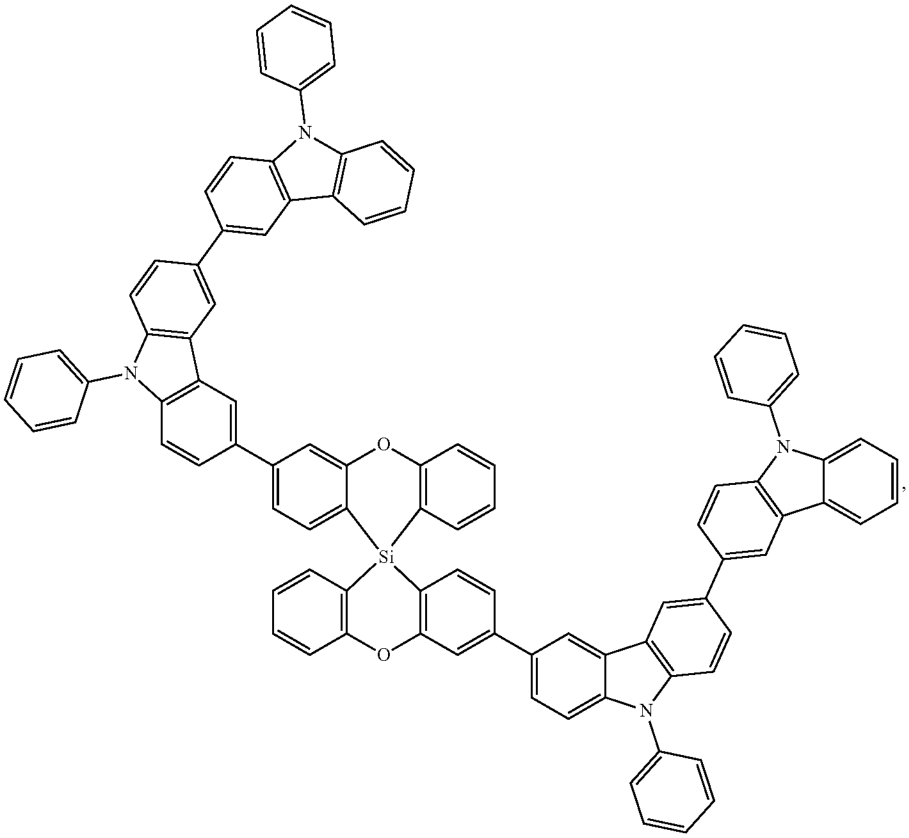
,

-continued
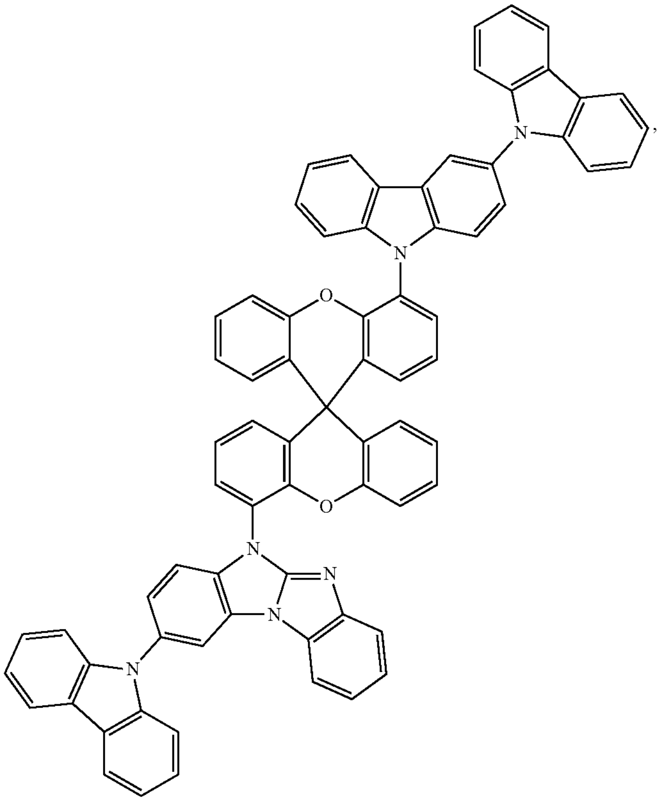
,
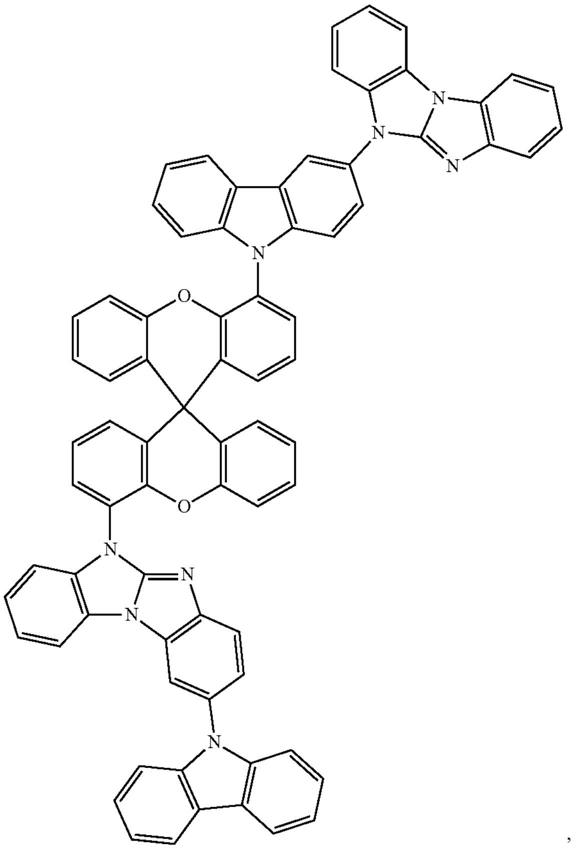
,
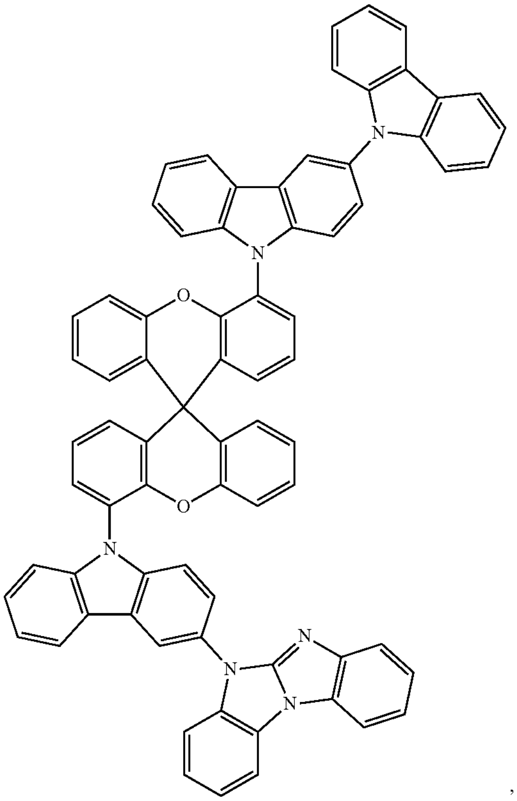
,

-continued
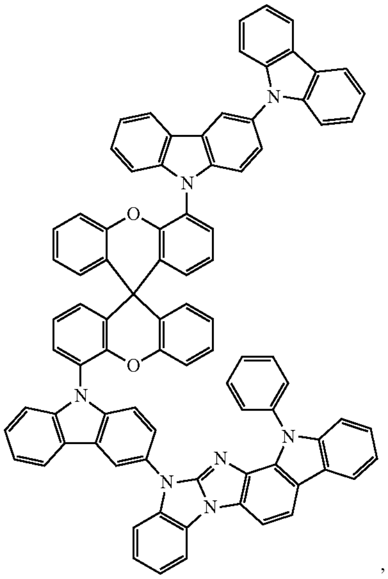
,
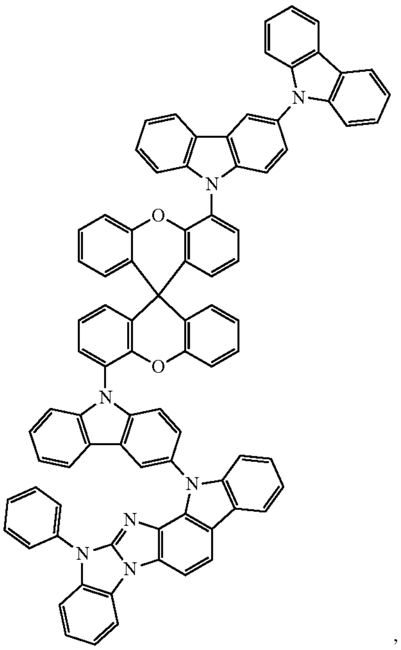
,
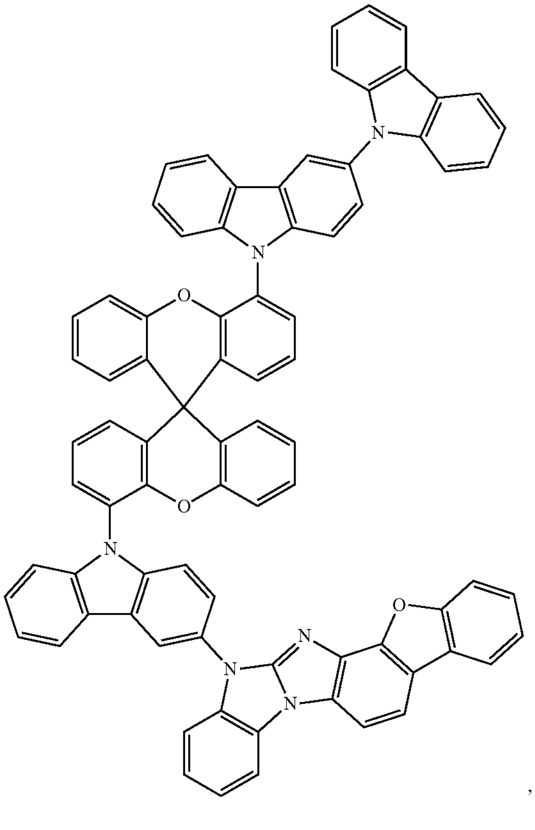
,
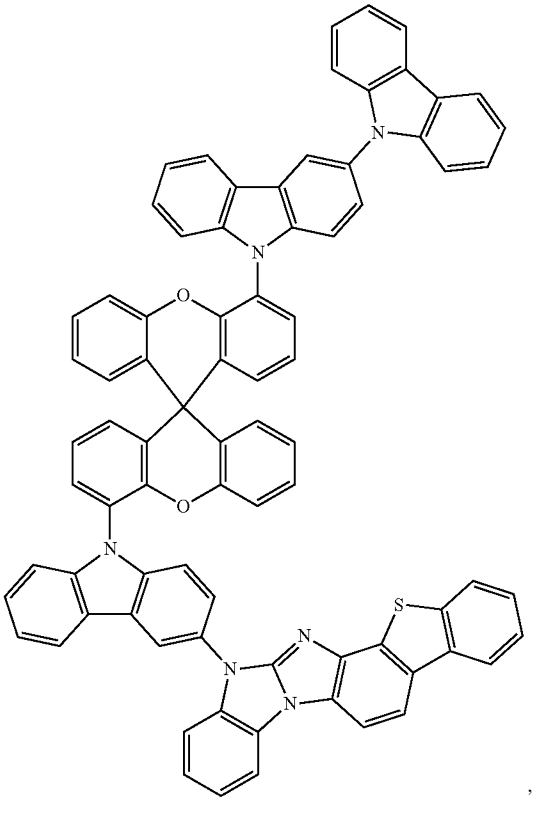
,

-continued

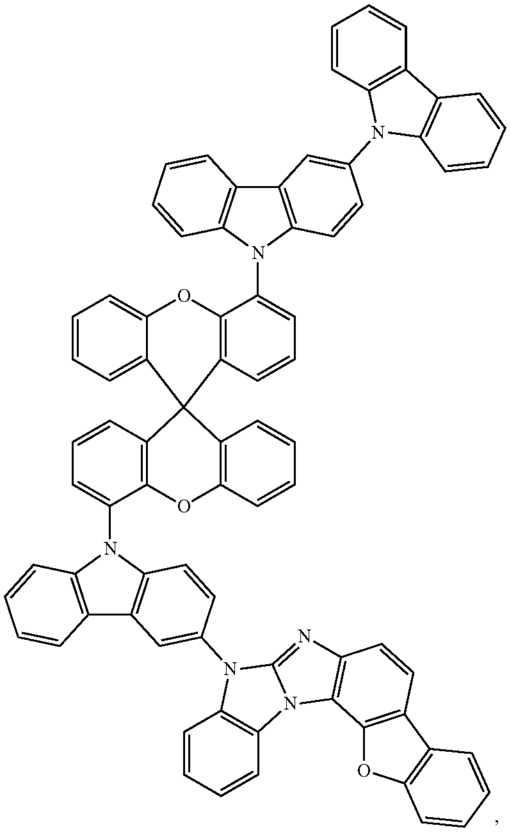

, and

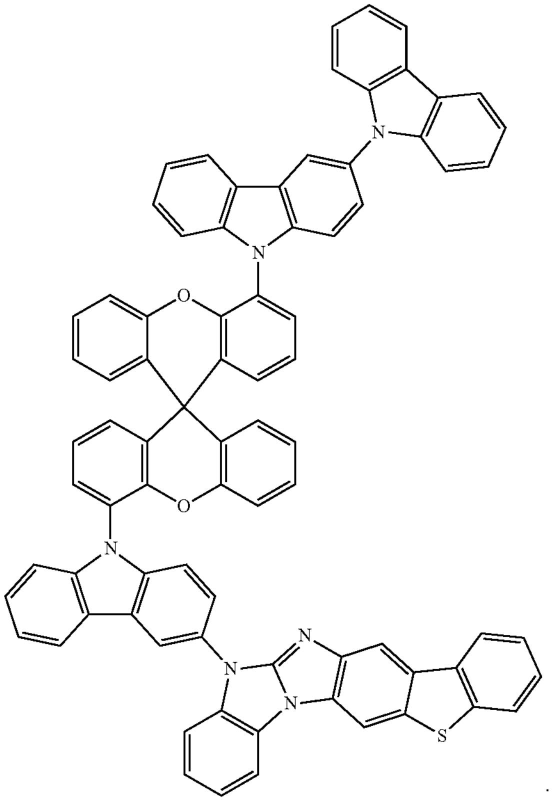

.

In some embodiments, at least one of moiety A, moiety B, moiety C, and moiety D can independently be a polycyclic fused ring structure. In some embodiments, at least one of moiety A, moiety B, moiety C, and moiety D can independently be a polycyclic fused ring structure comprising at least two fused rings. In some embodiments, the polycyclic fused ring structure has one 6-membered ring and one 5-membered ring. In some such embodiments, either the 5-membered ring or the 6-membered ring can coordinate to the metal. In some embodiments, the polycyclic fused ring structure has two 6-membered rings. In some embodiments, at least one of moiety A, moiety B, moiety C, and moiety D can independently be selected from the group consisting of benzofuran, benzothiophene, benzoselenophene, naphthalene, and aza-variants thereof.

In some embodiments, at least one of moiety A, moiety B, moiety C, and moiety D can independently be a polycyclic fused ring structure comprising at least three fused rings. In some embodiments, the polycyclic fused ring structure has two 6-membered rings and one 5-membered ring. In some such embodiments, the 5-membered ring is fused to the ring coordinated to metal M and the second 6-membered ring is fused to the 5-membered ring. In some embodiments, at least one of moiety A, moiety B, moiety C, and moiety D can independently be selected from the group consisting of dibenzofuran, dibenzothiophene, dibenzoselenophene, and aza-variants thereof. In some such embodiments, at least one of moiety A, moiety B, moiety C, and moiety D can independently be further substituted at the ortho- or meta-position of the O, S, or Se atom by a substituent selected from the group consisting of deuterium, fluorine, nitrile, alkyl, cycloalkyl, aryl, heteroaryl, and combinations thereof.

In some such embodiments, the aza-variants contain exactly one N atom at the 6-position (ortho to the O, S, or Se) with a substituent at the 7-position (meta to the O, S, or Se), at least one of moiety A, moiety B, moiety C, and moiety D moiety A] or [at least one of moiety A and moiety B] can independently be a polycyclic fused ring structure comprising at least four fused rings. In some embodiments, the polycyclic fused ring structure comprises three 6-membered rings and one 5-membered ring. In some such embodiments, the 5-membered ring is fused to the ring coordinated to metal M, the second 6-membered ring is fused to the 5-membered ring, and the third 6-membered ring is fused to the second 6-membered ring. In some such embodiments, the third 6-membered ring is further substituted by a substituent selected from the group consisting of deuterium, fluorine, nitrile, alkyl, cycloalkyl, aryl, heteroaryl, and combinations thereof.

In some embodiments, at least one of moiety A, moiety B, moiety C, and moiety D can independently be a polycyclic fused ring structure comprising at least five fused rings. In some embodiments, the polycyclic fused ring structure comprises four 6-membered rings and one 5-membered ring or three 6-membered rings and two 5-membered rings. In some embodiments comprising two 5-membered rings, the 5-membered rings are fused together. In some embodiments comprising two 5-membered rings, the 5-membered rings are separated by at least one 6-membered ring. In some embodiments with one 5-membered ring, the 5-membered ring is fused to the ring coordinated to metal M, the second 6-membered ring is fused to the 5-membered ring, the third 6-membered ring is fused to the second 6-membered ring, and the fourth 6-membered ring is fused to the third 6-membered ring.

In some embodiments, at least one of moiety A, moiety B, moiety C, and moiety D can independently be an aza version of the polycyclic fused rings described above. In some such embodiments at least one of moiety A, moiety B, moiety C, and moiety D can independently contain exactly one aza N atom. In some such embodiments, at least one of moiety A, moiety B, moiety C, and moiety D contains exactly two aza N atoms, which can be in one ring, or in two different rings. In some such embodiments, the ring having aza N atom is separated by at least two other rings from the metal M atom. In some such embodiments, the ring having aza N atom is separated by at least three other rings from the metal M atom. In some such embodiments, each of the ortho position of the aza N atom is substituted.

In some embodiments, the compound of Formula I described herein can be at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated. As used herein, percent deuteration has its ordinary meaning and includes the percent of all possible hydrogen atoms (e.g., positions that are hydrogen or deuterium) that are occupied by deuterium atoms. In some embodiments, one or more hole transporting moieties are partially or fully deuterated. In some embodiments, one or more electron transporting moieties are partially or fully deuterated. In some embodiments, one or more fused ring systems are partially or fully deuterated. In some embodiments, one or more non-fused rings are partially or fully deuterated. In some embodiments, one or more rings or fused rings containing one or more heteroatoms are partially or fully deuterated. In some embodiments, one or more fused or non-fused phenyl rings are partially or fully deuterated. In some embodiments, one or more alkyl or cycloalkyl are partially or fully deuterated.

In yet another aspect of the present disclosure, a formulation that comprises the novel compound disclosed herein is described. The formulation can include one or more components selected from the group consisting of a solvent, an emitter, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds. As used in this context, the description that a structure A comprises a moiety B means that the structure A includes the structure of moiety B not including the H or D atoms that can be attached to the moiety B. This is because at least one H or D on a given moiety structure has to be replaced to become a substituent so that the moiety B can be part of the structure A, and one or more of the H or D on a given moiety B structure can be further substituted once it becomes a part of structure A.

C. The OLEDs and the Devices of the Present Disclosure

In another aspect, the present disclosure also provides an OLED device comprising a first organic layer that contains a compound as disclosed in the above compounds section of the present disclosure.

In some embodiments, the OLED comprises: an anode; a cathode; and an organic layer disposed between the anode and the cathode, where the organic layer comprises a compound as described herein.

In some embodiments, the organic layer may be an emissive layer. In some embodiments, the organic layer is selected from the group consisting of HIL, HTL, EBL, EML, HBL, ETL, and EIL.

In some embodiments, the compound may be a host, and the first organic layer may be an emissive layer that comprises a phosphorescent or fluorescent emitter. As used herein, phosphorescence generally refers to emission of a photon with a change in electron spin quantum number, i.e., the initial and final states of the emission have different electron spin quantum numbers, such as from T1 to S0 state. Most of the Ir and Pt complexes currently used in OLED are phosphorescent emitters. In some embodiments, if an exciplex formation involves a triplet emitter, such exciplex can also emit phosphorescent light. On the other hand, fluorescent emitters generally refer to emission of a photon without a change in electron spin quantum number, such as from S1 to S0 state, or from D1 to D0 state. Fluorescent emitters can be delayed fluorescent or non-delayed fluorescent emitters. Depending on the spin state, fluorescent emitter can be a singlet emitter or a doublet emitter, or other multiplet emitter. It is believed that the internal quantum efficiency (IQE) of fluorescent OLEDs can exceed the 25% spin statistics limit through delayed fluorescence. There are two types of delayed fluorescence, i.e. P-type and E-type delayed fluorescence. P-type delayed fluorescence is generated from triplet-triplet annihilation (TTA). On the other hand, E-type delayed fluorescence does not rely on the collision of two triplets, but rather on the thermal population between the triplet states and the singlet excited states. Thermal energy can activate the transition from the triplet state back to the singlet state. This type of delayed fluorescence is also known as TADF. E-type delayed fluorescence characteristics can be found in an exciplex system or in a single compound. Without being bound by theory, it is believed that TADF emissions require a compound or an exciplex having a small singlet-triplet energy gap ($\Delta E_{S-T}$) less than or equal to 400, 350, 300, 250, 200, 150, 100, or 50 meV. There are two major types of TADF emitters, one is called donor-acceptor type TADF, the other one is called multiple resonance (MR) TADF. Often, single compound donor-acceptor TADF compounds are constructed by connecting an electron donor moiety such as amino- or carbazole-derivatives and an electron acceptor moiety such as N-containing six-membered aromatic rings or cyano-substituted aromatic rings. Donor-acceptor exciplexes can be formed between a hole transporting compound and an electron transporting compound. Examples of MR-TADF materials include highly conjugated fused ring systems. In some embodiments, MR-TADF materials comprises boron, carbon, and nitrogen atoms. Such materials may comprise other atoms, such as oxygen, as well. In some embodiments, the reverse intersystem crossing time from T1 to Si of the delayed fluorescent emission at 293K is less than or equal to 10 microseconds. In some embodiments, such time can be greater than 10 microseconds and less than 100 microseconds.

In some embodiments, the compound is a host, and the organic layer is an emissive layer that comprises a phosphorescent or fluorescent material.

In some embodiments, the emissive dopant can be a phosphorescent or fluorescent material.

In some embodiments, the non-emissive dopant can also be a phosphorescent or fluorescent material.

In some embodiments, the OLED may comprise an additional compound selected from the group consisting of a non-delayed fluorescence material, a delayed fluorescence material, a phosphorescent material, and combination thereof.

In some embodiments, the phosphorescent material is an emitter which emits light within the OLED. In some embodiments, the phosphorescent material does not emit light within the OLED. In some embodiments, the phosphorescent material energy transfers its excited state to another material within the OLED. In some embodiments, the phosphorescent material participates in charge transport within the OLED. In some embodiments, the phosphorescent material is a sensitizer or a component of a sensitizer, and the OLED further comprises an acceptor. In some embodiments, the phosphorescent material forms an exciplex with another material within the OLED, for example a host material, an emitter material.

In some embodiments, the non-delayed fluorescence material or the delayed fluorescence material is an emitter which emits light within the OLED. In some embodiments, the non-delayed fluorescence material or the delayed fluorescence material does not emit light within the OLED. In some embodiments, the non-delayed fluorescence material or the delayed fluorescence material energy transfers its excited state to another material within the OLED. In some embodiments, the non-delayed fluorescence material or the delayed fluorescence material participates in charge transport within the OLED. In some embodiments, the non-delayed fluorescence material or the delayed fluorescence material is an acceptor, and the OLED further comprises a sensitizer.

In some embodiments, the compound may be an acceptor, and the OLED may further comprise a sensitizer selected from the group consisting of a delayed fluorescence material, a phosphorescent material, and combination thereof.

In some embodiments, the compound may be a non-delayed fluorescent emitter, a delayed fluorescence emitter, or a component of an exciplex that is a non-delayed fluorescent emitter or a delayed fluorescence emitter. In some embodiments, the compound has an emission at room temperature with a full width at half maximum (FWHM) of equal to or less than 50, 45, 40, 35, 30, 25, 20, 15, 10, or 5 nm. Narrower FWHM means better color purity for the OLED display application.

In some embodiments, the compound is a host and the OLED comprises an acceptor that is an emitter and a sensitizer selected from the group consisting of a delayed fluorescence material, a phosphorescent material, and combination thereof; wherein the sensitizer transfers energy to the acceptor.

In some embodiments, the phosphorescent material can be a metal coordination complex having a metal-carbon bond, a metal-nitrogen bond, or a metal-oxygen bond. In some embodiments, the metal is selected from the group consisting of Ir, Rh, Re, Ru, Os, Pt, Pd, Zn, Au, Ag, and Cu. In some embodiments, the metal is Ir. In some embodiments, the metal is Pt. In some embodiments, the metal is Cu, Ag, or Au. In some embodiments, the phosphorescent material has the formula of $M(L^1)_x(L^2)_y(L^3)_z$;

wherein $L^1$, $L^2$, and $L^3$ can be the same or different;

wherein x is 1, 2, or 3;

wherein y is 0, 1, or 2;

wherein z is 0, 1, or 2;

wherein x+y+z is the oxidation state of the metal M;

wherein $L^1$ is selected from the group consisting of the structures of LIGAND LIST:

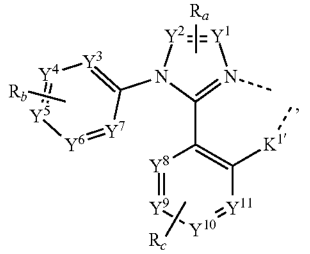

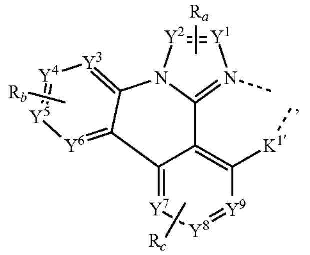

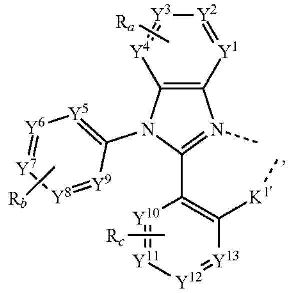

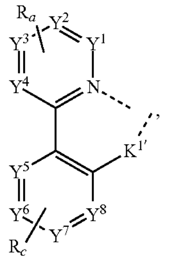

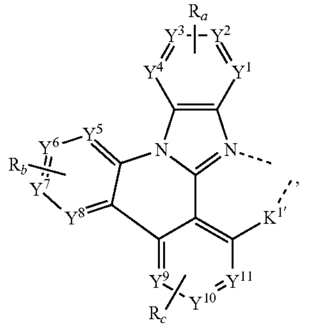

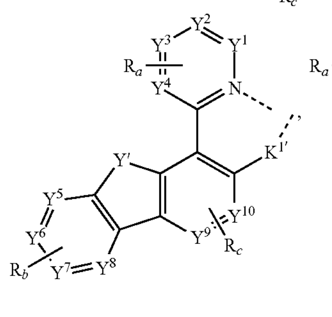

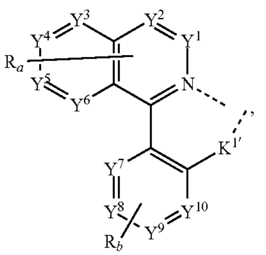

-continued
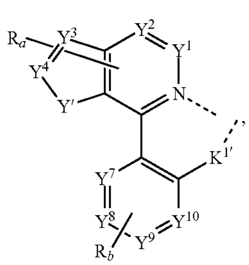
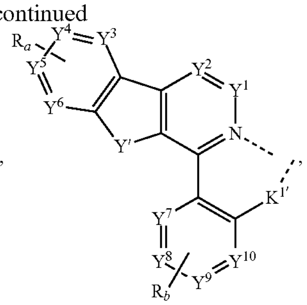
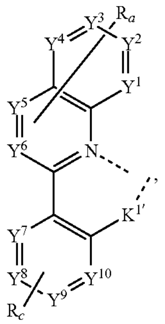
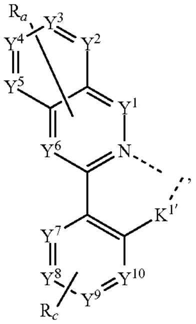
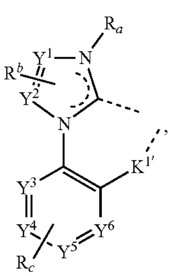
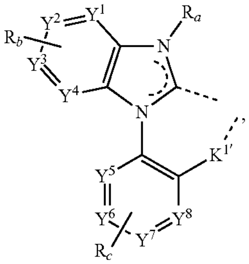
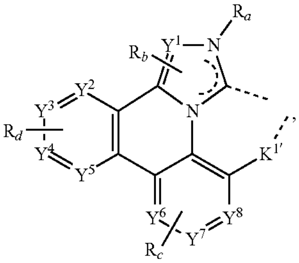
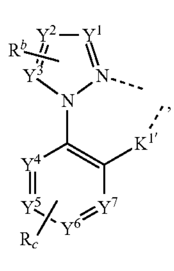
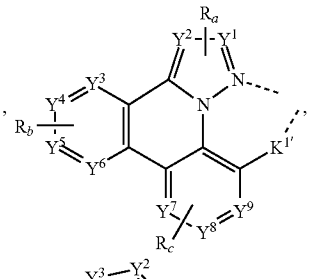
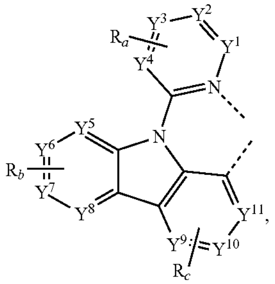
-continued
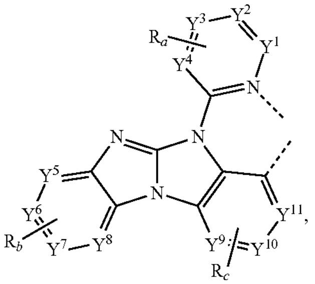
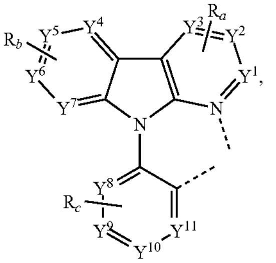
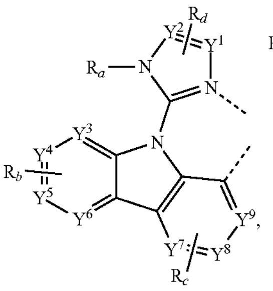
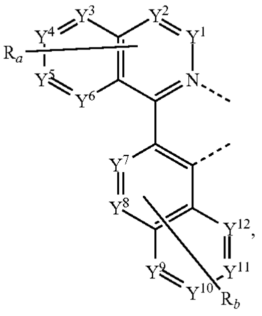
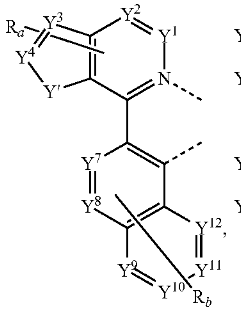
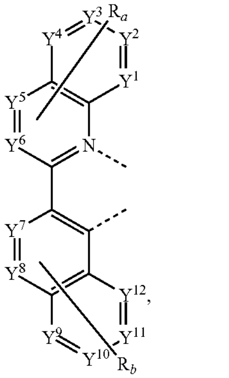
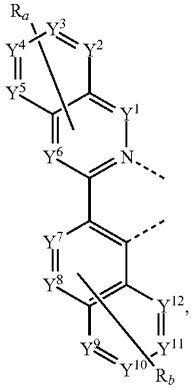
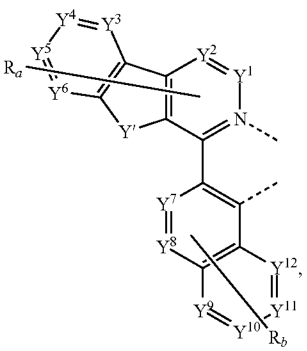

-continued

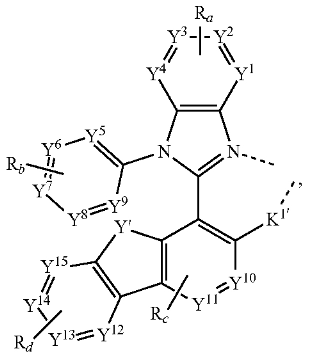

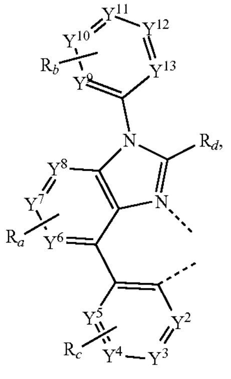

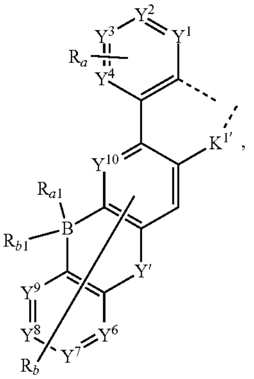

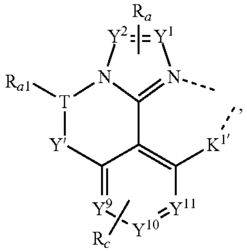

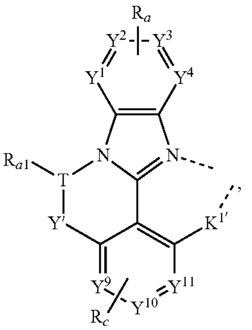

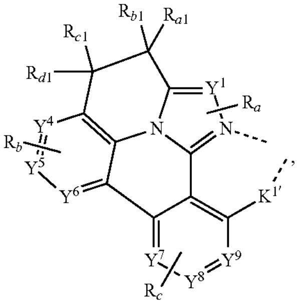

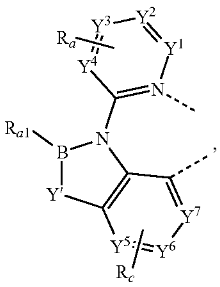

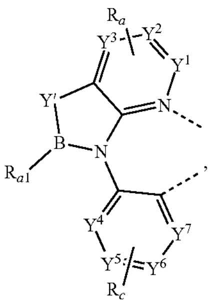

, and

-continued

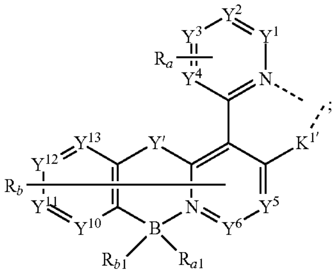

wherein each $L^2$ and $L^3$ are independently selected from the group consisting of

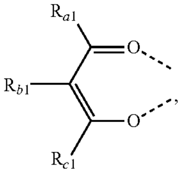

and the structures of LIGAND LIST; wherein:

M is selected from the group consisting of Ir, Rh, Re, Ru, Os, Pt, Pd, Zn, Au, Ag, and Cu;

T is selected from the group consisting of B, Al, Ga, and In;

K is a direct bond or is selected from the group consisting of $NR_e$, $PR_e$, O, S, and Se;

each $Y^1$ to $Y^5$ are independently selected from the group consisting of carbon and nitrogen;

Y' is selected from the group consisting of $BR_e$, $NR_e$, $PR_e$, O, S, Se, C═O, S═O, $SO_2$, $CR_eR_f$, $SiR_eR_f$, and $GeR_eR_f$;

$R_e$ and $R_f$ can be fused or joined to form a ring;

each $R_a$, $R_b$, $R_c$, and $R_d$ can independently represent from mono to the maximum possible number of substitutions, or no substitution;

each $R_{a1}$, $R_{b1}$, $R_{c1}$, $R_{d1}$, $R_a$, $R_b$, $R_c$, $R_d$, $R_e$, and $R_f$ is independently a hydrogen or a substituent selected from the group consisting of the general substituents as defined herein; and wherein any two substituents can be fused or joined to form a ring or form a multidentate ligand.

In some embodiments, the phosphorescent material has a formula selected from the group consisting of $Ir(L_A)_3$, $Ir(L_A)(L_B)_2$, $Ir(L_A)_2(L_B)$, $Ir(L_A)_2(L_C)$, $Ir(L_A)(L_B)(L_C)$, and $Pt(L_A)(L_B)$;

wherein $L_A$, $L_B$, and $L_C$ are different from each other in the Ir compounds;

wherein $L_A$ and $L_B$ can be the same or different in the Pt compounds; and wherein $L_A$ and $L_B$ can be connected to form a tetradentate ligand in the Pt compounds.

In some embodiments, the phosphorescent material is selected from the group consisting of the following Dopant Group 1:

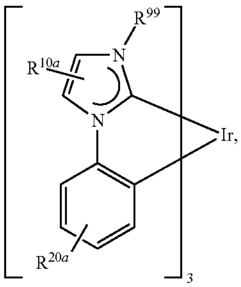
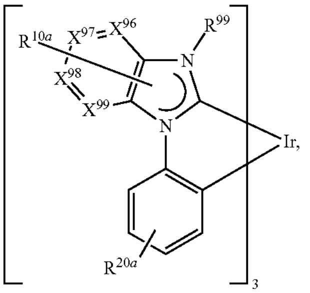
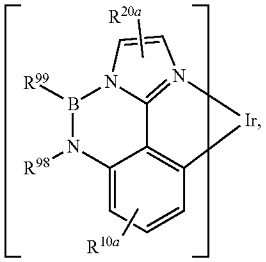
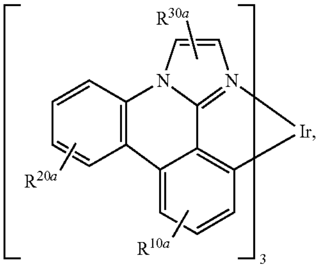
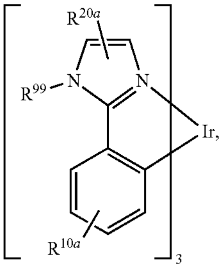
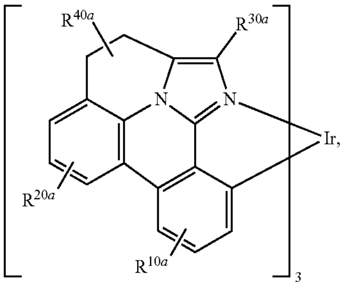
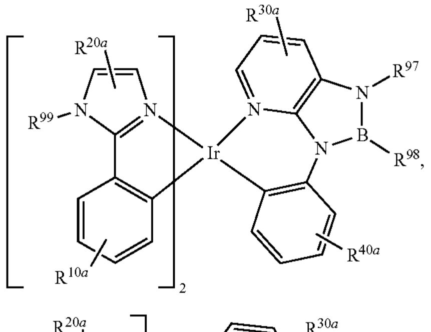
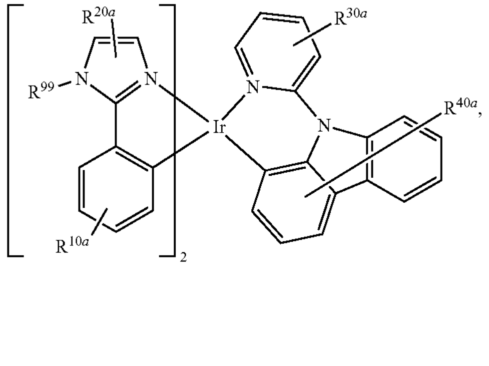
-continued
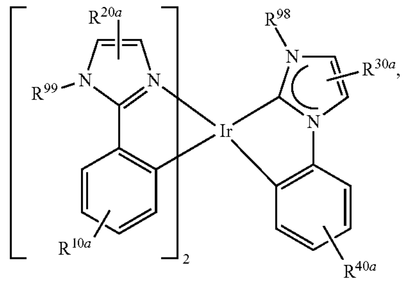
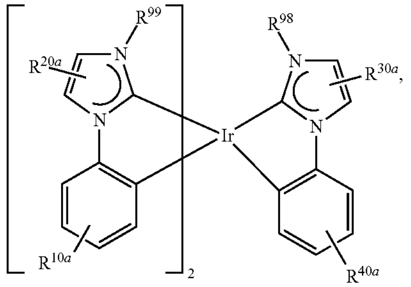
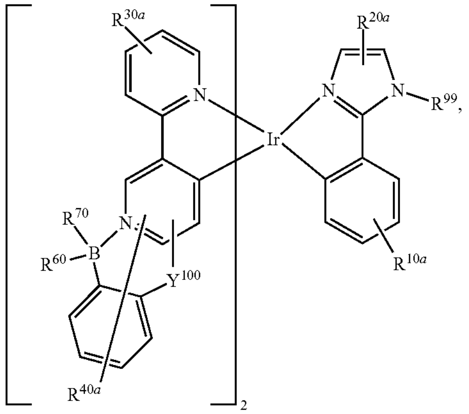
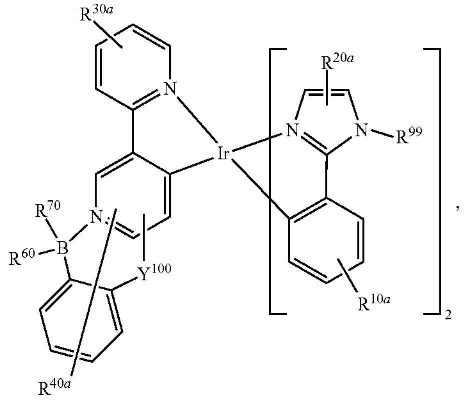
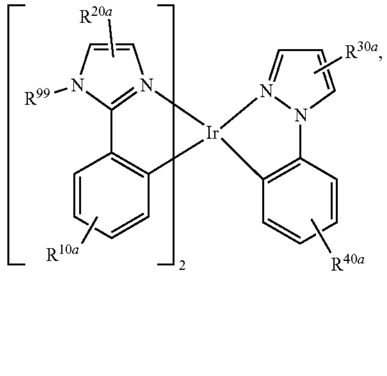

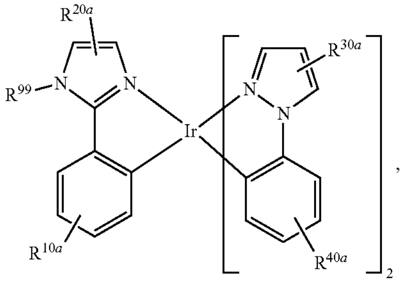
,
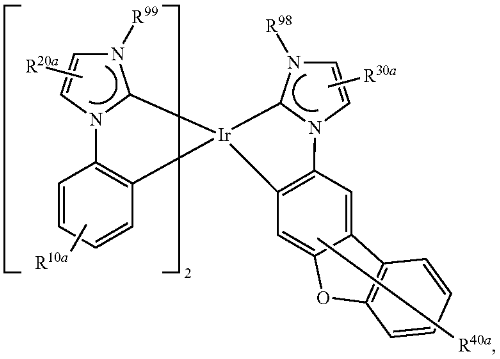
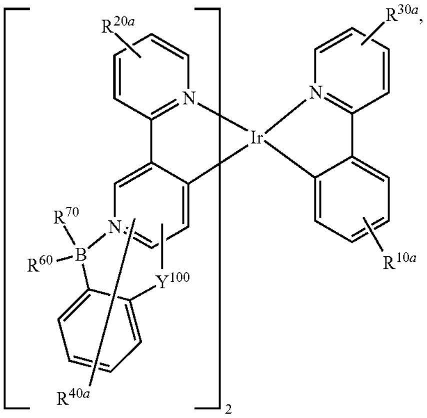
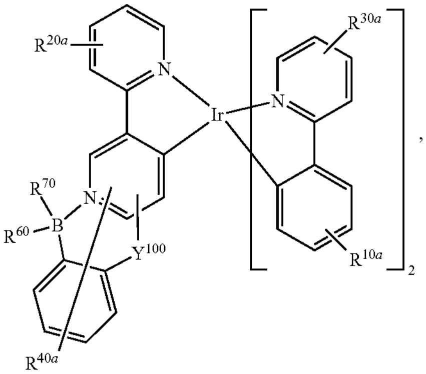
,
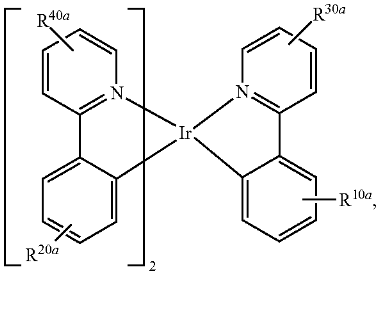
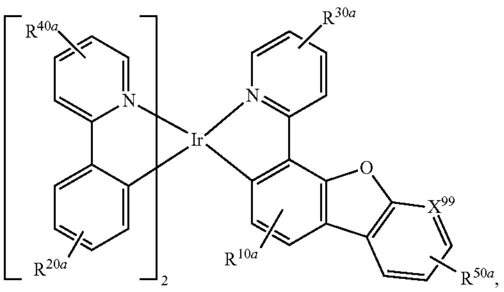
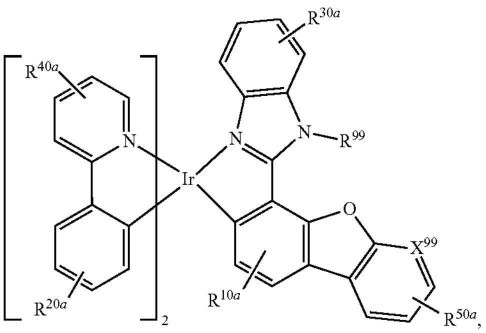
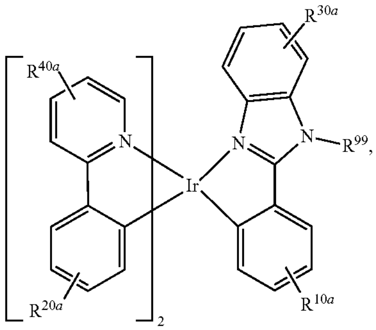
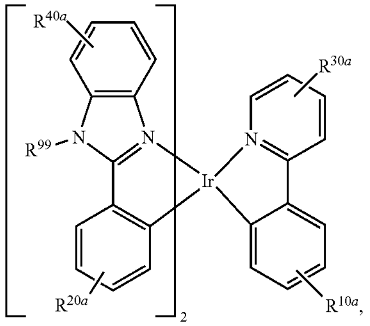
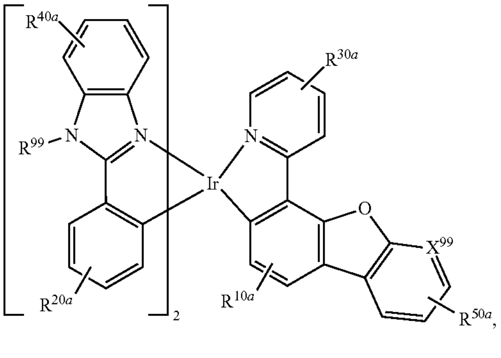

-continued
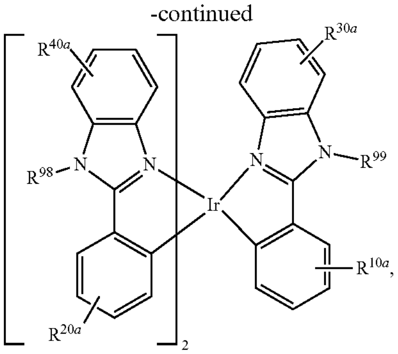
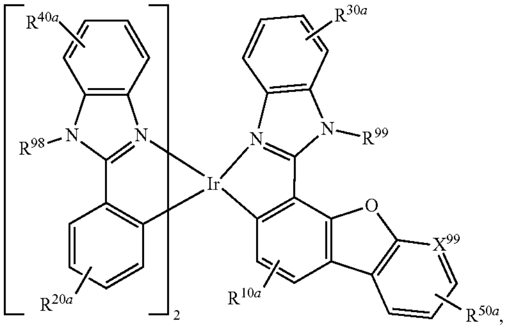
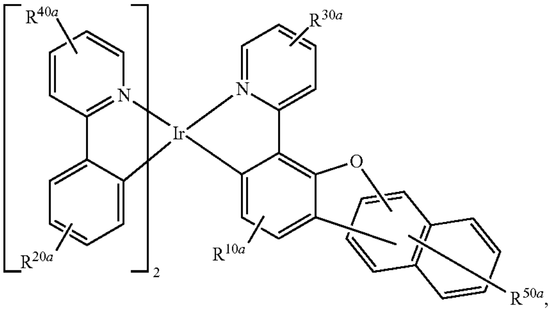
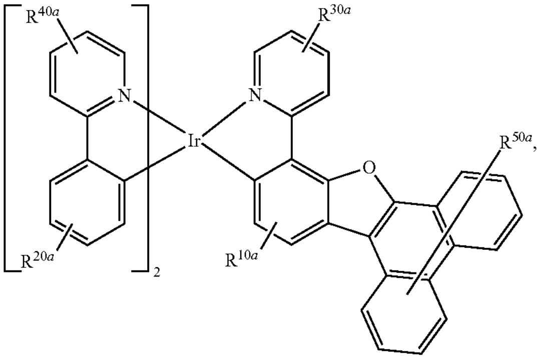
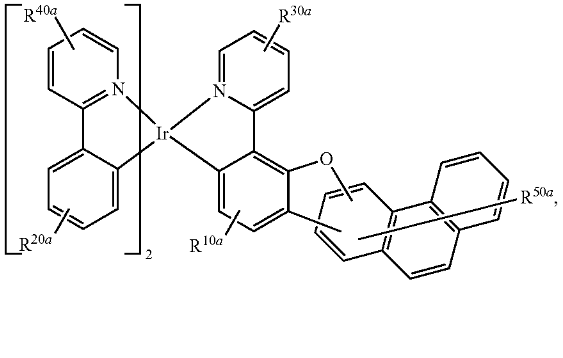
-continued
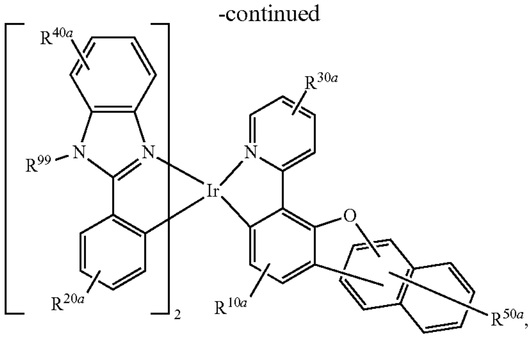
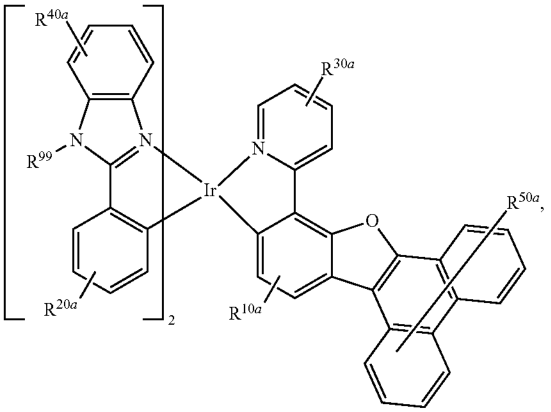
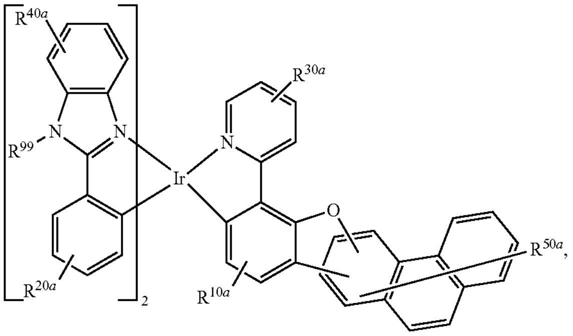
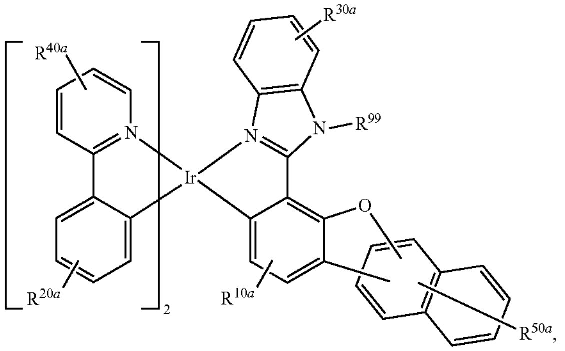

-continued
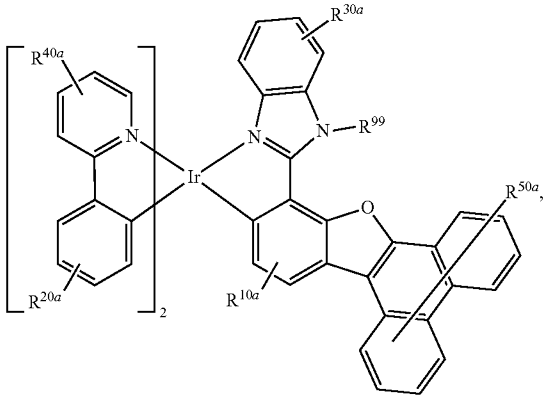
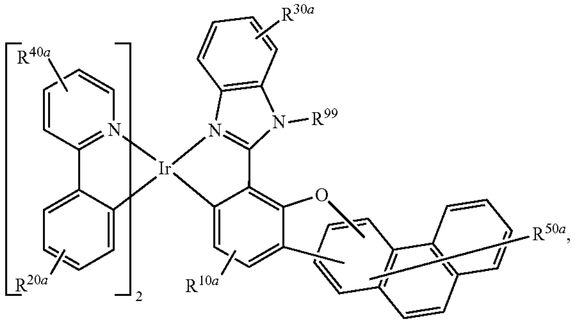
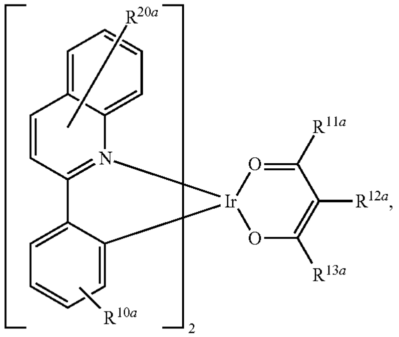
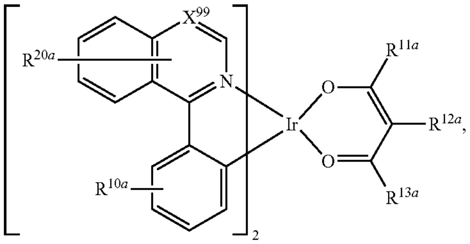
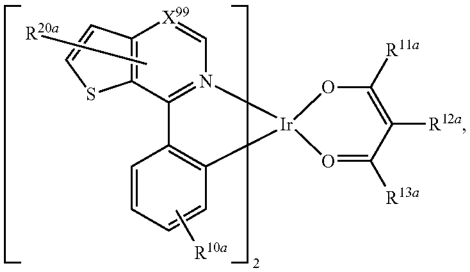
-continued
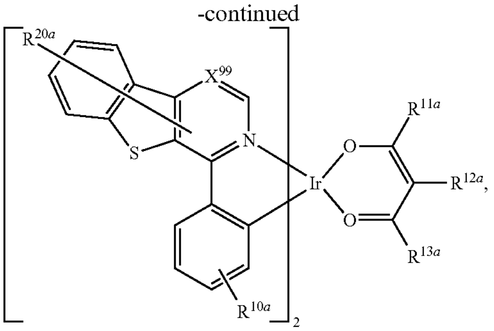
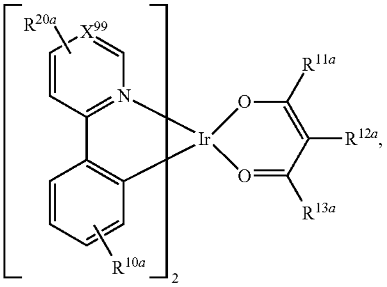
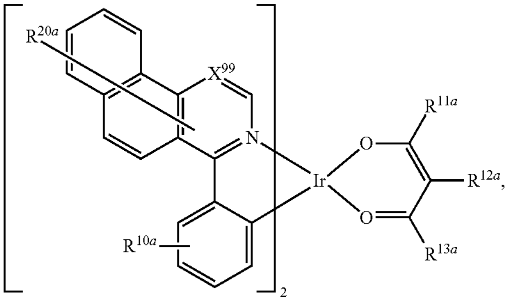
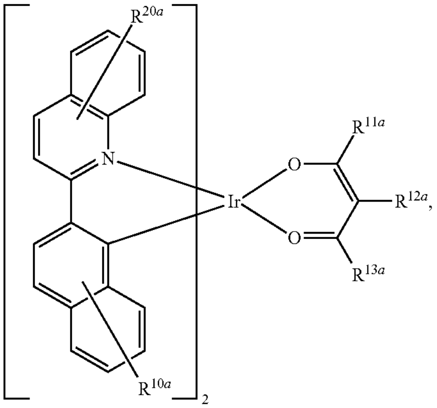
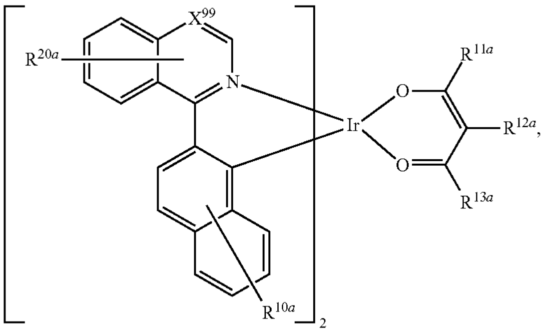

-continued

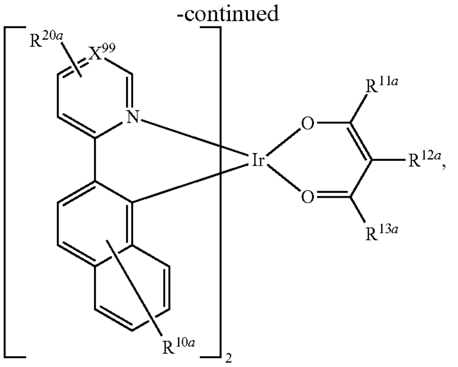

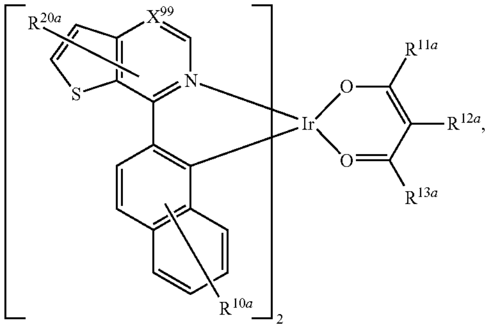

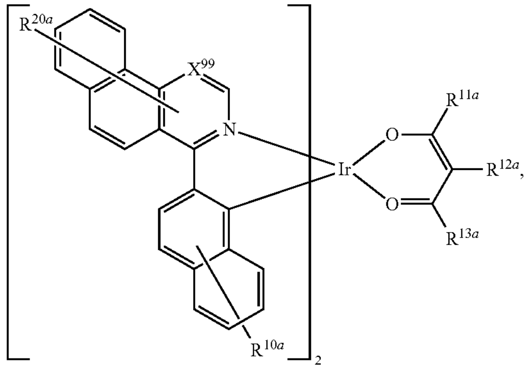

and

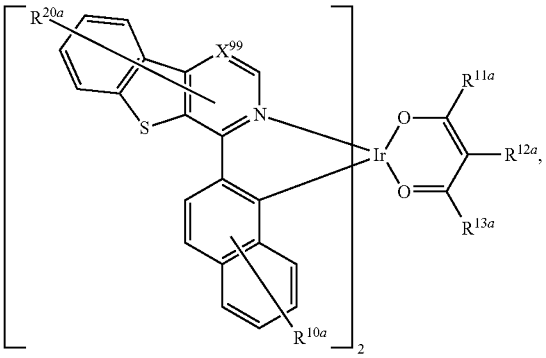

wherein each of $X^{96}$ to $X^{99}$ is independently C or N;

each $Y^{100}$ is independently selected from the group consisting of a NR", O, S, and Se;

each of $R^{10a}$, $R^{20a}$, $R^{30a}$, $R^{40a}$, and $R^{50a}$ independently represents mono substitution, up to the maximum substitutions, or no substitution;

each of R, R', R", $R^{10a}$, $R^{11a}$, $R^{12a}$, $R^{13a}$, $R^{20a}$, $R^{30a}$, $R^{40a}$, $R^{50a}$, $R^{60}$, $R^{70}$, $R^{97}$, $R^{98}$, and $R^{99}$ is independently a hydrogen or a substituent selected from the group consisting of the general substituents as defined herein; any two substituents can be joined or fused to form a ring.

In some embodiments, the phosphorescent material is selected from the group consisting of the following Dopant Group 2:

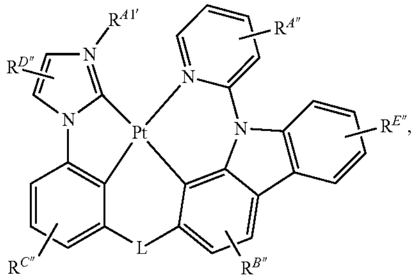

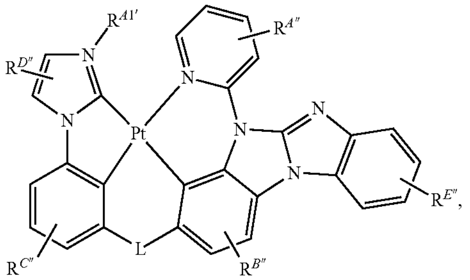

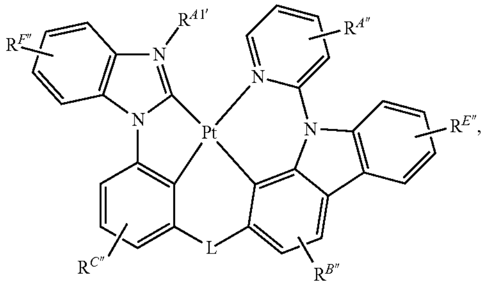

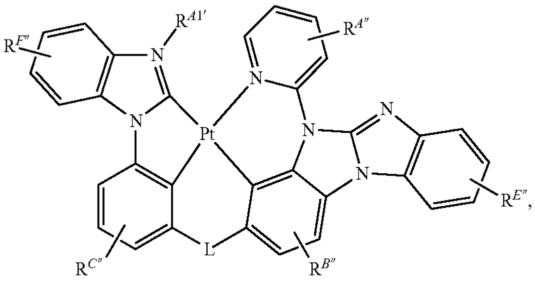

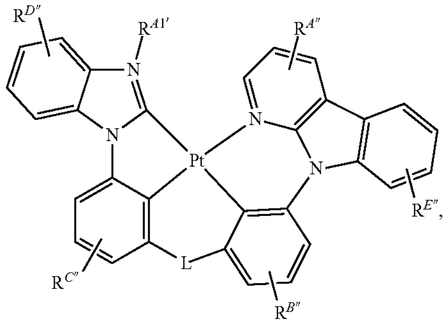

-continued
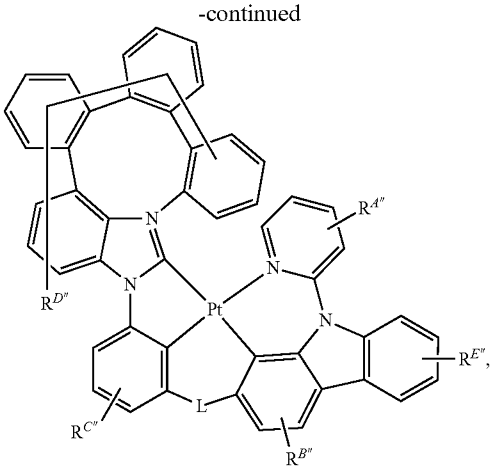
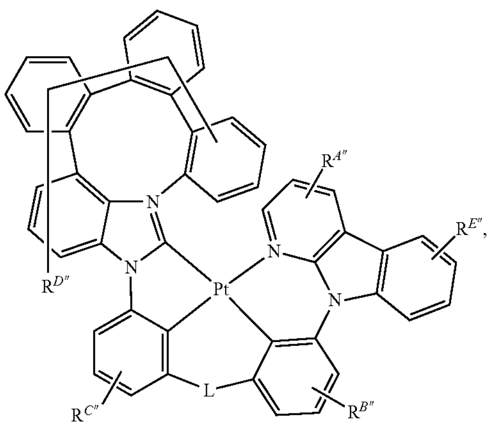
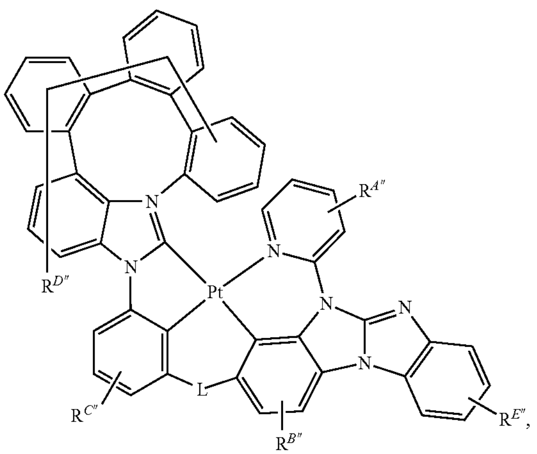
-continued
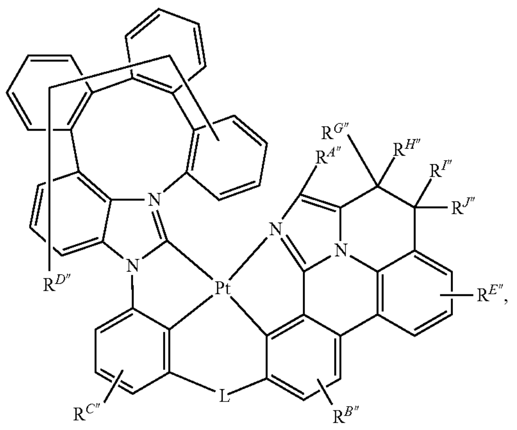
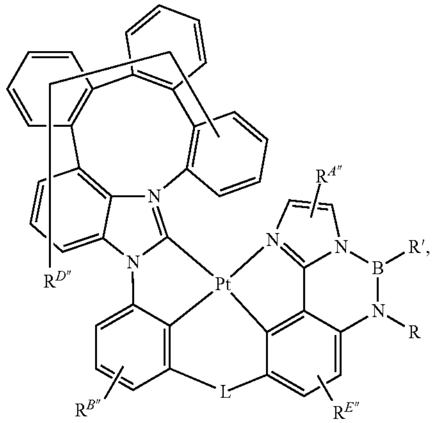
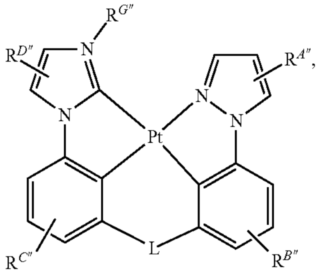
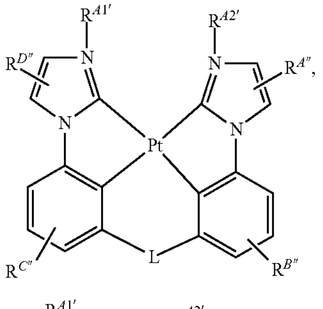
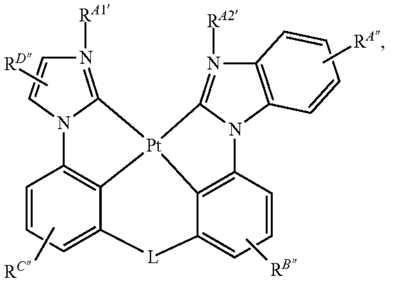

-continued
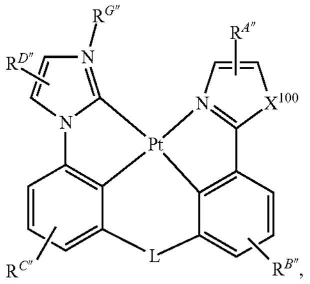
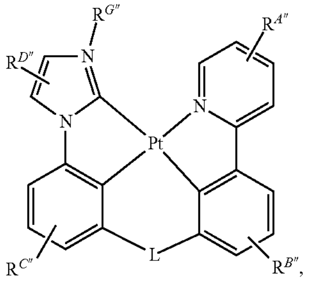
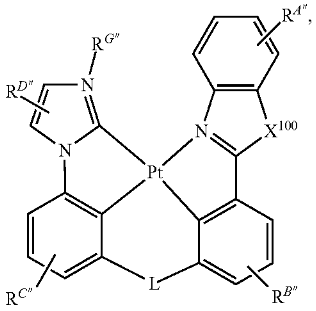
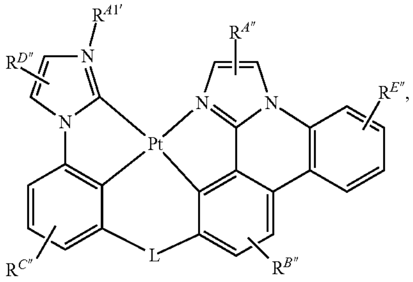
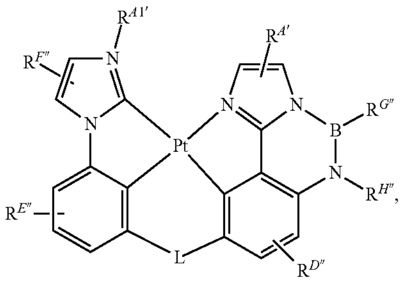
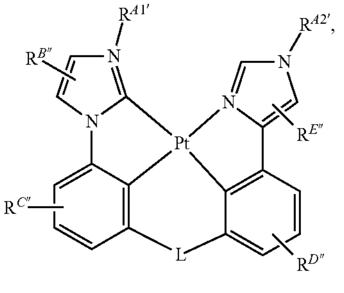
-continued
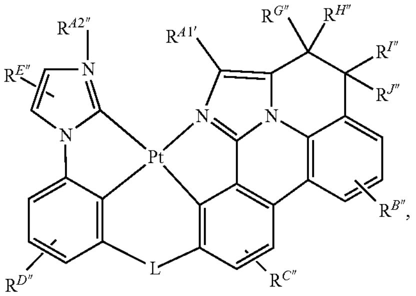
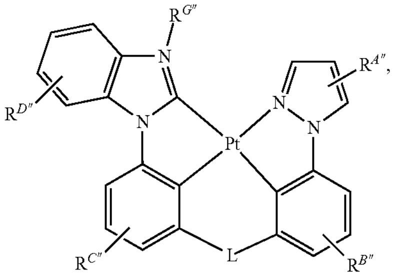
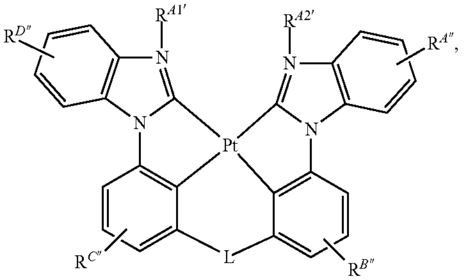
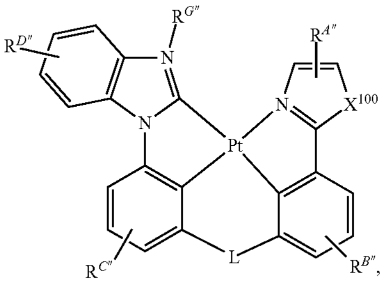
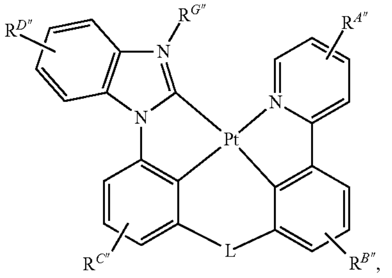
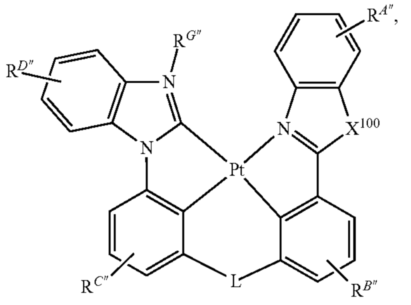

-continued
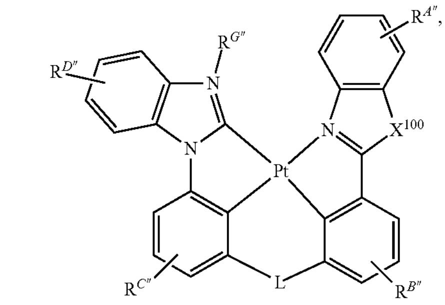
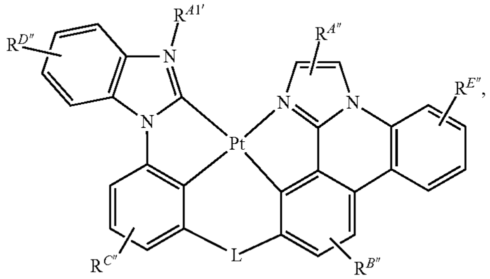
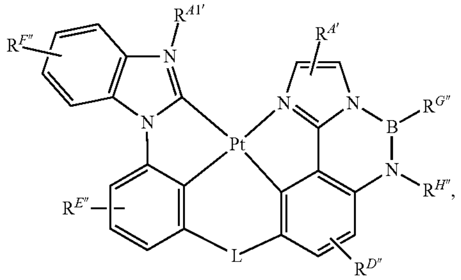
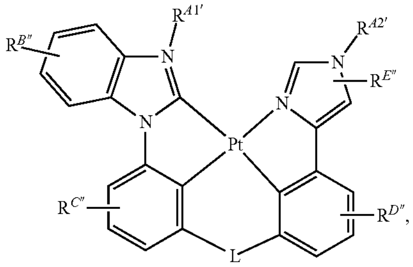
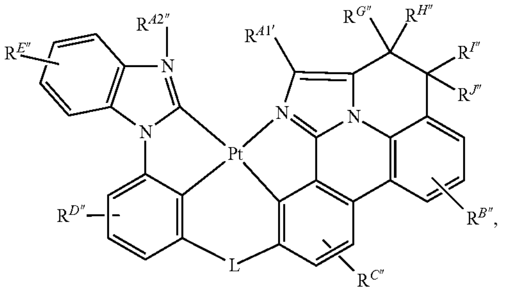
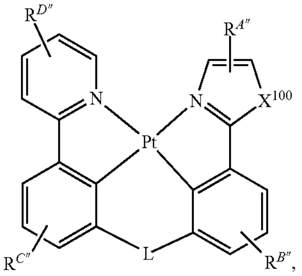
-continued
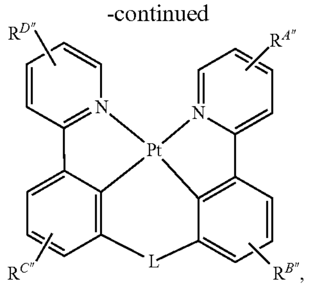
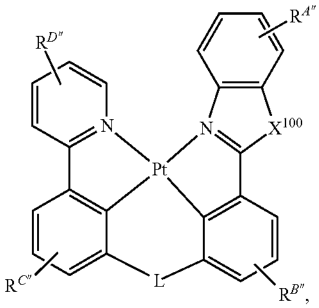
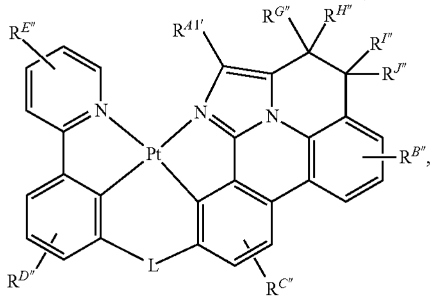
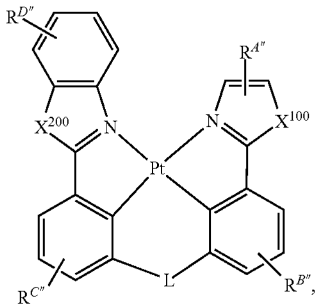
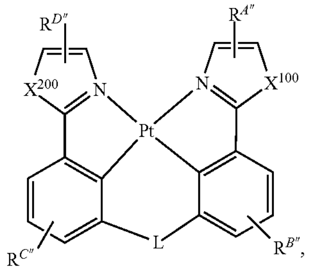

-continued
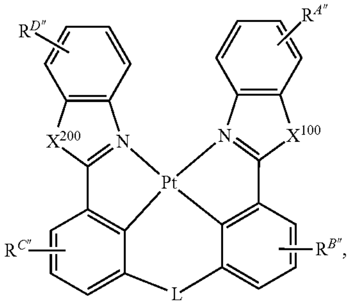
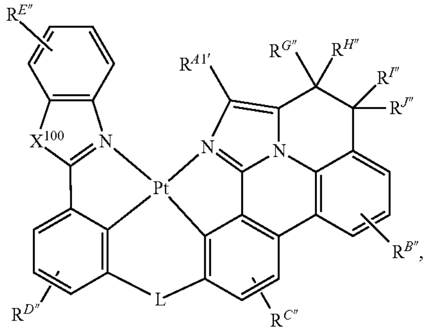
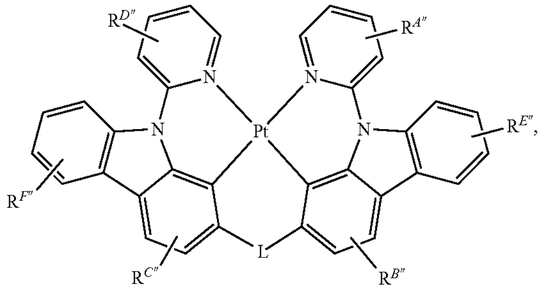
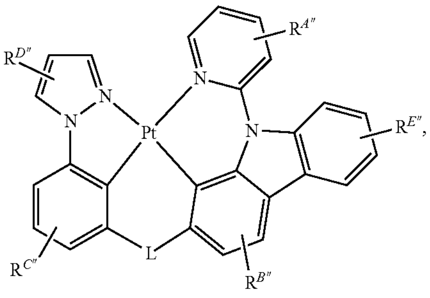
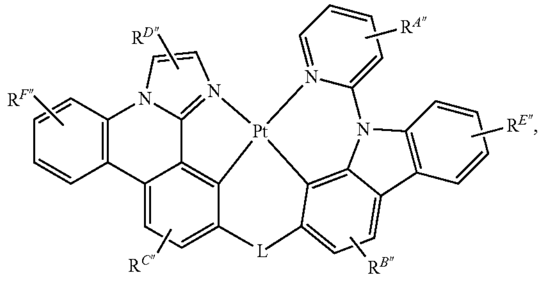
-continued
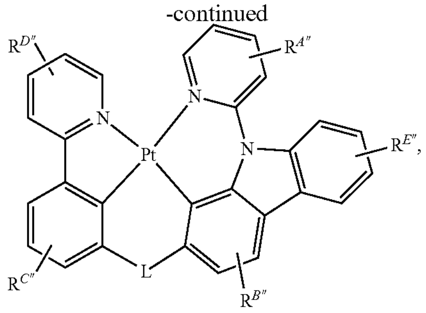
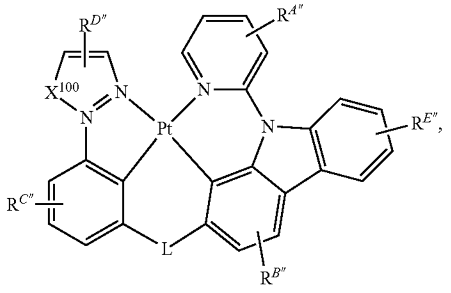
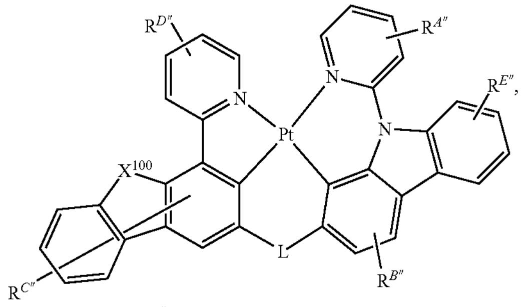
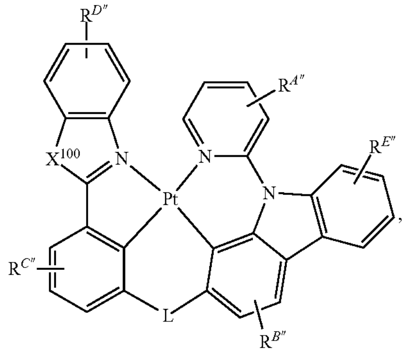
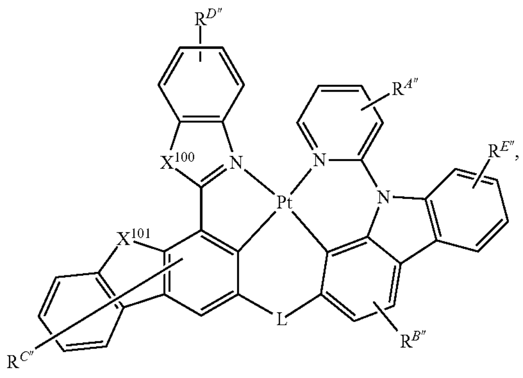

-continued
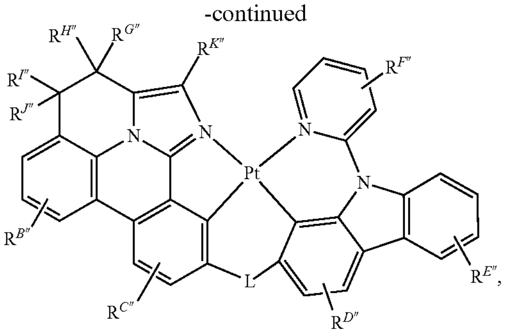
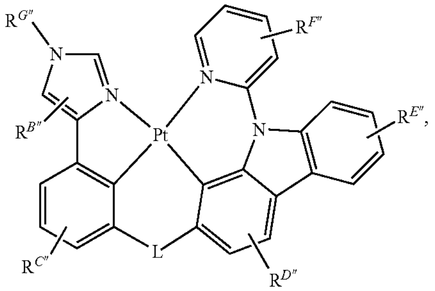
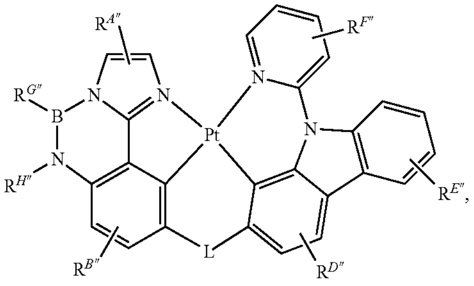
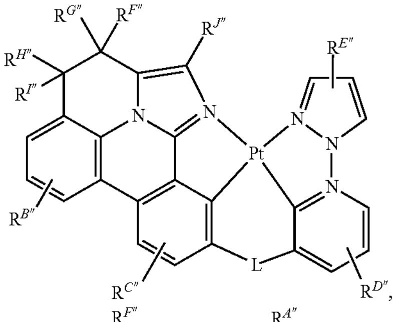
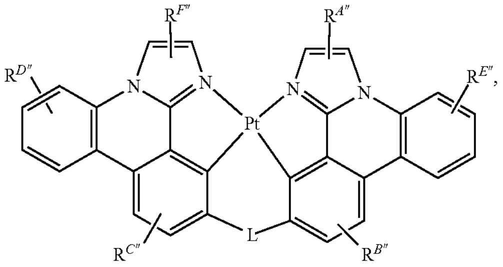
-continued
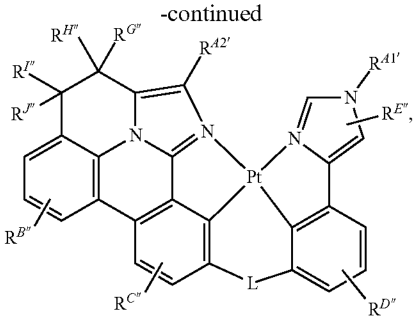
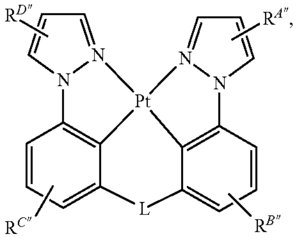
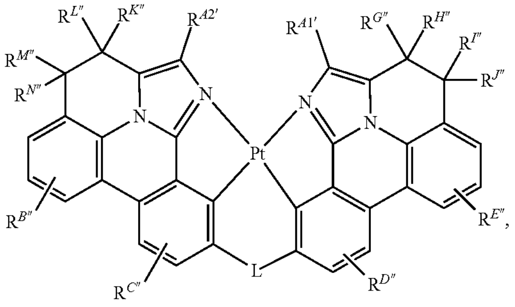
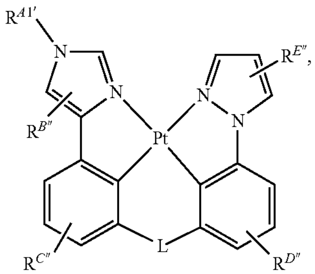
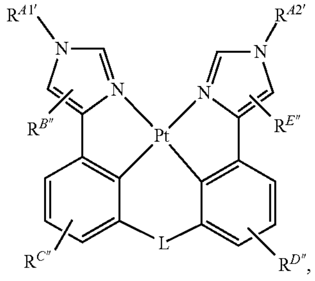

-continued
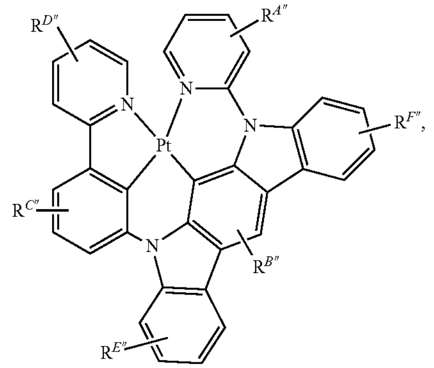
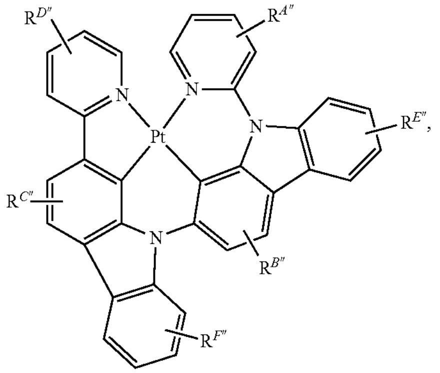
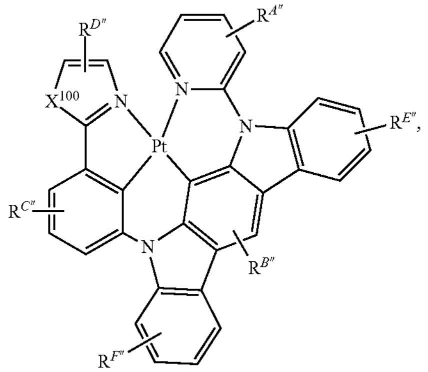
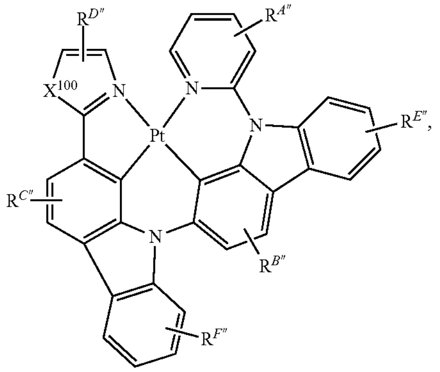
-continued
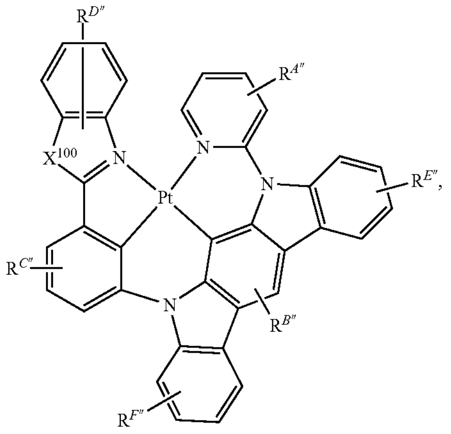
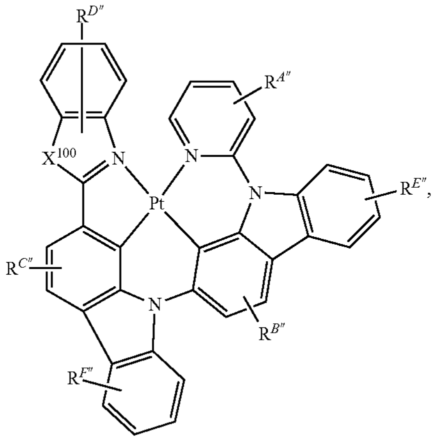
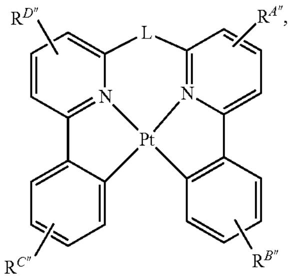
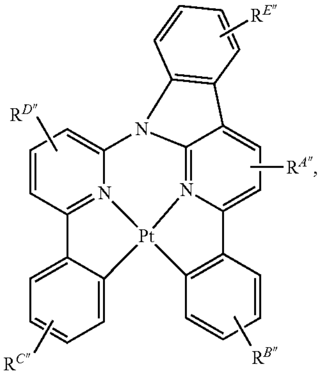

-continued
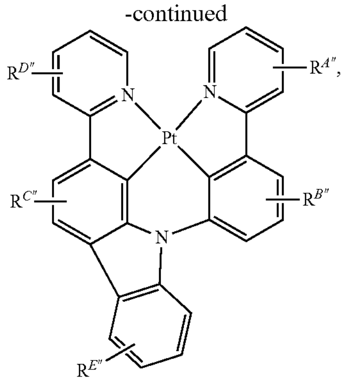
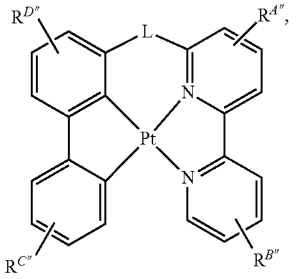
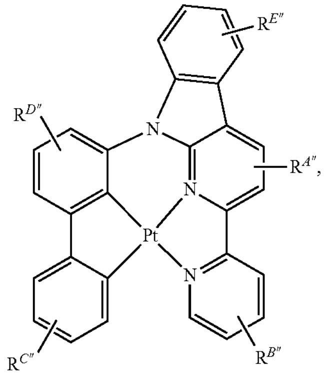
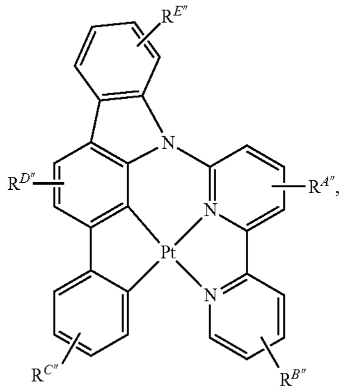
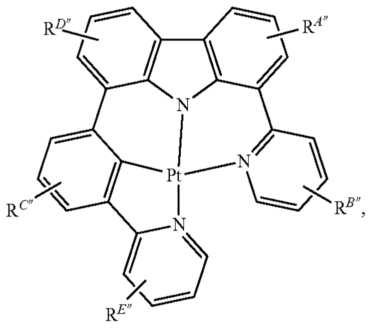
-continued
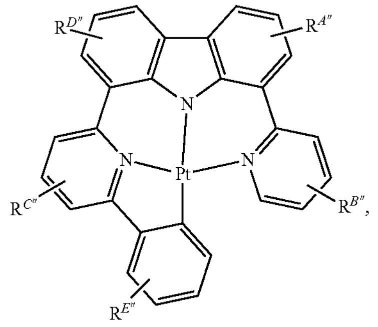
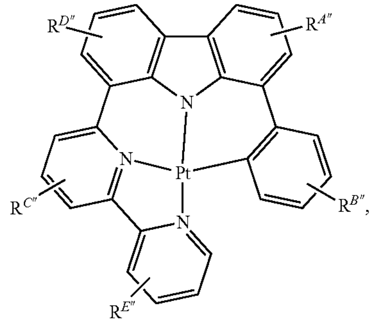
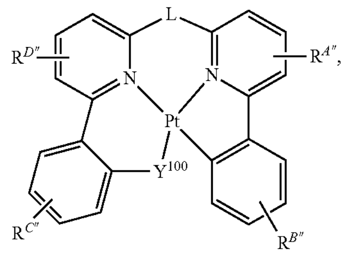
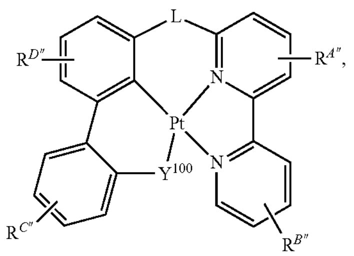
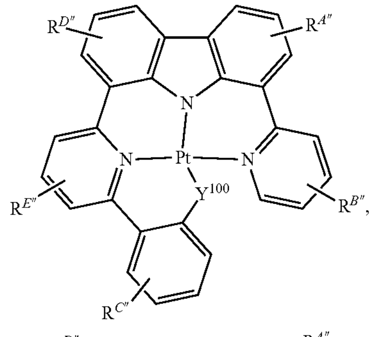
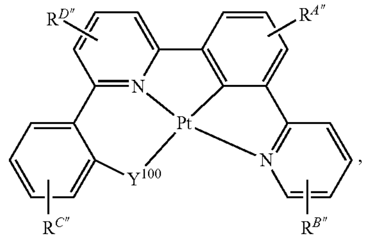

-continued

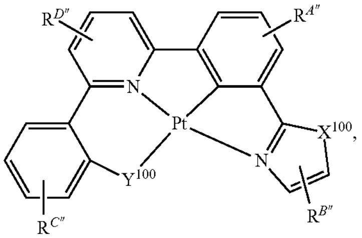

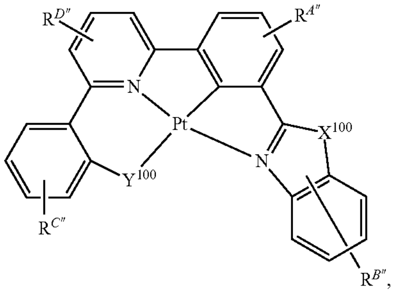

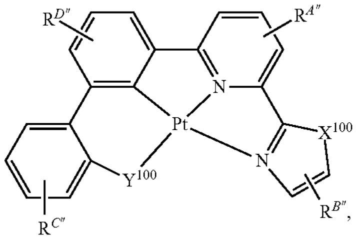

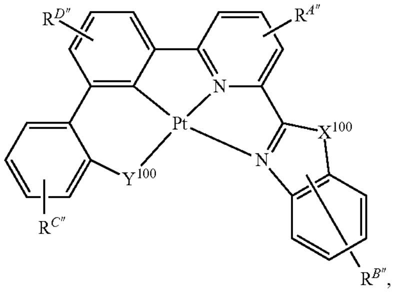

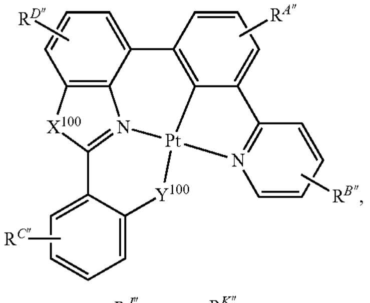

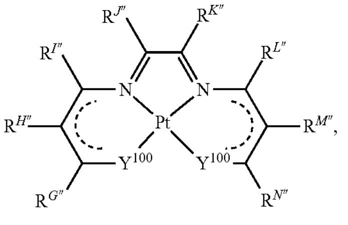

-continued

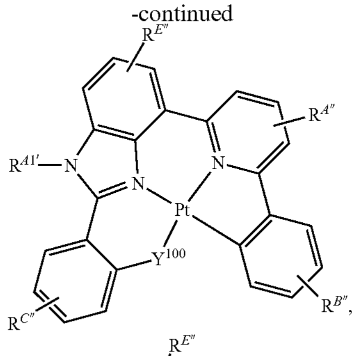

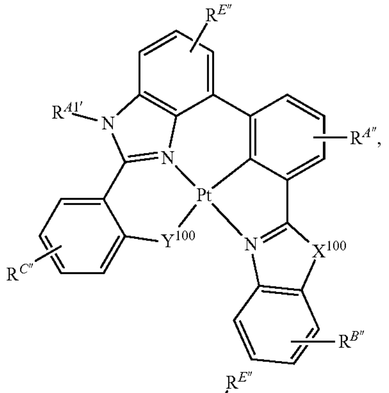

and

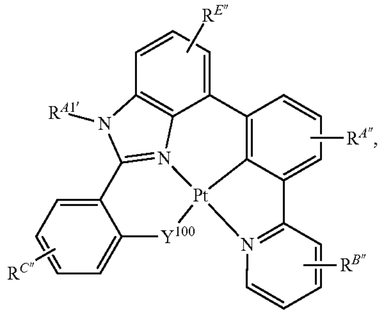

wherein:

each $Y^{100}$ is independently selected from the group consisting of a NR", O, S, and Se;

L is independently selected from the group consisting of a direct bond, BR", BR"R"', NR", PR", O, S, Se, C=O, C=S, C=Se, C=NR", C=CR"R"', S=O, $SO_2$, CR", CR"R"', SiR"R"', GeR"R"', alkyl, cycloalkyl, aryl, heteroaryl, and combinations thereof;

$X^{100}$ and $X^{200}$ for each occurrence is selected from the group consisting of O, S, Se, NR", and CR"R"';

each $R^{A''}$, $R^{B''}$, $R^{C''}$, $R^{D''}$, $R^{E''}$, and $R^{F''}$ independently represents mono-, up to the maximum substitutions, or no substitutions;

each of R, R', R", R"', $R^{A1'}$, $R^{A2'}$, $R^{A''}$, $R^{B''}$, $R^{C''}$, $R^{D''}$, $R^{E''}$, $R^{F''}$, $R^{G''}$, $R^{H''}$, $R^{I''}$, $R^{J''}$, $R^{K''}$, $R^{L''}$, $R^{M''}$, and $R^{N''}$ is independently a hydrogen or a substituent selected from the group consisting of the general substituents as defined herein; any two substituents can be joined or fused to form a ring;

In some embodiments of the above Dopant Groups 1 and 2, each unsubstituted aromatic carbon atom can be replaced with N to form an aza-ring. In some embodiments, the maximum number of N atom in one ring is 1 or 2. In some embodiments of the above Dopant Groups 2, Pt atom in each formula can be replaced by Pd atom.

In some embodiments of the OLED, the delayed fluorescence material comprises at least one donor group and at least one acceptor group. In some embodiments, the delayed fluorescence material is a metal complex. In some embodiments, the delayed fluorescence material is a non-metal complex. In some embodiments, the delayed fluorescence material is a Zn, Cu, Ag, or Au complex.

In some embodiments of the OLED, the delayed fluorescence material has the formula of $M(L^5)(L^6)$, wherein M is Cu, Ag, or Au, $L^5$ and $L^6$ are different, and $L^5$ and $L^6$ are independently selected from the group consisting of:

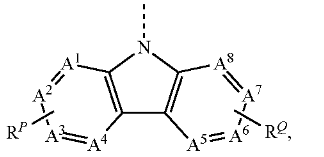

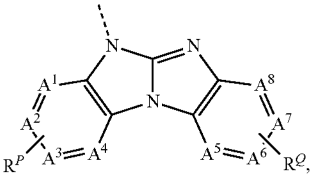

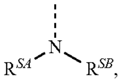

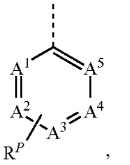

,

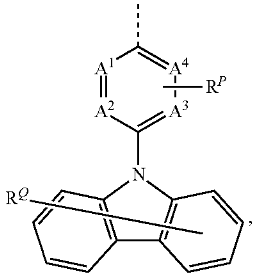

,

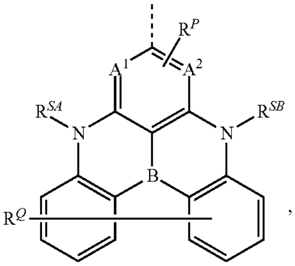

,

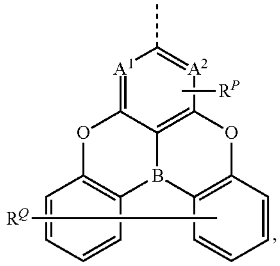

,

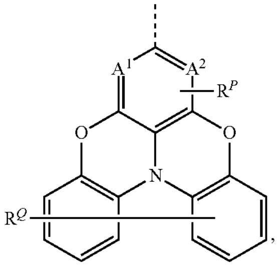

,

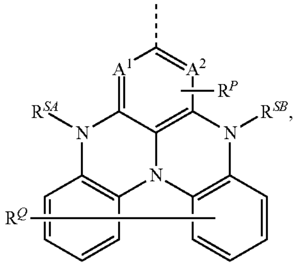

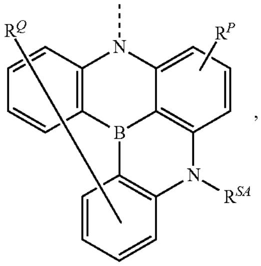

,

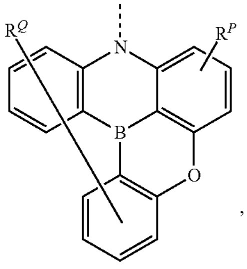

,

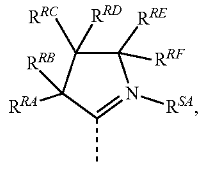

-continued

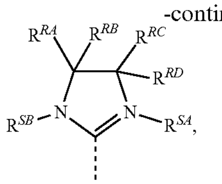

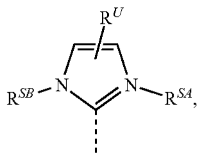

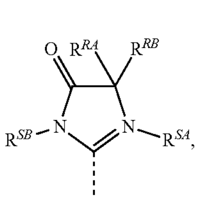

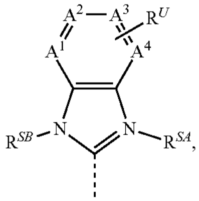

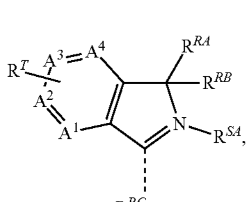

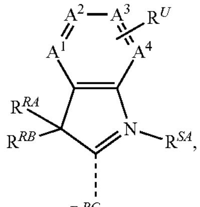

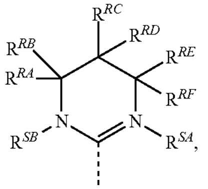

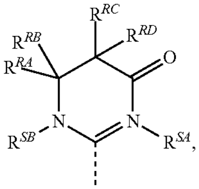

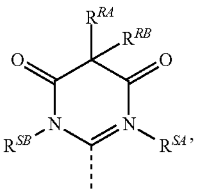

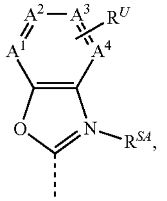

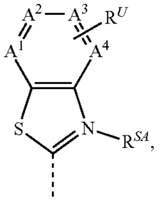

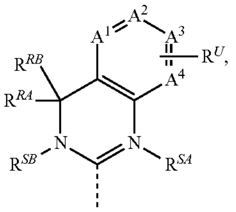

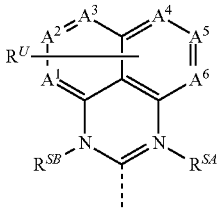

, and

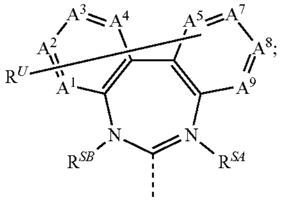

wherein $A^1$-$A^9$ are each independently selected from C or N;

each $R^P$, $R^Q$, and $R^U$ independently represents mono-, up to the maximum substitutions, or no substitutions;

wherein each $R^P$, $R^P$, $R^U$, $R^{SA}$, $R^{SB}$, $R^{RA}$, $R^{RB}$, $R^{RC}$, $R^{RD}$, $R^{RE}$, and $R^{RF}$ is independently a hydrogen or a substituent selected from the group consisting of the general substituents as defined herein; any two substituents can be joined or fused to form a ring.

In some embodiments of the OLED, the delayed fluorescence material comprises at least one of the donor moieties selected from the group consisting of:

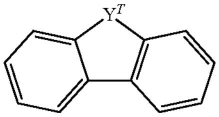,
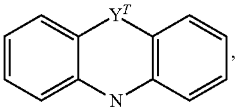,
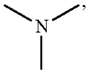,
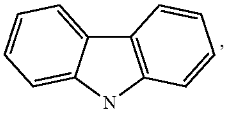,
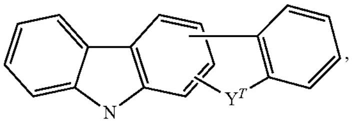,
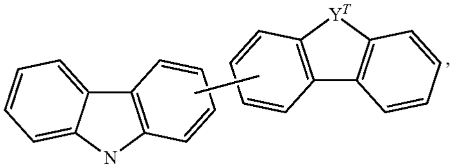,
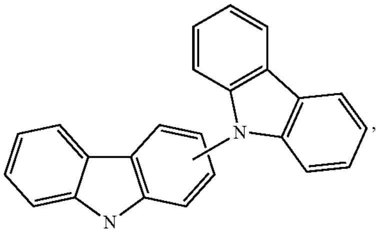,
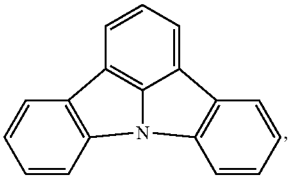,
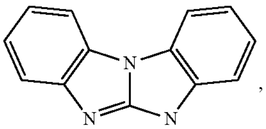,
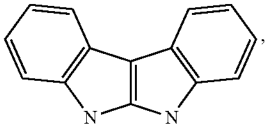,
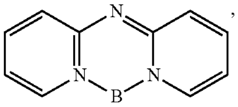,
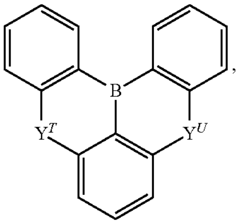,
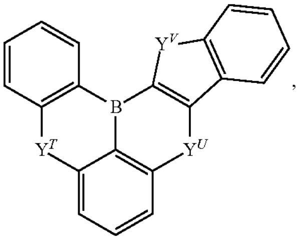,
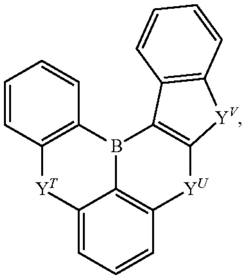,
-continued
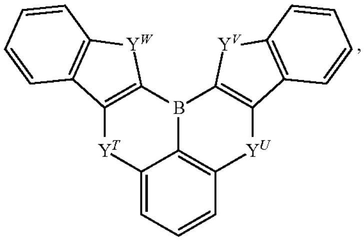,
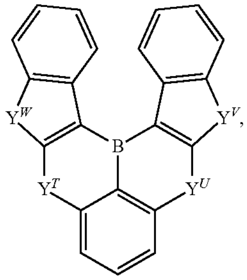,
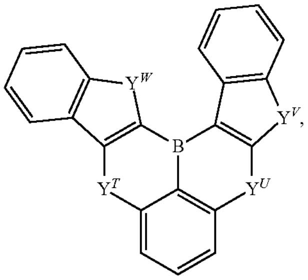,
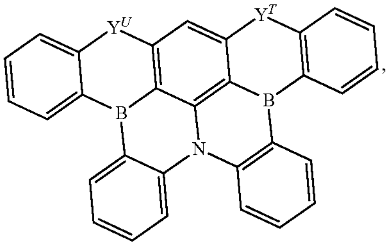,
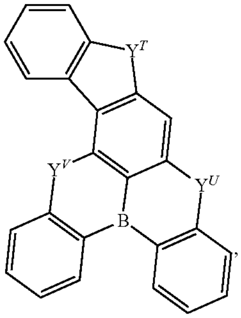,
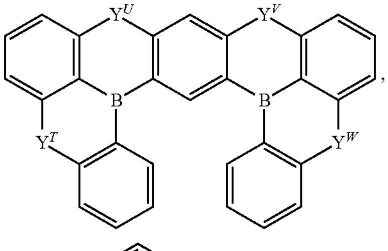, and
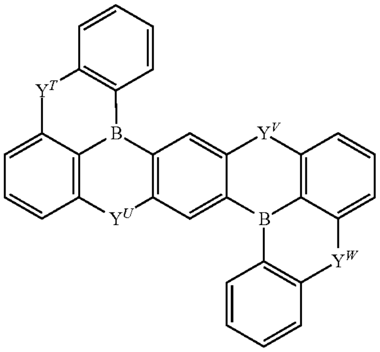;

wherein $Y^T$, $Y^U$, $Y^V$, and $Y^W$ are each independently selected from the group consisting of B, C, Si, Ge, N, P, O, S, Se, C═O, S═O, and $SO_2$.

In some of the above embodiments, any carbon ring atoms up to maximum of a total number of three, together with their substituents, in each phenyl ring of any of above structures can be replaced with N.

In some embodiments, the delayed fluorescence material comprises at least one of the acceptor moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole. In some embodiments, the acceptor moieties and the donor moieties as described herein can be connected directly, through a conjugated linker, or a non-conjugated linker, such as a $sp^3$ carbon or silicon atom.

In some embodiments, the fluorescent material comprises at least one of the chemical moieties selected from the group consisting of:

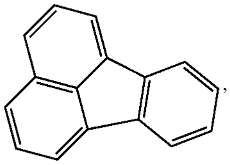
,
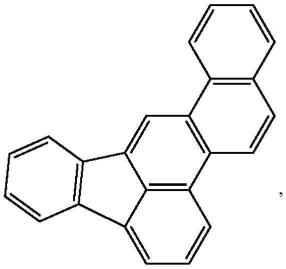
,
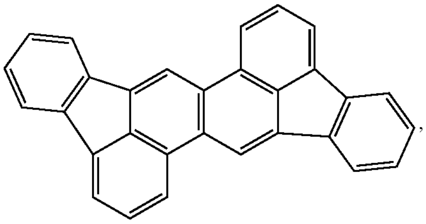
,
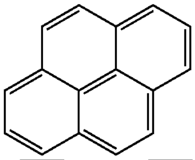
,
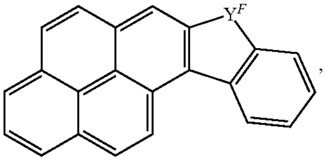
,
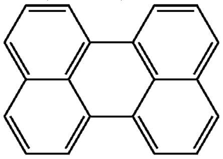
,
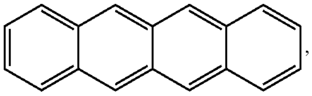
,
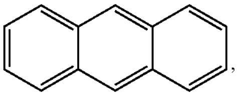
,
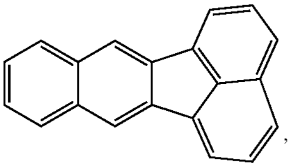
,
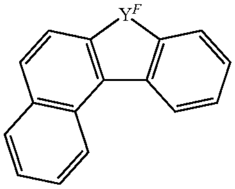
, -continued

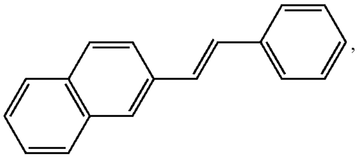
,
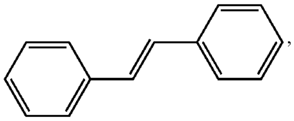
,
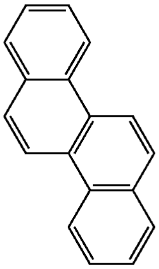
,
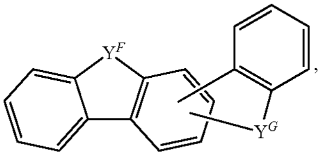
,
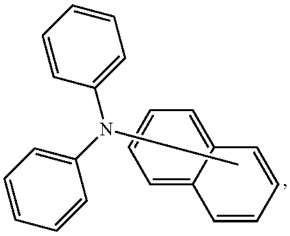
,
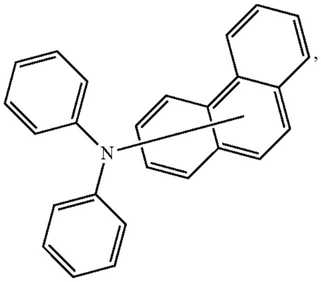
,
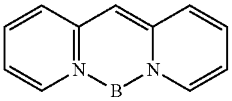
,
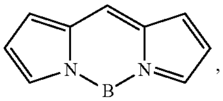
,
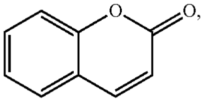
,
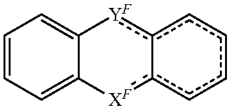
,
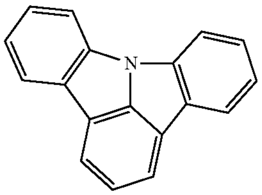
, -continued
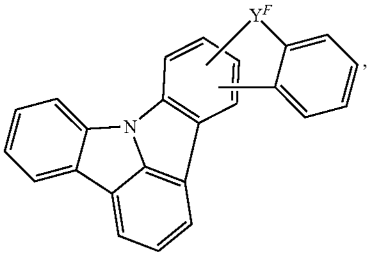
,
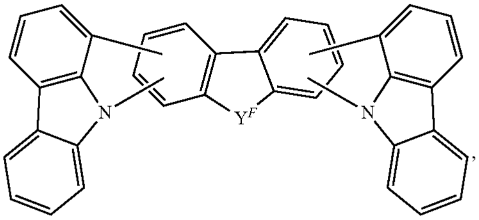
,
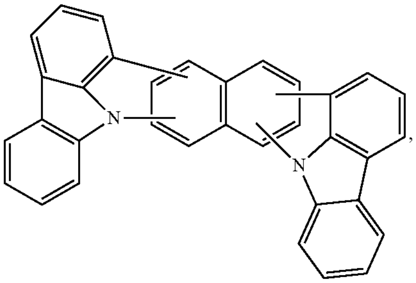
,
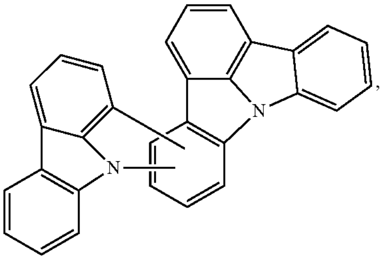
,
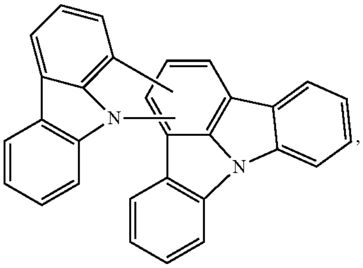
,
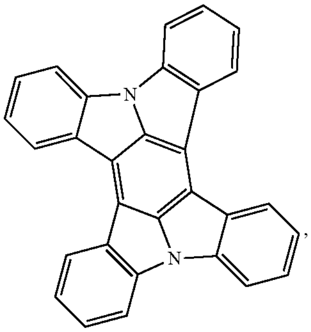
,
-continued
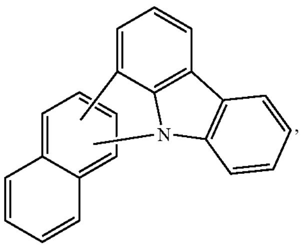
,
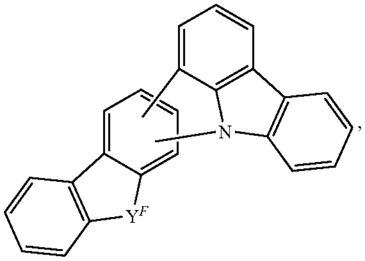
,
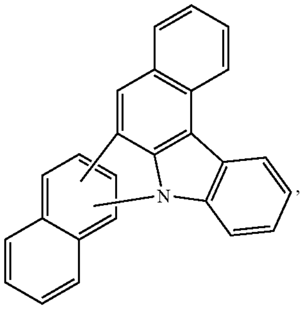
,
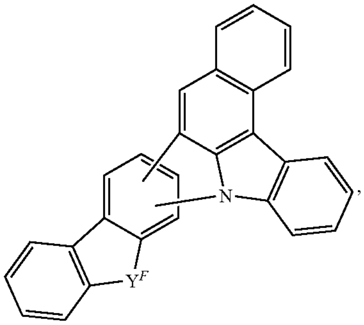
,
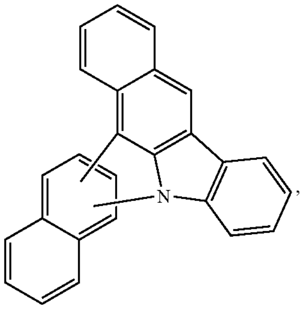
, -continued
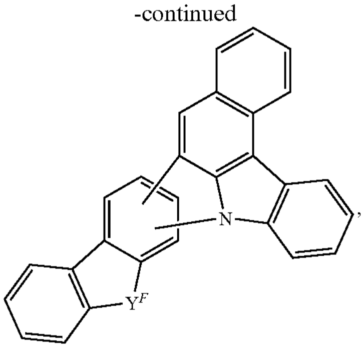
,
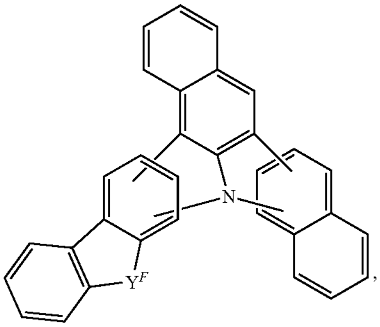
,
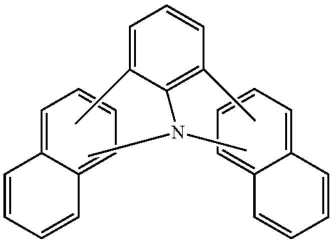
,
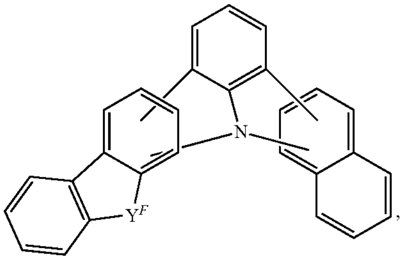
,
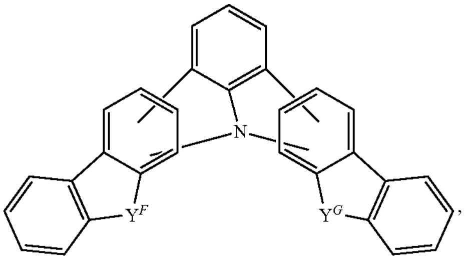
,
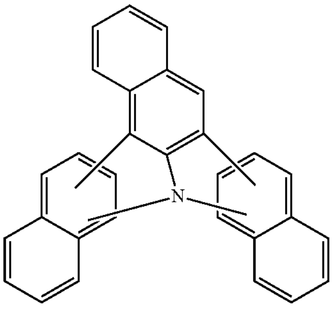
,
-continued
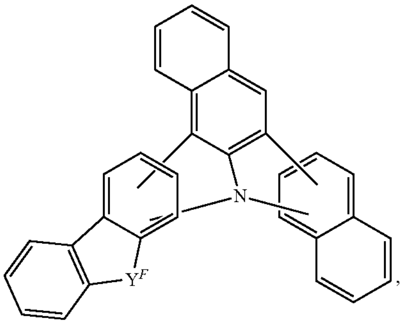
,
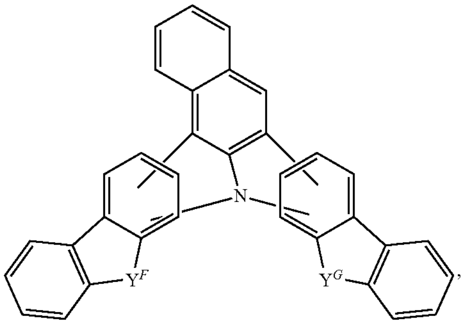
,
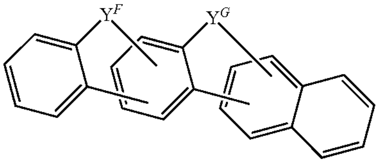
,
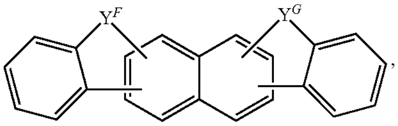
,
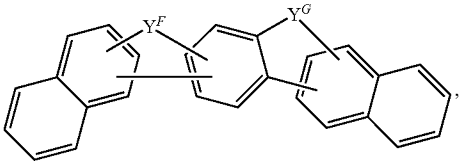
,
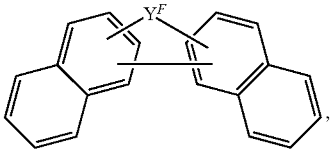
,
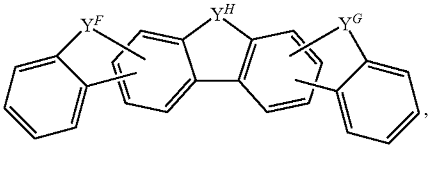
,
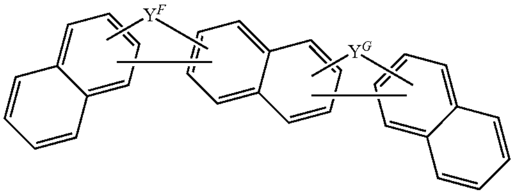
, -continued

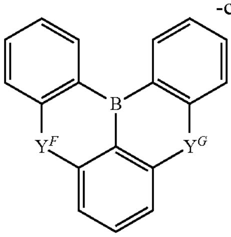

,

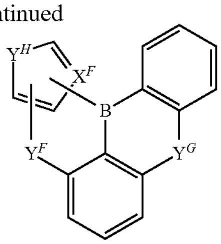

and

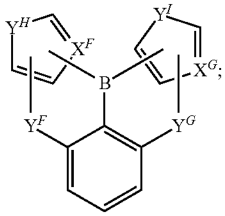

;

wherein $Y^F$, $Y^G$, $Y^H$, and $Y^I$ are each independently selected from the group consisting of B, C, Si, Ge, N, P, O, S, Se, C=O, S=O, and $SO_2$;

wherein $X^F$ and $X^G$ are each independently selected from the group consisting of C and N.

In some of the above embodiments, any carbon ring atoms up to maximum of a total number of three, together with their substituents, in each phenyl ring of any of above structures can be replaced with N.

In yet another aspect, the OLED of the present disclosure may also comprise an emissive region containing a compound or a formulation of the compound as disclosed in the above compounds section of the present disclosure. In some embodiments, the emissive region can comprise a compound or a formulation of the compound as described herein. In some embodiments, the emissive region consists of one or more organic layers, wherein at least one of the one or more organic layers has a minimum thickness selected from the group consisting of 350, 400, 450, 500, 550, 600, 650 and 700 Å. In some embodiments, the at least one of the one or more organic layers are formed from an Emissive System that has a figure of merit (FOM) value equal to or larger than the number selected from the group consisting of 2.50, 2.55, 2.60, 2.65, 2.70, 2.75, 2.80, 2.85, 2.90, 2.95, 3.00, 5.00, 10.0, 15.0, and 20.0. The definition of FOM is available in U.S. patent Application Publication No. 2023/0292605, and its entire contents are incorporated herein by reference. In some embodiments, the at least one of the one or more organic layers comprises a compound or a formulation of the compound as disclosed in Sections A and D of the present disclosure.

In some embodiments, the OLED or the emissive region comprising the inventive compound disclosed herein can be incorporated into a full-color pixel arrangement of a device. The full-color pixel arrangement of such device comprises at least one pixel, wherein the at least one pixel comprises a first subpixel and a second subpixel. The first subpixel includes a first OLED comprising a first emissive region. The second subpixel includes a second OLED comprising a second emissive region. In some embodiments, the first and/or second OLED, the first and/or second emissive region can be the same or different and each can independently have the various device characteristics and the various embodiments of the inventive compounds included therein, and various combinations and subcombinations of the various device characteristics and the various embodiments of the inventive compounds included therein, as disclosed herein.

In some embodiments, the first emissive region is configured to emit a light having a peak wavelength $\lambda_{max1}$; the second emissive region is configured to emit a light having a peak wavelength $\lambda_{max2}$. In some embodiments, the difference between the peak wavelengths $\lambda_{max1}$ and $\lambda_{max2}$ is at least 4 nm but within the same color. For example, a light blue and a deep blue light as described above. In some embodiments, a first emissive region is configured to emit a light having a peak wavelength $\lambda_{max1}$ in one region of the visible spectrum of 400-500 nm, 500-600 nm, 600-700 nm; and a second emissive region is configured to emit light having a peak wavelength $\lambda_{max2}$ in one of the remaining regions of the visible spectrum of 400-500 nm, 500-600 nm, 600-700 nm. In some embodiments, the first emissive region comprises a first number of emissive layers that are deposited one over the other if more than one; and the second emissive region comprises a second number of emissive layers that is deposited one over the other if more than one; and the first number is different from the second number. In some embodiments, both the first emissive region and the second emissive region comprise a phosphorescent materials, which may be the same or different. In some embodiments, the first emissive region comprises a phosphorescent material, while the second emissive region comprises a fluorescent material. In some embodiments, both the first emissive region and the second emissive region comprise a fluorescent materials, which may be the same or different.

In some embodiments, the at least one pixel of the OLED or emissive regions includes a total of N subpixels; wherein the N subpixels comprises the first subpixel and the second subpixel; wherein each of the N subpixels comprises an emissive region; wherein the total number of the emissive regions within the at least one pixel is equal to or less than N−1. In some embodiments, the second emissive region is exactly the same as the first emissive region; and each subpixel of the at least one pixel comprises the same one emissive region as the first emissive region. In some embodiments, the full-color pixel arrangements can have a plurality of pixels comprising a first pixel region and a second pixel region; wherein at least one display characteristic in the first pixel region is different from the corresponding display characteristic of the second pixel region, and wherein the at least one display characteristic is selected from the group consisting of resolution, cavity mode, color, outcoupling, and color filter.

In some embodiments, the OLED is a stacked OLED comprising one or more charge generation layers (CGLs). In some embodiments, the OLED comprises a first electrode, a first emissive region disposed over the first electrode, a first CGL disposed over the first emissive region, a second emissive region disposed over the first CGL, and a second electrode disposed over the second emissive region. In some embodiments, the first and/or the second emissive regions can have the various device characteristics as described above for the pixelated device. In some embodiments, the stacked OLED is configured to emit white color. In some embodiments, one or more of the emissive regions in a pixelated or in a stacked OLED comprises a sensitizer and an acceptor with the various sensitizing device characteristics and the various embodiments of the inventive compounds disclosed herein. For example, the first emissive region is comprised in a sensitizing device, while the second emissive region is not comprised in a sensitizing device; in some instances, both the first and the second emissive regions are comprised in sensitizing devices.

In some embodiments, the OLED can emit light having at least 1%, 5%, 10, 30%, 50%, 70%, 80%, 90%, 95%, 99%, or 100% from the plasmonic mode. In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. In some embodiments, the enhancement layer is provided no more than a threshold distance away from the organic emissive layer, wherein the emitter material has a total non-radiative decay rate constant and a total radiative decay rate constant due to the presence of the enhancement layer. A threshold distance is where the total non-radiative decay rate constant is equal to the total radiative decay rate constant. Another threshold distance is the distance at which the total radiative decay rate constant divided by the sum of the total non-radiative decay rate constant and total radiative decay rate constant is equal to the photoluminescent yield of the emissive material without the enhancement layer present.

In some embodiments, the OLED further comprises an outcoupling layer. In some embodiments, the outcoupling layer is disposed over the enhancement layer on a side opposite the organic emissive layer The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and a reduced efficiency roll-off of the OLED device. Placement of the enhancement layer on the cathode side, anode side, or on both sides, or the enhancement layer itself being as the CGL, results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

In some embodiments, the enhancement layer can be comprised of plasmonic materials, optically active metamaterials, or hyperbolic metamaterials. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, or Ca, alloys or mixtures of these materials, and stacks of these materials. In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly.

In some embodiments, the outcoupling layer has wavelength-sized or sub-wavelength sized features that are arranged periodically, quasi-periodically, or randomly. In some embodiments, the outcoupling layer may be composed of a plurality of nanoparticles. In some embodiments, the outcoupling layer is composed of a plurality of nanoparticles disposed over a material. In these embodiments the outcoupling layer may be tunable by at least one of: varying a size of the plurality of nanoparticles, varying a shape of the plurality of nanoparticles, changing a material of the plurality of nanoparticles, adjusting a thickness of the material, changing the refractive index of the material, adding an additional layer disposed on the plurality of nanoparticles, varying a thickness of the enhancement layer, or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, and Ca, alloys or mixtures of these materials, and stacks of these materials. In some embodiments the outcoupling layer is formed by lithography.

In some embodiments of plasmonic device, the emitter, and/or host compounds used in the emissive layer has a vertical dipole ratio (VDR) of 0.33 or more. In some such embodiments, the emitter, and/or host compounds have a VDR of 0.40, 0.50, 0.60, 0.70, or more.

In yet another aspect, the present disclosure also provides a consumer product comprising an organic light-emitting device (OLED) having an anode; a cathode; and an organic layer disposed between the anode and the cathode, wherein the organic layer may comprise a compound or a formulation of the compound as disclosed in the above compounds section of the present disclosure.

In some embodiments, the consumer product comprises an OLED having an anode; a cathode; and an organic layer disposed between the anode and the cathode, wherein the organic layer may comprise the compound as described herein.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, and an "exciton," which is a localized electron-hole pair having an excited energy state, is formed. Light is emitted when the exciton relaxes via a photoemissive mechanism. In some cases, the exciton may be localized as an excimer or an exciplex. Non-radiative mechanisms, such as thermal relaxation, may also occur, but are generally considered undesirable.

FIG. 1 shows an organic light emitting device 100. The figures are not necessarily drawn to scale. Device 100 may include a substrate 110, an anode 115, a hole injection layer (HIL) 120, a hole transport layer (HTL) 125, an electron blocking layer (EBL) 130, an emissive layer (EML) 135, a hole blocking layer (HBL) 140, an electron transport layer (ETL) 145, an electron injection layer (EIL) 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
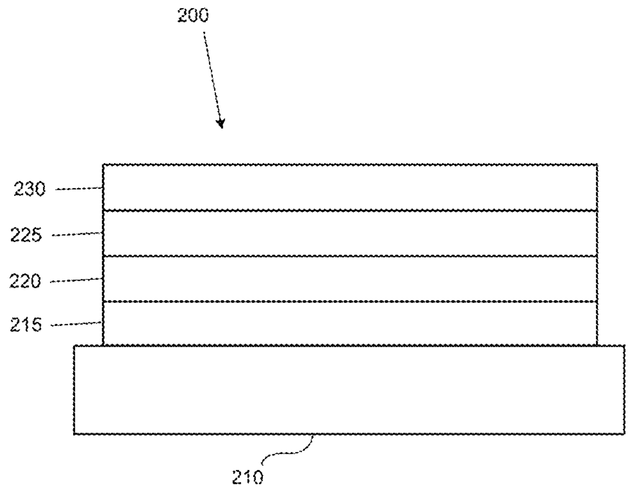
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an “inverted” OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an “organic layer” disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP, also referred to as organic vapor jet deposition (OVJD)), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation, sputtering, chemical vapor deposition, atomic layer deposition, and electron beam deposition. Preferred patterning methods include deposition through a mask, photolithography, and cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a plurality of alternative layers of polymeric material and non-polymeric material; organic material and inorganic material; or a mixture of a polymeric material and a non-polymeric material as one example described in U.S. Pat. No. 7,968,146, PCT Pat. Application Nos. PCT/US2007/023098 and PCT/US2009/042829, which are herein incorporated by reference in their entireties.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes. In some embodiments, the OLED further comprises one or more quantum dots. Such quantum dots can be in the emissive layer, or in other functional layers, such as a down conversion layer.

In some embodiments, the OLED comprises a RGB pixel arrangement or white plus color filter pixel arrangement. In some embodiments, the OLED is a mobile device, a handheld device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

D. Other Materials Used in the OLED

The materials described herein are as various examples useful for a particular layer in an OLED. They may also be used in combination with a wide variety of other materials present in the device. For example, host materials disclosed herein may be used by themselves in the EML, or in conjunction with a wide variety of other emitters, hosts, transport layers, blocking layers, injection layers, electrodes and other layers that may be present. The materials described or referred to below are non-limiting examples of materials that may be useful in combination with the compounds and the devices disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer. In some embodiments, conductivity dopants comprises at least one chemical moiety selected from the group consisting of cyano, fluorinated aryl or heteroaryl, fluorinated alkyl or cycloalkyl, alkylene, heteroaryl, amide, benzodithiophene, and highly conjugated heteroaryl groups extended by non-ring double bonds.

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

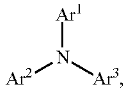
,
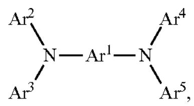
,

-continued

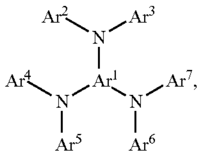

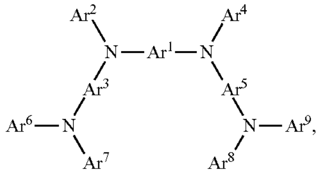

and

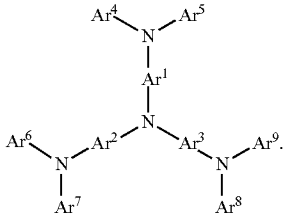

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each of $Ar^1$ to $Ar^9$ may be unsubstituted or may be substituted by a general substituent as described above, any two substituents can be joined or fused into a ring.

In some embodiments, each $Ar^1$ to $Ar^9$ independently comprises a moiety selected from the group consisting of:

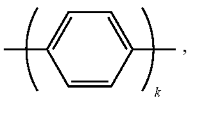

,

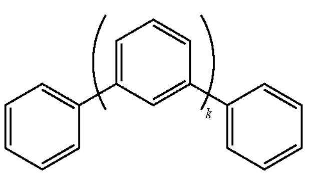

,

-continued

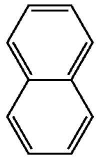

,

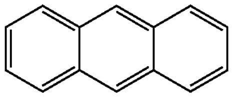

,

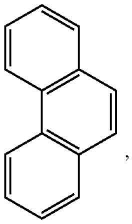

,

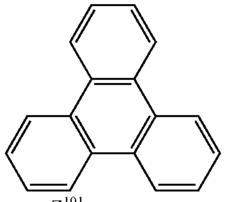

, and

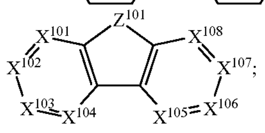

wherein k is an integer from 1 to 20; $X^{101}$ to $X^{108}$ is C or N; $Z^{101}$ is C, N, O, or S.

Examples of metal complexes used in HIL or HTL include, but are not limited to the following general formula:

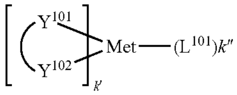

wherein Met is a metal, which can have an atomic weight greater than 40; $(Y^{101}\text{-}Y^{102})$ is a bidentate ligand, the coordinating atoms of $Y^{101}$ and $Y^{102}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, $(Y^{101}\text{-}Y^{102})$ is a 2-phenylpyridine or 2-phenylimidazole derivative. In some embodiments, $(Y^{101}\text{-}Y^{102})$ is a carbene ligand. In some embodiments, Met is selected from Ir, Pt, Pd, Os, Cu, and Zn. In some embodiments, the metal complex has a smallest oxidation potential in solution vs. $Fc^+/Fc$ couple less than about 0.6 V.

In some embodiments, the HIL/HTL material is selected from the group consisting of phthalocyanine and porphryin compounds, starburst triarylamines, CFX fluorohydrocarbon polymer, conducting polymers (e.g., PEDOT:PSS, polyaniline, polypthiophene), phosphonic acid and sliane SAMs, triarylamine or polythiophene polymers with conductivity dopants, Organic compounds with conductive inorganic compounds (such as molybdenum and tungsten oxides), n-type semiconducting organic complexes, metal organometallic complexes, cross-linkable compounds, polythiophene based polymers and copolymers, triarylamines, triaylamine with spirofluorene core, arylamine carbazole compounds, triarylamine with (di)benzothiophene/(di)benzofuran, indolocarbazoles, isoindole compounds, and metal carbene complexes.

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than one or more emitters closest to the EBL interface. In some embodiments, the compound used in EBL contains at least one carbazole group and/or at least one arylamine group. In some embodiments the HOMO level of the compound used in the EBL is shallower than the HOMO level of one or more of the hosts in the EML. In some embodiments, the compound used in EBL contains the same molecule or the same functional groups used as one of the hosts described herein.

d) Additional Hosts:

The light emitting layer of the organic EL device of the present disclosure preferably contains at least a light emitting material as the dopant, and a host material. Examples of the host material are not particularly limited, and any metal complexes or organic compounds may be used as long as the host won't fully quench the emission of the dopant. In some embodiments, the emissive layer can comprise two hosts, a first host and a second host. In some embodiments, the first host is a hole transporting host, and the second host is an electron transporting host. In some embodiments, the first host is a hole transporting host, and the second host is a bipolar host. In some embodiments, the first host is an electron transporting host, and the second host is a bipolar host. In some embodiments, the first host and the second host can form an exciplex. In some embodiments, the emissive layer can comprise a third host. In some embodiments, the third host is selected from the group consisting of an insulating host (wide band gap host), a hole transporting host, and an electron transporting host. In some embodiments, the third host forms an exciplex with one of the first host and the second host, or with both the first host and the second host. In some embodiments, the emissive layer can comprise a fourth host. In some embodiments, the fourth host is selected from the group consisting of an insulating host (wide band gap host), a hole transporting host, and an electron transporting host. In some embodiments, the fourth host forms an exciplex with one of the first host, the second host, and the third host, with two of the first host, the second host, and the third host, or with each of the first host, the second host, and the third host. In some embodiments, the electron transporting host has a LUMO less than −2.4 eV, less than −2.5 eV, less than −2.6 eV, or less than −2.7 eV. In some embodiments, the hole transporting host has a HOMO higher than −5.6 eV, higher than −5.5 eV, higher than −5.4 eV, or higher than −5.35 eV. The HOMO and LUMO values can be determined using solution electrochemistry. Solution cyclic voltammetry and differential pulsed voltammetry can be performed using a CH Instruments model 6201B potentiostat using anhydrous dimethylformamide (DMF) solvent and tetrabutylammonium hexafluorophosphate as the supporting electrolyte. Glassy carbon, platinum wire, and silver wire were used as the working, counter and reference electrodes, respectively. Electrochemical potentials can be referenced to an internal ferrocene-ferroconium redox couple (Fc/Fc+) by measuring the peak potential differences from differential pulsed voltammetry. The corresponding highest occupied molecular orbital (HOMO) and lowest unoccupied molecular orbital (LUMO) energies can be determined by referencing the cationic and anionic redox potentials to ferrocene (4.8 eV vs. vacuum) according to literature ((a) Fink, R.; Heischkel, Y.; Thelakkat, M.; Schmidt, H.-W. *Chem. Mater.* 1998, 10, 3620-3625. (b) Pommerehne, J.; Vestweber, H.; Guss, W.; Mahrt, R. F.; Bassler, H.; Porsch, M.; Daub, *J. Adv. Mater.* 1995, 7, 551).

In some embodiments, the inventive compounds described herein can be used as a one of the hosts as described above, and the compounds described below can be used as one or more other hosts as described above.

Examples of metal complexes used as one or more other hosts are preferred to have the following general formula:

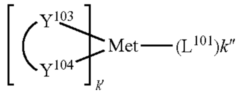

wherein Met is a metal; ($Y^{103}$-$Y^{104}$) is a bidentate ligand, the coordinating atoms of $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, the metal complexes are:

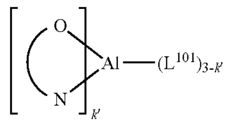 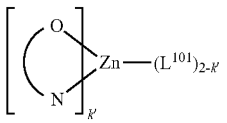

wherein (O—N) is a bidentate ligand, having metal coordinated to atoms O and N.

In some embodiments, Met is selected from Ir and Pt. In a further embodiments, ($Y^{103}$-$Y^{104}$) is a carbene ligand.

In some embodiments, the one or more other hosts contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, aza-dibenzothiophene, aza-dibenzofuran, aza-dibenzoselenophene, aza-carbazole, aza-indolocarbazole, aza-triphenylene, aza-tetraphenylene, 5$\lambda^2$-benzo[d]benzo[4,5]imidazo[3,2-a]imidazole, 5,9-dioxa-13b-boranaphtho[3,2,1-de]anthracene; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by the general substituents as described herein or may be further fused.

In some embodiments, the one or more other hosts comprises at least one of the moieties selected from the group consisting of:

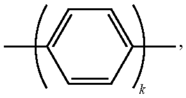,

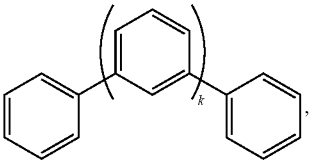,

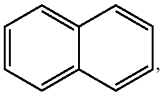,

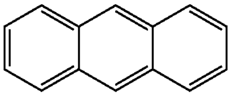,

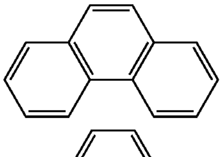,

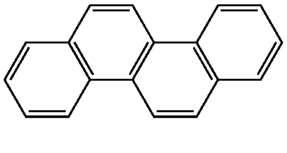,

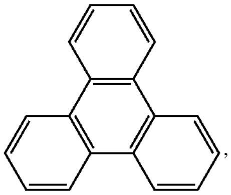,

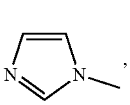,

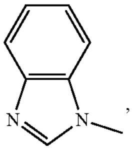,

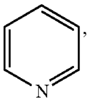,

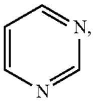

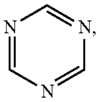

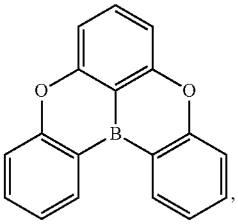,

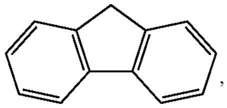,

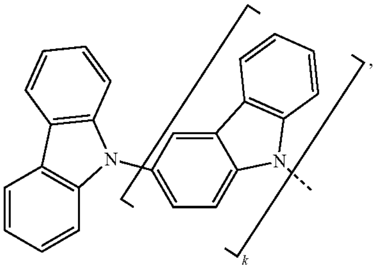,

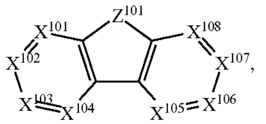

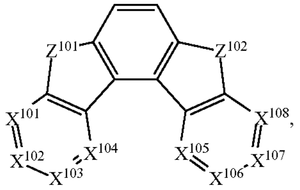

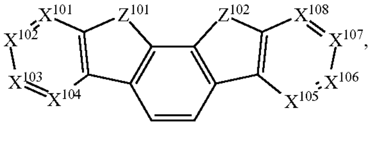

-continued

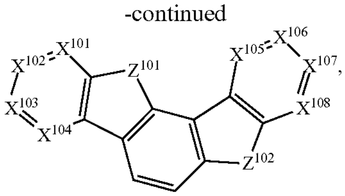

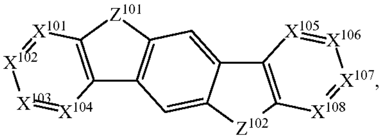

and

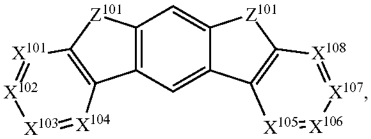

wherein k is an integer from 0 to 20 or 1 to 20. $X^{101}$ to $X^{108}$ are independently selected from C or N. $Z^{101}$ and $Z^{102}$ are independently selected from C, N, O, or S.

In some embodiments, the one or more other hosts is selected from the group consisting of arylcarbazoles, metal 8-hydroxyquinolates, (e.g., alq3, balq), metal phenoxybenzothiazole compounds, conjugated oligomers and polymers (e.g., polyfluorene), aromatic fused rings, zinc complexes, chrysene based compounds, aryltriphenylene compounds, poly-fused heteroaryl compounds, donor acceptor type molecules, dibenzofuran/dibenzothiophene compounds, polymers (e.g., pvk), spirofluorene compounds, spirofluorene-carbazole compounds, indolocabazoles, 5-member ring electron deficient heterocycles (e.g., triazole, oxadiazole), tetraphenylene complexes, metal phenoxypyridine compounds, metal coordination complexes (e.g., Zn, Al with N^N ligands), dibenzothiophene/dibenzofuran-carbazole compounds, silicon/germanium aryl compounds, aryl benzoyl esters, carbazole linked by non-conjugated groups, aza-carbazole/dibenzofuran/dibenzothiophene compounds, and high triplet metal organometallic complexes (e.g., metal-carbene complexes).

In some embodiments, the one or more other hosts comprises at least one chemical group selected from the group consisting of triphenylene, carbazole, indolocarbazole, dibenzothiophene, dibenzofuran, dibenzoselenophene, 5$\lambda^2$-benzo[d]benzo[4,5]imidazo[3,2-a]imidazole, 5,9-dioxa-13b-boranaphtho[3,2,1-de]anthracene, azaborinine, oxaborinine, dihydroacridine, xanthene, dihydrobenzoazasiline, dibenzooxasiline, phenoxazine, phenoxathiine, phenothiazine, dihydrophenazine, fluorene, naphthalene, anthracene, phenanthrene, phenanthroline, benzoquinoline, quinoline, isoquinoline, quinazoline, pyrimidine, pyrazine, pyridine, triazine, boryl, silyl, aza-triphenylene, aza-carbazole, aza-indolocarbazole, aza-dibenzothiophene, aza-dibenzofuran, aza-dibenzoselenophene, aza-5$\lambda^2$-benzo[d]benzo[4,5]imidazo[3,2-a]imidazole, and aza-(5,9-dioxa-13b-boranaphtho[3,2,1-de]anthracene).

In some embodiments, the one or more other hosts can be selected from the group consisting of the structures of the following HOST Group 1:

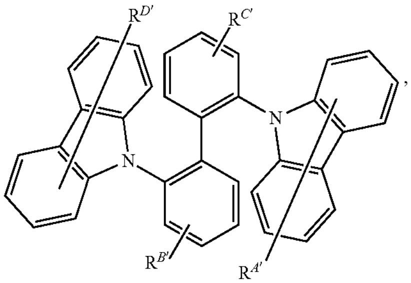
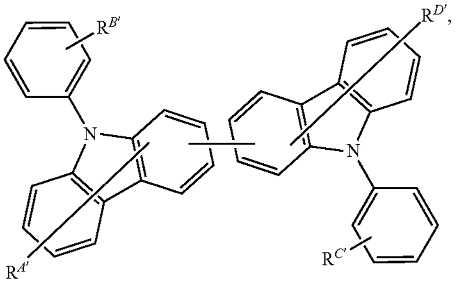
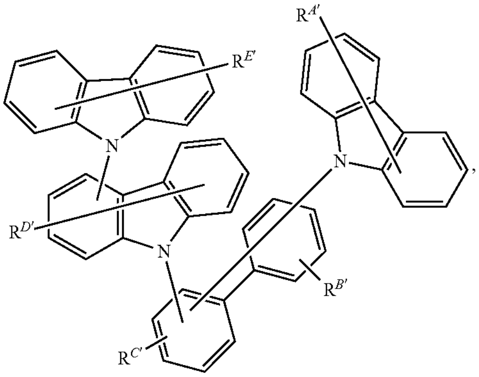
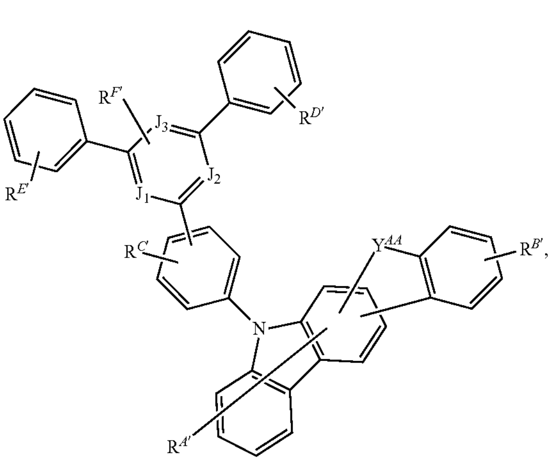
-continued
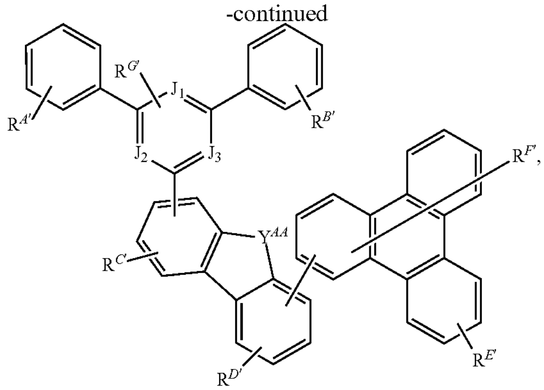
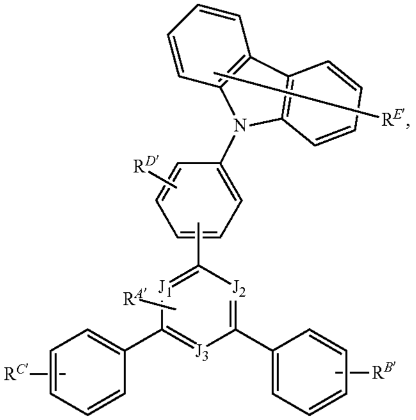
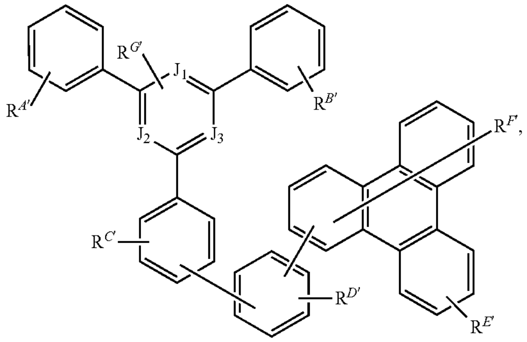
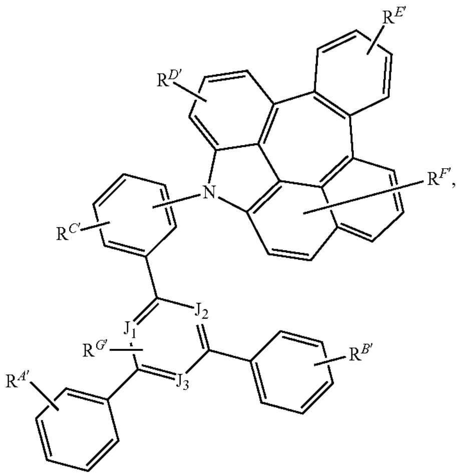

-continued
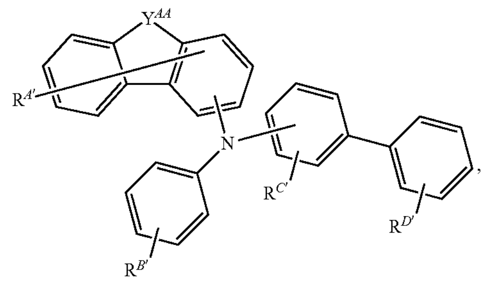
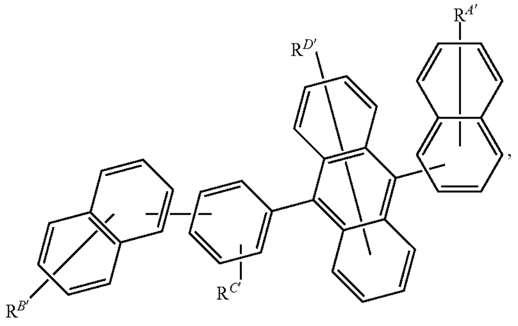
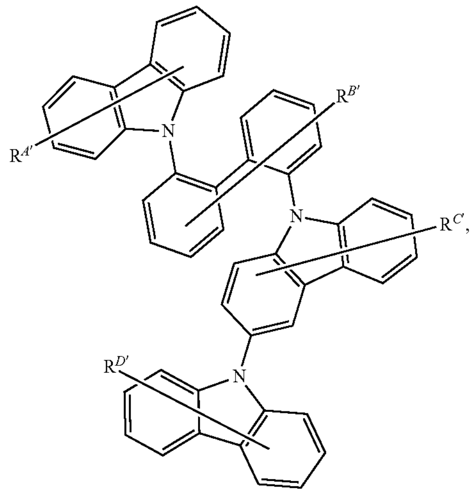
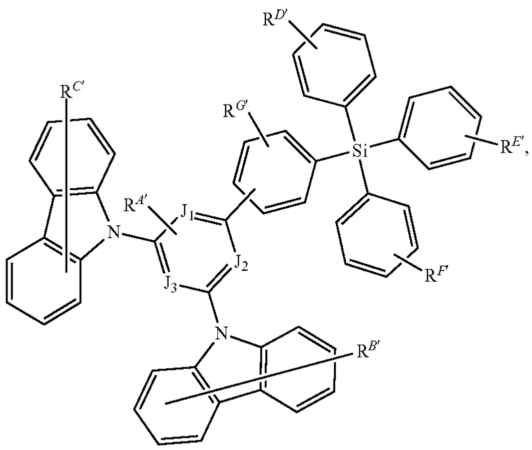
-continued
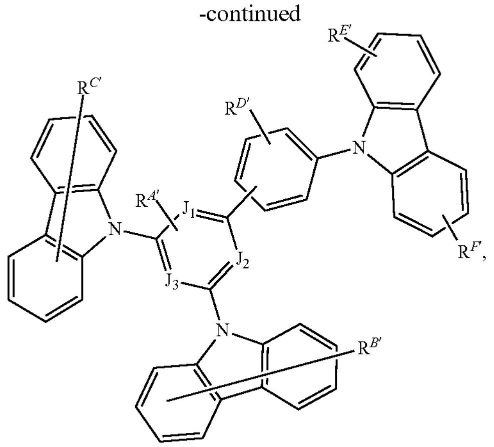
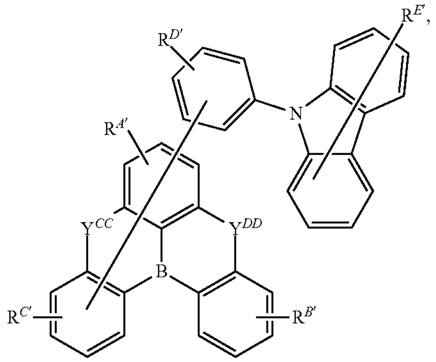
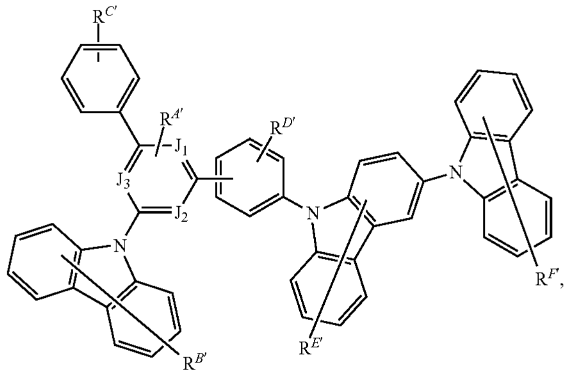
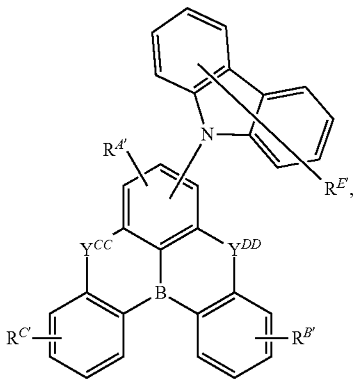

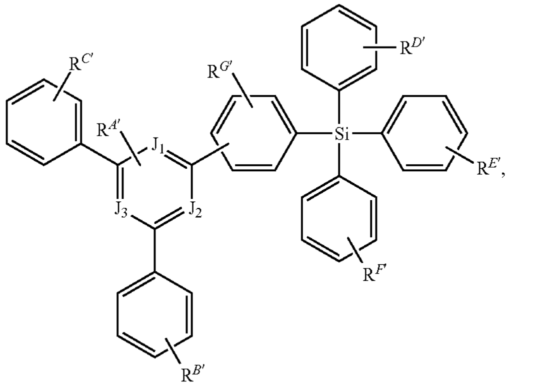
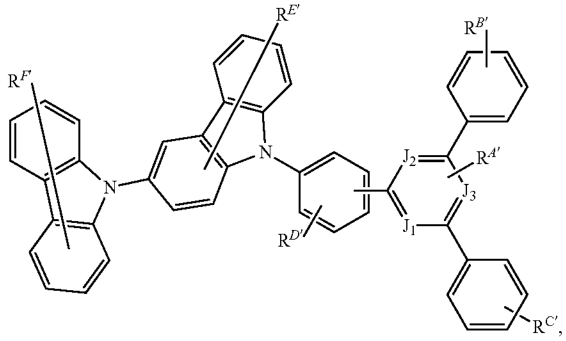
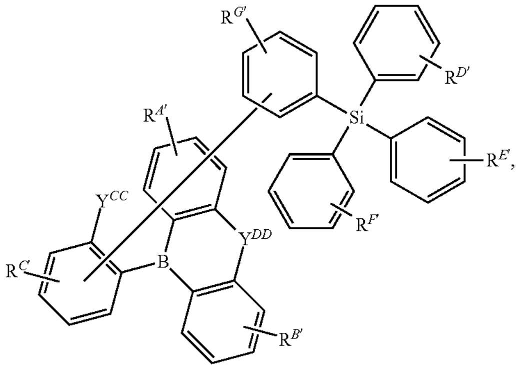
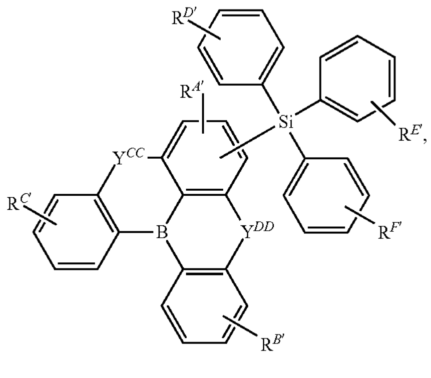
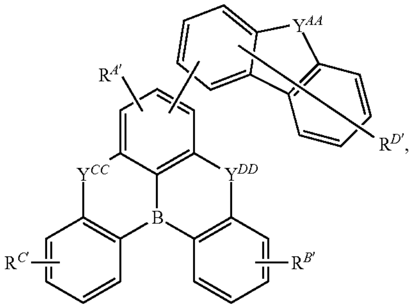
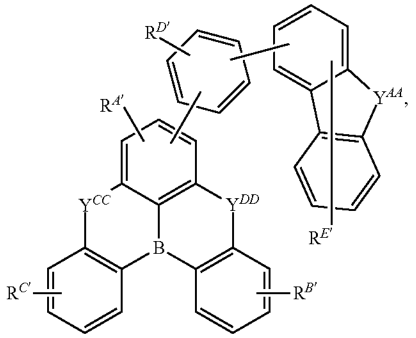
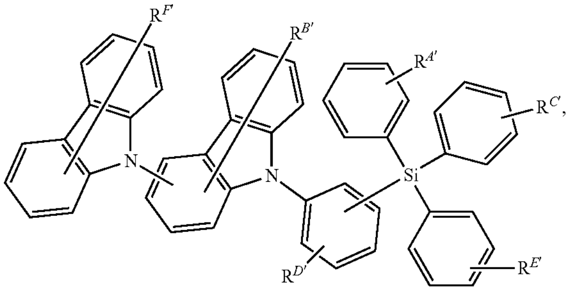
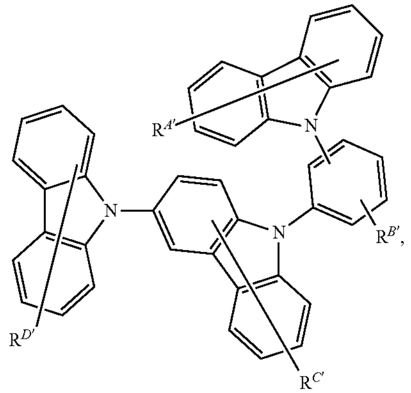
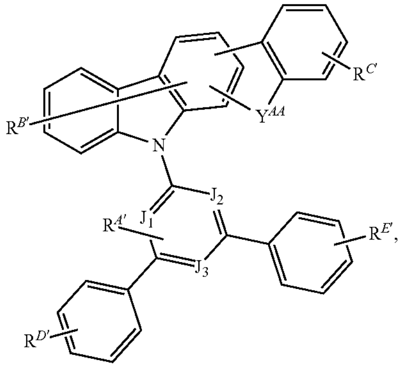

-continued
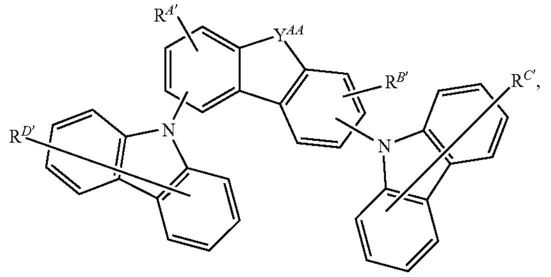
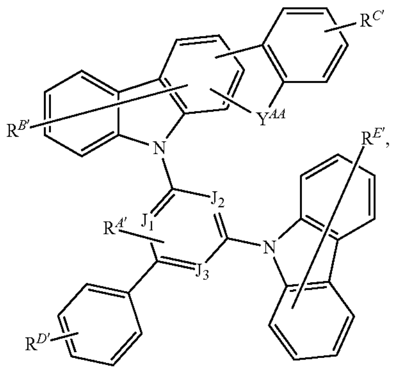
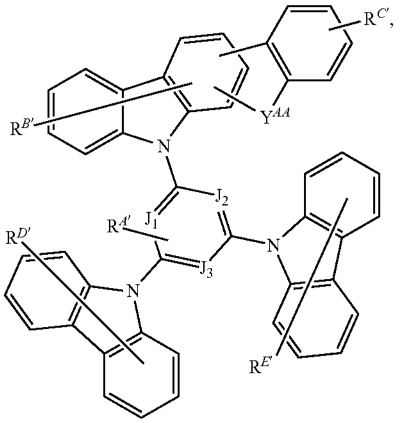
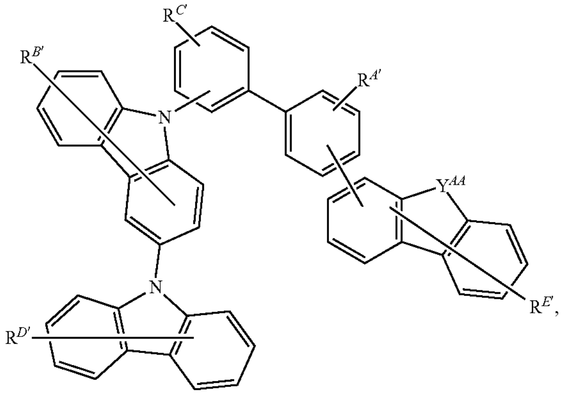
-continued
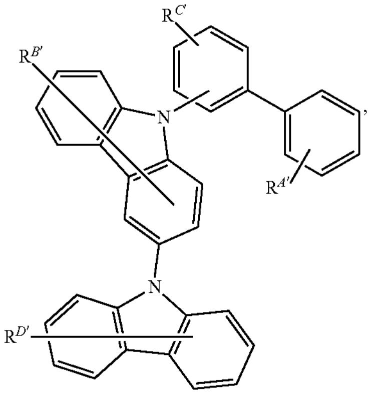
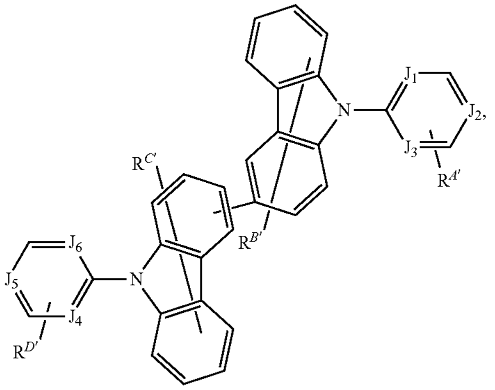
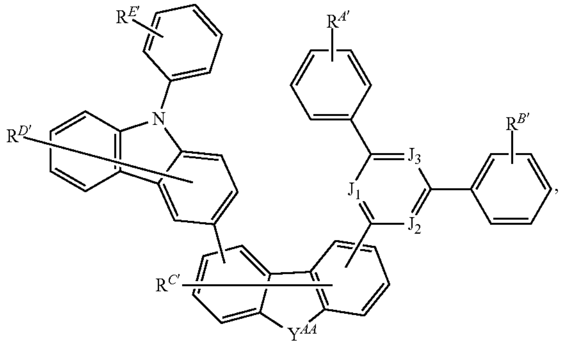
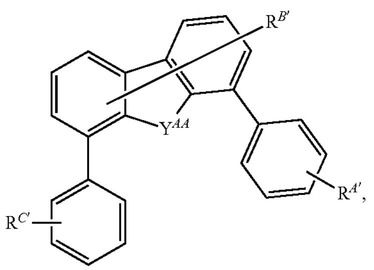

-continued
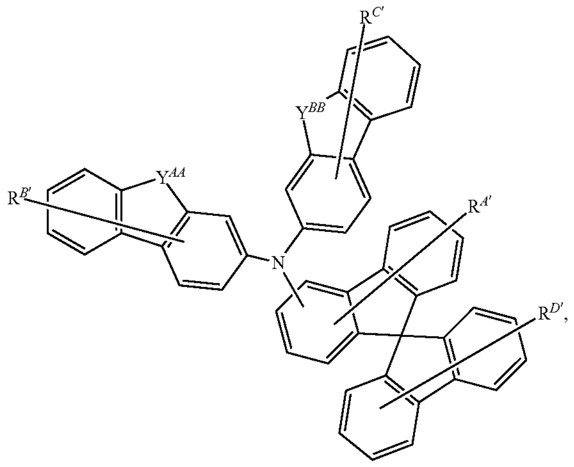
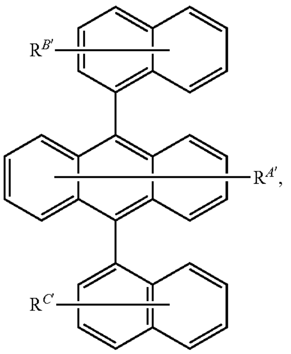
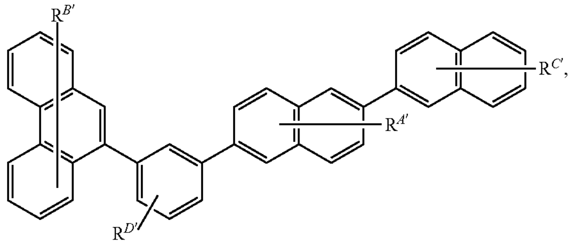
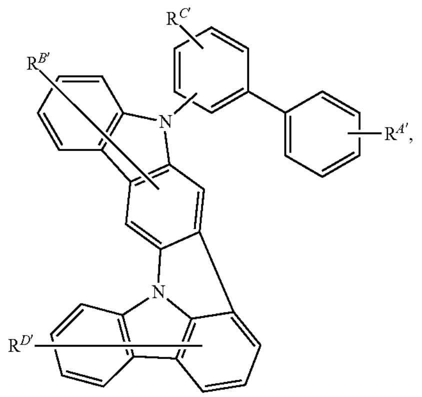
-continued
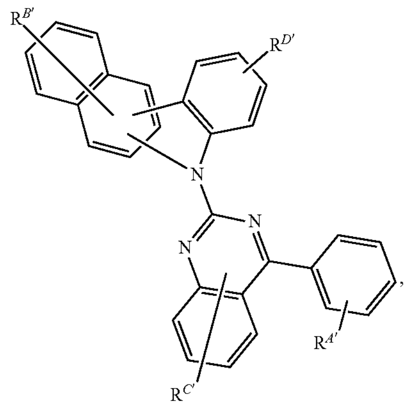
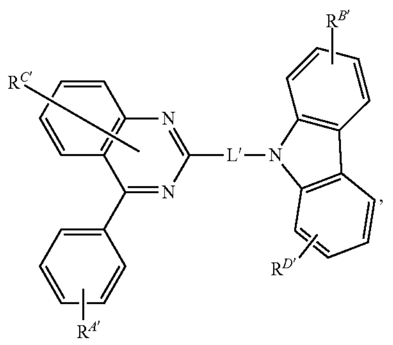
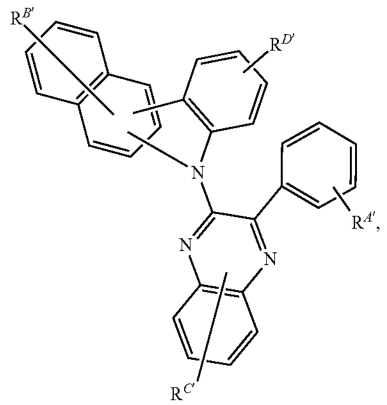
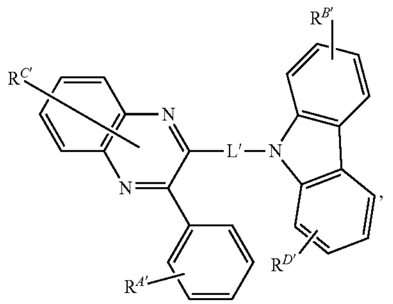

-continued
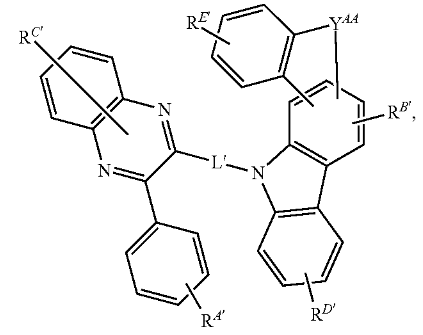
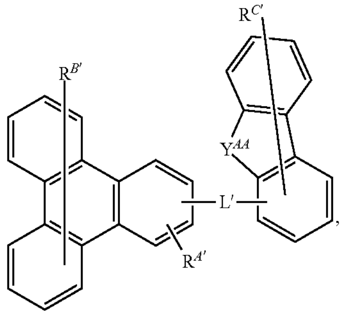
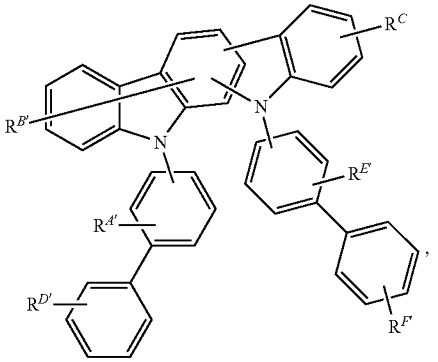
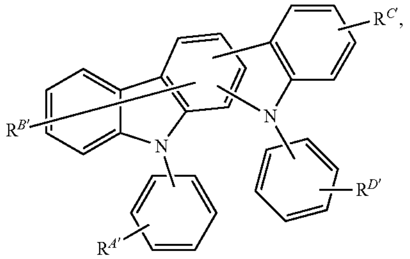
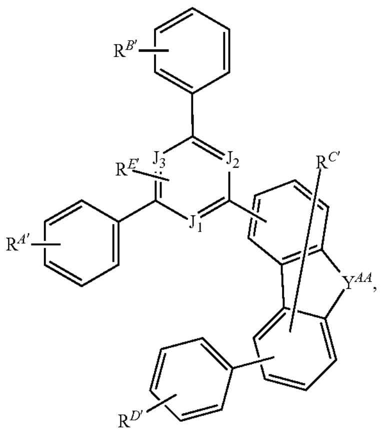
-continued
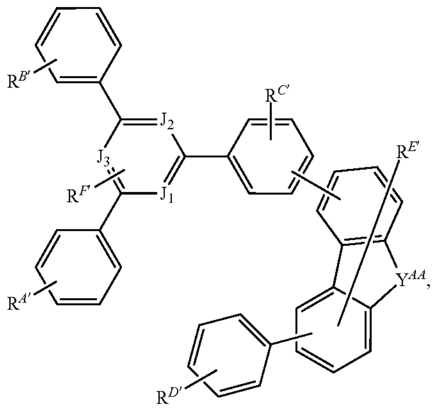
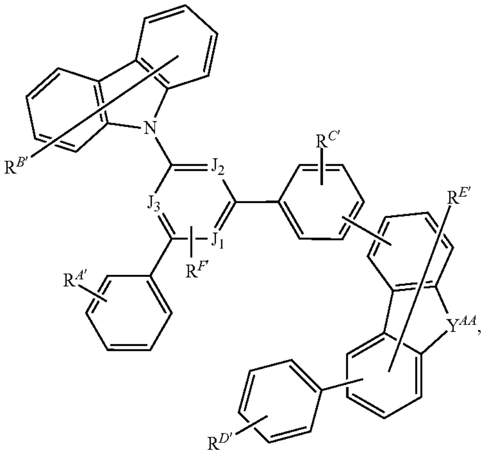
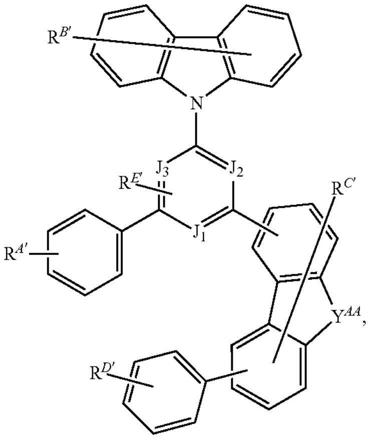
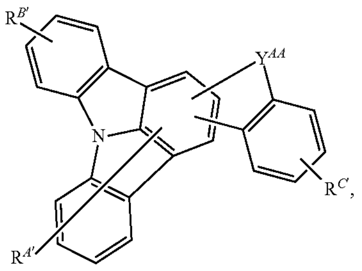

-continued
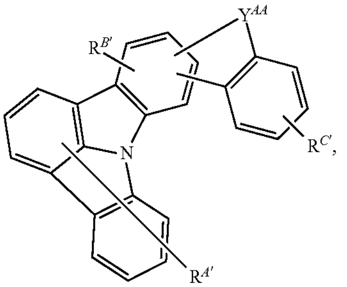
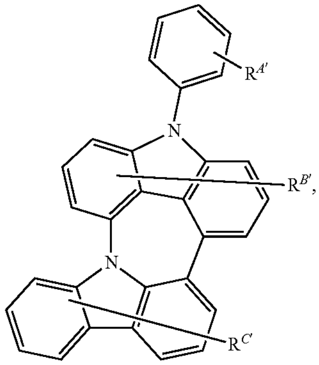
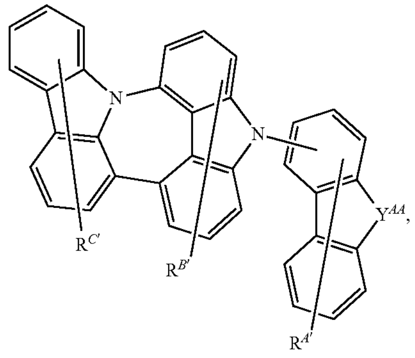
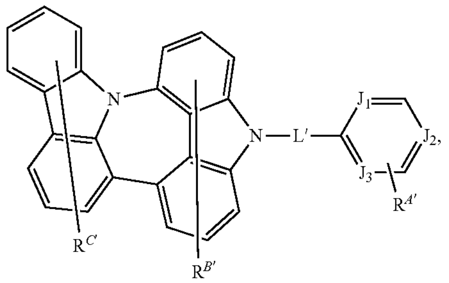
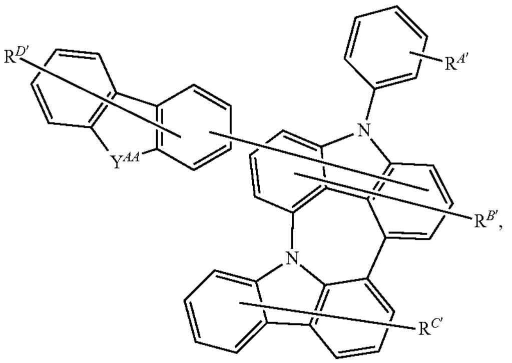
-continued
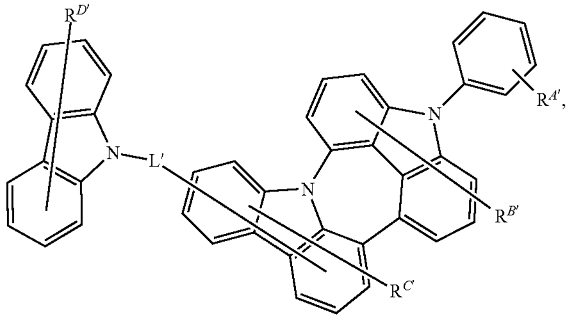
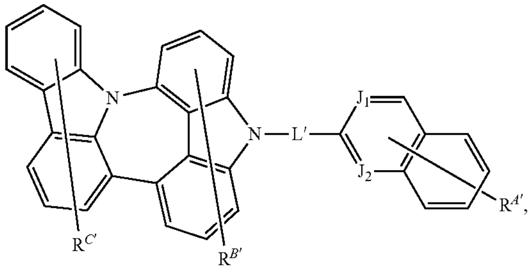
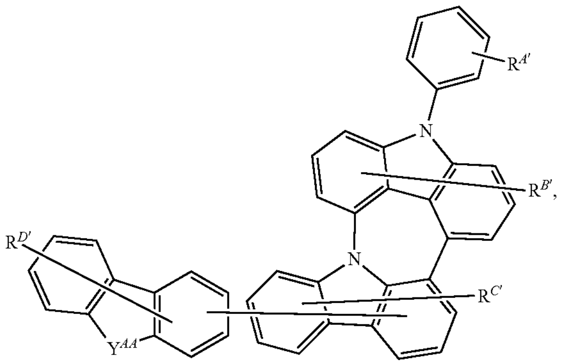
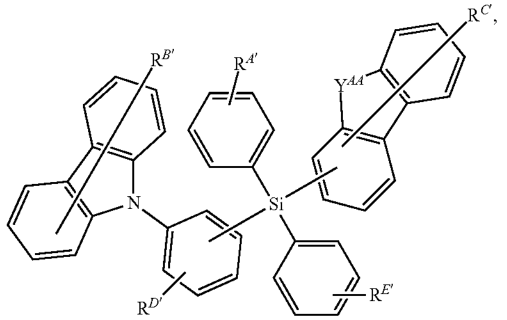
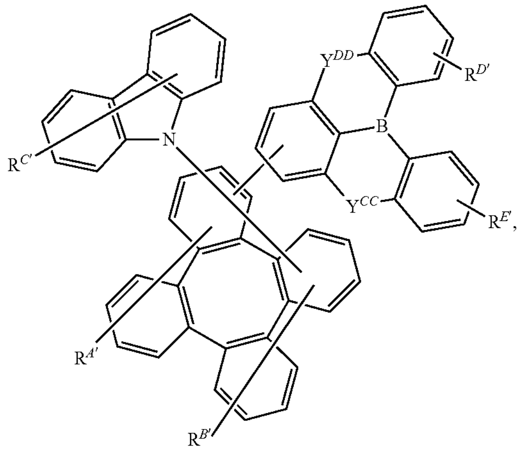

-continued
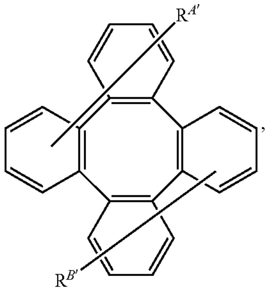
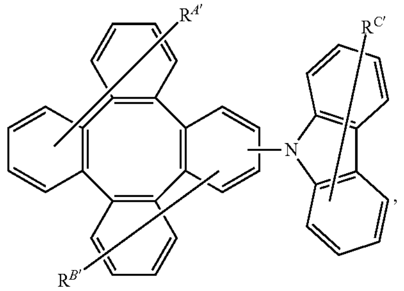
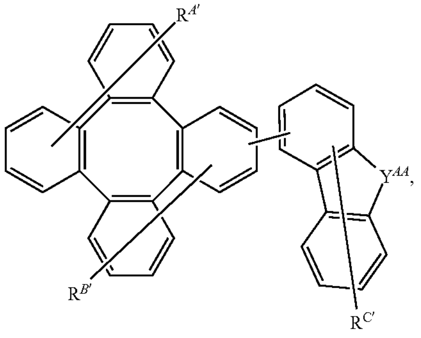
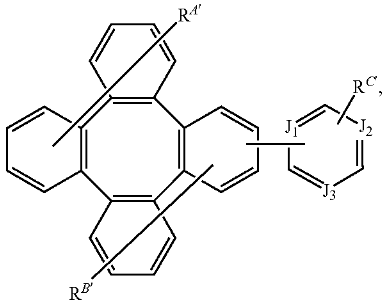
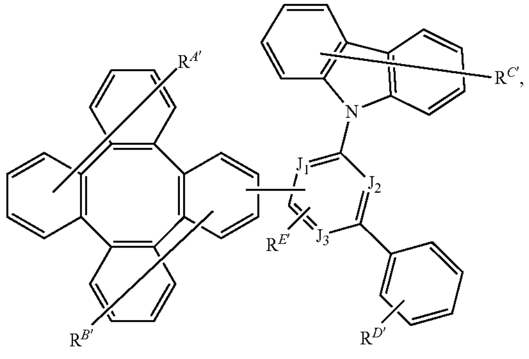
-continued
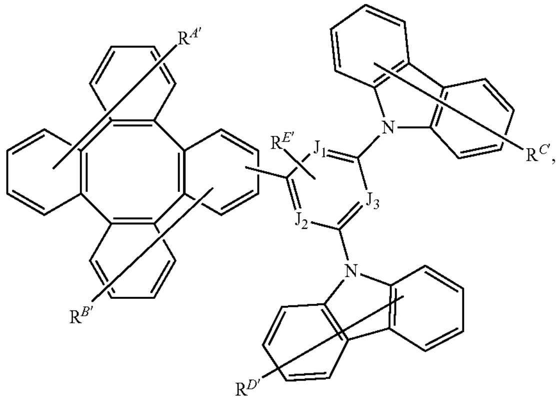
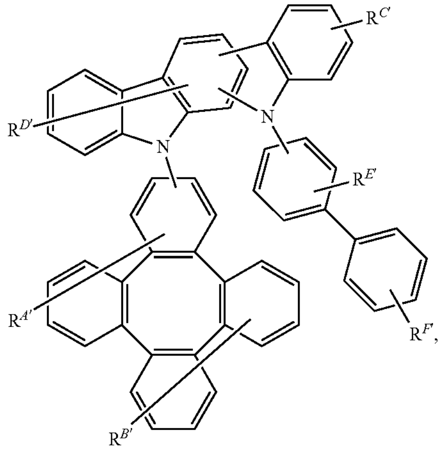
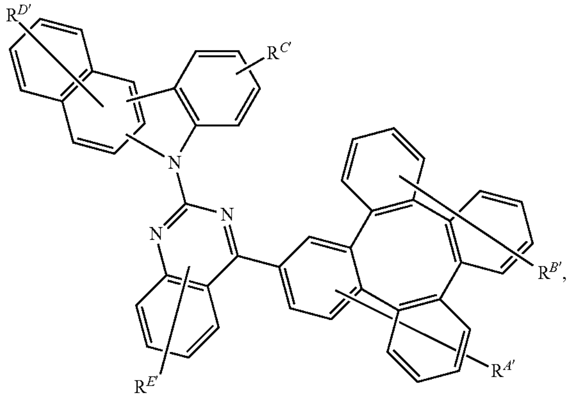
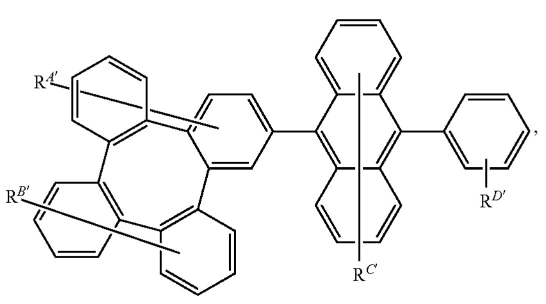

-continued

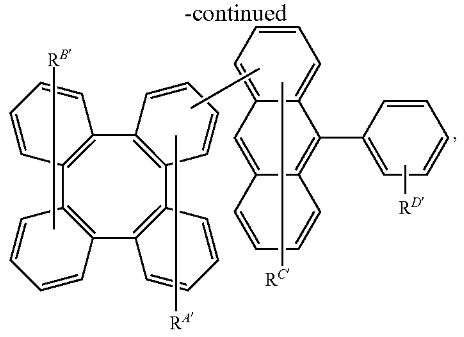

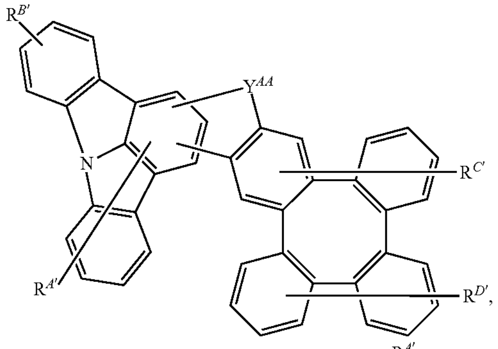

and

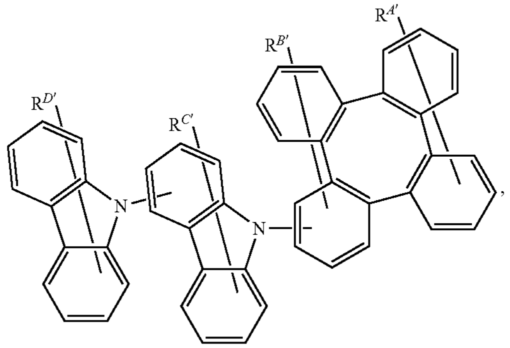

wherein:

each of $J_1$ to $J_6$ is independently C or N;

L' is a direct bond or an organic linker;

each $Y^{AA}$, $Y^{BB}$, $Y^{CC}$ and $Y^{DD}$ is independently selected from the group consisting of absent a bond, direct bond, O, S, Se, CRR', SiRR', GeRR', NR, BR, BRR';

each of $R^{A'}$, $R^{B'}$, $R^{C'}$, $R^{D'}$, $R^{E'}$, $R^{F'}$, and $R^{G'}$ independently represents mono, up to the maximum substitutions, or no substitutions;

each R, R', $R^{A'}$, $R^{B'}$, $R^{C'}$, $R^{D'}$, $R^{E'}$, $R^{F'}$, and $R^{G'}$ is independently a hydrogen or a substituent selected from the group consisting of the general substituents as defined herein; any two substituents can be joined or fused to form a ring;

and where possible, each unsubstituted aromatic carbon atom is optionally replaced with N to form an aza-substituted ring.

In some embodiments at least one of $J_1$ to $J_3$ are N, in some embodiments at least two of $J_1$ to $J_3$ are N, in some embodiments, all three of $J_1$ to $J_3$ are N. In some embodiments, each $Y^{CC}$ and $Y^{DD}$ are preferably O, S, and SiRR', more preferably O, or S. In some embodiments, at least one unsubstituted aromatic carbon atom is replaced with N to form an aza-ring.

In some embodiments, the host is selected from the group consisting of EG1-MG1-EG1 to EG53-MG27-EG53 with a formula of EGa-MGb-EGc, or EG1-EG1 to EG53-EG53 with a formula of EGa-EGc when MGb is absent, wherein a is an integer from 1 to 53, b is an integer from 1 to 27, c is an integer from 1 to 53. The structure of EG1 to EG53 is shown below:

EG1

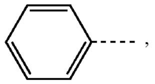

EG2

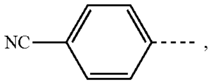

EG3

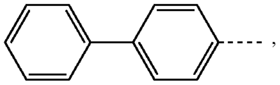

EG4

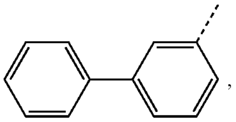

EG5

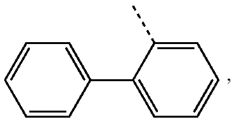

EG6

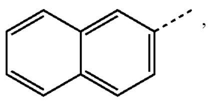

EG7

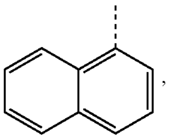

EG8

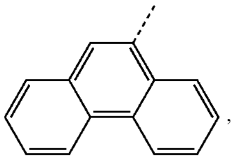

EG9

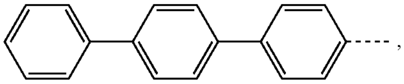

EG10

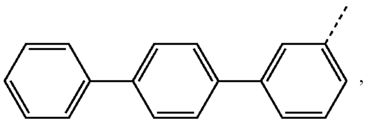

EG11

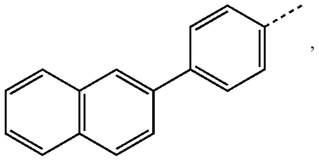

-continued
EG12
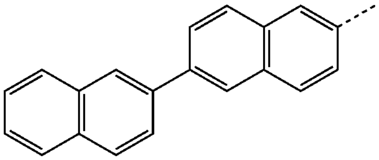,
EG13
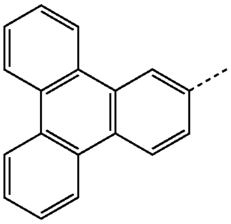,
EG14
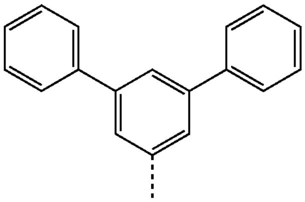,
EG15
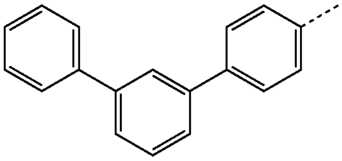,
EG16
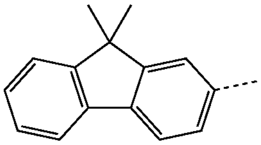,
EG17
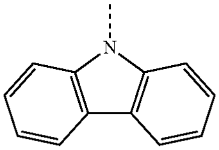,
EG18
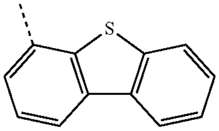,
EG19
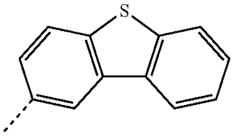,
EG20
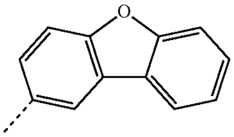,
-continued
EG21
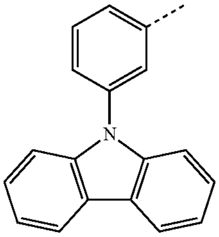,
EG22
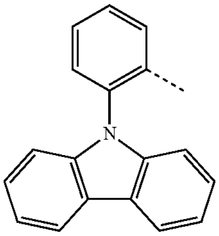,
EG23
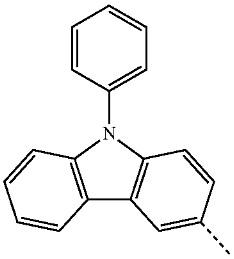,
EG24
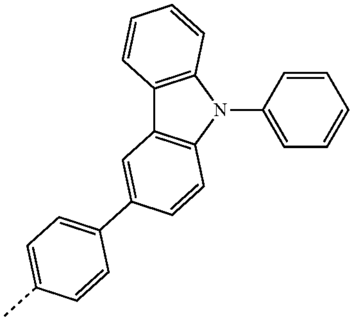,
EG25
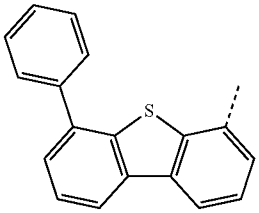,
EG26
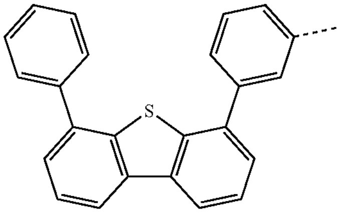, -continued
EG27
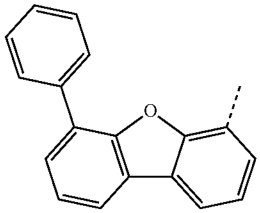
,
EG28
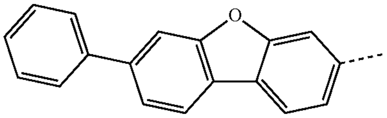
,
EG29
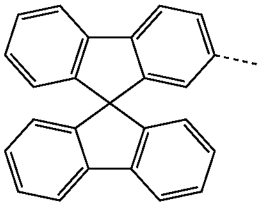
,
EG30
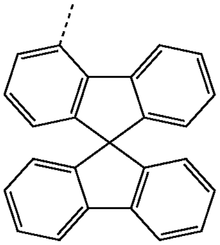
,
EG31
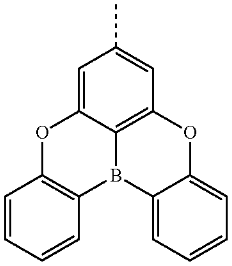
,
EG32
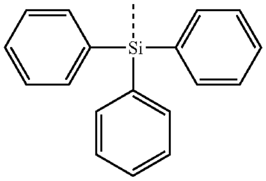
,
EG33
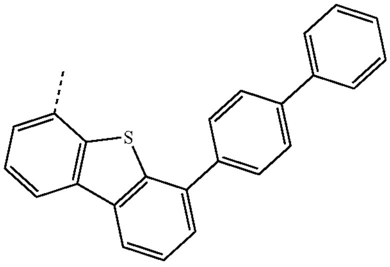
,
-continued
EG34
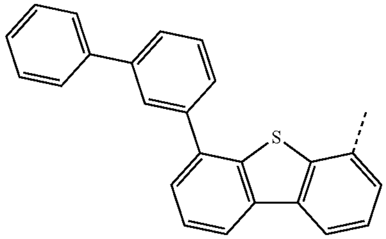
,
EG35
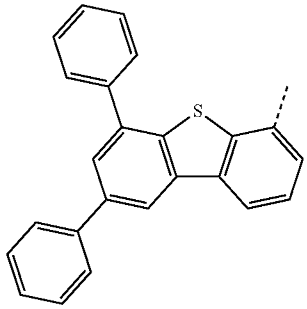
,
EG36
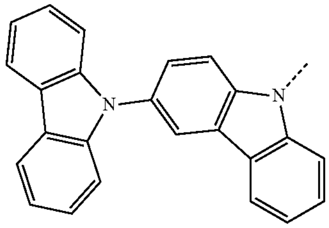
,
EG37
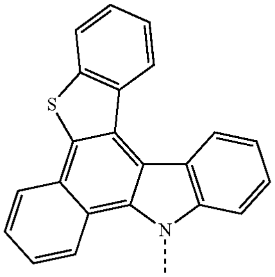
,
EG38
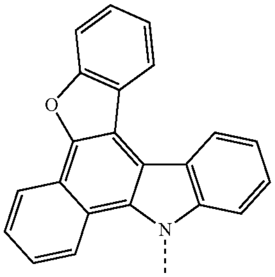
,
EG39
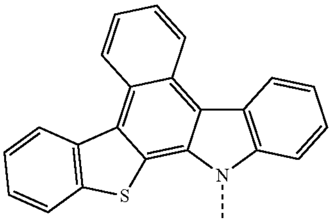
, -continued
EG40
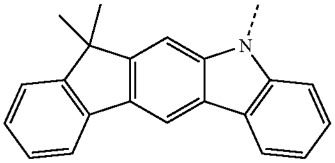
,
EG41
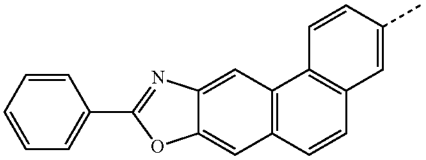
,
EG42
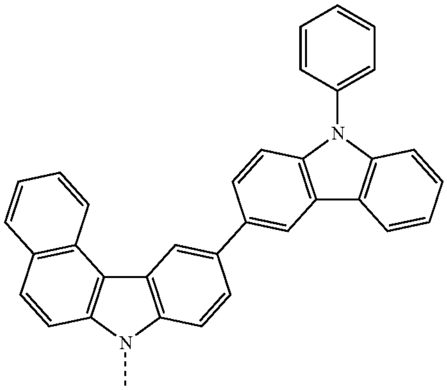
,
EG43
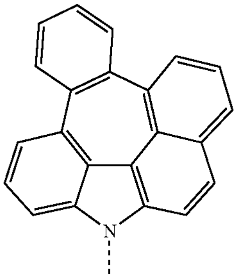
,
EG44
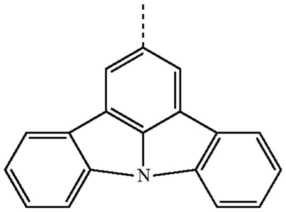
,
EG45
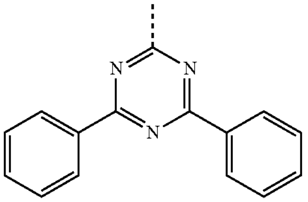
,
-continued
EG46
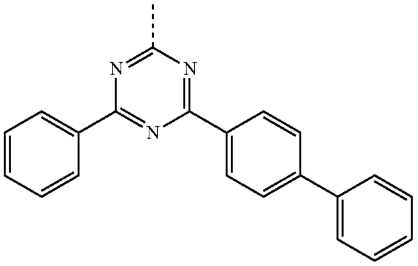
,
EG47
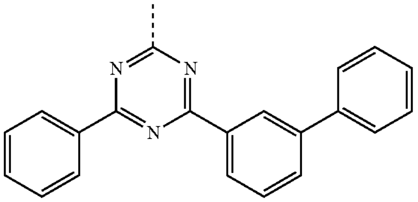
,
EG48
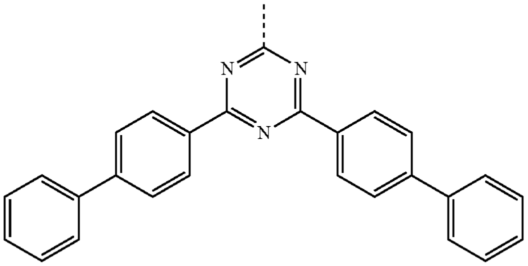
,
EG49
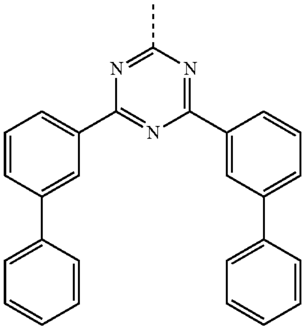
,
EG50
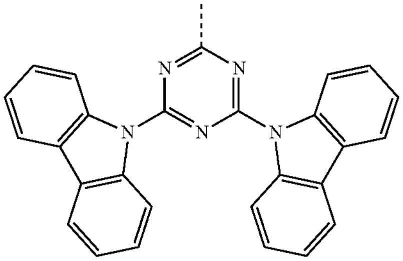
,
EG51
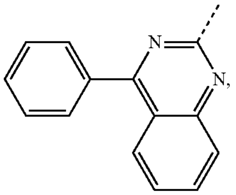
, -continued
EG52
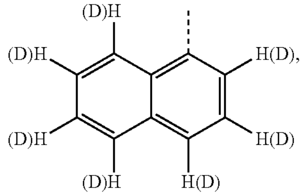
EG53
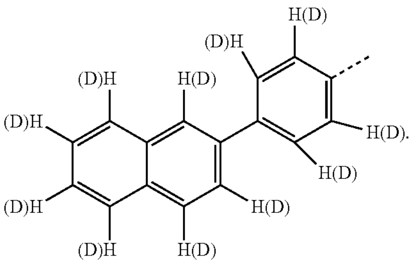
The structure of MG1 to MG27 is shown below:
MG1
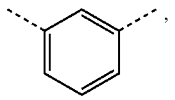
MG2
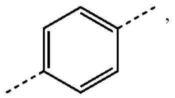
MG3
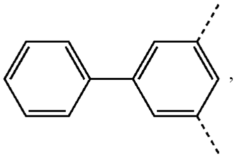
MG4
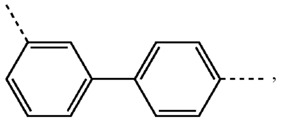
MG5
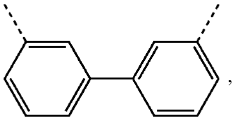
MG6
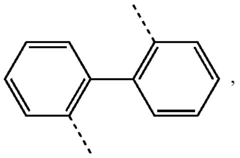
MG7
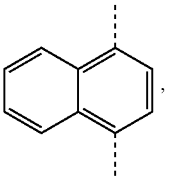
-continued
MG8
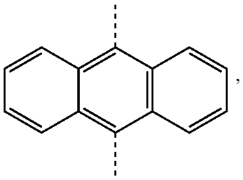
MG9
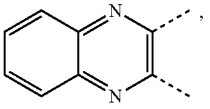
MG10
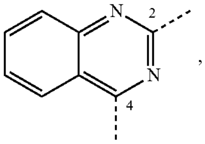
MG11
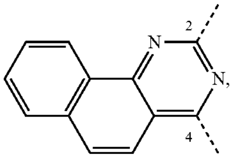
MG12
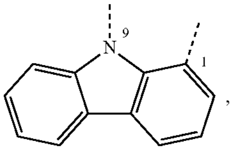
MG13
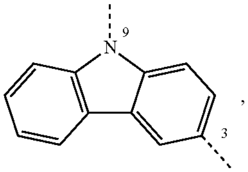
MG14
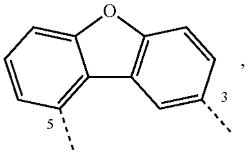
MG15
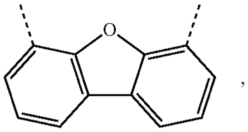
MG16
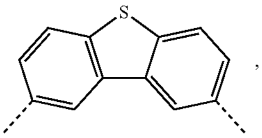
MG17
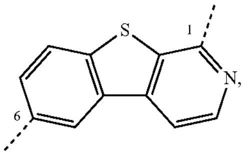

-continued

MG18

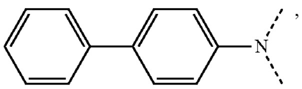

MG19

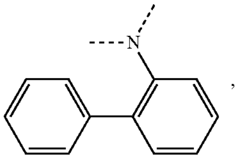

MG20

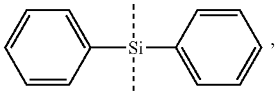

MG21

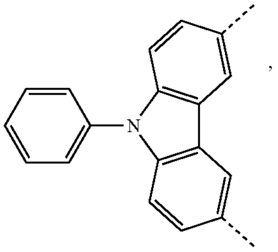

MG22

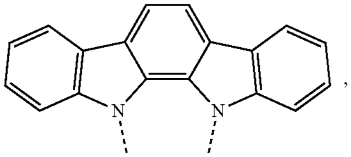

MG23

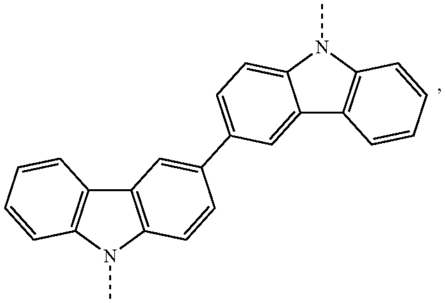

MG24

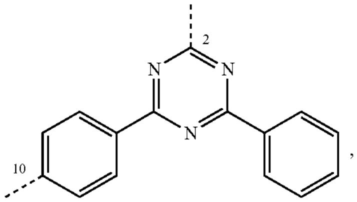

MG25

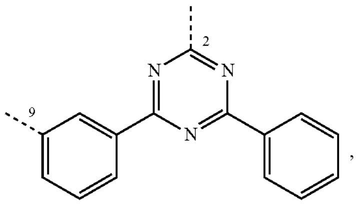

-continued

MG26

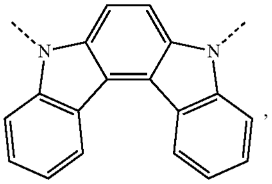

MG27

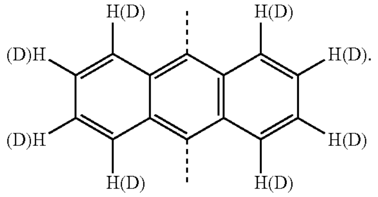

In the MGb structures shown above, the two bonding positions in the asymmetric structures MG10, MG11, MG12, MG13, MG14, MG17, MG24, and MG25 are labeled with numbers for identification purposes.

In some embodiments, the host can be any of the aza-substituted variants thereof, fully or partially deuterated variants thereof, and combinations thereof. In some embodiments, the host has formula EGa-MGb-Egc and is selected from the group consisting of h1 to h112 defined in the following HOST Group 2 list, where each of MGb, EGa, and EGc are defined as follows:

| h | MGb | EGa | EGc |
|---|---|---|---|
| h1 | MG1 | EG3 | EG36 |
| h2 | MG1 | EG8 | EG12 |
| h3 | MG1 | EG13 | EG14 |
| h4 | MG1 | EG13 | EG18 |
| h5 | MG1 | EG13 | EG25 |
| h6 | MG1 | EG13 | EG36 |
| h7 | MG1 | EG22 | EG36 |
| h8 | MG1 | EG25 | EG46 |
| h9 | MG1 | EG27 | EG46 |
| h10 | MG1 | EG27 | EG48 |
| h11 | MG1 | EG32 | EG50 |
| h12 | MG1 | EG35 | EG46 |
| h13 | MG1 | EG36 | EG45 |
| h14 | MG1 | EG36 | EG49 |
| h15 | MG1 | EG40 | EG45 |
| h16 | MG2 | EG3 | EG36 |
| h17 | MG2 | EG25 | EG31 |
| h18 | MG2 | EG31 | EG33 |
| h19 | MG2 | EG36 | EG45 |
| h20 | MG2 | EG36 | EG46 |
| h21 | MG3 | EG4 | EG36 |
| h22 | MG3 | EG34 | EG45 |
| h23 | MG4 | EG13 | EG17 |
| h24 | MG5 | EG13 | EG45 |
| h25 | MG5 | EG17 | EG36 |
| h26 | MG5 | EG18 | EG36 |
| h27 | MG6 | EG17 | EG17 |
| h28 | MG7 | EG43 | EG45 |
| h29 | MG8 | EG1 | EG28 |
| h30 | MG8 | EG6 | EG7 |
| h31 | MG8 | EG7 | EG7 |
| h32 | MG8 | EG7 | EG11 |
| h33 | MG9 | EG1 | EG43 |
| h34 | MG10 | 4-EG1 | 2-EG37 |
| h35 | MG10 | 4-EG1 | 2-EG38 |
| h36 | MG10 | EG1 | EG42 |
| h37 | MG11 | 4-EG1 | 2-EG39 |
| h38 | MG12 | 1-EG17 | 9-EG31 |
| h39 | MG13 | 3-EG17 | 9-EG4 |
| h40 | MG13 | 3-EG17 | 9-EG13 |
| h41 | MG13 | 3-EG17 | 9-EG31 |

-continued

| h | MGb | EGa | EGc |
|---|---|---|---|
| h42 | MG13 | 3-EG17 | 9-EG45 |
| h43 | MG13 | 3-EG17 | 9-EG46 |
| h44 | MG13 | 3-EG17 | 9-EG48 |
| h45 | MG13 | 3-EG17 | 9-EG49 |
| h46 | MG13 | 3-EG32 | 9-EG31 |
| h47 | MG13 | 3-EG44 | 9-EG3 |
| h48 | MG14 | 3-EG13 | 5-EG45 |
| h49 | MG14 | 3-EG23 | 5-EG45 |
| h50 | MG15 | EG3 | EG48 |
| h51 | MG15 | EG17 | EG31 |
| h52 | MG15 | EG31 | EG36 |
| h53 | MG16 | EG17 | EG17 |
| h54 | MG17 | EG17 | EG17 |
| h55 | MG18 | EG16 | EG24 |
| h56 | MG18 | EG16 | EG30 |
| h57 | MG18 | EG20 | EG41 |
| h58 | MG19 | EG16 | EG29 |
| h59 | MG20 | EG1 | EG31 |
| h60 | MG20 | EG17 | EG18 |
| h61 | MG21 | EG23 | EG23 |
| h62 | MG22 | EG1 | EG45 |
| h63 | MG22 | EG1 | EG46 |
| h64 | MG22 | EG3 | EG46 |
| h65 | MG22 | EG4 | EG46 |
| h66 | MG22 | EG4 | EG47 |
| h67 | MG22 | EG9 | EG45 |
| h68 | MG23 | EG1 | EG3 |
| h69 | MG23 | EG1 | EG6 |
| h70 | MG23 | EG1 | EG14 |
| h71 | MG23 | EG1 | EG18 |
| h72 | MG23 | EG1 | EG19 |
| h73 | MG23 | EG1 | EG23 |
| h74 | MG23 | EG1 | EG51 |
| h75 | MG23 | EG2 | EG18 |
| h76 | MG23 | EG3 | EG3 |
| h77 | MG23 | EG3 | EG4 |
| h78 | MG23 | EG3 | EG5 |
| h79 | MG23 | EG4 | EG4 |
| h80 | MG23 | EG4 | EG5 |
| h81 | MG24 | 2-EG1 | 10-EG33 |
| h82 | MG24 | 2-EG4 | 10-EG36 |
| h83 | MG24 | 2-EG21 | 10-EG36 |
| h84 | MG24 | 2-EG23 | 10-EG36 |
| h85 | MG25 | 2-EG1 | 9-EG33 |
| h86 | MG25 | 2-EG3 | 9-EG36 |
| h87 | MG25 | 2-EG4 | 9-EG36 |
| h88 | MG25 | 2-EG17 | 9-EG27 |
| h89 | MG25 | 2-EG17 | 9-EG36 |
| h90 | MG25 | 2-EG21 | 9-EG36 |
| h91 | MG25 | 2-EG23 | 9-EG27 |
| h92 | MG25 | 2-EG23 | 9-EG36 |
| h93 | MG26 | EG1 | EG9 |
| h94 | MG26 | EG1 | EG10 |
| h95 | MG26 | EG1 | EG21 |
| h96 | MG26 | EG1 | EG23 |
| h97 | MG26 | EG1 | EG26 |
| h98 | MG26 | EG3 | EG3 |
| h99 | MG26 | EG3 | EG9 |
| h100 | MG26 | EG3 | EG23 |
| h101 | MG26 | EG3 | EG26 |
| h102 | MG26 | EG4 | EG10 |
| h103 | MG26 | EG5 | EG10 |
| h104 | MG26 | EG6 | EG10 |
| h105 | MG26 | EG10 | EG10 |
| h106 | MG26 | EG10 | EG14 |
| h107 | MG26 | EG10 | EG15 |
| h108 | MG27 | EG52 | EG53 |
| h109 | — | EG13 | EG18 |
| h110 | — | EG17 | EG31 |
| h111 | — | EG17 | EG50 |
| h112 | — | EG40 | EG45 |

In the table above, the EGa and EGc structures that are bonded to one of the asymmetric structures MG10, MG11, MG12, MG13, MG14, MG17, MG24, and MG25, are noted with a numeric prefix identifying their bonding position in the MGb structure.

e) Emitter Materials in EML:

One or more emitter materials may be used in conjunction with the compound or device of the present disclosure. The emitter material can be emissive or non-emissive in the current device as described herein. Examples of the emitter materials are not particularly limited, and any compounds may be used as long as the compounds are capable of producing emissions in a regular OLED device. Examples of suitable emitter materials include, but are not limited to, compounds which are capable of producing emissions via phosphorescence, non-delayed fluorescence, delayed fluorescence, especially the thermally activated delayed fluorescence, i.e., TADF (also referred to as E-type delayed fluorescence), triplet-triplet annihilation, or combinations of these processes.

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further away from the vacuum level) and/or higher triplet energy than one or more of the emitters closest to the HBL interface.

In some embodiments, compound used in HBL contains the same molecule or the same functional groups used as host described above.

In some embodiments, compound used in HBL comprises at least one of the following moieties selected from the group consisting of:

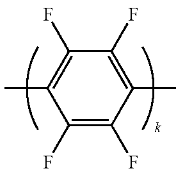
,
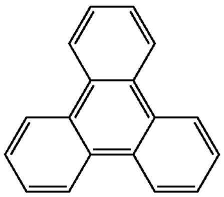
,
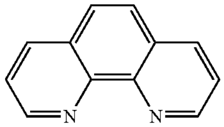
,
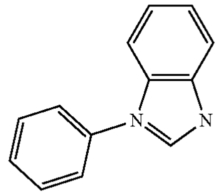
,
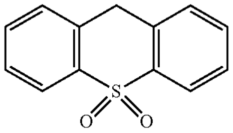
, and
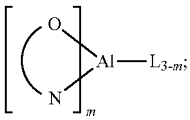

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In some embodiments, compound used in ETL comprises at least one of the following moieties in the molecule:

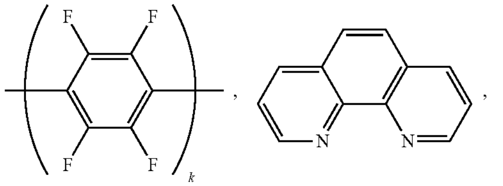

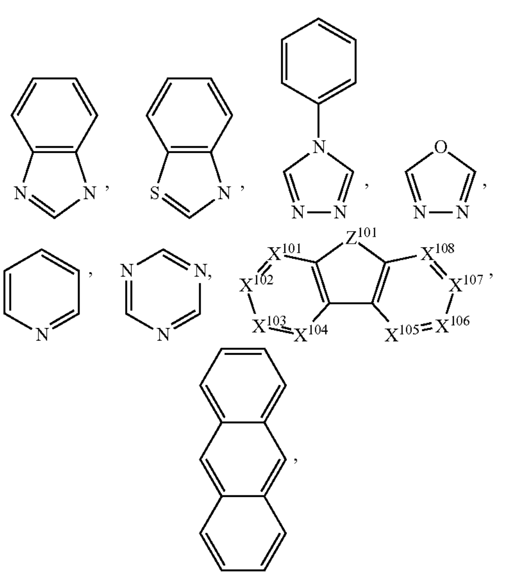

and fullerenes; wherein k is an integer from 1 to 20, $X^{101}$ to $X^{108}$ is selected from C or N; $Z^{101}$ is selected from the group consisting of C, N, O, and S.

In some embodiments, the metal complexes used in ETL contains, but not limit to the following general formula:

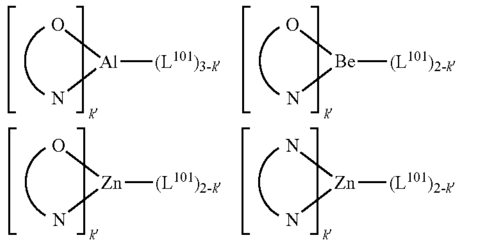

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In some embodiments, the ETL material is selected from the group consisting of anthracene-benzoimidazole compounds, aza triphenylene derivatives, anthracene-benzothiazole compounds, metal 8-hydroxyquinolates, metal hydroxybenoquinolates, bathocuprine compounds, 5-member ring electron deficient heterocycles (e.g., triazole, oxadiazole, imidazole, benzoimidazole), silole compounds, arylborane compounds, fluorinated aromatic compounds, fullerene (e.g., C60), triazine complexes, and Zn(N^N) complexes.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. The minimum amount of hydrogen of the compound being deuterated is selected from the group consisting of 30%, 40%, 50%, 60%, 70%, 80%, 90%, 95%, 99%, and 100%. As used herein, percent deuteration has its ordinary meaning and includes the percent of all possible hydrogen and deuterium atoms that are replaced by deuterium atoms. In some embodiments, the deuterium atoms are attached to an aromatic ring. In some embodiments, the deuterium atoms are attached to a saturated carbon atom, such as an alkyl or cycloalkyl carbon atom. In some other embodiments, the deuterium atoms are attached to a heteroatom, such as Si, or Ge atom.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

Experimental Part

Computational:

In some embodiments of the device, the structure of the compound, showing below, used to measure point P, the center of gravity C1/C2, the angle between C1-P—C2, and the frontier orbital energy levels was derived from the ground state geometry of the molecular structure calculated using Gaussian 16, Revision B.01 with the B3LYP functional applying a 6-31G* basis set. This was after performing a systematic torsional sampling of the conformational space of the molecular structure using Maestro, Release 2019-1 from Schrodinger, with the OPLS3e forcefield. The lowest energy conformer was used as input for the ground state B3LYP calculation described above. While the software package BIOVIA Materials Studio 2022, Release 22.1, was used to define and measure point P, the center of gravity C1/C2, including the angle between C1-P—C2.

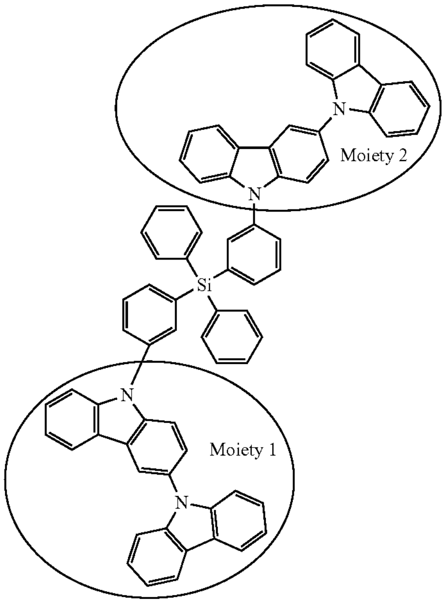
Si = Point P
The frontier energy levels of the compound are shown in Table 1.
TABLE 1
| | Chemical Structure | $E_{HOMO}$ (eV) | $E_{LUMO}$ (eV) |
|---|---|---|---|
| Moiety 1 and 2 | 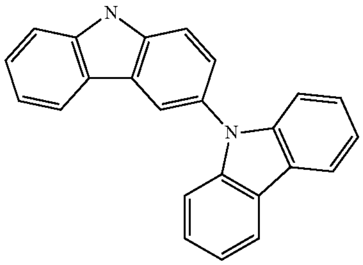 [SMILES: c1ccc2c(c1)[nH]c1ccc(-n3c4ccccc4c4ccccc43)cc12] | −5.33 | −0.98 |

Figure 3:
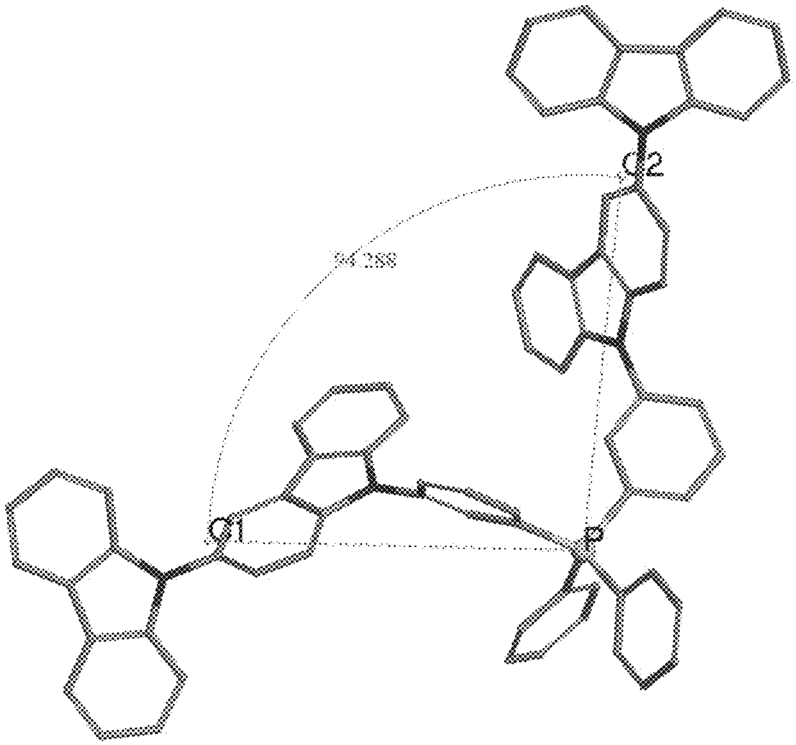
FIG. 3 shows the measurement of the angle between C1-P—C2 in a compound according to the invention.

FIG. 3 illustrates the measurement of metrics P, C1, C2 and the angle between C1-P—C2.

As shown in FIG. 3 and Table 1 the angle between the hole transporting moieties is 94.3°, close to orthogonal 90.0°, while HOMO of $E_{HOMO}$ of moiety 1 and 2, $E_{HOMO}$, are degenerate.

Demonstrated below is another example using designed host compound A, following the same procedure, but now point P is defined as the mid-point between the C—N bond formed between the two 3-bicarbazole moieties.

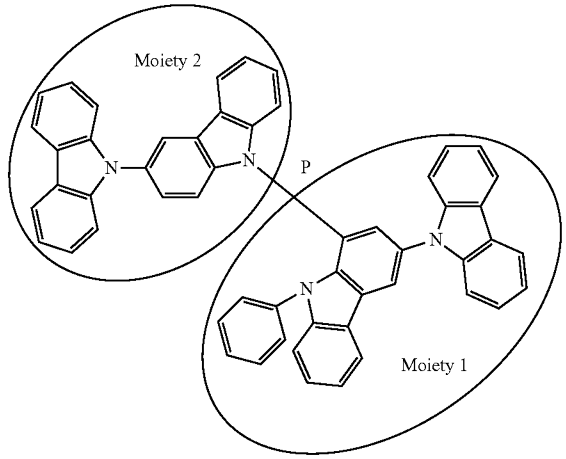

Midpoint connecting C—N bond = Point P

Figure 4:
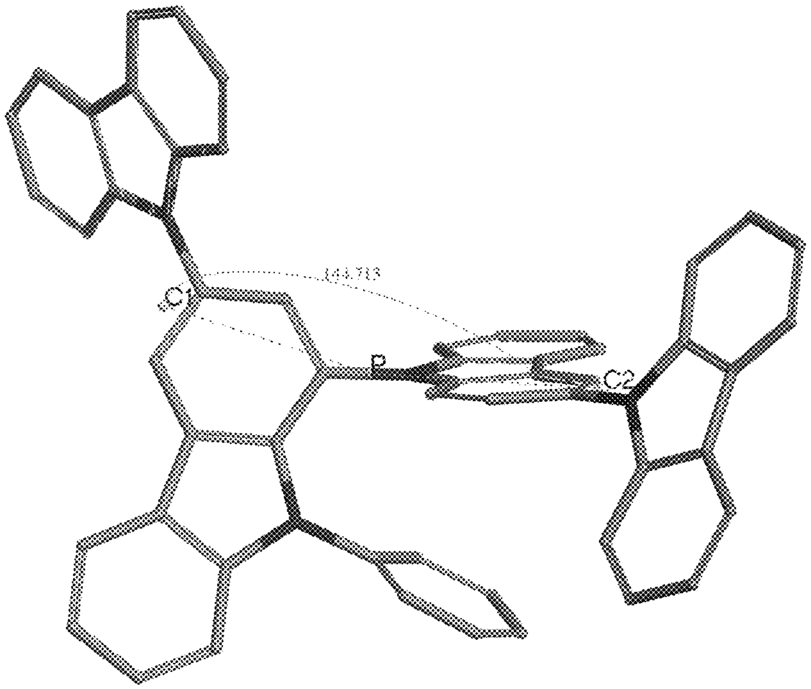
FIG. 4 shows the measurement of the angle between C1-P—C2 for Compound A according to the invention.

FIG. 4 illustrates the measurement of the metrics P, C1, C2 and the angle between C1-P—C2 for Compound A.

As shown in FIG. 4 and Table 1 the angle between the hole transporting moieties is 144.7°, which is greater than orthogonal 90.0°, but significantly less than co-linear 180.0°, while HOMO of $E_{HOMO}$ of moiety 1 and 2, $E_{HOMO}$, are degenerate.

In either example the designed host would provide the hole being conducted through a film equivalent bidirectional pathways for transport leading to a lower voltage device.

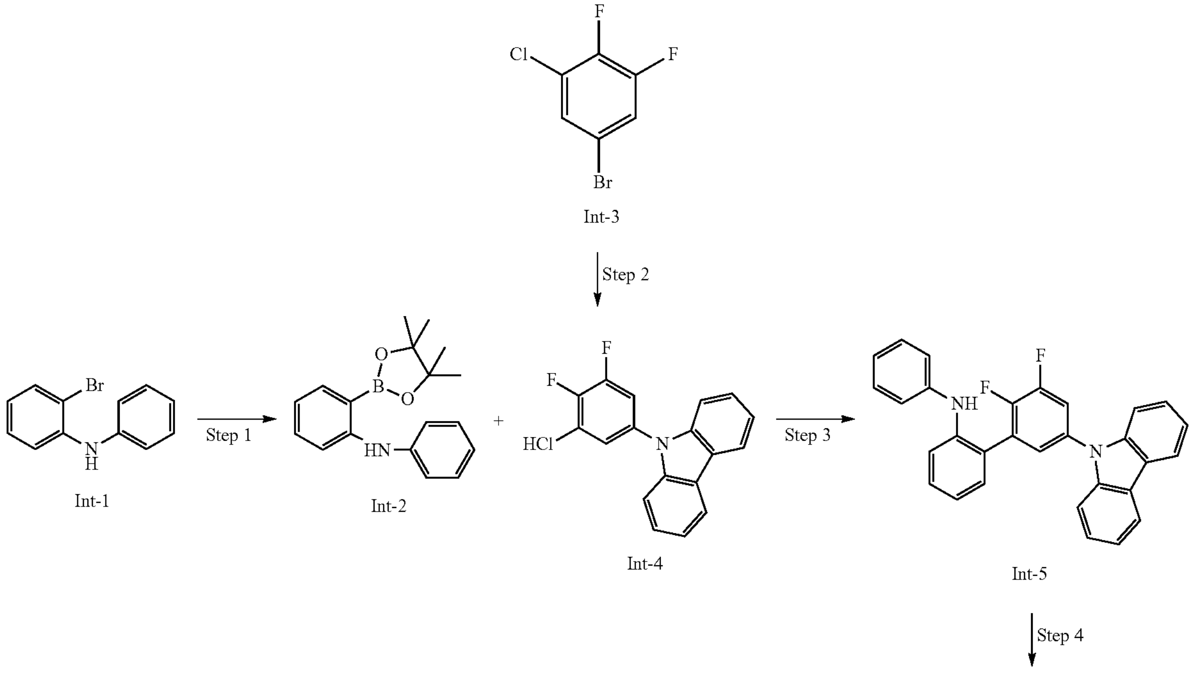

Int-3

Int-1

Int-2

Int-4

Int-5

-continued

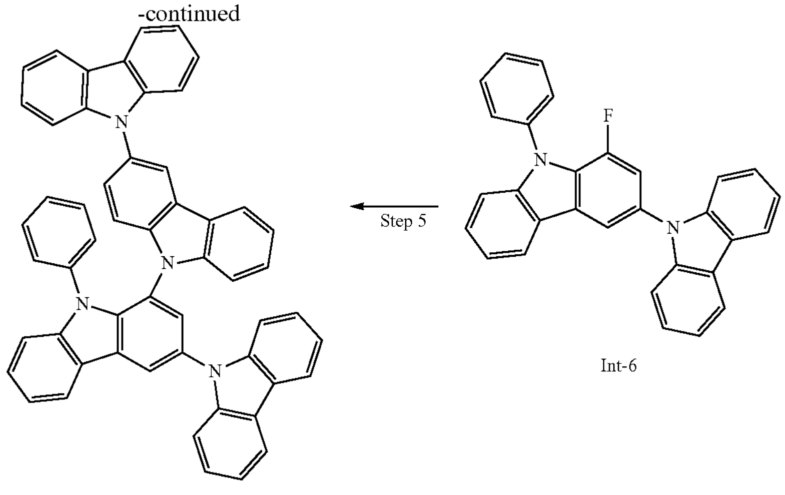

Compound A

Int-6

Synthesis of Compound A:

Step 1: Into a 1000 mL round bottom flask, 2-bromo-N-phenylaniline Int-1 (8.500 g, 1 Eq, 34.26 mmol), 4,4,4',4',5,5,5',5'-octamethyl-2,2'-bi(1,3,2-dioxaborolane) (17.40 g, 2 Eq, 68.52 mmol), potassium acetate (10.09 g, 3 Eq, 102.8 mmol) and DMSO (200.0 mL) were added. The reaction mixture was bubbled with nitrogen for 10 minutes. Then, $PdCl_2(dppf)$-$CH_2Cl_2$ adduct (2.798 g, 0.1 Eq, 3.426 mmol) was added and bubbling was continued for another 5 minutes. The reaction mixture was heated to 90° C. in an oil bath and stirred overnight. The reaction mixture was cooled to room temperature, water (1000 mL) and ethyl acetate (200 mL) were added. The layers were separated, aqueous layer was extracted with ethyl acetate (3×100 mL). The organics were combined and dried over anhydrous $MgSO_4$ and filtered. The crude was purified by column chromatography eluting with heptanes and ethyl acetate to obtain a yellow oil product Int-2 (4.2 g, 41.5% yield).

Step 2: Into a round bottom flask, 9H-carbazole (7.426 g, 1.01 Eq, 44.41 mmol), xylenes (30.00 mL) and anhydrous THF (30.00 mL) were added, and the reaction mixture was cooled to 5° C. in a ice-water bath. Then methylmagnesium chloride (3.354 g, 14.95 mL, 3.000 molar, 1.02 Eq, 44.85 mmol) in anhydrous tetrahydrofuran was added dropwise over 10 minutes and then the reaction mixture was stirred for 30 minutes. Into a separate round bottom flask, 5-bromo-1-chloro-2,3-difluorobenzene Int-3 (10.00 g, 1 Eq, 43.97 mmol), di-tert-butyl(1-methyl-2,2-diphenylcyclopropyl) phosphane (1.550 g, 0.1 Eq, 4.397 mmol), xylenes (30.00 mL) and anhydrous THF (50.00 mL) were added, and the mixture was bubbled with nitrogen for 5 minutes. Then, allylpalladium(II) chloride (402.2 mg, 0.025 Eq, 1.099 mmol) was added and the bubbling continued for another 5 minutes. To the above Grignard solution, the catalytic reaction mixture was added dropwise over a period of 10 minutes. The reaction mixture was heated to 110° C. and stirred overnight. The reaction mixture was cooled to room temperature, saturated $NH_4Cl$ (100 mL) and ethyl acetate (200 mL) were added. The layers were separated, aqueous layer was extracted with ethyl acetate (2×100 mL). The organics were combined and dried over anhydrous $MgSO_4$ and filtered. The crude was purified by column chromatography eluting with heptanes and ethyl acetate to obtain a white solid product Int-4 (10.1 g, 73.2% yield).

Step 3: Into a 100 mL round bottom flask, 9-(3-chloro-4,5-difluorophenyl)-9H-carbazole Int-4 (1.500 g, 1 Eq, 4.781 mmol), N-phenyl-2-(4,4,5,5-tetramethyl-1,3,2-dioxaborolan-2-yl)aniline Int-2 (1.694 g, 1.2 Eq, 5.737 mmol), potassium carbonate (1.982 g, 3 Eq, 14.34 mmol), toulene (30.00 mL) and water (6.000 mL) were added. The reaction mixture was bubbled with nitrogen for 10 minutes. Then, Sphos Pd G2 (172.3 mg, 0.05 Eq, 239.1 μmol) was added and bubbling was continued for another 5 minutes. The reaction mixture was heated to 90° C. in an oil bath and stirred overnight. The reaction mixture was cooled to room temperature, water (100 mL) and ethyl acetate (100 mL) were added. The layers were separated, aqueous layer was extracted with ethyl acetate (3×50 mL). The organics were combined and dried over anhydrous $MgSO_4$ and filtered. The crude was purified by column chromatography eluting with heptanes and ethyl acetate to obtain a white solid product Int-5 (1.8 g, 84.3% yield).

Step 4: Into a 250 mL round bottom flask, 5'-(9H-carbazol-9-yl)-2',3'-difluoro-N-phenyl-[1,1'-biphenyl]-2-amine Int-5 (1.2 g, 1 Eq, 2.688 mmol), cesium carbonate (2.627 g, 3 Eq, 8.063 mmol) and NMP (20.0 mL) were added. The reaction mixture was heated to 100° C. in an oil bath and stirred overnight. The reaction mixture was cooled to room temperature, water (300 mL) and ethyl acetate (50 mL) were added. The layers were separated, aqueous layer was extracted with ethyl acetate (3×50 mL). The organics were combined and dried over anhydrous $MgSO_4$ and filtered. The crude was purified by column chromatography eluting with heptanes and ethyl acetate to obtain a white solid product Int-6 (1.0 g, 87.3% yield).

Step 5: Into a 500 mL round bottom flask, 1-fluoro-9-phenyl-9H-3,9'-bicarbazole Int-6 (6.000 g, 1 Eq, 14.07 mmol), 9H-3,9'-bicarbazole (5.144 g, 1.1 Eq, 15.48 mmol), cesium carbonate (13.75 g, 3 Eq, 42.20 mmol) and NMP (200.0 mL) were added. The reaction mixture was heated to 150° C. in an oil bath and stirred overnight. The reaction mixture was cooled to room temperature, water (1000 mL) and ethyl acetate (100 mL) were added. The layers were separated, aqueous layer was extracted with ethyl acetate (3×100 mL). The organics were combined and dried over anhydrous $MgSO_4$ and filtered. The crude was purified by column chromatography eluting with heptanes and ethyl acetate to obtain a white solid product Compound A (7.5 g, 72% yield).

Device Example:

In the OLED experiment device were fabricated by high vacuum (<10-7 Torr) thermal evaporation. The anode electrode was 800 Å of indium tin oxide (ITO). The cathode consisted of 10 Å of LiF followed by 1,000 Å of Al. All devices were encapsulated with a glass lid sealed with epoxy resin in a nitrogen glove box.

The organic stack of the examples shown in Table 2 consists of sequentially, from the ITO surface, 100 Å of HAT-CN as the hole injection layer (HIL) and 250 Å of HTL1, in example 1 300 Å of 40% compound A doped with 48% of compound D and 12% of compound E, as the emissive layer (EML), 50 Å of compound C as EBL1, 50 Å of compound D as HBL1 and 300 Å of LiQ containing 35% of ETL as ETL1. In example 2 the device structure was identical to example 1 except the EML contained 40% of compound B doped with 48% of compound D and 12% of compound E.

Compound A

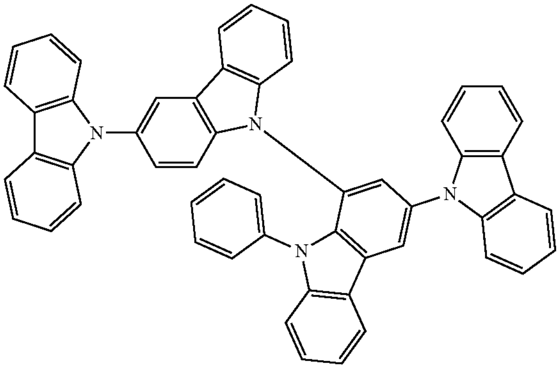

,

Compound B

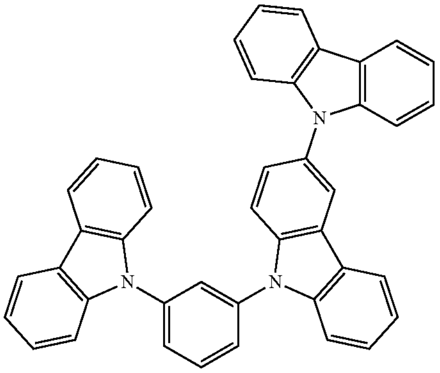

,

Compound C

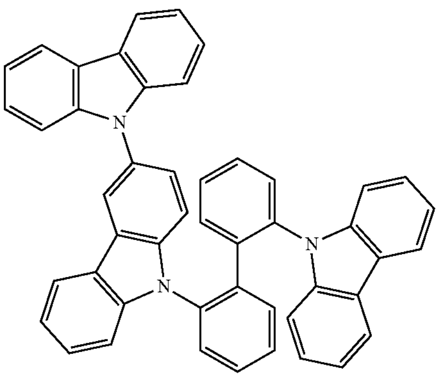

,

-continued

Compound D

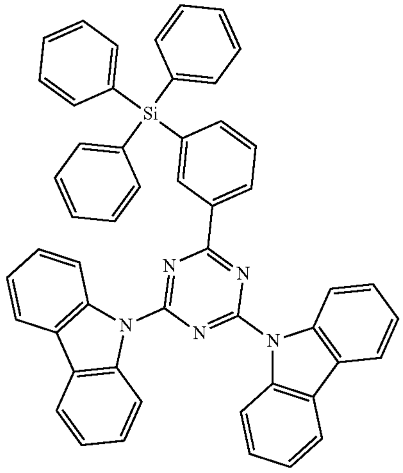

,

Compound E

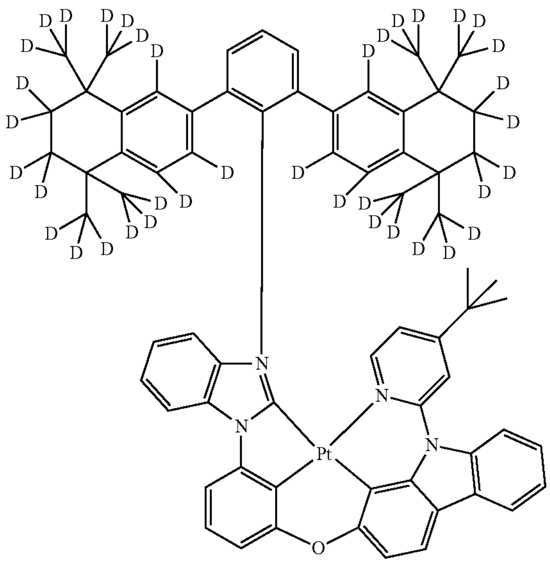

,

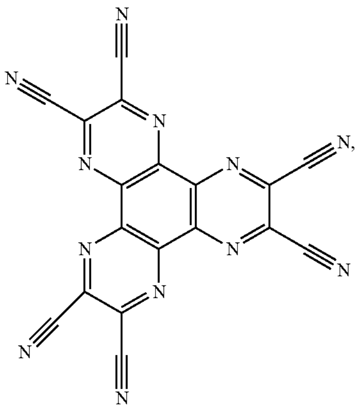

HAT-CT

-continued

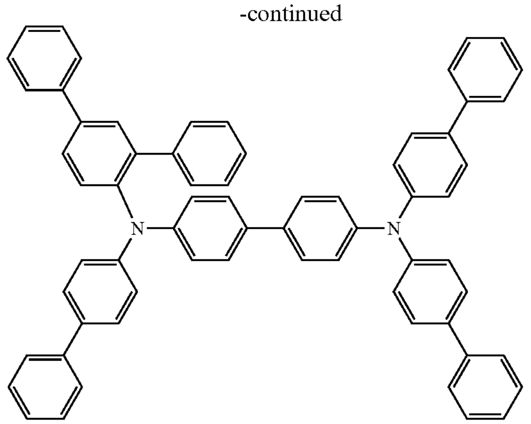

and

HTL1

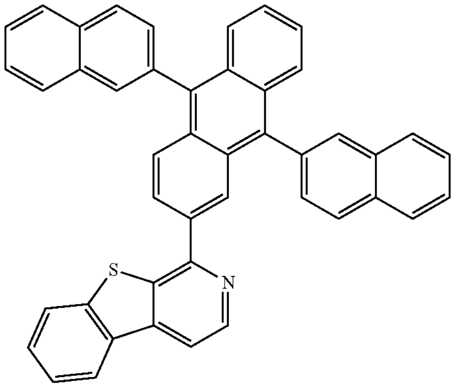

,

ETL

The device date is summarized in Table 2.

TABLE 2

| Device | Host in EML | 1931 CIE x | 1931 CIE y | $E\lambda_{max}$ [nm] | Relative Voltage@10 mA/cm$^2$ |
|---|---|---|---|---|---|
| Example 1 | Compound A | 0.136 | 0.154 | 461 | 0.92 |
| Example 2 | Compound B | 0.137 | 0.146 | 460 | 1.00 |

The data shows that Device Example 1 with compound A as the hole transporting host in the EML has a lower voltage compared to the comparative hole transporting host compound B. This is evidence that having a hole transporting host designed with degenerate HOMO levels near orthogonal to each other provides the hole being conducted through the EML equivalent bidirectional pathways for transport leading to a lower voltage device.

What is claimed is:

1. A compound comprising a first moiety and a second moiety;

wherein the free form of the first moiety has a HOMO level, $E_{HOMO1}$, a LUMO level, $E_{LUMO1}$, and a center of gravity C1;

wherein the free form of the second moiety has a HOMO level, $E_{HOMO2}$, a LUMO level, $E_{LUMO2}$, and a center of gravity C2;

wherein the compound has a Point P;

wherein when the first moiety and the second moiety are connected by a direct bond, then the Point P is the center of the gravity of the direct bond;

wherein when the first moiety and the second moiety are connected by a structure of Formula I or a structure of Formula II, $W^1$ is the Point P;

Formula I

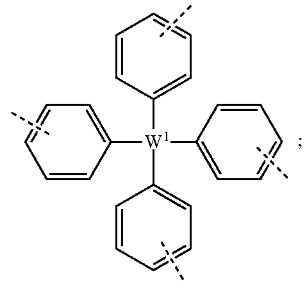

;

Formula II

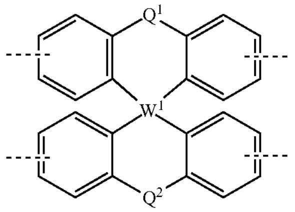

;

wherein $W^1$ are each independently C, Si or Ge;

wherein $Q^1$ and $Q^2$ are each independently a direct bond or selected from the list consisting of O, S, Se, NR, BR, BRR', PR, CR, C═O, C═NR, C═CRR', C═S, CRR', SO, $SO_2$, P(O)R, SiRR', and GeRR';

wherein each R and R' is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof;

wherein the first moiety and the second moiety are connected to Formula I or Formula II via any of the dashed lines;

wherein the angle between C1, P and C2 is equal to or greater than 45 degrees; and less than 180 degrees, wherein the first moiety and the second moiety are (i) both electron transporting moieties and $|E_{LUMO1}-E_{LUMO2}|<0.2$ eV; or (ii) both hole transporting moieties and $|E_{HOMO1}-E_{HOMO2}|<0.2$ eV.

2. The compound of claim 1, wherein the angle between C1, P and C2 is equal to or greater than 50 degrees; and less than 130 degrees.

3. The compound of claim 1, wherein the first moiety and the second moiety are connected by a structure of Formula I; or wherein the first moiety and the second moiety are connected by a structure of Formula II.

4. The compound of claim 1, wherein the first moiety and the second moiety are connected by a direct bond.

5. The compound of claim 1, wherein the first moiety and the second moiety are connected by a structure of Formula I or a structure of Formula II, and wherein $W^1$ is Si; or wherein the compound has Formula III, and $R^1$ comprises a structure selected from Formula I or II, and wherein $W^1$ is Si.

6. The compound of claim 1, wherein the first moiety and the second moiety are connected by a structure of Formula II, and wherein $Q^1$ and $Q^2$ are O; or wherein the compound has Formula III, and $R^1$ comprises a structure selected from Formula II, and wherein $Q^1$ and $Q^2$ are O.

7. The compound of claim 1, wherein each R and R' is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

8. The compound of claim 1, wherein moiety 1 and moiety 2 are symmetric and have degenerate HOMO levels.

9. The compound of claim 1, wherein the compound is selected from the group consisting of:

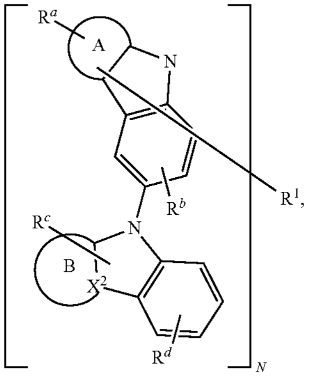

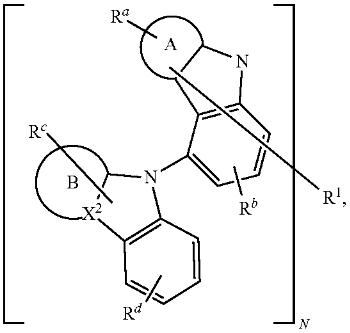

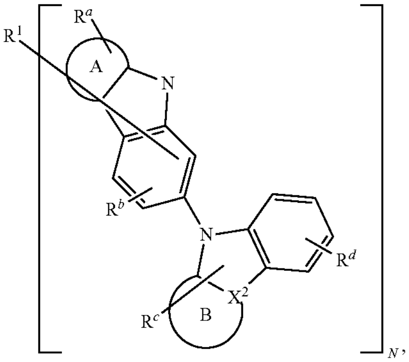

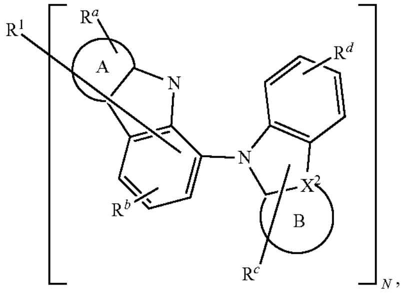

-continued

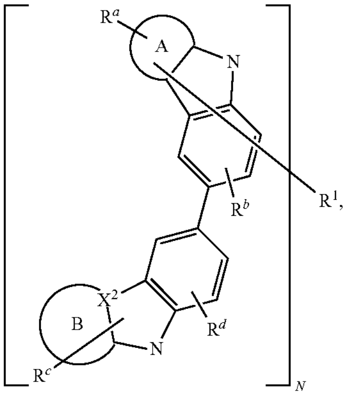

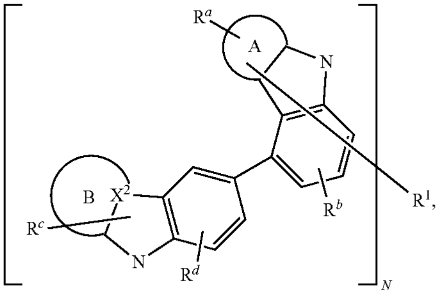

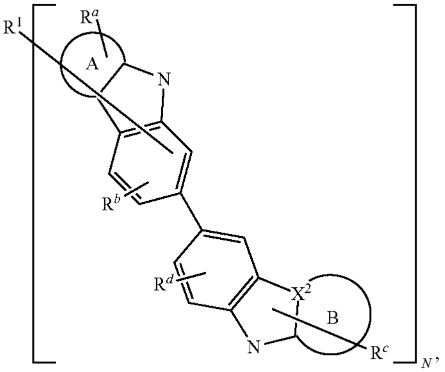

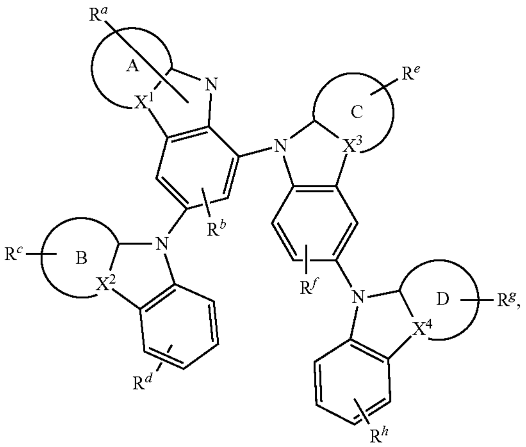

and

-continued
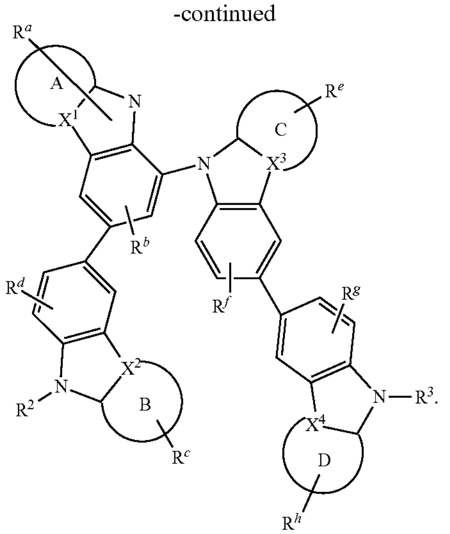
10. The compound of claim 1, wherein the compound is selected from the group consisting of:
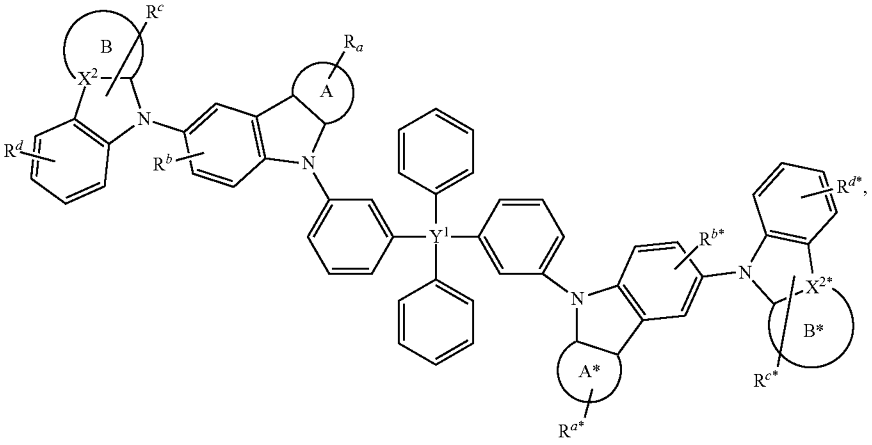
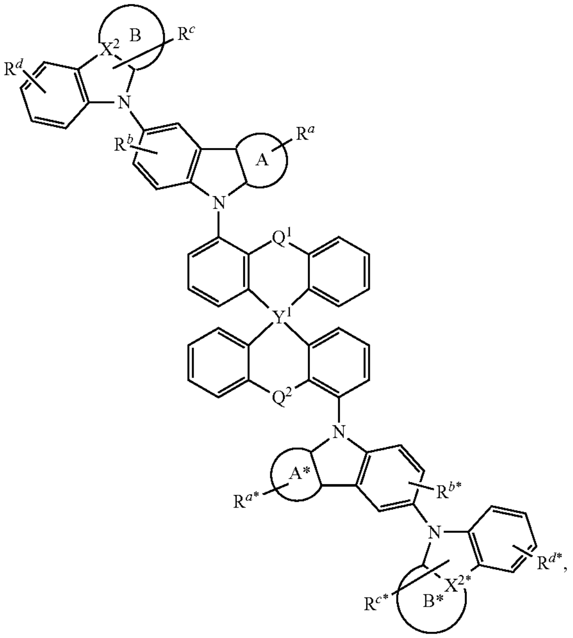

-continued
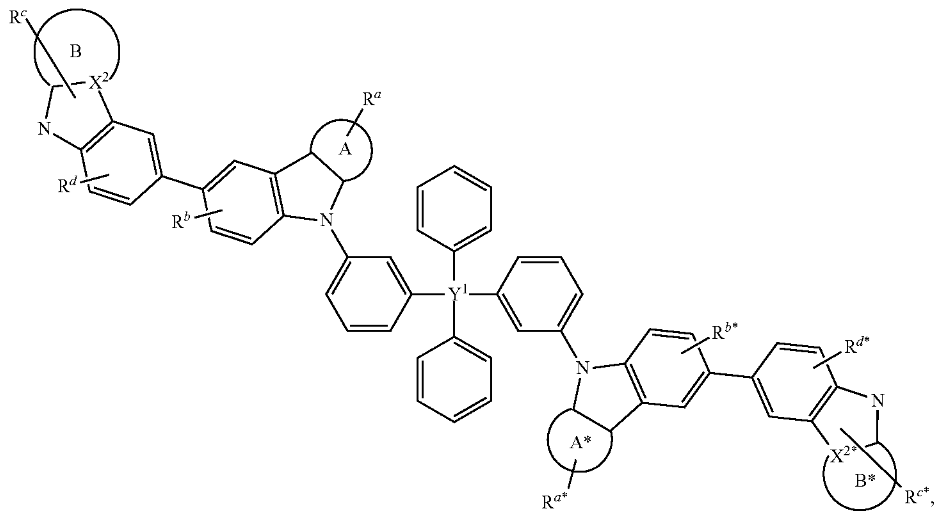
,
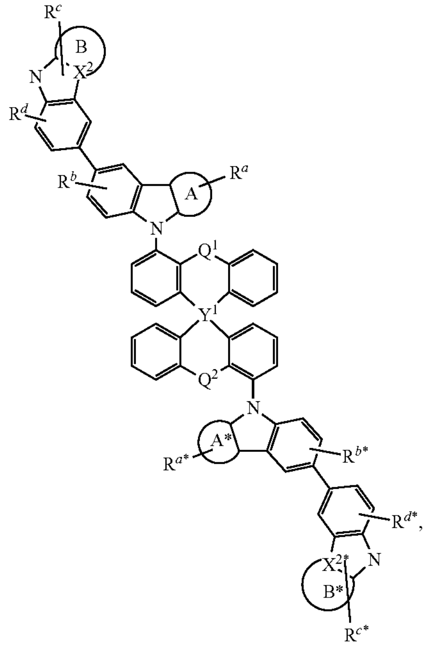
,
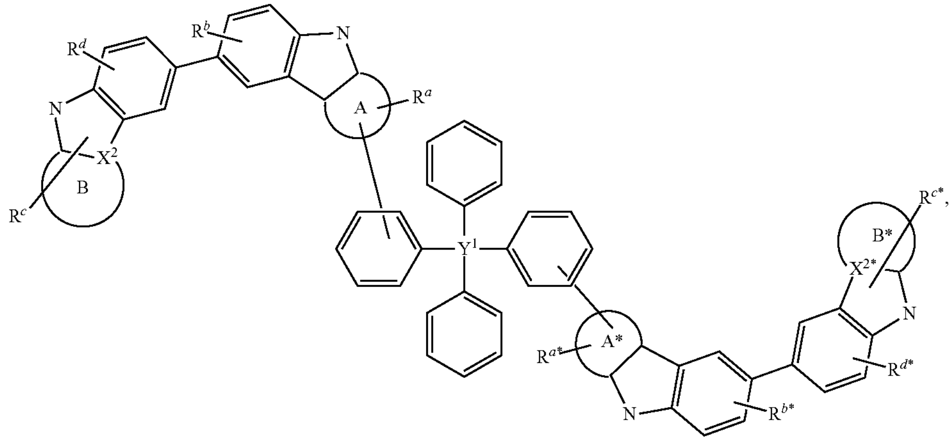
, and

-continued
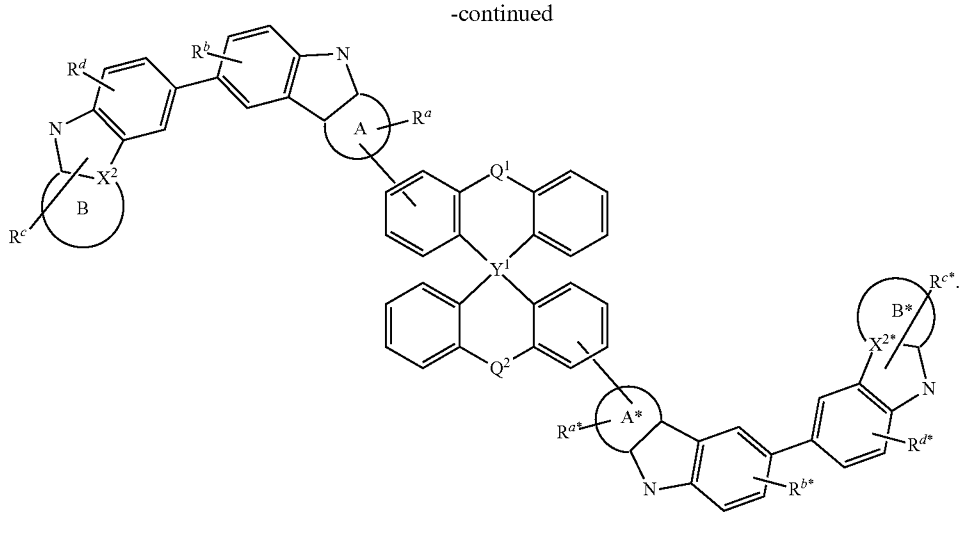
11. The compound of claim 1, wherein the compound is selected from the group consisting of:
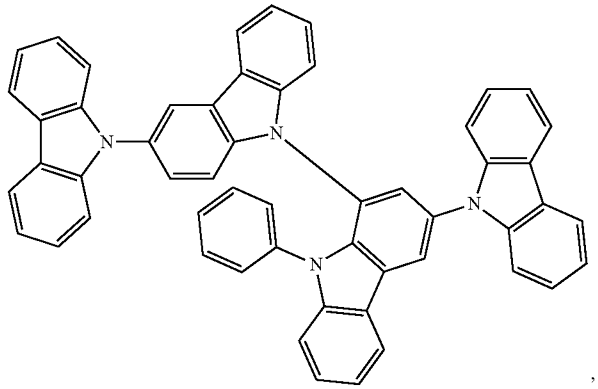
,
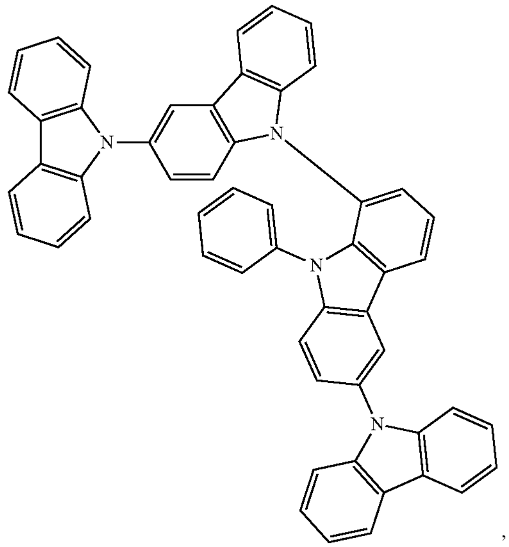
, -continued
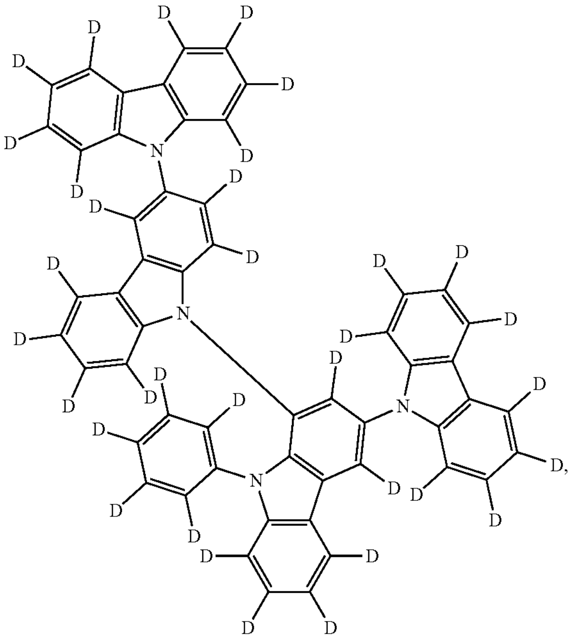
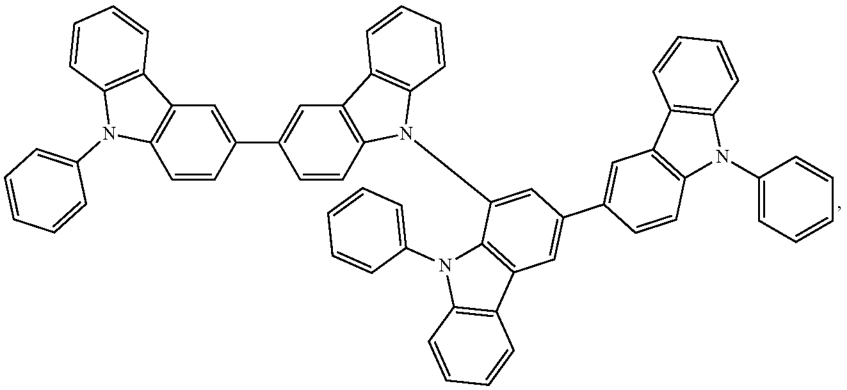
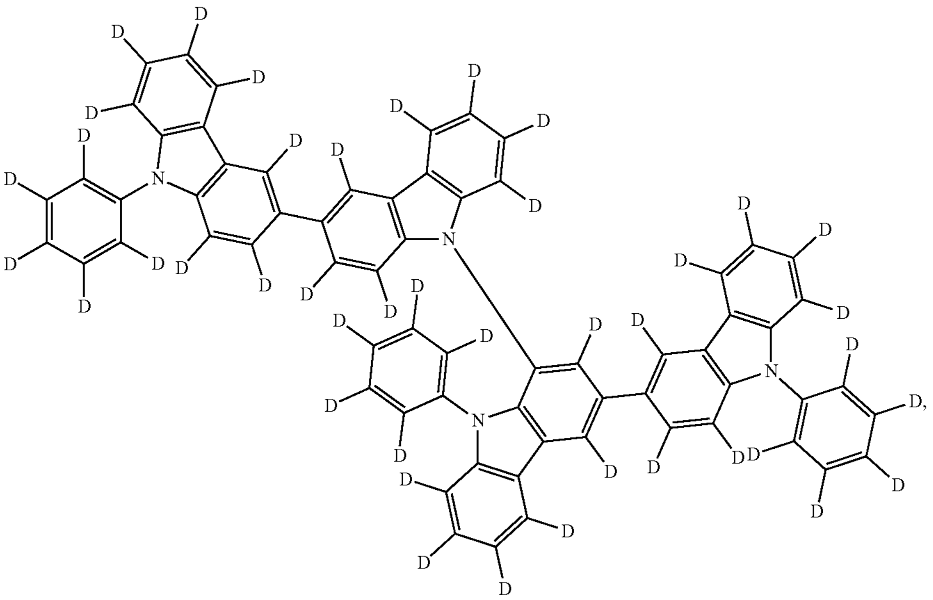

-continued
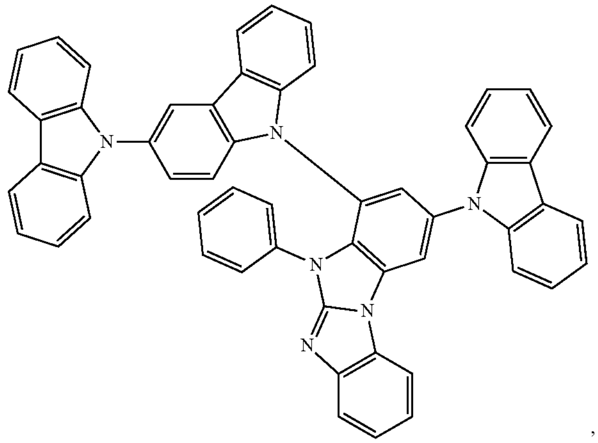
,
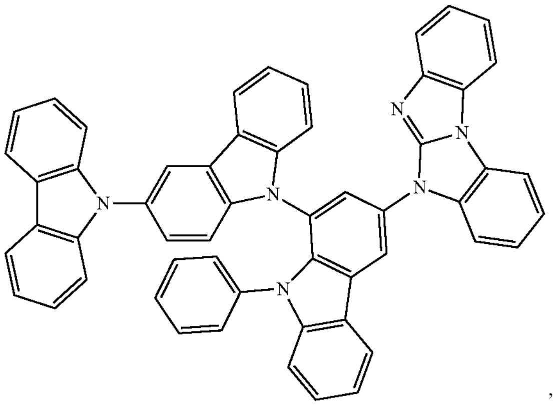
,
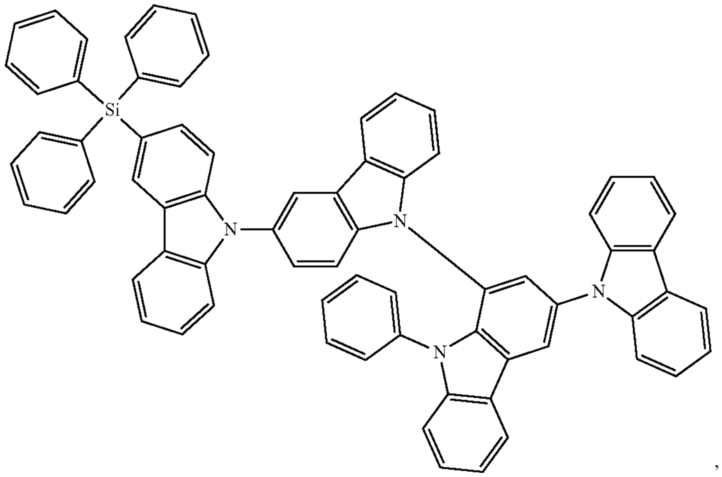
,
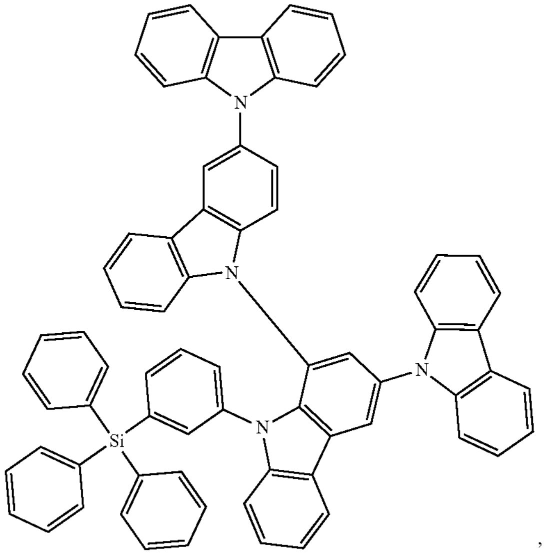
,
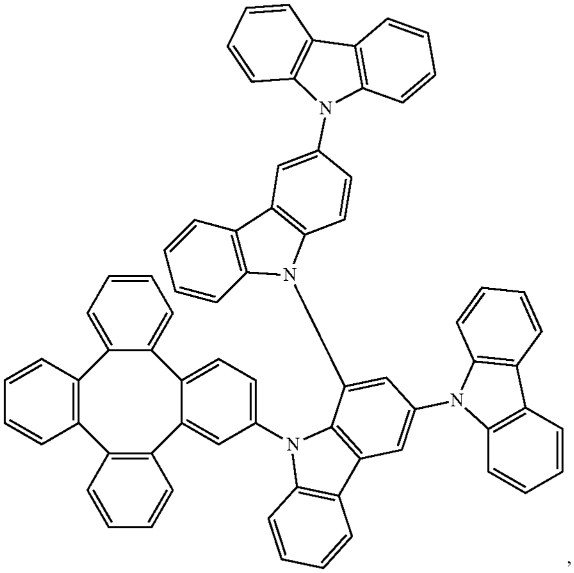
, -continued
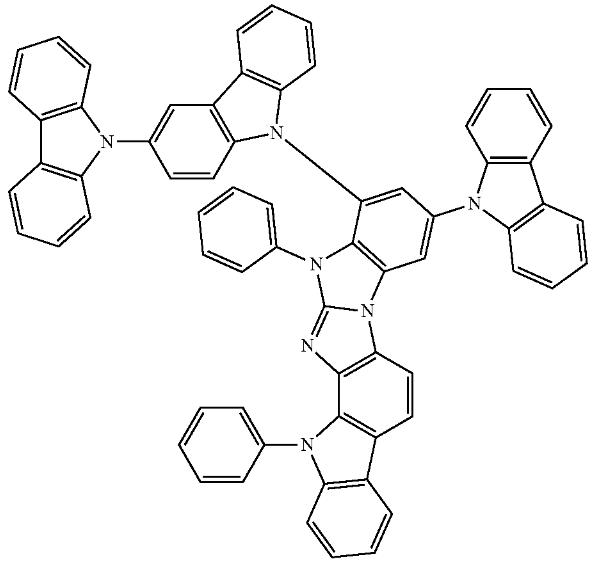
,
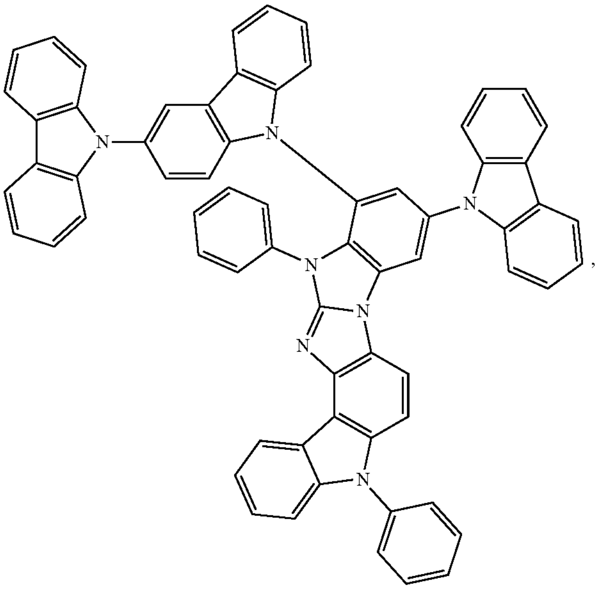
,
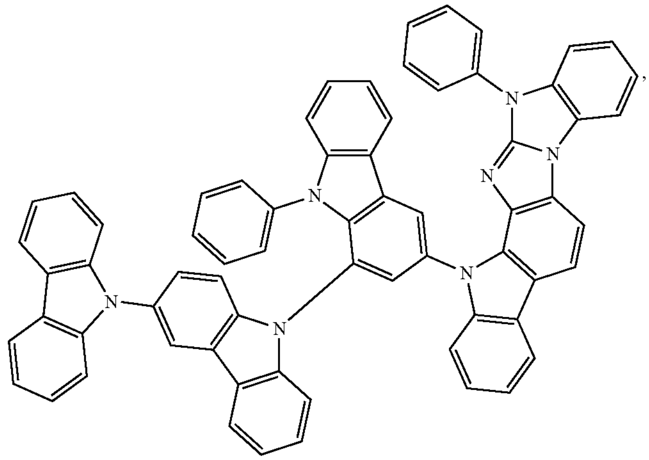
,
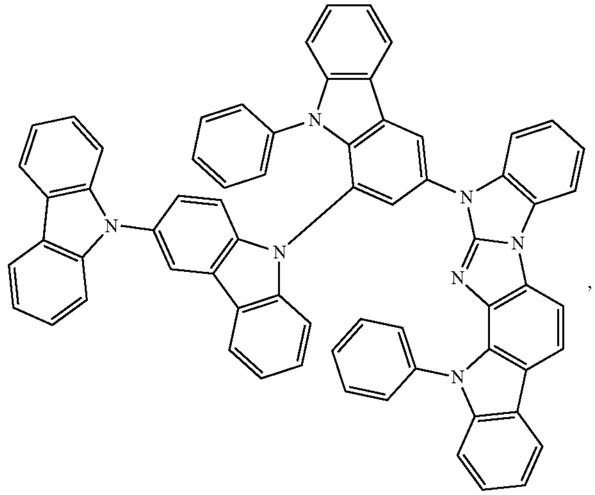
,
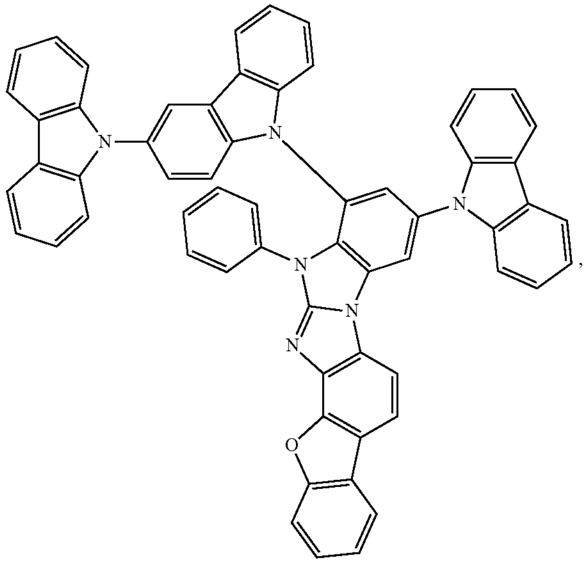
, -continued
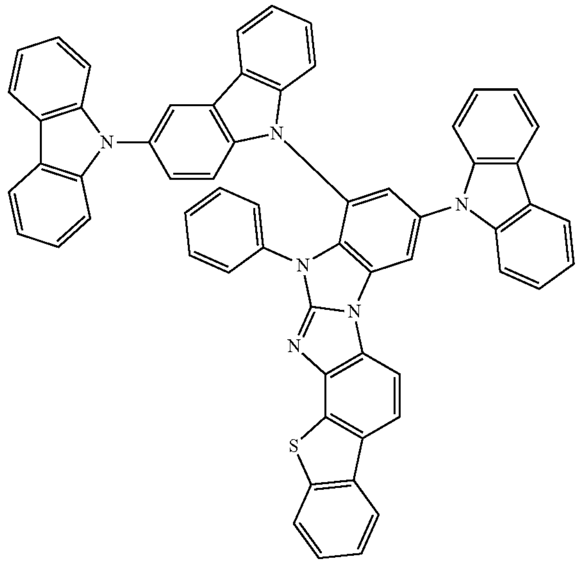
,
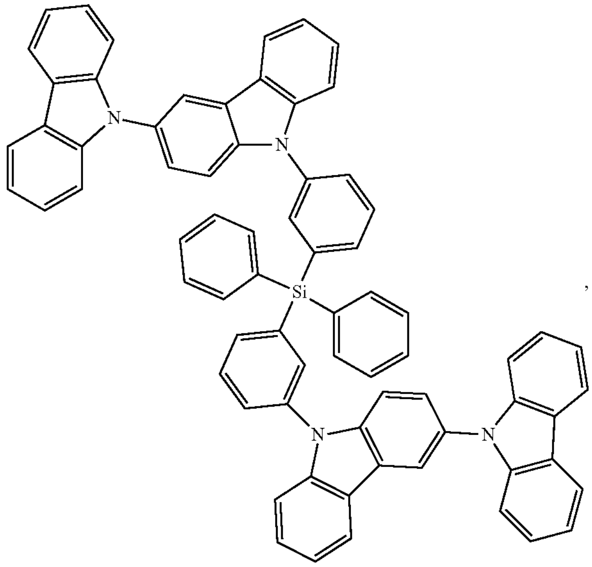
,
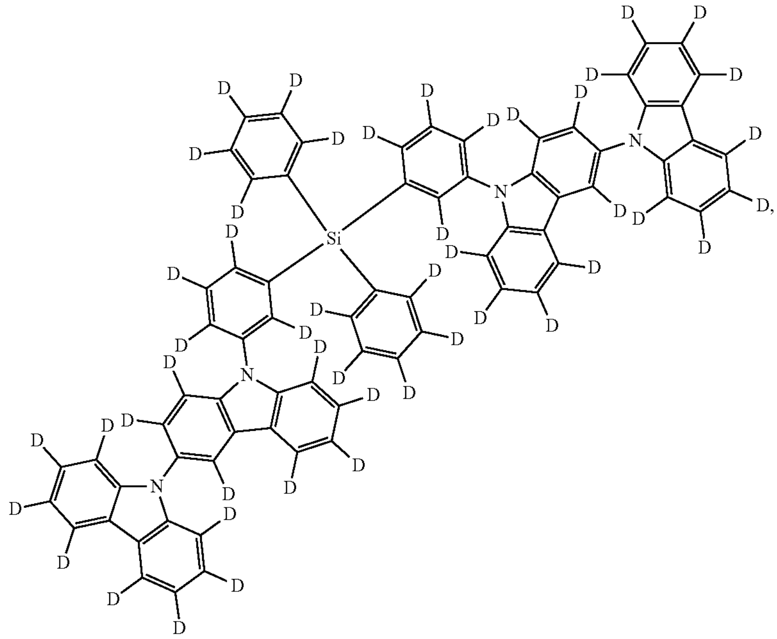
,
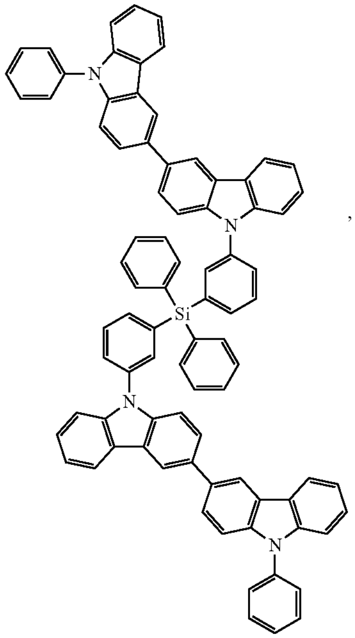
, -continued
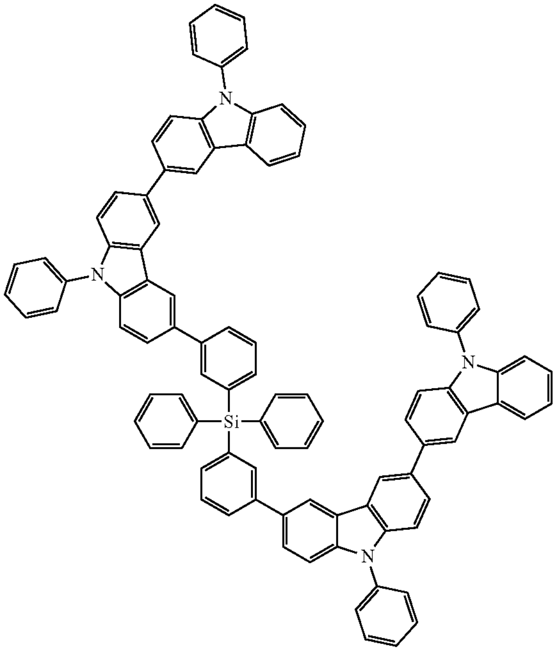
,
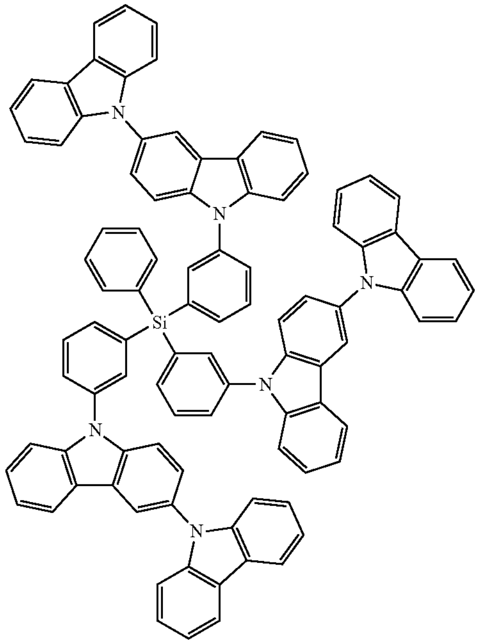
,
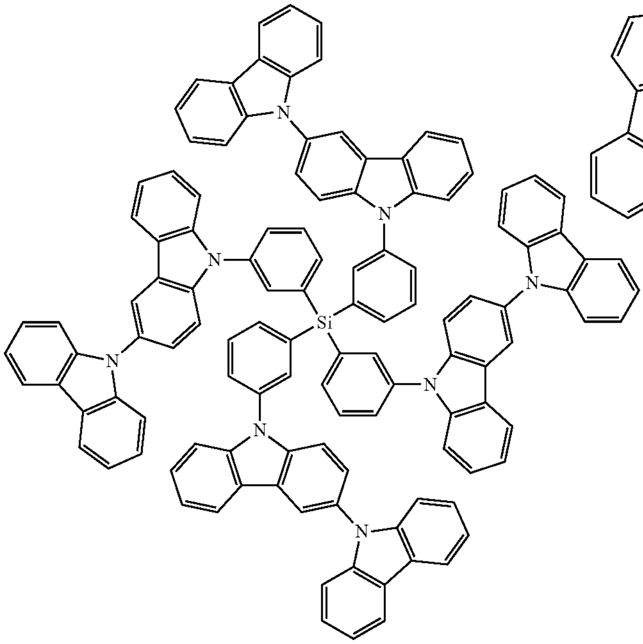
,
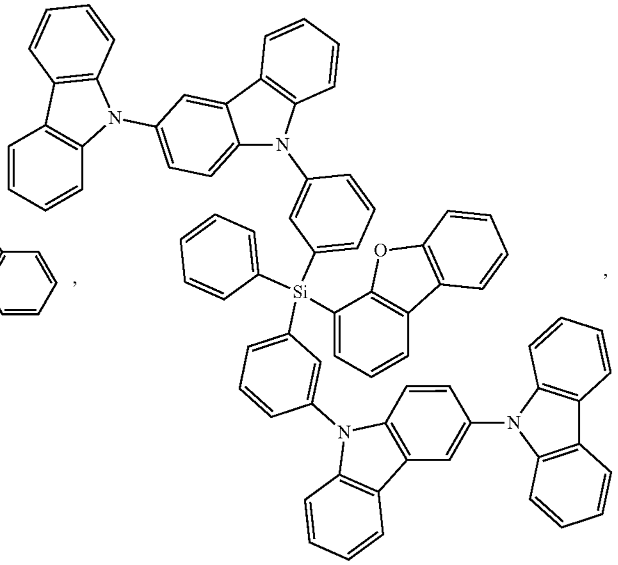
, -continued
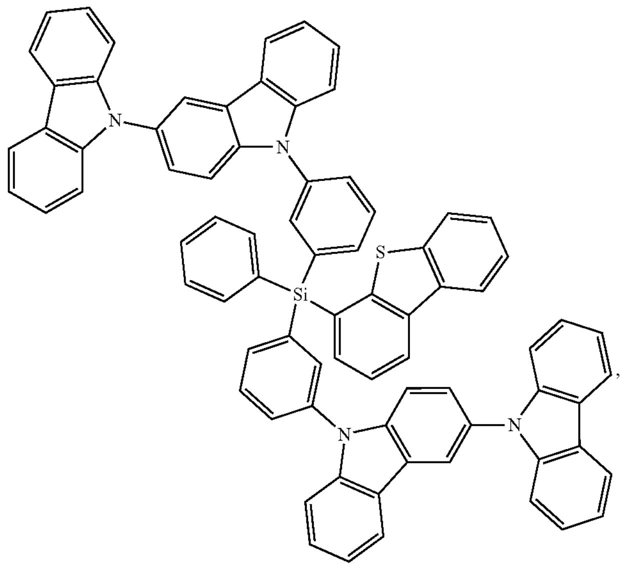
,
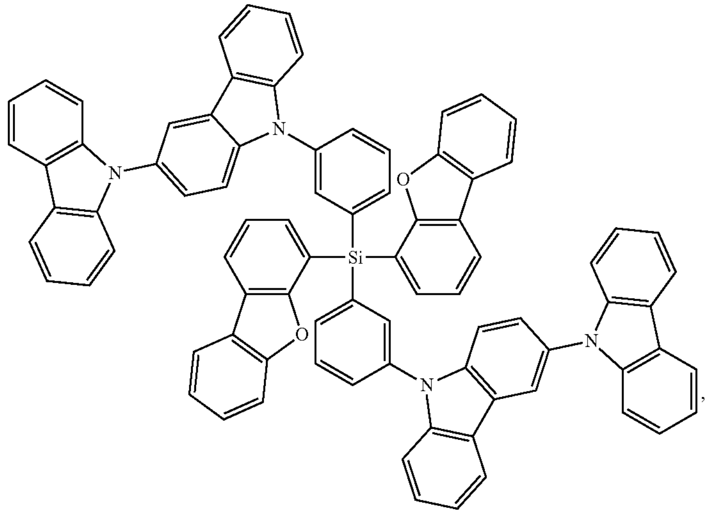
, -continued
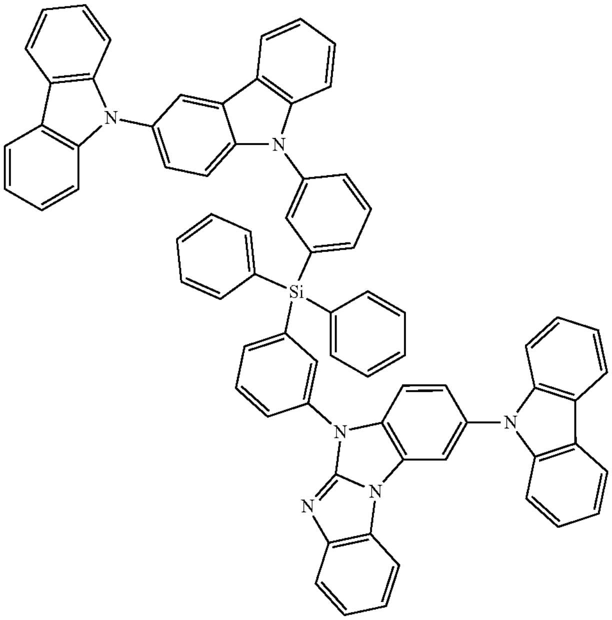
,
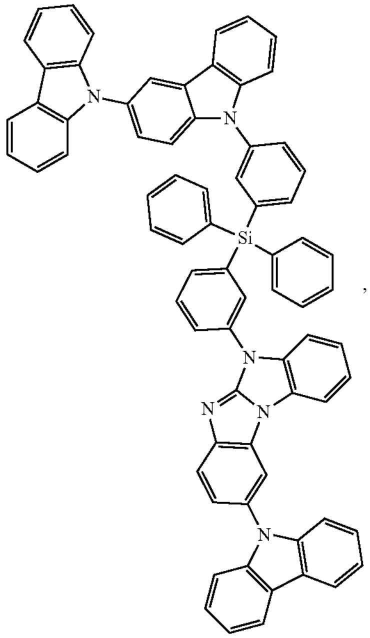
,
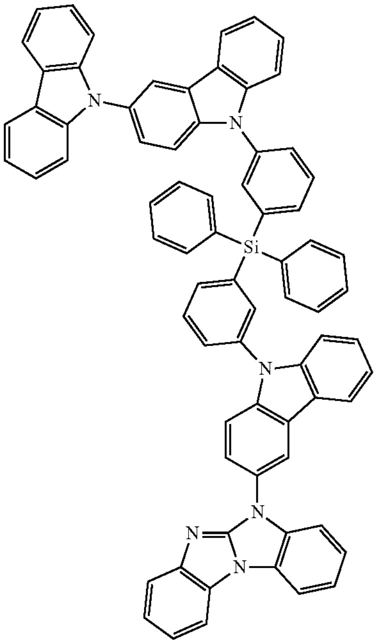
,
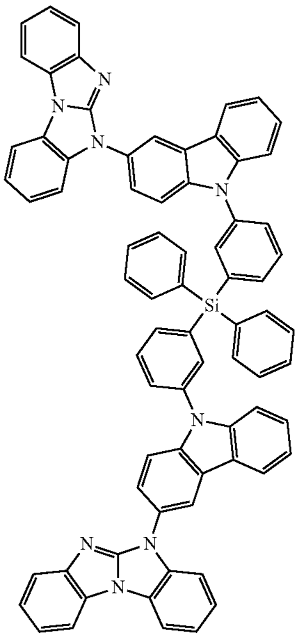
,
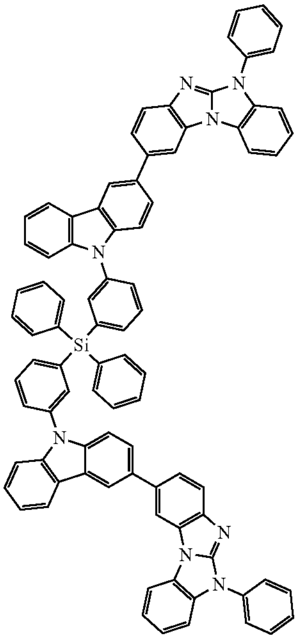
, -continued
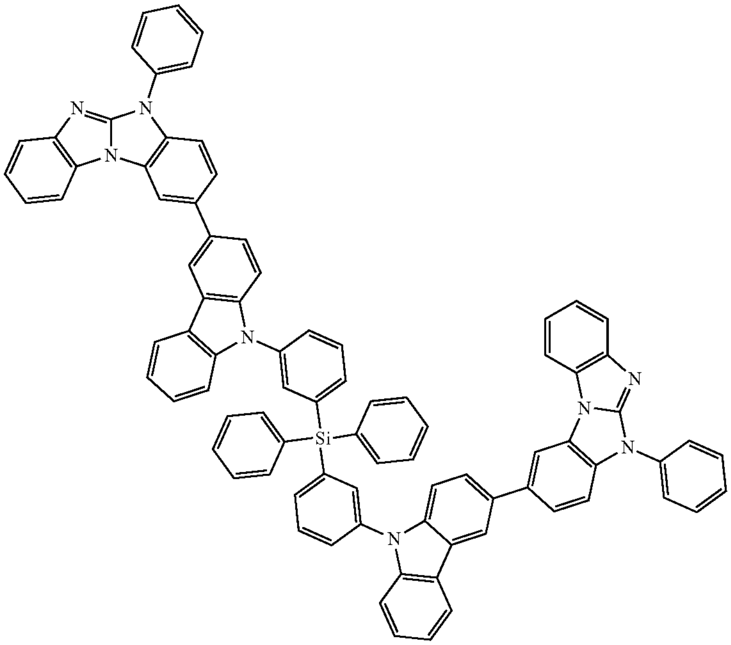
,
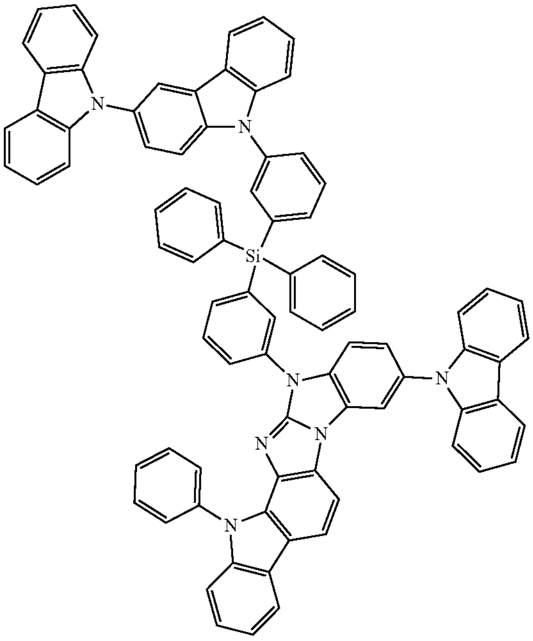
, -continued
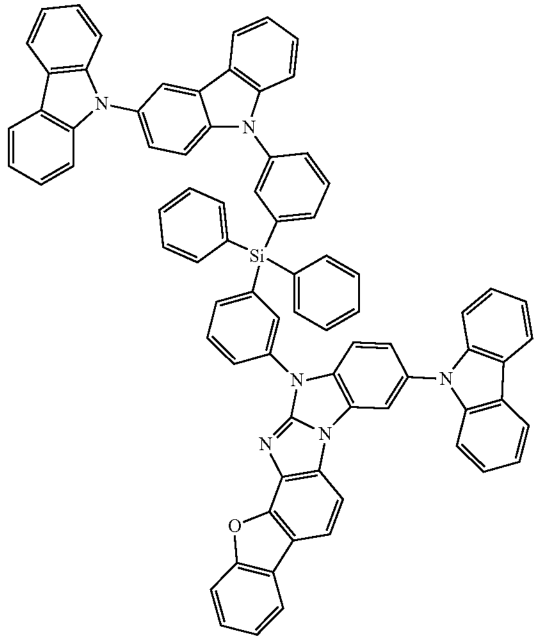
,
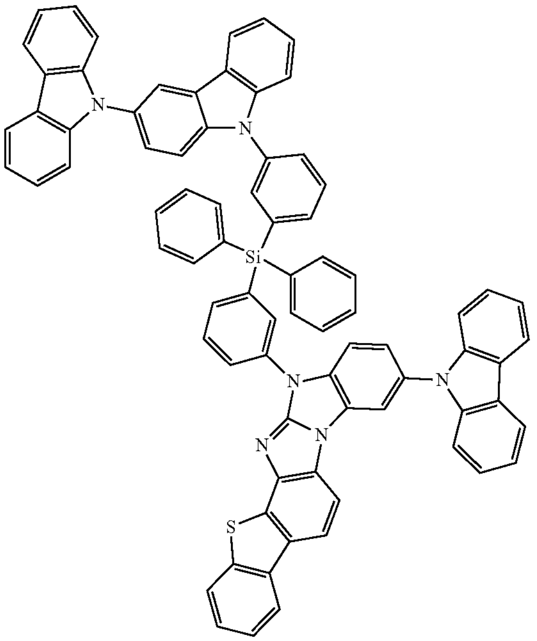
,
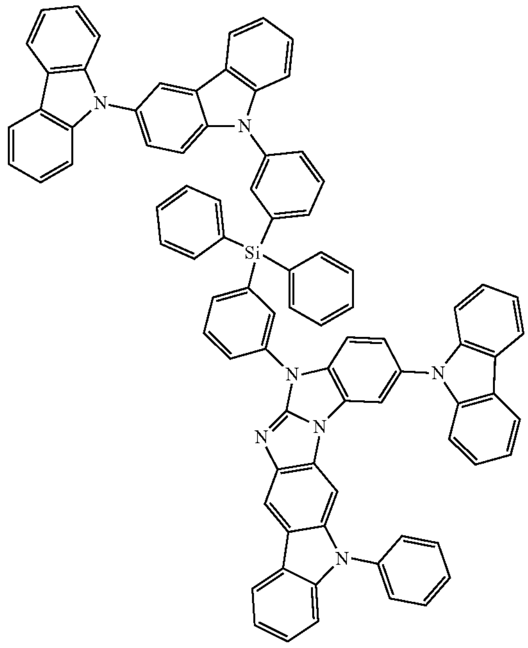
,
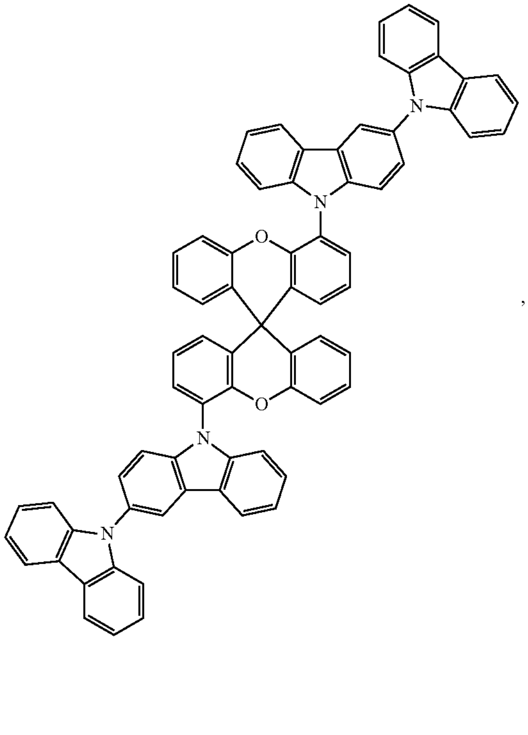
, -continued
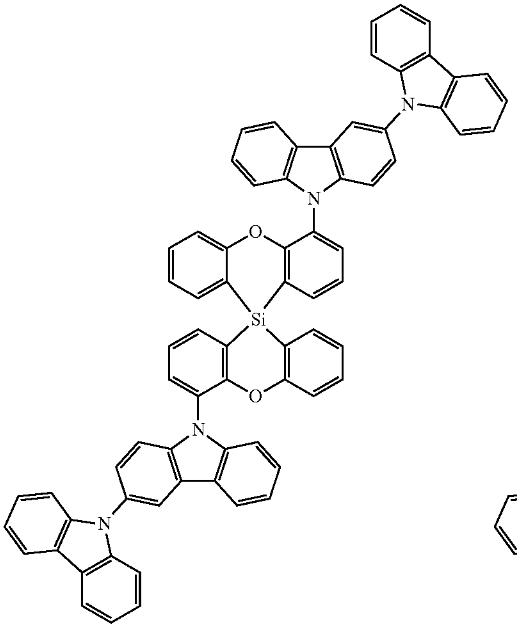
,
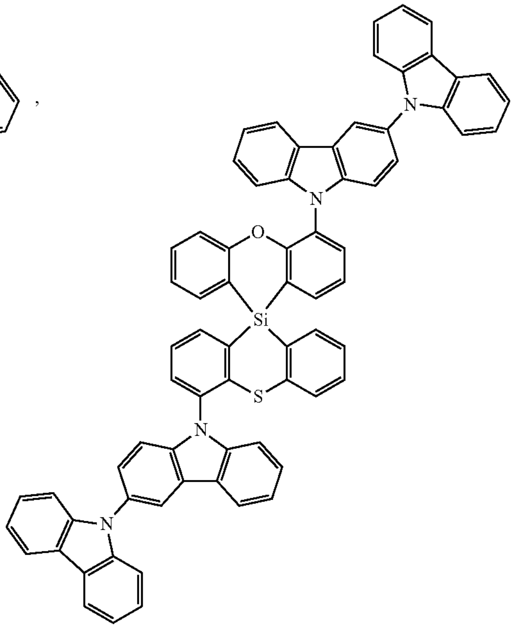
,
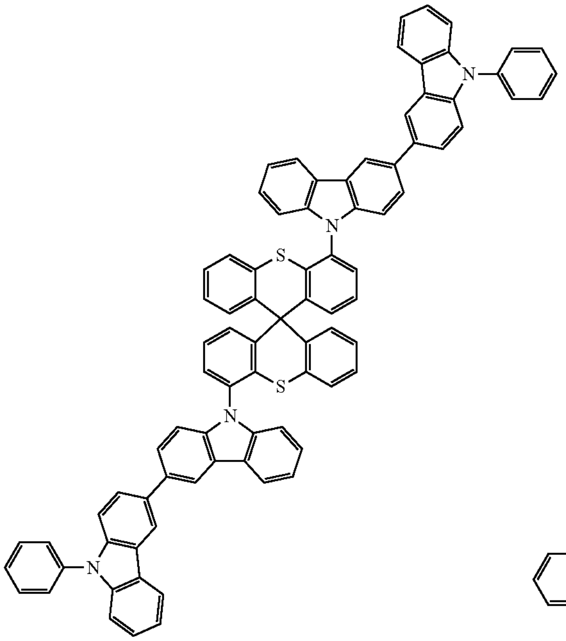
,
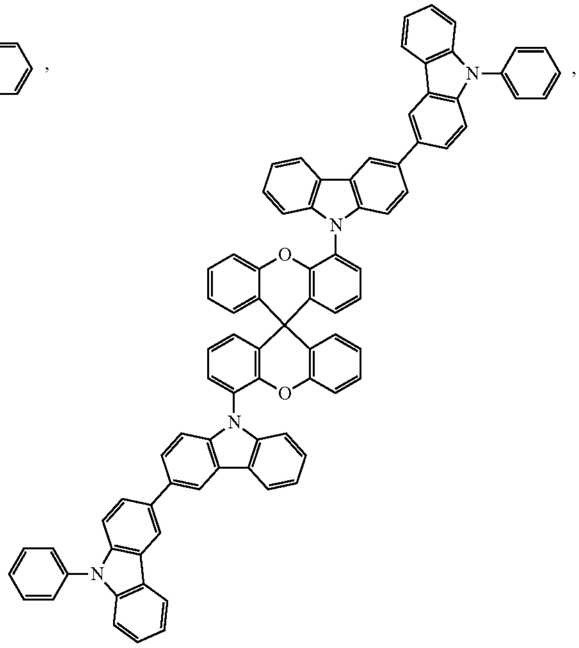
, -continued
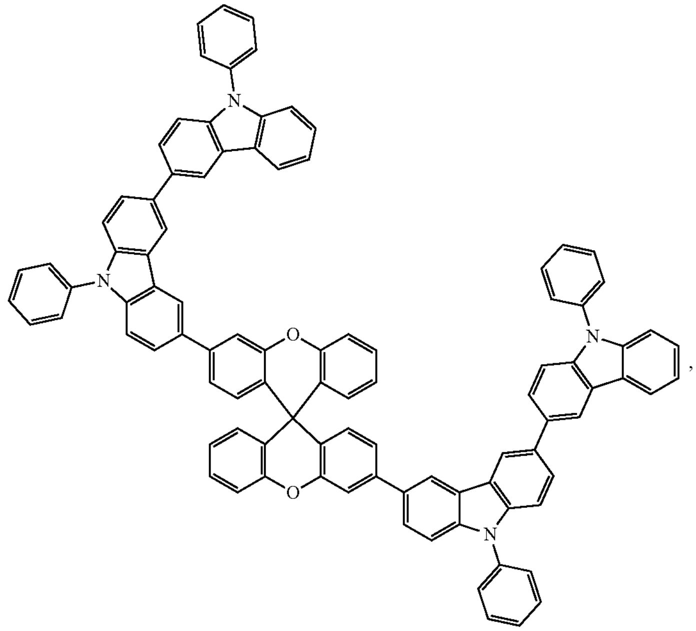
,
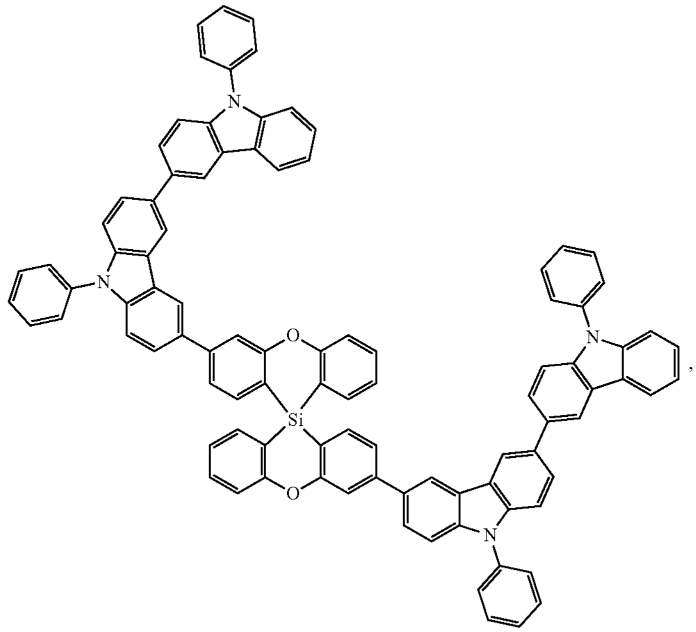
, -continued
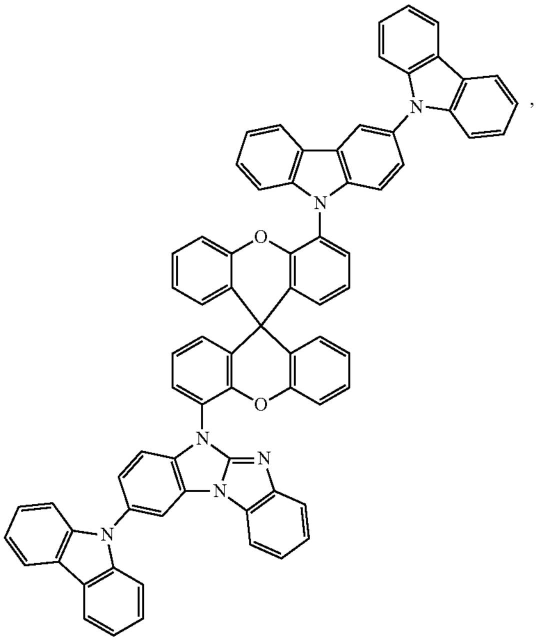
,
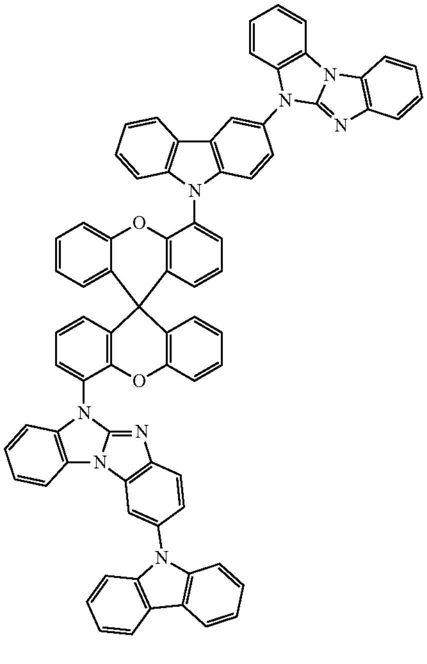
,
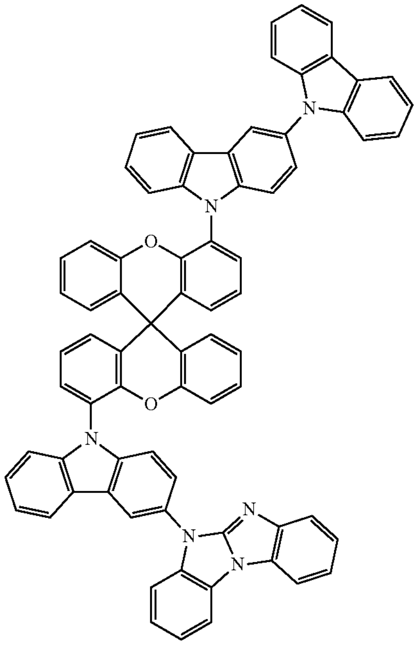
, -continued
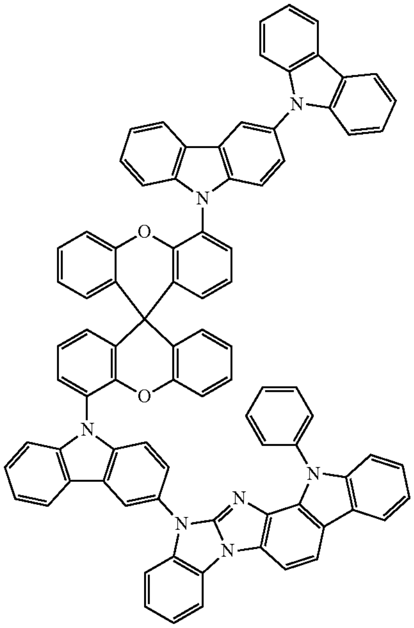
,
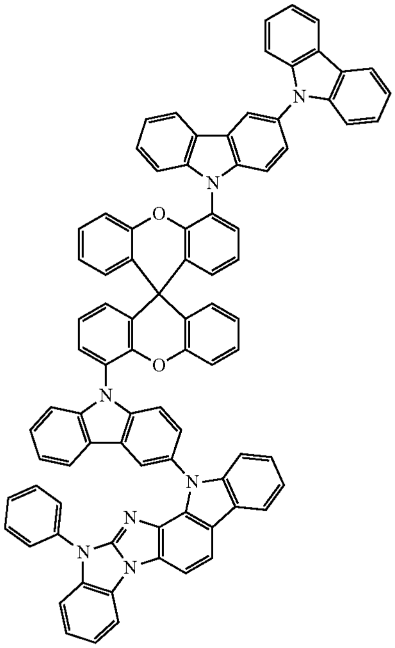
,
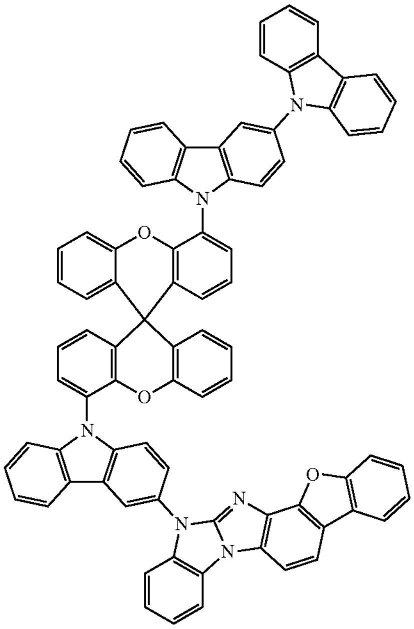
,
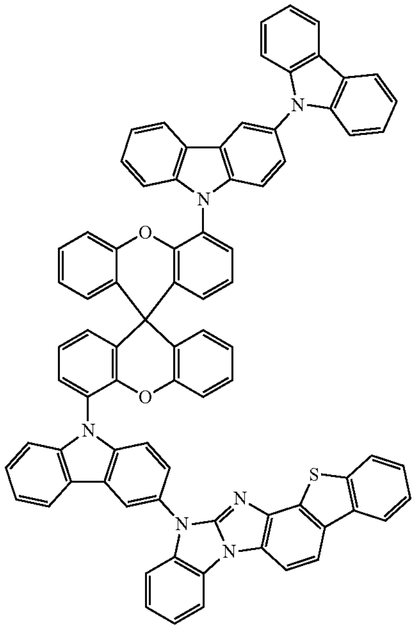
, -continued

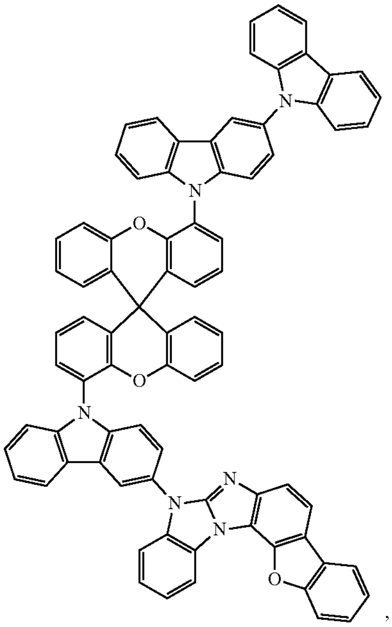

, and

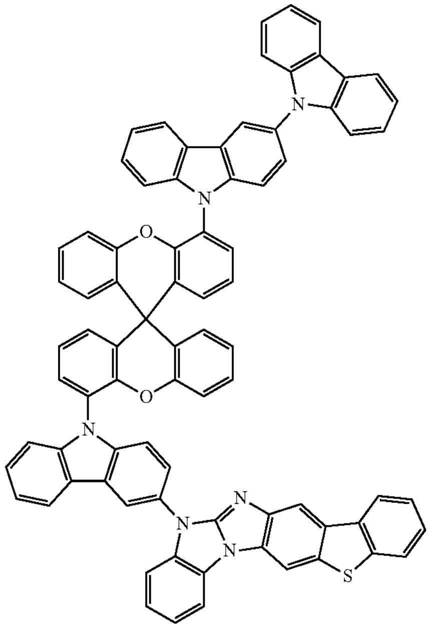

.

12. A consumer product comprising an organic light-emitting device (OLED) comprising:

an anode;

a cathode; and an organic layer disposed between the anode and the cathode, wherein the organic layer comprises the compound of claim 1.

13. A compound of Formula III or Formula IV

Formula III

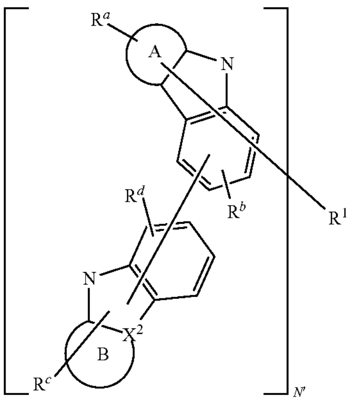

-continued

Formula IV

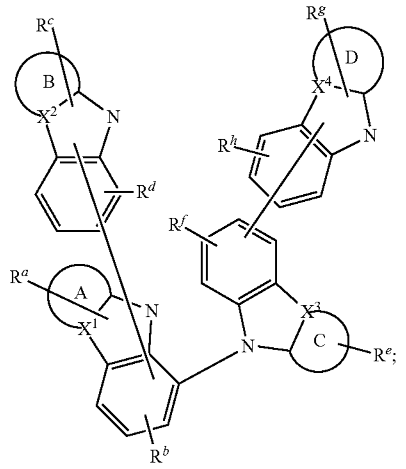

wherein $X^1$—$X^4$ are each independently C or N;

wherein N' is an integer of 2 to 4;

wherein moieties A, B, C and D are each independently a monocyclic ring or a polycyclic fused ring system, wherein the monocyclic ring or each ring of the polycyclic fused ring system is independently a 5-membered to 10-membered carbocyclic or heterocyclic ring;

wherein $R^1$ is a group selected from Formula I or Formula II as defined above;

wherein $R^a$, $R^b$, $R^c$, $R^d$, $R^e$, $R^f$, $R^g$ and $R^h$ each independently represent mono to the maximum allowable substitution, or no substitution;

wherein $R^a$, $R^b$, $R^c$, $R^d$, $R^e$, $R^f$, $R^g$ and $R^h$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof;

with the proviso that the compound is not one of the following two compounds:

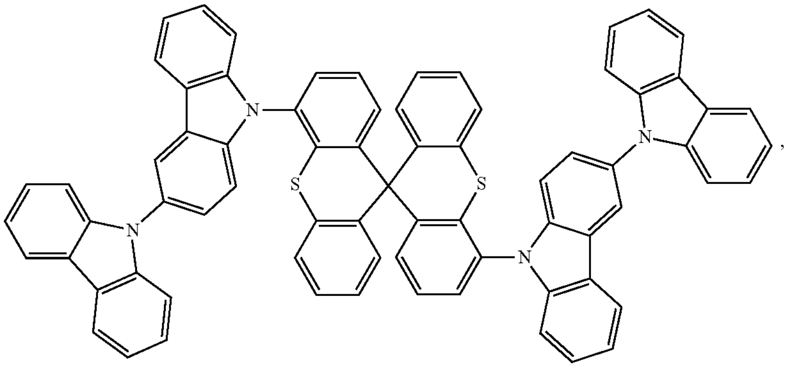

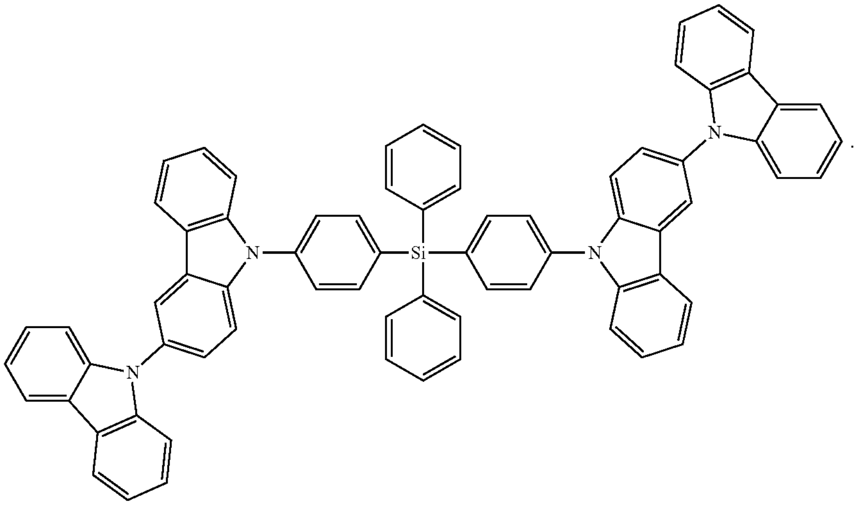

14. The compound of claim 13, wherein each $R^a$, $R^b$, $R^c$, $R^d$, $R^e$, $R^f$, $R^g$ and $R^h$ is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

15. The compound of claim 13, wherein the compound has Formula IV, and all of $X^1$—$X^4$ are C.

16. The compound of claim 13, wherein moiety A is a 6-membered carbocyclic aromatic ring; and/or wherein moiety B is a 6-membered carbocyclic aromatic ring; wherein the compound has Formula IV, and wherein moiety C is a 6-membered carbocyclic aromatic ring; and/or wherein the compound has Formula IV, and wherein moiety D is a 6-membered carbocyclic aromatic ring.

17. The compound of claim 13, wherein the compound has Formula III, and N' is 2.

18. The compound of claim 13, wherein the compound comprises at least four carbazole groups.

19. The compound of claim 13, wherein the compound has a structure selected from the group consisting of:

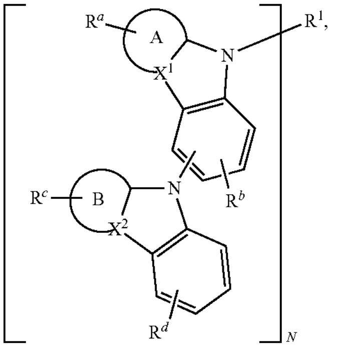

-continued

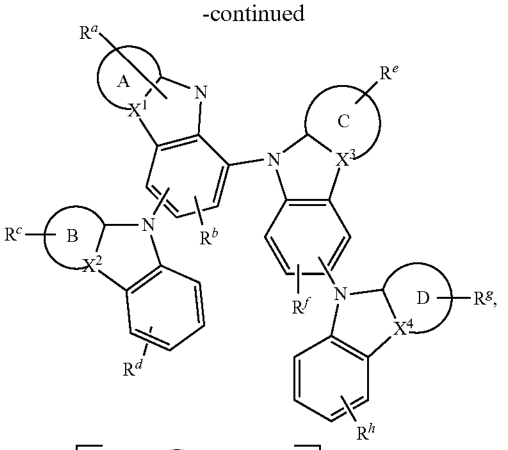

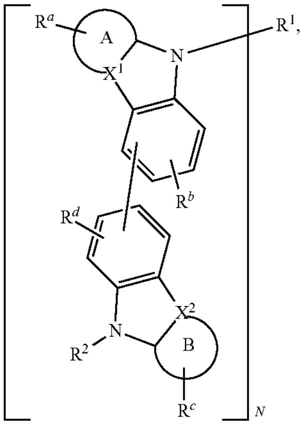

and

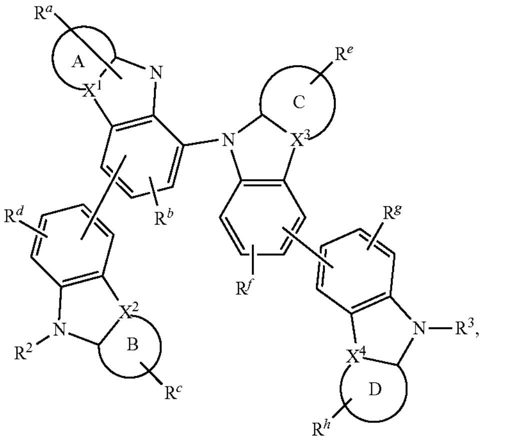

wherein $R^2$ and $R^3$ are each independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof.

20. An organic light emitting device (OLED) comprising:

an anode;

a cathode; and an organic layer disposed between the anode and the cathode, wherein the organic layer comprises the compound comprising a first moiety and a second moiety;

wherein the free form of the first moiety has a HOMO level, $E_{HOMO1}$, a LUMO level, $E_{LUMO1}$, and a center of gravity C1;

wherein the free form of the second moiety has a HOMO level, $E_{HOMO2}$, a LUMO level, $E_{LUMO2}$, and a center of gravity C2;

wherein the compound has a Point P;

wherein when the first moiety and the second moiety are connected by a direct bond, then the Point P is the center of the gravity of the direct bond;

wherein when the first moiety and the second moiety are connected by a structure of Formula I or a structure of Formula II, $W^1$ is the Point P;

Formula I

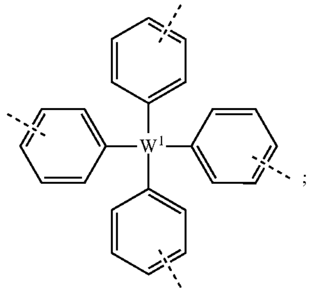

Formula II

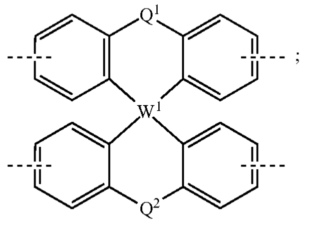

wherein $W^1$ are each independently C, Si or Ge;

wherein $Q^1$ and $Q^2$ are each independently a direct bond or selected from the list consisting of O, S, Se, NR, BR, BRR', PR, CR, C=O, C=NR, C=CRR', C=S, CRR', SO, $SO_2$, P(O)R, SiRR', and GeRR';

wherein each R and R' is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, selenyl, and combinations thereof;

wherein the first moiety and the second moiety are connected to Formula I or Formula II via any of the dashed lines;

wherein the angle between C1, P and C2 is equal to or greater than 45 degrees; and less than 180 degrees, wherein the first moiety and the second moiety are (i) both electron transporting moieties and $|E_{LUMO1}-E_{LUMO2}|<0.2$ eV; or (ii) both hole transporting moieties and $|E_{HOMO1}-E_{HOMO2}|<0.2$ eV.

* * * * *